US008709704B2

(12) United States Patent
Kamimura et al.

(10) Patent No.: US 8,709,704 B2
(45) Date of Patent: Apr. 29, 2014

(54) PATTERN FORMING METHOD USING DEVELOPER CONTAINING ORGANIC SOLVENT AND RINSING SOLUTION FOR USE IN THE PATTERN FORMING METHOD

(75) Inventors: Sou Kamimura, Shizuoka (JP); Shinji Tarutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/131,403

(22) PCT Filed: Nov. 27, 2009

(86) PCT No.: PCT/JP2009/070372
§ 371 (c)(1),
(2), (4) Date: May 26, 2011

(87) PCT Pub. No.: WO2010/061977
PCT Pub. Date: Jun. 3, 2010

(65) Prior Publication Data

US 2011/0229832 A1 Sep. 22, 2011

(30) Foreign Application Priority Data

Nov. 27, 2008 (JP) ................................ 2008-303259
Nov. 26, 2009 (JP) ................................ 2009-269342

(51) Int. Cl.
*G03F 7/26* (2006.01)

(52) U.S. Cl.
USPC .......................................................... 430/322

(58) Field of Classification Search
USPC ......................................... 430/325, 322, 331
See application file for complete search history.

(56) References Cited

U.S. PATENT DOCUMENTS

| | | | |
|---|---|---|---|
| 6,872,503 | B2 | 3/2005 | Wheland et al. |
| 7,985,534 | B2 | 7/2011 | Tsubaki |
| 7,998,655 | B2 | 8/2011 | Tsubaki |
| 8,017,298 | B2 | 9/2011 | Tsubaki |
| 8,017,304 | B2 | 9/2011 | Tarutani et al. |
| 8,034,547 | B2 | 10/2011 | Tsubaki et al. |

(Continued)

FOREIGN PATENT DOCUMENTS

| | | | |
|---|---|---|---|
| EP | 1939691 | A2 | 7/2008 |
| EP | 1980911 | A2 | 10/2008 |

(Continued)

OTHER PUBLICATIONS

International Search Report (PCT/ISA/210) for International Application No. PCT/JP2009/070372.

(Continued)

*Primary Examiner* — Cynthia Kelly
*Assistant Examiner* — Caleen Sullivan
(74) *Attorney, Agent, or Firm* — Sughrue Mion, PLLC

(57) ABSTRACT

A pattern forming method, includes: (i) a step of forming a resist film from a resist composition for organic solvent-based development, the resist composition containing (A) a resin capable of increasing a polarity by an action of an acid to decrease a solubility in an organic solvent-containing developer and (B) a compound capable of generating an acid upon irradiation with an actinic ray or radiation; (ii) an exposure step; (iii) a development step using an organic solvent-containing developer; and (iv) a washing step using a rinsing solution, wherein in the step (iv), a rinsing solution containing at least either the solvent S1 or S2 as defined in the specification is used.

20 Claims, 9 Drawing Sheets

(56) References Cited

U.S. PATENT DOCUMENTS

| | | | | |
|---|---|---|---|---|
| 8,071,272 | B2 | 12/2011 | Tsubaki | |
| 8,088,557 | B2 | 1/2012 | Tsubaki | |
| 8,227,183 | B2 | 7/2012 | Tsubaki et al. | |
| 8,241,840 | B2 | 8/2012 | Tsubaki et al. | |
| 2004/0204328 | A1 | 10/2004 | Zhang et al. | |
| 2006/0147836 | A1 | 7/2006 | Hatakeyama et al. | |
| 2006/0189138 | A1 | 8/2006 | Nishimura et al. | |
| 2007/0122741 | A1 | 5/2007 | Hatakeyama et al. | |
| 2008/0070167 | A1 | 3/2008 | Takahashi et al. | |
| 2008/0187860 | A1* | 8/2008 | Tsubaki et al. | 430/270.1 |
| 2011/0045413 | A1 | 2/2011 | Tsubaki | |
| 2011/0171583 | A1 | 7/2011 | Zhang et al. | |
| 2011/0229832 | A1 | 9/2011 | Kamimura et al. | |
| 2011/0250543 | A1 | 10/2011 | Tsubaki | |
| 2011/0300485 | A1 | 12/2011 | Tsubaki et al. | |
| 2011/0305992 | A1 | 12/2011 | Tarutani et al. | |
| 2012/0088194 | A1 | 4/2012 | Tsubaki | |
| 2012/0122031 | A1* | 5/2012 | Chen et al. | 430/280.1 |
| 2012/0135355 | A1 | 5/2012 | Tsubaki | |
| 2012/0148957 | A1* | 6/2012 | Enomoto et al. | 430/285.1 |

FOREIGN PATENT DOCUMENTS

| | | | |
|---|---|---|---|
| JP | 4-134350 | A | 5/1992 |
| JP | 2000-199953 | A | 7/2000 |
| JP | 2005-292827 | A | 10/2005 |
| WO | 2008/140119 | A1 | 11/2008 |

OTHER PUBLICATIONS

Written Opinion (PCT/ISA/237) for International Application No. PCT/JP2009/070372.

Office Action dated Jun. 28, 2012 in Chinese Application No. 200980147739.2.

Office Action dated Sep. 4, 2012 in Singapore Application No. 201103876-7.

Office Action dated Sep. 19, 2012 in European Application No. 09775333.9.

Office Action dated Jan. 23, 2013 in Chinese Application No. 200980147739.2.

Office Action dated Mar. 11, 2013 in European Application No. 09 775 333.9.

Office Action dated Jan. 9, 2013 in U.S. Appl. No. 13/588,762.

Office Action dated Aug. 6, 2013, issued by the Japanese Patent Office in counterpart Japanese Patent Application No. 2009-269342.

Office Action, dated Aug. 30, 2013, issued by the European Patent Office, in counterpart Application No. 09775333.9.

Office Action issued Mar. 4, 2014, in corresponding European Application No. 09775333.9.

Office Action dated Mar. 4, 2014 in Japanese Application No. 2009-269342.

* cited by examiner

PATTERN FORMING METHOD USING DEVELOPER CONTAINING ORGANIC SOLVENT AND RINSING SOLUTION FOR USE IN THE PATTERN FORMING METHOD

TECHNICAL FIELD

The present invention relates to a pattern forming method using an organic solvent-containing developer (i.e. a developer containing an organic solvent), which is used in the process for producing a semiconductor such as IC or in the lithography process for the production of a circuit board of liquid crystal, thermal head and the like, or for other photofabrications; and a rinsing solution for use in the pattern forming method. More specifically, the present invention relates to a pattern forming method using an organic solvent-containing developer, which is suitable for exposure with an ArF exposure apparatus using a light source that emits far ultraviolet light at a wavelength of 300 nm or less or with an immersion-type projection exposure apparatus; and a rinsing solution for use in the pattern forming method.

BACKGROUND ART

As shown in FIG. 1, in the case of a positive system (the combination of a resist composition and an alkali developer) for the pattern formation, only a material of performing the pattern formation by selectively dissolving and removing a region having strong light irradiation intensity out of spatial frequencies of an optical image is provided. On the other hand, as for a negative system (the combination of a resist composition and an organic solvent-containing developer), only a material system of performing the pattern formation by selectively dissolving and removing a region having a weak light irradiation intensity is provided.

The term "alkali developer" as used herein indicates a developer that selectively dissolves and removes the exposed area not lower than a predetermined threshold value (a) shown by a solid line in FIG. 1, and the "organic solvent-containing developer" indicates a developer that selectively dissolves and removes the exposed area not higher than a predetermined threshold value (b). A development step using an alkali developer is called an alkali development step (sometimes referred to as a positive development step), and a development step using an organic solvent-containing developer is called an organic solvent-based development step (sometimes referred to as a negative development step).

Meanwhile, JP-A-2000-199953 (the term "JP-A" as used herein means an "unexamined published Japanese patent application") describes a double development technology as the double patterning technology for raising the resolution. In this case, an image forming method by general chemical amplification is utilized, and by making use of a property that upon exposure, the polarity of a resin in a resist composition becomes a high polarity in a region irradiated with high-intensity light and a low polarity is maintained in a region irradiated with low-intensity light, development is performed by dissolving a high exposure region of a specific resist film with a high-polarity developer, while development is performed by dissolving a low exposure region with a low-polarity developer. More specifically, the region not lower than an exposure dose E2 of irradiation light 1 in FIG. 2 is dissolved using an aqueous alkali solution as the developer, the region not higher than an exposure dose E1 is dissolved using a specific organic solvent as the developer, and, as shown in FIG. 2, the region at a medium exposure dose (E2 to E1) is allowed to remain without being developed, whereby a line-and-space pattern 3 with a pitch half the pitch of the exposure mask 2 is formed on a wafer 4.

European Unexamined Patent Publication No. 1,939,691 discloses organic solvent-based development and a pattern forming method by double exposure and double development using organic solvent-based development.

In the pattern forming method using an organic solvent-containing developer, which can be utilized for the formation of a fine pattern, it is demanded to suppress defects produced after the development step.

SUMMARY OF INVENTION

An object of the present invention is to solve these problems and provide a pattern forming method for stably forming a high-precision fine pattern so as to produce a highly integrated electronic device with high precision, ensuring that in the pattern formation, defects such as residue-type defect or blob defect can be greatly reduced, and a rinsing solution for use in the method.

The blob defect is produced during drying of liquid droplets when the rinsing solution on the hydrophobic resist surface is dried by spin drying. In general, a liquid droplet of developer/rinsing solution is considered to become a blob defect after a liquid droplet of developer/rinsing solution is dried while peeling off the surface of a resist film or coagulating an additive such as acid generator.

The present invention includes the following constitutions, and above object of the present invention is solved by these constitutions.

(1) A pattern forming method, comprising:

(i) a step of forming a resist film from a resist composition for organic solvent-based development, the resist composition containing (A) a resin capable of increasing a polarity of the resin (A) by an action of an acid to decrease a solubility of the resin (A) in an organic solvent-containing developer and (B) a compound capable of generating an acid upon irradiation with an actinic ray or radiation;

(ii) an exposure step;

(iii) a development step using an organic solvent-containing developer; and (iv) a washing step using a rinsing solution, wherein in the step (iv), a rinsing solution containing at least either the following solvent S1 or S2 is used:

Solvent S1: an alcohol having a carbon number of at least 5 and having an alkyl chain containing at least either a branched or cyclic structure, with a secondary or tertiary carbon atom in the alkyl chain being bonded to a hydroxyl group; and Solvent S2: a dialkyl ether having at least either an alkyl group having a carbon number of at least 5 or a cycloalkyl group having a carbon number of at least 5.

(2) The pattern forming method as described in (1) above, wherein the rinsing solution contains the solvent S1 and the carbon number of the solvent S1 is from 6 to 8.

(3) The pattern forming method as described in (1) or (2) above, wherein the rinsing solution contains the solvent S2 and the carbon number of the alkyl group having a carbon number of at least 5 or the cycloalkyl group having a carbon number of at least 5 in the solvent S2 is from 5 to 8.

(4) The pattern forming method as described in any one of (1) to (3) above, wherein the rinsing solution contains both the solvent S1 and the solvent S2 and satisfies a condition of solvent S1/solvent S2 (ratio by mass) being from 50/50 to 80/20.

(5) The pattern forming method as described in any one of (1) to (4) above, wherein the resin (A) contains a repeating unit represented by the following formula (pA):

(pA)

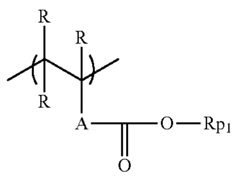

wherein R represents a hydrogen atom, a halogen atom or a linear or branched alkyl group having a carbon number of 1 to 4, and each R may be the same as or different from every other R;

A represents a single bond, an alkylene group, an ether bond, a thioether bond, a carbonyl group, an ester bond, an amido bond, a sulfonamido bond, a urethane bond, a ureylene bond or a combination of two or more of these groups and bonds; and $Rp_1$ represents a group represented by any one of the following formulae (pI) to (pV):

(pI)

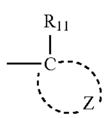

(pII)

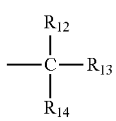

(pIII)

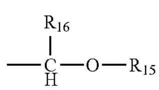

(pIV)

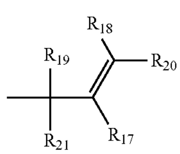

(pV)

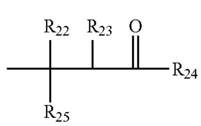

wherein $R_{11}$ represents a methyl group, an ethyl group, an n-propyl group, an isopropyl group, an n-butyl group, an isobutyl group or a sec-butyl group;

Z represents an atomic group necessary for forming a cycloalkyl group together with the carbon atom;

each of $R_{12}$ to $R_{16}$ independently represents a linear or branched alkyl group having a carbon number of 1 to 4 or a cycloalkyl group, provided that at least one of $R_{12}$ to $R_{14}$ and either one of $R_{15}$ and $R_{16}$ represent a cycloalkyl group;

each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group;

each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

(6) The pattern forming method as described in any one of (1) to (5) above, wherein the resin (A) contains a repeating unit represented by the following formula (IX) having neither a hydroxyl group nor a cyano group:

(IX)

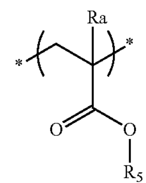

wherein $R_5$ represents a hydrocarbon group having at least one cyclic structure and having neither a hydroxyl group nor a cyano group; and Ra represents a hydrogen atom, an alkyl group or a $—CH_2—O—Ra_2$ group in which $Ra_2$ represents an alkyl group or an acyl group.

(7) The pattern forming method as described in any one of (1) to (6) above, wherein the resist composition for organic solvent-based development further contains (C) a solvent.

(8) A rinsing solution for organic solvent-based development, which is used for a resist composition for organic solvent-based development, the rinsing solution comprising at least either the following solvent S1 or S2:

Solvent S1: an alcohol having a carbon number of at least 5 and having an alkyl chain containing at least either a branched or cyclic structure, with a secondary or tertiary carbon atom in the alkyl chain being bonded to a hydroxyl group; and Solvent S2: a dialkyl ether having at least either an alkyl group having a carbon number of at least 5 or a cycloalkyl group having a carbon number of at least 5.

(9) The rinsing solution for organic solvent-based development as described in (8) above, comprising the solvent S1, wherein the carbon number of the solvent S1 is from 6 to 8.

(10) The rinsing solution for organic solvent-based development as described in (8) or (9) above, comprising the solvent S2, wherein the carbon number of the alkyl group having a carbon number of at least 5 or the cycloalkyl group having a carbon number of at least 5 in the solvent S2 is from 5 to 8.

(11) The rinsing solution for organic solvent-based development as described in any one of (8) to (10) above, comprising both the solvent S1 and the solvent S2 and satisfying a condition of solvent S1/solvent S2 (ratio by mass) being from 50/50 to 80/20.

DESCRIPTION OF EMBODIMENTS

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of a mercury lamp, a far ultraviolet ray typified by excimer laser, an extreme-ultraviolet ray (EUV), an X-ray or an electron beam. Also, in the present invention, the "light" means an actinic ray or radiation. Furthermore, in the present invention, unless otherwise indicated, the "exposure" includes not only exposure with a mercury lamp, a far ultraviolet ray typified by excimer laser, an X-ray, EUV light or the like but also lithography with a particle beam such as electron beam and ion beam.

Figure 1:
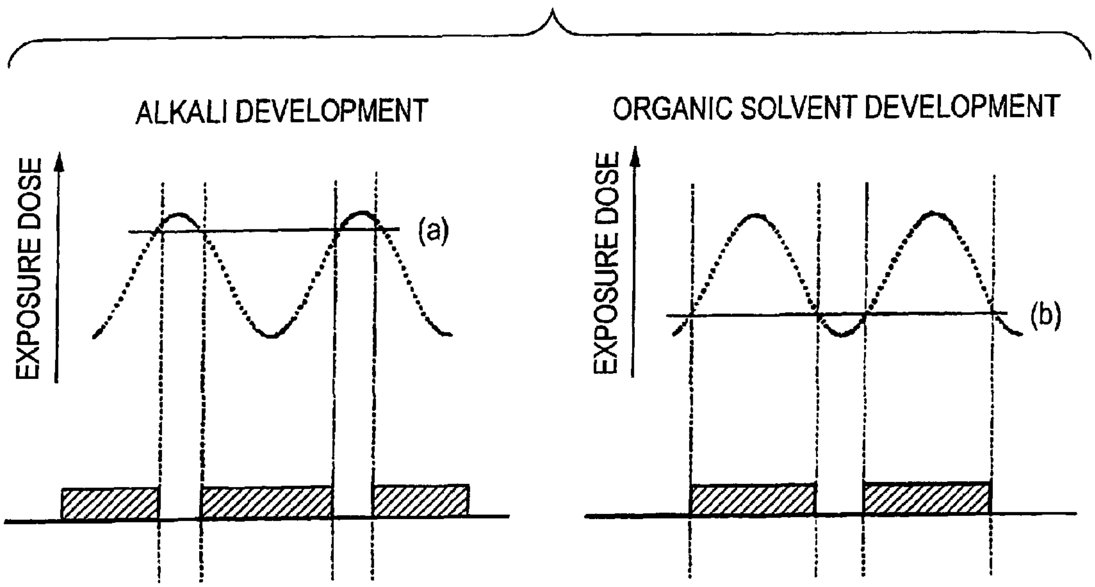
FIG. 1 is a schematic view showing the relationship among alkali development, organic solvent-based development and exposure dose.
Figure 2:
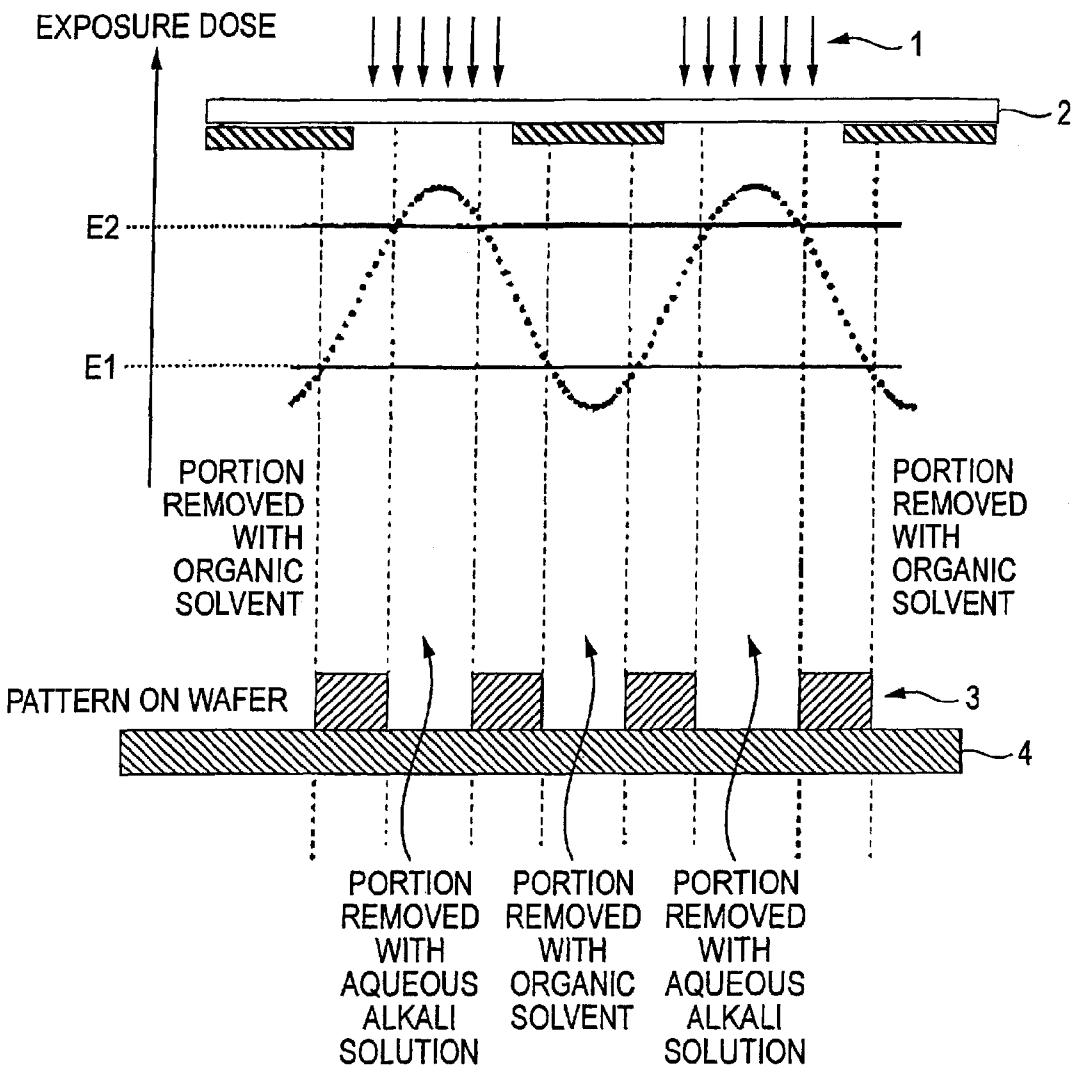
FIG. 2 is a schematic view showing the pattern forming method using alkali development and organic solvent-based development in combination.

First, the terms used in the context of the present invention are described. The pattern forming system includes a positive system and a negative system and in either system, a change in the solubility of a resist film in a developer due to a chemical reaction triggered by light irradiation is utilized. A system where the light-irradiated part dissolves in a developer is called a positive system, and a system where the light-unirradiated part dissolves in a developer is called a negative system. The developer used here includes two types of developers, that is, an alkali developer (aqueous) (sometimes referred to as a positive developer) and an organic solvent-containing developer (sometimes referred to as a negative developer). The alkali developer is a developer that selectively dissolves and removes the exposed area not lower than a predetermined threshold value (a) shown by a solid line in FIG. 1, and the organic solvent-containing developer is a developer that selectively dissolves and removes an exposed area not higher than a predetermined threshold value (b). A development step using an alkali developer is called an alkali development step (sometimes referred to as a positive development step), and a development step using an organic solvent-containing developer is called an organic solvent-based development step (sometimes referred to as a negative development step). The multiple development (sometimes referred to as a multiple development step) is a development step combining the development step using an alkali developer and the developing step using an organic solvent-containing developer. In the present invention, a resist composition used for the organic solvent-based development is called a resist composition for organic solvent-based development, and when the resist composition for organic solvent-based development is used for multiple development, the resist composition for organic solvent-based development is also called a resist composition for multiple development. In the following, when simply referred to as "resist composition", this indicates a resist composition for organic solvent-based development. The rinsing solution for organic solvent-based development indicates an organic solvent-containing rinsing solution for use in the washing step after organic solvent-based development.

Figure 3:
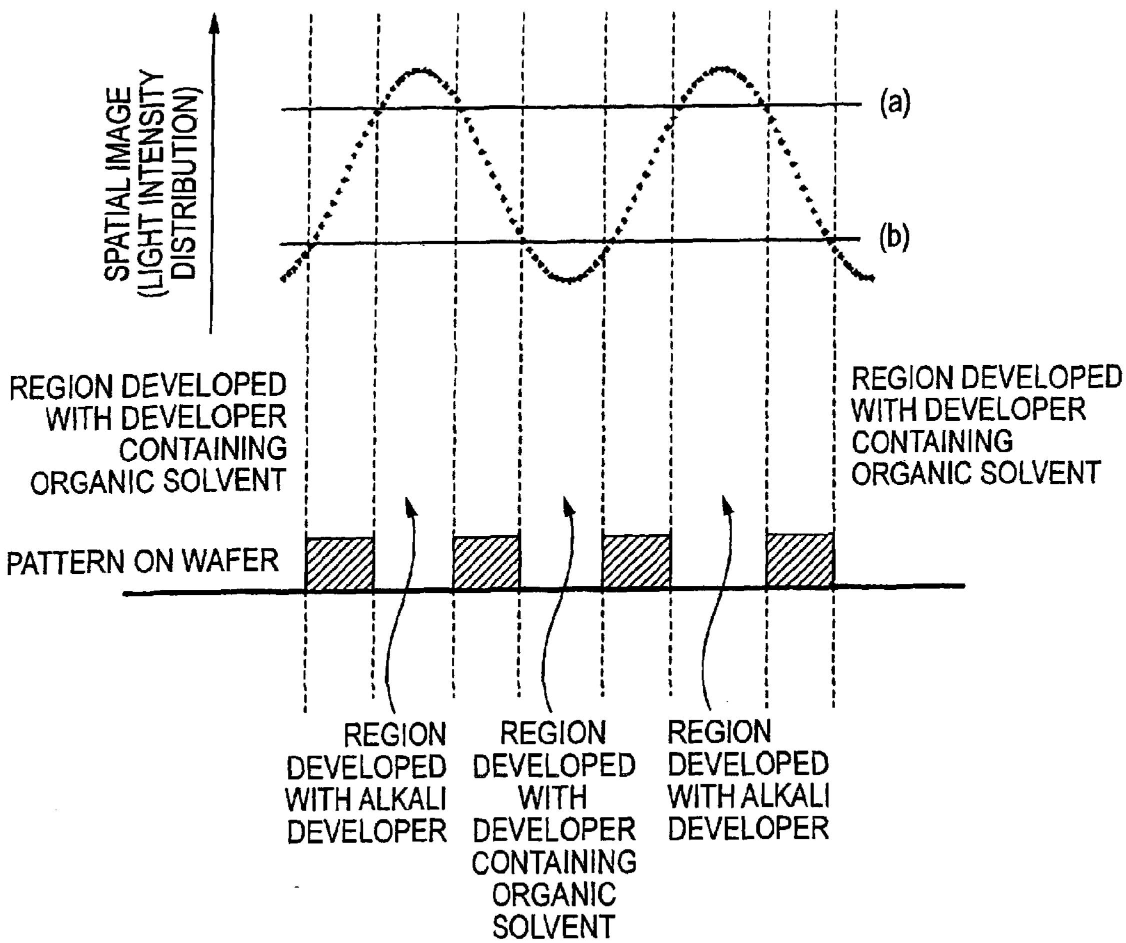
FIG. 3 is a schematic view showing the relationship among alkali development, organic solvent-based development and exposure dose.

The present invention provides, as a technique for raising the resolution, a new pattern forming method combining a developer (organic solvent-containing developer) for selectively dissolving and removing the exposed area not higher than a predetermined threshold value (b) as shown in FIG. 3, with a resist composition for organic solvent-based development, which contains a resin capable of increasing the polarity by the action of an acid and forms a film whose solubility in an alkali developer increases and solubility in an organic solvent-containing developer decreases upon irradiation with an actinic ray or radiation.

The resist composition for organic solvent-based development of the present invention also exhibits excellent development characteristics for a developer (alkali developer) capable of selectively dissolving and removing the exposed area not lower than a predetermined threshold value (a) upon irradiation with an actinic ray or radiation, and pattern formation by multiple development can be performed by combining a developer (alkali developer) for selectively dissolving and removing the exposed area not lower than a predetermined threshold value (a) and a developer (organic solvent-containing developer) for selectively dissolving and removing the exposed area not higher than a predetermined threshold value (b) with the resist composition for organic solvent-based development.

That is, as shown in FIG. 3, when a pattern element on an exposure mask is projected on a wafer by light irradiation, the region having a strong light irradiation intensity (the exposed area not lower than a predetermined threshold value (a)) is dissolved and removed using an alkali developer and the region having a weak light irradiation intensity (the exposed area not higher than a predetermined threshold value (b)) is dissolved and removed using an organic solvent-containing developer, whereby a pattern with resolution as high as 2 times the frequency of an optical spatial image (light intensity distribution) can be obtained.

The pattern forming method comprises the following steps:

(i) a step of forming a resist film from a resist composition for organic solvent-based development, containing (A) a resin capable of increasing the polarity by the action of an acid to decrease the solubility in an organic solvent-containing developer and (B) a compound capable of generating an acid upon irradiation with an actinic ray or radiation;

(ii) an exposure step;

(iii) a development step using an organic solvent-containing developer; and (iv) a washing step using a rinsing solution containing at least either solvent S1 or S2:

Solvent S1: an alcohol having a carbon number of at least 5 and having an alkyl chain containing at least either a branched or cyclic structure, with the secondary or tertiary carbon atom in the alkyl chain being bonded to a hydroxyl group; and Solvent S2: a dialkyl ether having at least either an alkyl group having a carbon number of at least 5 or a cycloalkyl group having a carbon number of at least 5.

The pattern forming method of the present invention preferably further comprises (vi) a step of performing development by using an alkali developer.

The pattern forming method of the present invention preferably comprises (v) a heating step after the exposure step (ii).

In the pattern forming method of the present invention, the exposure step (ii) may be performed a plurality of times.

In the pattern forming method of the present invention, the heating step (v) may be performed a plurality of times.

<Pattern Forming Method>

The pattern forming method of the present invention is characterized by having a washing step using a rinsing solution containing a specific solvent after a development step using an organic solvent-containing developer (organic solvent-based development).

(Washing Step Using Rinsing Solution)

The pattern forming method of the present invention has a step of washing the resist film by using the following rinsing solution for organic solvent-based development containing a specific organic solvent after organic solvent-based development.

In an embodiment of the present invention, the rinsing solution contains an alcohol having a carbon number of at least 5 and having an alkyl chain containing at least either a branched or cyclic structure, with the secondary or tertiary carbon atom in the alkyl chain being bonded to a hydroxyl group (Solvent S1).

The solvent S1 is an alcohol where the alkyl chain has at least either a branched or cyclic structure as the carbon chain and the secondary or tertiary carbon atom is bonded to a hydroxyl group.

The hydrogen atom in the alkyl chain may be replaced by an arbitrary substituent. Examples of the substituent include an alkyl group, an alkoxy group, an alkylcarbonyl group, an alkylcarbonyloxy group, an alkyloxycarbonyl group, an alkenyl group, an alkenyloxy group, an alkenylcarbonyl group, an alkenylcarbonyloxy group, an alkenyloxycarbonyl group, an alkynyl group, an alkynyleneoxy group, an alkynylenecarbonyl group, an alkynylenecarbonyloxy group, an alkynyleneoxycarbonyl group, an aralkyl group, an aralkyloxy group, an aralkylcarbonyl group, an aralkylcarbonyloxy group, an aralkyloxycarbonyl group, a hydroxyl group, an amido group, a carboxyl group, a cyano group and a fluorine atom.

The carbon number of the solvent S1 is preferably from 5 to 10, more preferably from 6 to 8.

The molecular weight of the solvent S1 is preferably from 80 to 400, more preferably from 90 to 250.

The boiling point of the solvent S1 is preferably from 70 to 170° C., more preferably from 100 to 140° C.

Examples of the solvent S1 include 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, 3-cyclohexyl-2-propanol and cyclohexanol. Of these, 3-methyl-2-pentanol, 3-methyl-3-pentanol, 4-methyl-2-pentanol, 4-methyl-3-pentanol, cyclopentanol, 2,3-dimethyl-2-butanol, 3,3-dimethyl-2-butanol, 9-methyl-2-decanol, 3-cyclohexyl-2-propanol, 2-methyl-2-pentanol, 7-methyl-2-octanol, 6-methyl-2-heptanol, cyclohexanol and 8-methyl-2-nonanol are preferred, 3-methyl-2-pentanol, 3-methyl-3-pentanol, 4-methyl-2-pentanol, 4-methyl-3-pentanol and 2-methyl-2-pentanol are more preferred, and 4-methyl-2-pentanol is most preferred.

In an another embodiment of the present invention, the rinsing solution contains a dialkyl ether having at least either an alkyl group having a carbon number of at least 5 or a cycloalkyl group having a carbon number of at least 5 (solvent S2).

Two alkyl groups in the dialkyl ether of the solvent S2 may be a cycloalkyl group and may be the same or different, but at least one is an alkyl group having a carbon number of 5 or more or a cycloalkyl group having a carbon number of 5 or more.

The alkyl group or cycloalkyl group in the dialkyl ether of the solvent S2 may have an arbitrary substituent. Examples of the substituent include an alkyl group, a cycloalkyl group, an alkoxy group, an alkylcarbonyl group, an alkylcarbonyloxy group, an alkyloxycarbonyl group, an alkenyl group, an alkenyloxy group, an alkenylcarbonyl group, an alkenylcarbonyloxy group, an alkenyloxycarbonyl group, an alkynyl group, an alkynyleneoxy group, an alkynylenecarbonyl group, an alkynylenecarbonyloxy group, an alkynyleneoxycarbonyl group, an aralkyl group, an aralkyloxy group, an aralkylcarbonyl group, an aralkylcarbonyloxy group, an aralkyloxycarbonyl group, a hydroxyl group, an amido group, a carboxyl group, a cyano group and a fluorine atom.

The carbon number of the alkyl group having a carbon number of at least 5 or the cycloalkyl group having a carbon number of at least 5 in the solvent S2 is preferably from 5 to 10, more preferably from 5 to 8.

The molecular weight of the solvent S2 is preferably from 100 to 800, more preferably from 150 to 600.

The boiling point of the solvent S2 is preferably from 100 to 250° C., more preferably from 120 to 180° C.

Examples of the solvent S2 include diisoamyl ether, cyclopentyl methyl ether, cyclohexyl methyl ether, cyclopentyl ethyl ether, cyclohexyl ethyl ether, cyclopentyl 1-propyl ether, cyclopentyl 2-propyl ether, cyclohexyl 1-propyl ether, cyclohexyl 2-propyl ether, cyclopentyl 1-butyl ether, cyclopentyl tert-butyl ether, cyclohexyl 1-butyl ether, cyclohexyl tert-butyl ether and dihexyl ether. Of these, diisoamyl ether, cyclohexyl 1-butyl ether, cyclopentyl 1-propyl ether, cyclopentyl methyl ether and dihexyl ether are preferred.

The solvents S1 and S2 may be a commercial product or may be synthesized by a known method.

For each of the solvents S1 and S2, a plurality of kinds may be mixed or the solvent may be mixed with another organic solvent.

The content of the solvent S1 in the rinsing solution is generally 40 mass % or more, preferably 80 mass % or more, and generally 100 mass % or less. (In this specification, mass ratio is equal to weight ratio.)

The content of the solvent S2 in the rinsing solution is generally 20 mass % or more, preferably 50 mass % or more, and generally 100 mass % or less.

The rinsing solution may contain both the solvent S1 and the solvent S2, and in the case of containing both solvent, the ratio therebetween is, for example, solvent S1/solvent S2 (by mass)=from 1/99 to 99/1, preferably solvent S1/solvent S2 (by mass)=from 10/90 to 90/10, more preferably solvent S1/solvent S2 (by mass)=from 20/80 to 80/20, still more preferably solvent S1/solvent S2 (by mass)=from 50/50 to 80/20.

The other organic solvent which may be added together with at least either the solvent S1 or S2 is not particularly limited as long as it does not dissolve the resist pattern, an a solution containing a general organic solvent may be used.

Examples of the other organic solvent include a solvent selected from a hydrocarbon-based solvent, a ketone-based solvent, an ester-based solvent, an alcohol-based solvent, an amide-based solvent and an ether-based solvent.

The hydrocarbon-based solvent is a hydrocarbon solvent not having a substituent. Also, the ketone-based solvent is a solvent having a ketone group in the molecule; the ester-based solvent is a solvent having an ester group in the molecule; the alcohol-based solvent is a solvent having an alcoholic hydroxyl group in the molecule; the amide-based solvent is a solvent having an amide group in the molecule; and the ether-based solvent is a solvent having an ether bond in the molecule. In these solvents, a solvent having a plurality of kinds of the above-described functional groups in one molecule is present, and in this case, the solvent comes under any solvent species containing the functional group contained in the solvent. For example, diethylene glycol monomethyl ether comes under any of the alcohol-based solvent and the ether-based solvent in the categories above.

For example, a ketone-based solvent such as 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone and propylene carbonate; and an ester-based solvent such as methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate, can be used.

Examples of the alcohol-based solvent other than the solvent S1 include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent other than the solvent S2 include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

In the case where the rinsing solution contains an organic solvent other than the solvents S1 and S2, the content of the other organic solvent in the rinsing solution is usually 30 mass % or less, preferably 10 mass % or less, more preferably 5 mass % or less, still more preferably 3 mass % or less. It is most preferred that the rinsing solution does not contain an organic solvent other than the solvents S1 and S2.

The solvent may be mixed with water, but the water content in the rinsing solution is usually 30 mass % or less, preferably 10 mass % or less, more preferably 5 mass % o less, still more preferably 3 mass % or less. It is most preferred that the rinsing solution does not contain water. By setting the water content to 30 mass % or less, good development characteristics can be obtained.

In the rinsing solution, an appropriate amount of a surfactant may be added, if desired.

The surfactant is not particularly limited, but, for example, an ionic or nonionic fluorine-containing and/or silicon-containing surfactant may be used.

The amount of the surfactant used is usually from 0.001 to 5 mass %, preferably from 0.005 to 2 mass %, more preferably from 0.01 to 0.5 mass %, based on the entire amount of the rinsing solution.

The boiling point of the rinsing solution is preferably from 70 to 170° C., more preferably from 100 to 140° C.

The vapor pressure at 20° C. of the rinsing solution used after organic solvent-based development is preferably from 0.05 to 5 kPa, more preferably from 0.1 to 5 kPa, and most preferably from 0.12 to 3 kPa. By setting the vapor pressure of the rinsing solution to from 0.05 to 5 kPa, the temperature uniformity in the wafer plane is enhanced and the swelling attributable to penetration of the rinsing solution is suppressed, as a result, the dimensional uniformity in the wafer plane is improved.

In the rinsing step, the wafer after performing organic solvent-based development is washed using the above-described rinsing solution containing an organic solvent. The method of washing treatment is not particularly limited but, for example, a method of continuously ejecting the rinsing solution on a substrate rotating at a constant speed (spin coating method), a method of dipping the substrate in a bath filled with the rinsing solution for a fixed time (dipping method), and a method of spraying the rinsing solution on the substrate surface (spraying method) may be applied. Above all, a method where the washing treatment is performed by the spin coating method and after the washing, the rinsing solution is removed from the substrate surface by rotating the substrate at a rotation speed of 2,000 to 4,000 rpm, is preferred. The time for which the substrate is rotated may be set according to the rotation speed within the range where removal of the rinsing solution from the substrate can be achieved, but is usually from 10 seconds to 3 minutes. Incidentally, rinsing is preferably performed under room-temperature conditions.

After the development or rinsing, a treatment of eliminating the developer or rinse solution adhering to the pattern by using a supercritical fluid can be performed.

Furthermore, after development or rinsing or after the treatment with a supercritical fluid, a heat treatment for eliminating water remaining in the pattern can be performed. The heating temperature and time are not particularly limited as long as a good pattern can be obtained, and these are usually from 40 to 160° C. and from 10 seconds to 3 minutes. The heat treatment may be performed a plurality of times.

In the pattern forming method of the present invention, the step of forming a resist film from a resist composition for organic solvent-based development, the exposure step, and the step of performing development with an organic solvent-containing developer may be performed by a generally known method.

(Step of Forming Resist Film)

The resist composition for organic solvent-based development is applied on such a substrate (e.g., silicon/silicon dioxide-coated substrate) as used in the production of a precision integrated circuit device by an appropriate coating method such as spinner or coater and dried to form a resist film. The thickness of the resist film is preferably form 50 to 150 nm, more preferably from 80 to 100 nm.

The substrate is not particularly limited, and an inorganic substrate such as silicon, SiN, $SiO_2$, silicon/silicon dioxide coating and SiN, a coating-type inorganic substrate such as SOG, and a substrate generally used in the production process of a semiconductor such as IC, in the production process of a circuit board of liquid crystal, thermal head and the like or in the lithography process for other photofabrications, may be used.

Also, an antireflection film such as organic antireflection film or inorganic antireflection film may be formed between the resist film and the substrate, if desired.

As for the organic antireflection film, any organic film composed of a light absorber and a polymer material may be used, and examples the organic film which can be used include a commercially available organic antireflection film such as DUV-30 series and DUV-40 series produced by Brewer Science Inc., AR-2, AR-3 and AR-5 produced by Shipley Company, and ARC series such as ARC29A produced by Nissan Chemical Industries, Ltd. As for the inorganic antireflection film, an antireflection film such as titanium, titanium dioxide, titanium nitride, chromium oxide, carbon and amorphous silicon can be used.

(Exposure Step)

The exposure apparatus used for exposing the resist film is not limited in its light source wavelength, but, for example, a KrF excimer laser wavelength (248 nm), an ArF excimer laser wavelength (193 nm) and an $F_2$ excimer laser wavelength (157 nm) can be applied. The exposure is performed through an appropriate mask.

In the step of performing exposure of the present invention, an immersion exposure method can be applied.

The immersion exposure method is a technique for raising the resolution, and this is a technique of performing the exposure by filling a high refractive-index liquid (hereinafter sometimes referred to as an "immersion liquid") between the projection lens and the sample.

As for the "effect of immersion", assuming that $NA_0=\sin\theta$, the resolution and depth of focus when immersed can be expressed by the following formulae:

$$(\text{Resolution})=k_1\cdot(\lambda_0/n)/NA_0$$

$$(\text{Depth of focus})=\pm k_2\cdot(\lambda_0/n)/NA_0^2$$

wherein $\lambda_0$ is the wavelength of exposure light in air, n is the refractive index of the immersion liquid based on air, and θ is the convergence half-angle of beam.

That is, the effect of immersion is equal to use of an exposure wavelength of 1/n. In other words, when the projection optical system has the same NA, the depth of focus can be made n times larger by the immersion. This is effective for all pattern profiles and can be combined with the super-resolution technology under study at present, such as phase-shift method and modified illumination method.

In the case of performing immersion exposure, a step of washing the film surface with an aqueous chemical solution may be performed (1) before the exposure step after forming the film on a substrate and/or (2) after the step of exposing the film through an immersion liquid but before the step of heating the film.

The immersion liquid is preferably a liquid being transparent to light at the exposure wavelength and having as small a temperature coefficient of refractive index as possible so as to minimize the distortion of an optical image projected on the film. Particularly, when the exposure light source is an ArF excimer laser (wavelength: 193 nm), water is preferably used in view of easy availability and easy handleability, in addition to the above-described aspects.

In the case of using water, an additive (liquid) capable of decreasing the surface tension of water and increasing the surface activity may be added in a small ratio. This additive is preferably a liquid that does not dissolve the resist layer on the wafer and at the same time, gives only a negligible effect on the optical coat at the undersurface of the lens element.

Such an additive is preferably, for example, an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

The electrical resistance of water as the immersion liquid is preferably 18.3 MΩcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or deuterium water ($D_2O$) may be used in place of water.

(Development Step Using Developer Containing Organic Solvent)

At the time of performing organic solvent-based development, an organic developer containing an organic solvent is used.

As for the organic developer which can be used in performing organic solvent-based development, a polar solvent such as ketone-based solvent, ester-based solvent, alcohol-based solvent, amide-based solvent and ether-based solvent, and a hydrocarbon-based solvent can be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or water.

The vapor pressure at 20° C. of the organic solvent-containing developer is preferably 5 kPa or less, more preferably 3 kPa or less, still more preferably 2 kPa or less. By setting the vapor pressure of the organic solvent-containing developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the developer having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the developer having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the developer usable when performing organic solvent-based development, a surfactant can be added in an appropriate amount, if desired. The surfactant is not particularly limited, but examples thereof include surfactants described in the later-described preparation of resist composition.

The amount of the surfactant used is usually from 0.001 to 5 mass %, preferably from 0.005 to 2 mass %, more preferably from 0.01 to 0.5 mass %, based on the entire amount of the developer.

The water content in the developer is preferably 10 mass % or less, more preferably 5 mass % or less, still more preferably 3 mass % or less, and it is most preferred that the developer contains substantially no water. By setting the water content to 10 mass % or less, good development characteristics can be obtained.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate rotating at a constant speed while scanning the developer ejecting nozzle at a constant rate (dynamic dispense method) may be applied.

After the step of performing organic solvent-based development, a step of stopping the development by replacement with another solvent may be practiced.

<Development Step Using Alkali Developer>

At the time of performing alkali development, an alkali developer is used.

Examples of the alkali developer which can be used in performing alkali development include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkaline aqueous solution may be used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38 mass % tetramethylammonium hydroxide solution is preferred.

<Washing Step Using Rinsing Solution After Development Step Using Alkali Developer>

As regards the rinsing solution for use in the washing step performed after alkali development, for example, pure water is used, and the pure water may be used after adding thereto a surfactant in an appropriate amount.

(Double Development Process Performing Organic Solvent-Based Development and Alkali Development)

In the case of performing a pattern forming process using two kinds of developers, that is, an alkali developer and an organic solvent-containing developer (double development process), the order of developments is not particularly limited, but it is preferred to perform development by using an alkali developer or an organic solvent-containing developer after first exposure and then perform development by using a developer different from that in the first development.

In the present invention, one resist composition acts at the same time as a positive resist for an alkali developer and as a negative resist for an organic solvent-containing developer.

Also, the resist composition is a "resin composition which contains a compound capable of generating an acid upon irradiation with an actinic ray or radiation and a resin capable of increasing the polarity by the action of an acid and forms a film whose solubility in an alkali developer increases and solubility in an organic solvent-containing developer decreases".

The resist composition for use in the present invention contains a compound capable of generating an acid upon irradiation with an actinic ray or radiation and a resin capable of increasing the polarity by the action of an acid and not only brings about a decrease of solubility in an organic solvent-containing developer but also, in particular, brings about an increase of solubility in an alkali developer and a decrease of solubility in an organic solvent-containing developer at the same time.

In the double development process, it is important to control the "threshold value" of the exposure dose (the exposure dose for solubilizing or insolubilizing the film by a developer in the light-irradiated region). That is, the "threshold value" is the minimum exposure dose for solubilizing the film by an alkali developer and the minimum exposure dose for insolubilizing the film by an organic solvent-containing developer so as to obtain a desired line width in performing pattern formation.

More strictly, the threshold value is defined as follows.

Figure 4:
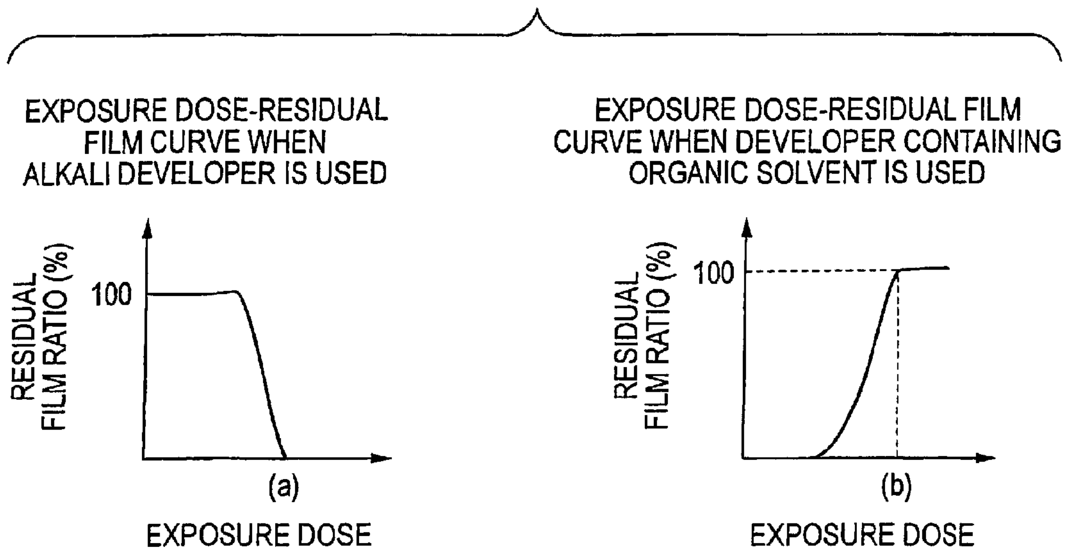
FIG. 4 is a graph showing the relationship between exposure dose and residual film curve when an alkali developer or an organic solvent-containing developer is used.

The residual film ratio of the resist film with respect to the exposure dose is measured and at this time, as shown in FIG. 4, the exposure dose giving a residual film ratio of 0% for the alkali developer is designated as a threshold value (a), while the exposure dose giving a residual film ratio of 100% for the organic solvent-containing developer is designated as a threshold value (b).

Figure 5:
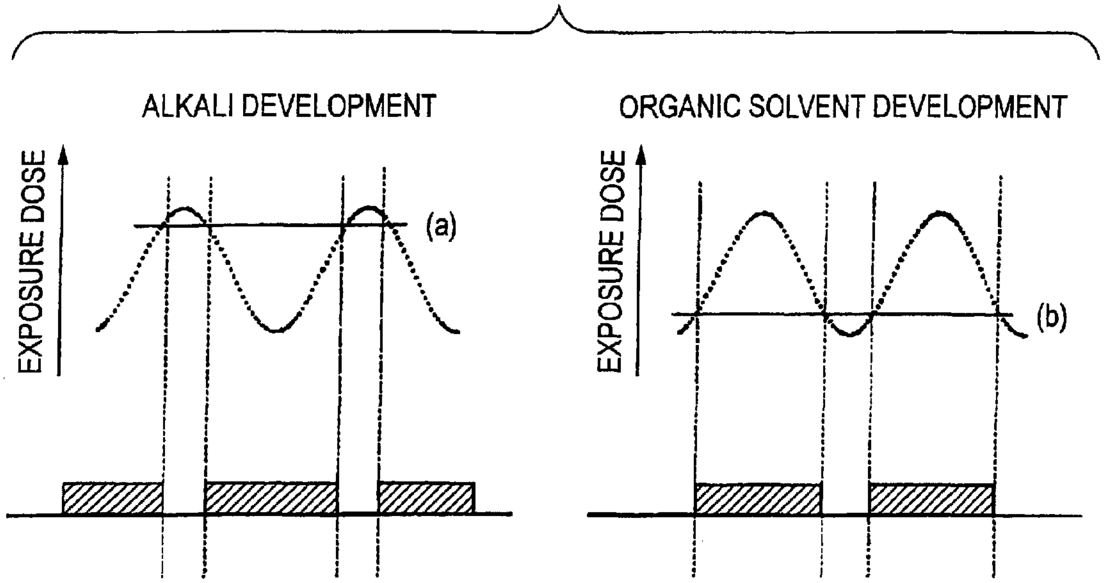
FIG. 5 is a schematic view showing the relationship among alkali development, organic solvent-based development and exposure dose in the method of the present invention.
Figure 6:
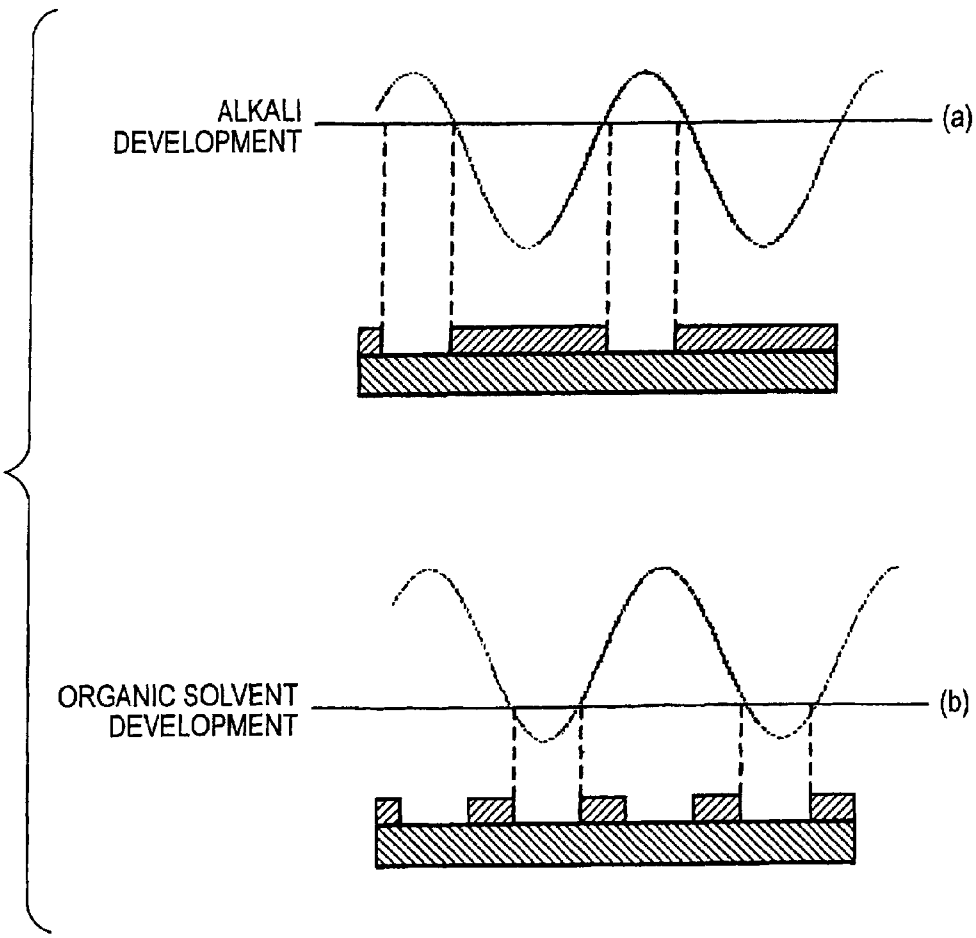
FIG. 6 is a schematic view showing the relationship among alkali development, organic solvent-based development and exposure dose in the method of the present invention.

For example, as shown in FIG. 5, the threshold value (a) of the exposure dose for solubilizing the film by an alkali developer is set to be higher than the threshold value (b) of the exposure dose for insolubilizing the film by an organic solvent-containing developer, whereby pattern formation can be achieved by one exposure operation. More specifically, as shown in FIG. 6, after a resist is applied on a wafer and exposed, the portion not lower than the threshold value (a) of the exposure dose is dissolved with an alkali developer and then, the region not higher than the threshold value (b) of the exposure dose is dissolved with an organic solvent-containing developer, whereby pattern formation can be performed by one exposure operation. In this case, development with an alkali developer or development with an organic solvent-containing developer, whichever development may be performed earlier. After the organic solvent-based development, when the resist film is washed with a rinsing solution containing an organic solvent, more successful pattern formation can be achieved.

The method for controlling the threshold value includes a method of controlling the material-related parameters of resist composition and developer or the process-related parameters.

As for the material-related parameter, control of various physical values related to solubility of the resist composition in the developer and organic solvent, such as SP value (solubility parameter) and Log P value, is effective. Specific examples of the parameter include, as related to the polymer contained in the resist composition, the average molecular weight, molecular weight polydispersity, compositional ratio of monomers, polarity of monomer, monomer sequence, polymer blend and addition of low molecular additive, and as related to the developer, the concentration of developer, addition of low molecular additive and addition of surfactant.

Also, specific examples of the process-related parameter include the film formation temperature, film formation time, temperature and time of post-heating after exposure, temperature at development, development time, nozzle system (puddle method) of developing apparatus, and rinsing method after development.

Accordingly, for obtaining a good pattern in the pattern forming method using an organic solvent-based development as well as in the pattern forming method by multiple development using organic solvent-based development and alkali development in combination, it is important to combine the above-described material-related parameters and process parameters by appropriately controlling the parameters.

(Double Exposure Process)

The pattern forming process using two kinds of developers, namely, an alkali developer and an organic solvent-containing developer, may be either a process of performing the exposure once as described above or performing the exposure two or more times. That is, development using an alkali developer or an organic solvent-containing developer is performed after first exposure, and development using a developer different from that in the first development is performed after second exposure.

Figure 7:
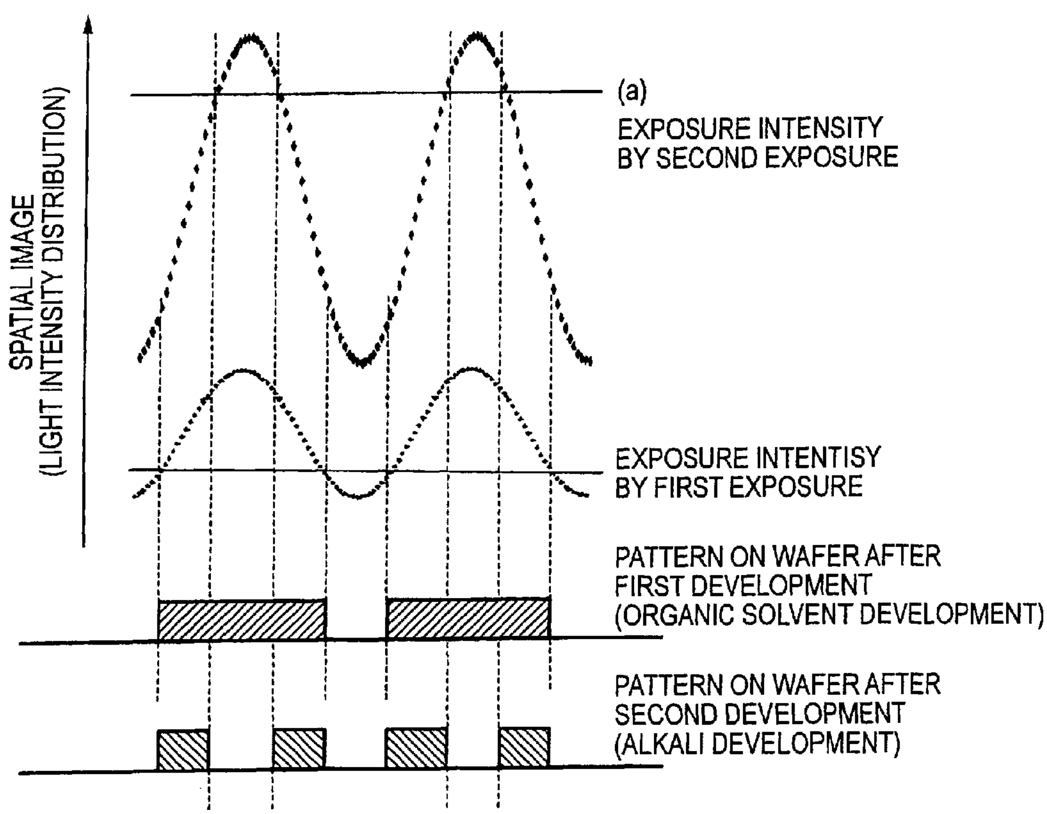
FIG. 7 is a schematic view showing the relationship among alkali development, organic solvent-based development and exposure dose in the method of the present invention.

When exposure is performed two or more times, this is advantageous in that the latitude of control of the threshold value in the development after first exposure and control of the threshold value in the development after second exposure increases. In the case of performing the exposure two or more times, the second exposure dose is preferably set to be larger than the first exposure dose. Because, as shown in FIG. 7, in the second development, the threshold value is determined based on the amount to which the history of first and second exposure doses is added, and when the second exposure dose is sufficiently larger than the first exposure dose, the effect of the first exposure dose is reduced and depending on the case, can be neglected.

The exposure dose (Eo1 [mJ/cm$^2$]) in the step of performing the first exposure is preferably 5 [mJ/cm$^2$] or more smaller than the exposure dose (Eo2 [mJ/cm$^2$]) in the step of performing the second exposure. In this case, the history of the first exposure can be made to little affect the process of performing pattern formation by the second exposure.

For changing the first exposure dose and the second exposure dose, a method of adjusting the above-described various parameters related to the material and process is effective. In particular, it is effective to control the temperature in the first heating step and the temperature in the second heating step. That is, in order to make the first exposure dose smaller than the second exposure dose, setting the temperature in the first heating step to be higher than the temperature in the second heating step is effective.

The threshold value (a) in alkali development is determined as follows in the actual lithography process.

A film composed of a resist composition whose solubility in an alkali developer increases and solubility in an organic solvent-containing developer decreases upon irradiation with an actinic ray or radiation is formed on a substrate, and the resist film is exposed through a photomask having a desired pattern size under desired illumination conditions. At this time, the exposure is performed by varying the exposure focus in 0.05 [μm] steps and the exposure dose in 0.5 [mJ/$cm^2$] steps. After the exposure, the resist film is heated at a desired temperature for a desired time and then developed with an alkali developer in a desired concentration for a desired time. After the development, the line width of the pattern is measured using CD-SEM, and the exposure dose A [mJ/$cm^2$] and focus position for forming a desired line width are determined. Subsequently, the intensity distribution of an optical image when the above-described photomask is irradiated with a specific exposure dose A [mJ/$cm^2$] and a specific focus position is computed. The computation can be performed using a simulation software (Prolith, ver. 9.2.0.15, produced by KLA). Details of the computation method are described in Chris. A. Mack, Inside PROLITH, Chapter 2, "Aerial Image Formation", FINLE Technologies, Inc.

Figure 8:
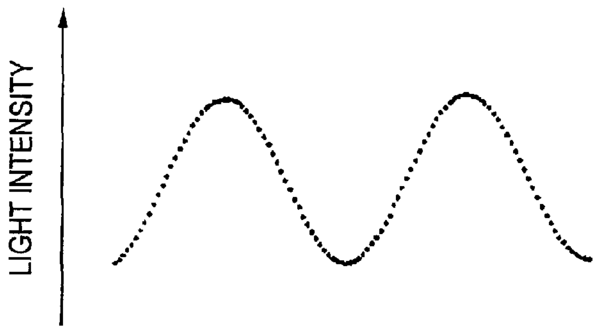
FIG. 8 is a view showing the spatial intensity distribution of an optical image.

As a result of computation, for example, the spatial intensity distribution shown in FIG. 8 of an optical image is obtained.

Figure 9:
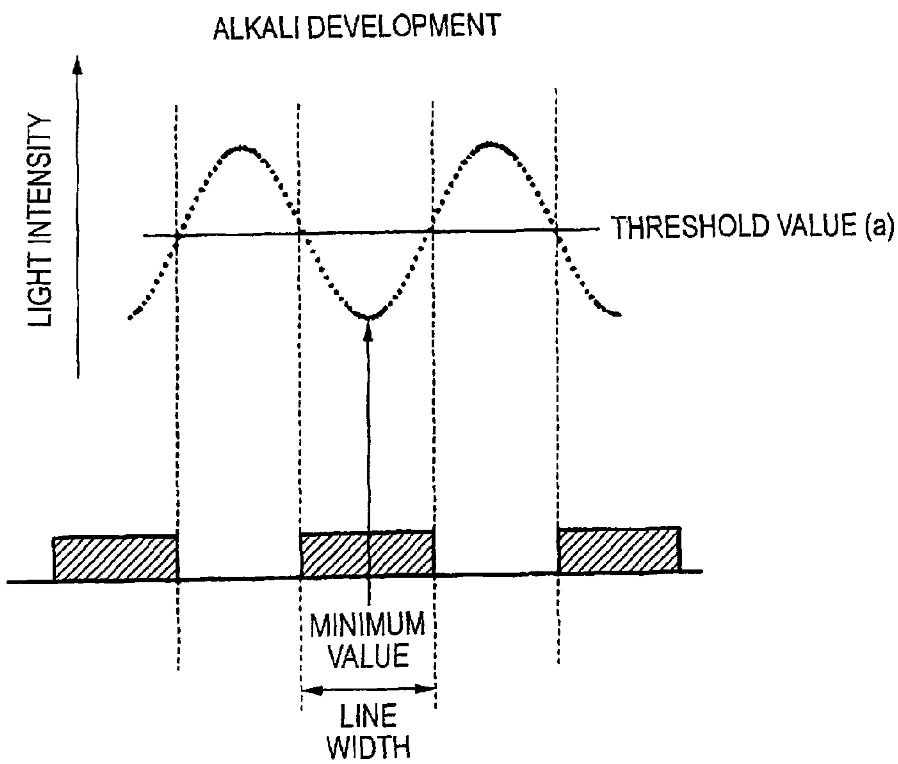
FIG. 9 is a schematic view showing the relationship among alkali development, threshold value (a) and light intensity.

Here, as shown in FIG. 9, the light intensity at a position after the spatial position is shifted by ½ of the obtained pattern line width from the minimum value in the spatial intensity distribution of an optical image is defined as the threshold value (a).

The threshold value (b) in the organic solvent-based development is determined as follows in the actual lithography process.

A film composed of a resist composition which contains a resin capable of increasing the polarity by the actin of an acid and whose solubility in an alkali developer increases and solubility in an organic solvent-containing developer decreases upon irradiation with an actinic ray or radiation is formed on a substrate, and the resist film is exposed through a photomask having a desired pattern size under desired illumination conditions. At this time, the exposure is performed by varying the exposure focus in 0.05 [μm] steps and the exposure dose in 0.5 [mJ/$cm^2$] steps. After the exposure, the resist film is heated at a desired temperature for a desired time and then developed with an organic developer in a desired concentration for a desired time. After the development, the line width of the pattern is measured using CD-SEM, and the exposure dose A [mJ/$cm^2$] and focus position for forming a desired line width are determined. Subsequently, the intensity distribution of an optical image when the above-described photomask is irradiated with a specific exposure dose A [mJ/$cm^2$] and a specific focus position is computed. The computation is performed using a simulation software (Prolith, produced by KLA).

Figure 10:
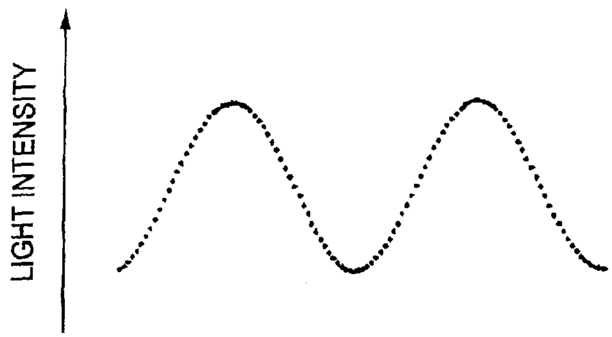
FIG. 10 is a schematic view showing the spatial intensity distribution of an optical image.

For example, a spatial intensity distribution shown in FIG. 10 of an optical image is obtained.

Figure 11:
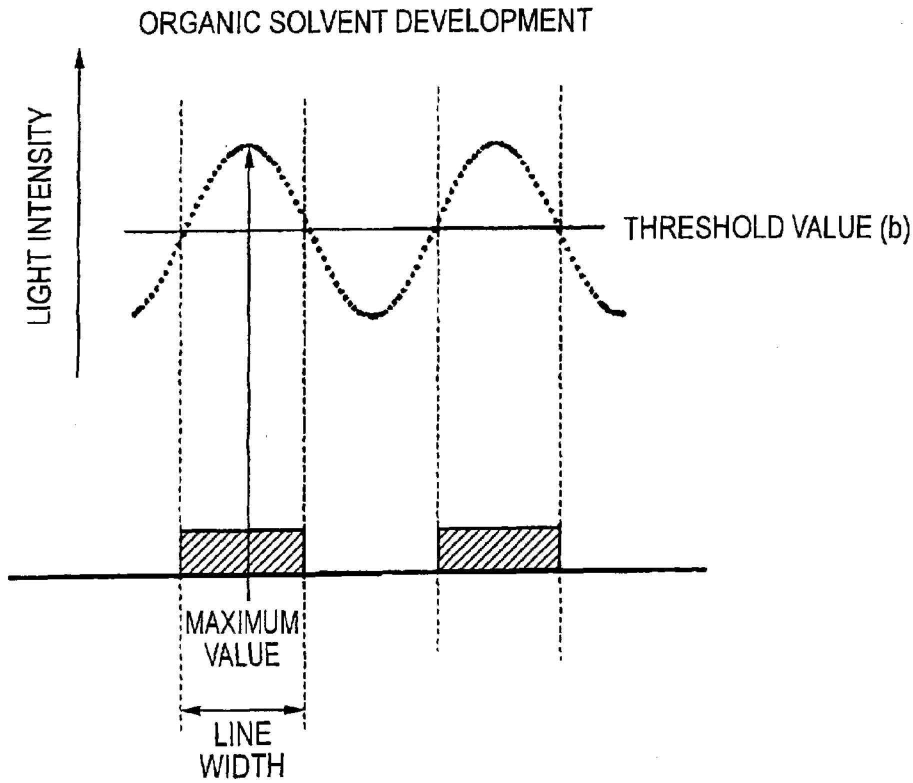
FIG. 11 is a schematic view showing the relationship among organic solvent-based development, threshold value (b) and light intensity.

Here, as shown in FIG. 11, the light intensity at a position after the spatial position is shifted by ½ of the obtained pattern line width from the maximum value in the spatial intensity distribution of an optical image is defined as the threshold value (b).

The threshold value (a) is preferably from 0.1 to 100 [mJ/$cm^2$], more preferably from 0.5 to 50 [mJ/$cm^2$], still more preferably from 1 to 30 [mJ/$cm^2$]. The threshold value (b) is preferably from 0.1 to 100 [mJ/$cm^2$], more preferably from 0.5 to 50 [mJ/$cm^2$], still more preferably from 1 to 30 [mJ/$cm^2$]. The difference between threshold values (a) and (b) is preferably from 0.1 to 80 [mJ/$cm^2$], more preferably from 0.5 to 50 [mJ/$cm^2$], still more preferably from 1 to 30 [mJ/$cm^2$].

<Resist Composition>

The resist composition which can be used in the present invention is described below.

[1] (A) Resin Capable of Increasing the Polarity by the Action of an Acid to Decrease the Solubility in an Organic Solvent-Containing Developer The resin capable of increasing the polarity by the action of an acid to decrease the solubility in an organic solvent-containing developer, which is used in the resist composition of the present invention, includes, for example, a resin having a group capable of decomposing by the action of an acid to produce an alkali-soluble group (hereinafter sometimes referred to as an "acid-decomposable group"), on either one or both of the main chain and the side chain of the resin (sometimes referred to as an "acid-decomposable resin" or a "resin (A)). Incidentally, this resin is also a resin capable of increasing the polarity by the action of an acid to increase the solubility in an alkali developer.

The resin (A) is preferably a resin having a monocyclic or polycyclic alicyclic hydrocarbon structure, whose porality increases by the action of an acid to increase the solubility in an alkali developer and decrease the solubility in an organic solvent (hereinafter sometimes referred to as an "alicyclic hydrocarbon-based acid-decomposable resin").

The reasons therefor are not clearly known but are considered because the polarity of the resin greatly changes between before and after irradiation of an actinic ray or radiation and when the resist film is developed using an alkali developer and an organic solvent-containing developer (preferably an organic solvent), the dissolution contrast rises. Furthermore, the resin having a monocyclic or polycyclic alicyclic hydrocarbon structure generally has high hydrophobicity and the developability when developing the resist film in the region of weak light irradiation intensity by using an organic solvent-containing developer (preferably an organic developer) is enhanced.

The alicyclic hydrocarbon-based acid-decomposable resin can be suitably used when ArF excimer laser light is irradiated.

The resin (A) is an acid-decomposable resin containing a repeating unit having an acid-decomposable group.

The acid-decomposable group is preferably a group obtained by substituting the hydrogen atom of an alkali-soluble group with a group capable of leaving by the action of an acid.

Examples of the alkali-soluble group include groups having a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

The alkali-soluble group is preferably a carboxyl group, a fluorinated alcohol group (preferably a hexafluoroisopropanol group) or a sulfonic acid group.

Examples of the group capable of leaving by the action of an acid include —C($R_{36}$)($R_{37}$)($R_{38}$), —C($R_{36}$)($R_{37}$)($OR_{39}$) and —C($R_{01}$)($R_{02}$)($OR_{39}$).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The alicyclic hydrocarbon-based acid-decomposable resin is preferably a resin containing at least one member selected from the group consisting of a repeating unit having an alicyclic hydrocarbon-containing partial structure represented by any one of the following formulae (pI) to (pV) and a repeating unit represented by the following formula (II-AB).

(pI)

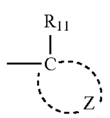

(pII)

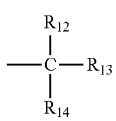

(pIII)

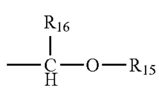

(pIV)

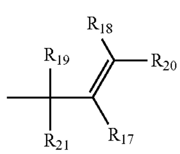

(pV)

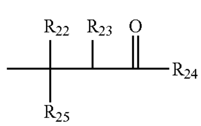

In formulae (pI) to (pV), $R_{11}$ represents a methyl group, an ethyl group, an n-propyl group, an isopropyl group, an n-butyl group, an isobutyl group or a sec-butyl group.

Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group, provided that at least one of $R_{12}$ to $R_{14}$ and either one of $R_{15}$ and $R_{16}$ represent a cycloalkyl group.

Each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group. $R_{23}$ and $R_{24}$ may combine with each other to form a ring.

(II-AB)

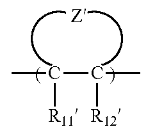

In formula (II-AB), each of $R_{11}'$ and $R_{12}'$ independently represents a hydrogen atom, a cyano group, a halogen atom or an alkyl group.

Z' represents an atomic group for forming an alicyclic structure containing two bonded carbon atoms (C—C).

Formula (II-AB) is preferably the following formula (II-AB1) or (II-AB2):

(II-AB1)

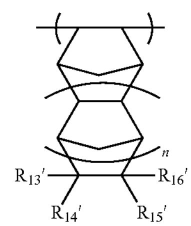

(II-AB2)

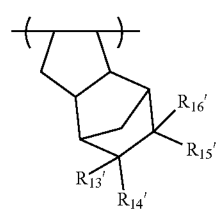

In formulae (II-AB1) and (II-AB2), each of $R_{13}'$ to $R_{16}'$ independently represents a hydrogen atom, a halogen atom, a cyano group, —COOH, —$COOR_5$, an acid-decomposable group, —C(=O)—X-A'-$R_{17}'$, an alkyl group or a cycloalkyl group. The alkyl group or cycloalkyl group of $R_{13}'$ to $R_{16}'$ may be substituted by a hydroxyl group or the like. At least two members out of $R_{13}'$ to $R_{16}'$ may combine to form a ring.

$R_5$ represents an alkyl group, a cycloalkyl group, a hetero ring or a group having a lactone structure. These groups may be substituted by a hydroxyl group or the like.

X represents an oxygen atom, a sulfur atom, —NH—, —$NHSO_2$— or —$NHSO_2NH$—.

A' represents a single bond or a divalent linking group. Examples of the divalent linking group of A' include an alkylene group and a cycloalkylene group.

$R_{17}'$ represents an alkyl group, —COOH, —$COOR_5$, —CN, a hydroxyl group, an alkoxy group, —CO—NH—$R_6$, —CO—NH—$SO_2$—$R_6$ or a group having a lactone structure. Here, $R_5$ has the same meaning as $R_5$ above.

$R_6$ represents an alkyl group or a cycloalkyl group.

n represents 0 or 1.

In formulae (pI) to (pV), examples of the linear or branched alkyl group having a carbon number of 1 to 4 of $R_{12}$ to $R_{25}$ include a methyl group, an ethyl group, an n-propyl group, an isopropyl group, an n-butyl group, an isobutyl group and a sec-butyl group.

The cycloalkyl group of $R_{12}$ to $R_{25}$ and the cycloalkyl group formed by Z together with two carbon atoms may be monocyclic or polycyclic. Specific examples thereof include a group having a carbon number of 5 or more and having a monocyclo, bicyclo, tricyclo or tetracyclo structure or the like. The carbon number thereof is preferably from 6 to 30, more preferably from 7 to 25. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

Examples of the substituent which the alkyl group and cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like may further have include a hydroxyl group, a halogen atom and an alkoxy group.

The structures represented by formulae (pI) to (pV) can be used for the protection of an alkali-soluble group. Examples of the alkali-soluble group include various groups known in this technical field.

Specific examples thereof include a structure where the hydrogen atom of a carboxyl group, a sulfonic acid group, a phenolic hydroxyl group or a thiol group is replaced by a structure represented by formulae (pI) to (pV). A structure where the hydrogen atom of a carboxyl group or a sulfonic acid group is replaced by a structure represented by formulae (pI) to (pV) is preferred.

The repeating unit having an alkali-soluble group protected by a structure represented by formulae (pI) to (pV) is preferably a repeating unit represented by the following formula (pA):

(pA)

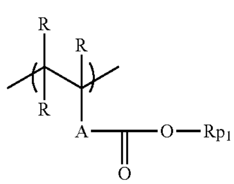

In the formula, R represents a hydrogen atom, a halogen atom or a linear or branched alkyl group having a carbon number of 1 to 4, and each R may be the same as or different from every other R.

A represents a single bond, an alkylene group, an ether bond, a thioether bond, a carbonyl group, an ester bond, an amido bond, a sulfonamido bond, a urethane bond, a ureylene bond or a combination of two or more of these groups and bonds, and is preferably a single bond.

$Rp_1$ represents a group represented by any one of formulae (pI) to (pV).

The repeating unit represented by formula (pA) is more preferably a repeating unit composed of a 2-alkyl-2-adamantyl (meth)acrylate or a dialkyl(1-adamantyl)methyl(meth)acrylate.

The resin (A) is more preferably a resin having at least either a repeating unit represented by formula (1) or a repeating unit represented by formula (2):

(1)

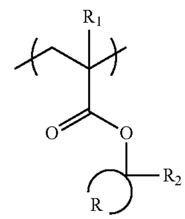

(2)

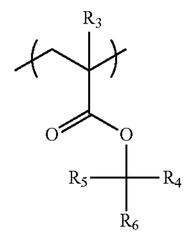

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. The monovalent organic group in $R_9$ is, for example, an alkyl group having a carbon number of 5 or less or an acyl group having a carbon number of 5 or less, preferably an alkyl group having a carbon number of 3 or less, more preferably a methyl group.

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Examples of the repeating unit represented by formula (1) include a repeating unit represented by the following formula (1-a). In the formula, $R_1$ and $R_2$ have the same meanings as those in formula (1).

(1-a)

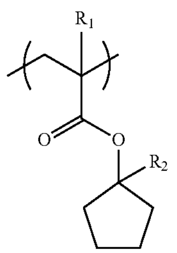

The repeating unit represented by formula (2) is preferably a repeating unit represented by the following formula (2-1):

(2-1)

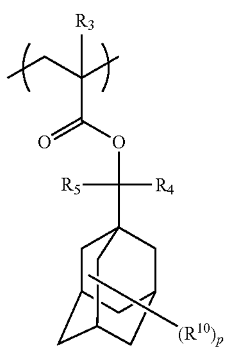

In formula (2-1), $R_3$ to $R_5$ have the same meanings as those in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a hydroxyl group, a cyano group, an amino group, an alkylamide group, a sulfonamide group itself, and a linear or branched alkyl group or cycloalkyl group having at least one of these groups. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

Specific preferred examples of the repeating unit having an acid-decomposable group are set forth below, but the present invention is not limited thereto.

(In the formulae, Rx represents H, $CH_3$ or $CH_2OH$, and each of Rxa and Rxb represents an alkyl group having a carbon number of 1 to 4.)

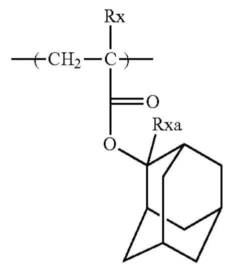

1

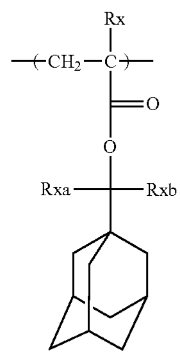

2

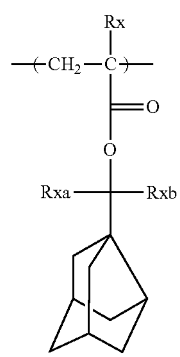

3

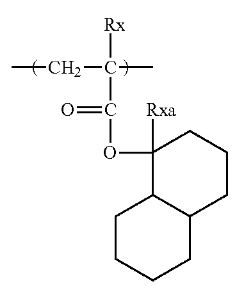

4

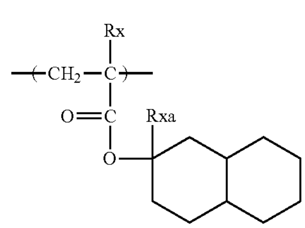

5

-continued
6
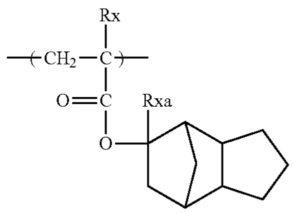
7
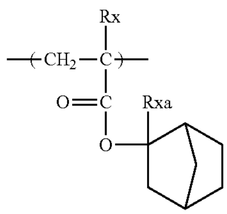
8
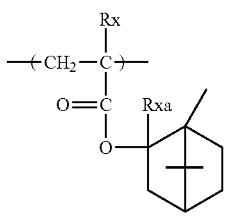
9
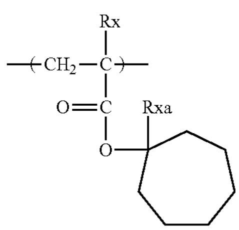
10
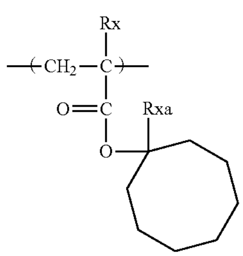
11
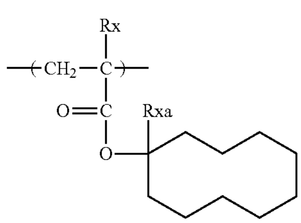
12
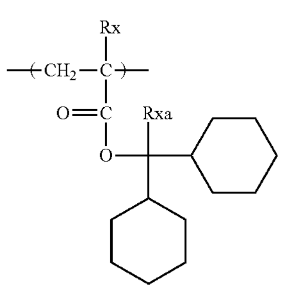
-continued
13
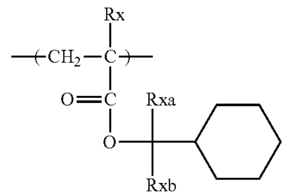
14
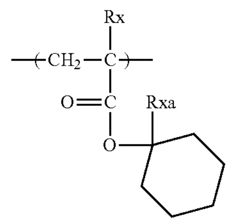
15
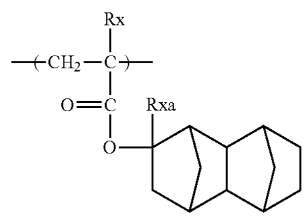
16
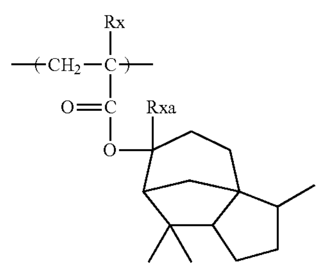
17
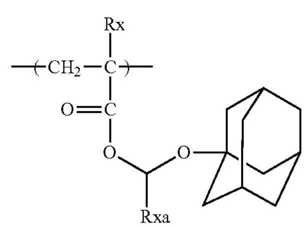
18
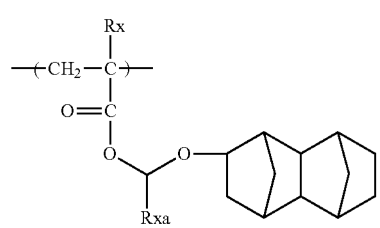
19
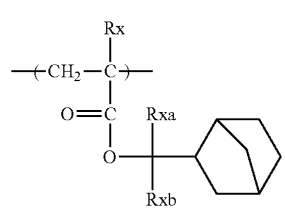

-continued

20

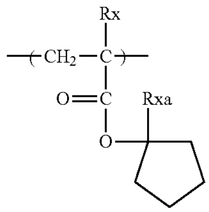

21

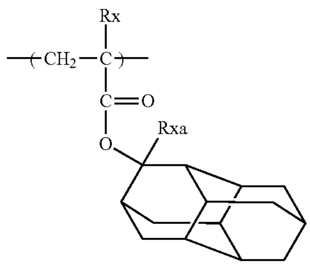

22

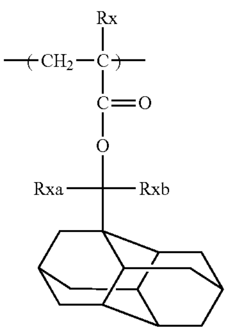

23

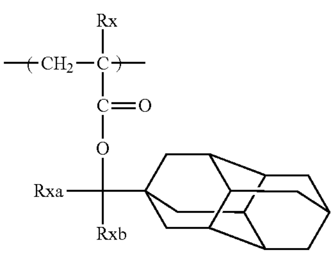

24

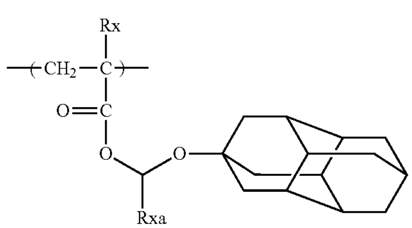

25

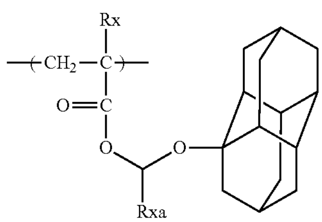

-continued

26

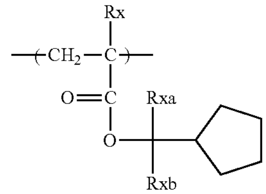

27

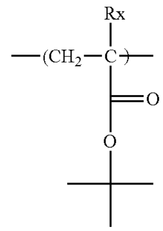

28

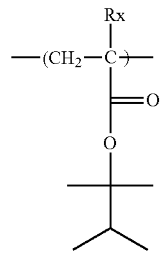

In formula (II-AB), the halogen atom in $R_{11}'$ and $R_{12}'$ includes a chlorine atom, a bromine atom, a fluorine atom and an iodine atom.

The alkyl group in $R_{11}'$ and $R_{12}'$ includes a linear or branched alkyl group having a carbon number of 1 to 10.

The atomic group of Z' for forming an alicyclic structure is an atomic group for forming, in the resin, a repeating unit composed of an alicyclic hydrocarbon which may have a substituent. Above all, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of $R_{12}$ to $R_{25}$ in formulae (pI) to (pV).

The skeleton of the alicyclic hydrocarbon may have a substituent, and examples of the substituent include $R_{13}'$ to $R_{16}'$ in formulae (II-AB1) and (II-AB2).

In the alicyclic hydrocarbon-based acid-decomposable resin, the group capable of decomposing by the action of an acid may be contained in at least one repeating unit out of the repeating unit having an alicyclic hydrocarbon-containing partial structure represented by formulae (pI) to (pV), the repeating unit represented by formula (II-AB), and the repeating unit composed of a copolymerization component described later. The group capable of decomposing by the action of an acid is preferably contained in the repeating unit having an alicylcic hydrocarbon-containing partial structure represented by formulae (pI) to (pV).

Various substituents $R_{13}'$ to $R_{16}'$ in formulae (II-AB1) and (II-AB2) may become substituents of the atomic group for forming an alicyclic structure in formula (II-AB) or the atomic group Z' for forming a crosslinked alicyclic structure.

Specific examples of the repeating units represented by formulae (II-AB1) and (II-AB2) are set forth below, but the present invention is not limited to these specific examples.

[II-1]
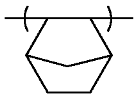
[II-2]
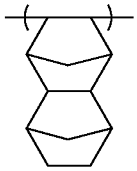
[II-3]
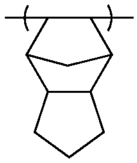
[II-4]
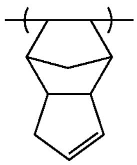
[II-5]
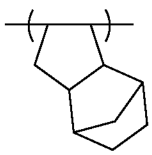
[II-6]
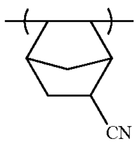
[II-7]
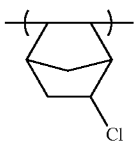
[II-8]
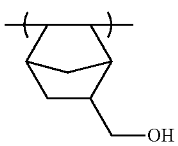
[II-9]
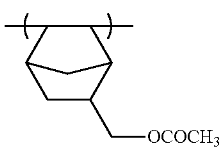
[II-10]
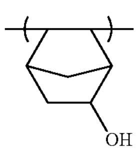
-continued
[II-11]
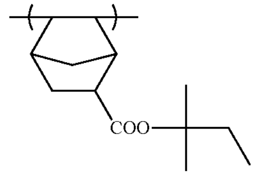
[II-12]
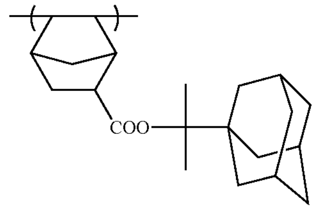
[II-13]
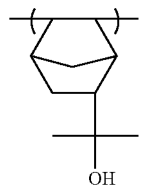
[II-14]
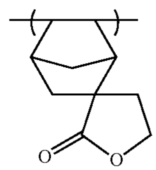
[II-15]
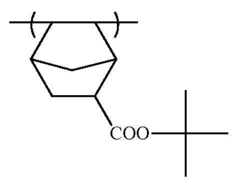
[II-16]
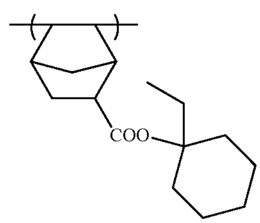
[II-17]
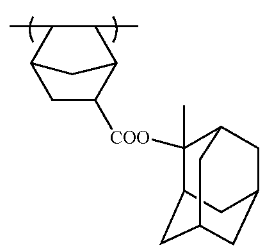

-continued
[II-18]
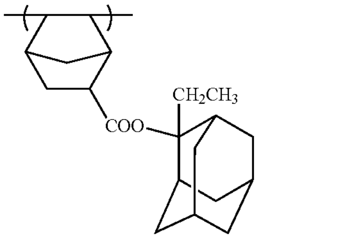
[II-19]
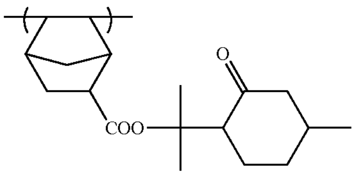
[II-20]
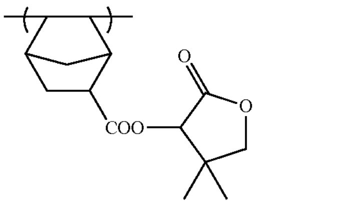
[II-21]
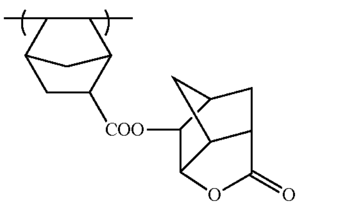
[II-22]
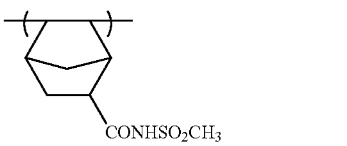
[II-23]
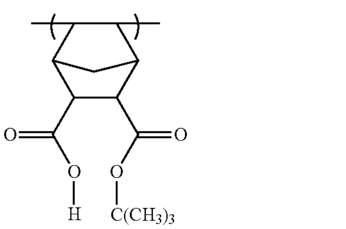
[II-24]
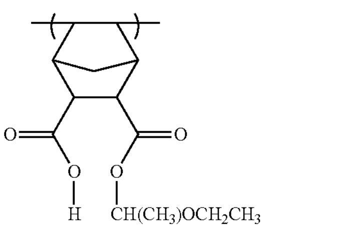
-continued
[II-25]
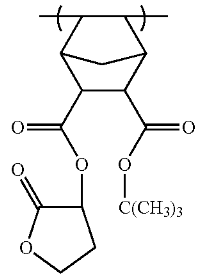
[II-26]
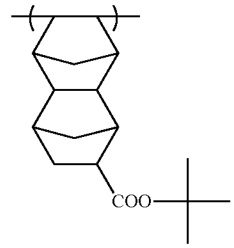
[II-27]
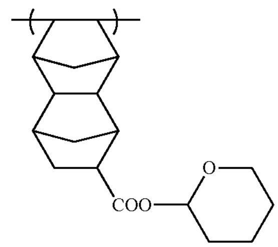
[II-28]
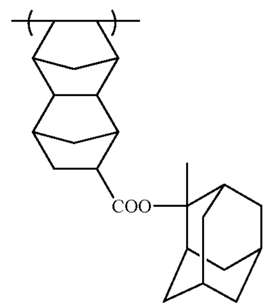
[II-29]
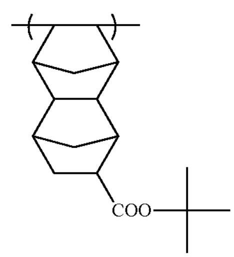
[II-30]
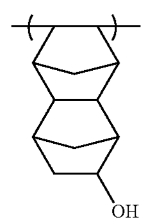

-continued

[II-31]

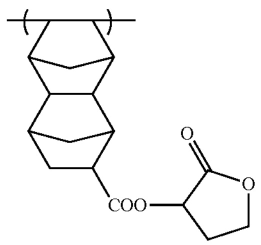

[II-32]

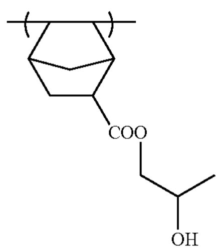

The resin (A) may contain a plurality of acid-decomposable group-containing repeating units.

The resin (A) is more preferably a resin containing a repeating unit represented by formula (1) and a repeating unit represented by formula (2). In another embodiment, the resin is preferably a resin containing at least two kinds of repeating units represented by formula (1).

Also, the resist composition for use in the present invention may contain a plurality of kinds of resins (A), and the acid-decomposable group-containing repeating units contained in the plurality of resins (A) may be different from each other. For example, a resin (A) containing a repeating unit represented by formula (1) and a resin (A) containing a repeating unit represented by formula (2) may be used in combination.

Preferred examples of the combination when the resin (A) contains a plurality of acid-decomposable group-containing repeating units and when a plurality of resins (A) contain different acid-decomposable group-containing repeating units, are set forth below. In the formulae below, each R independently represents a hydrogen atom or a methyl group.

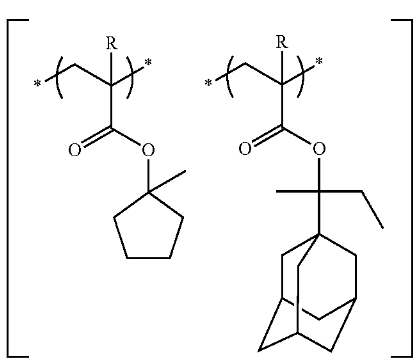

-continued

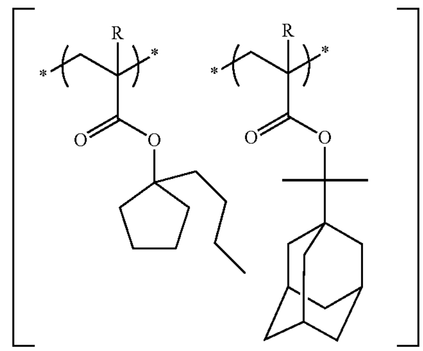

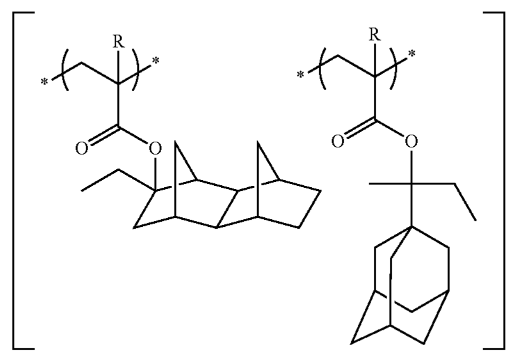

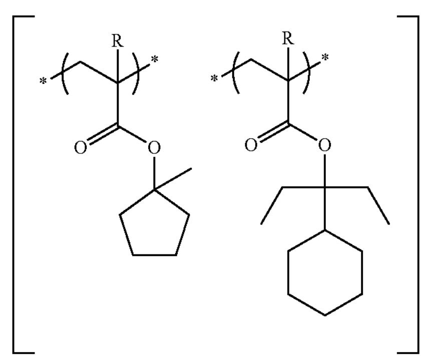

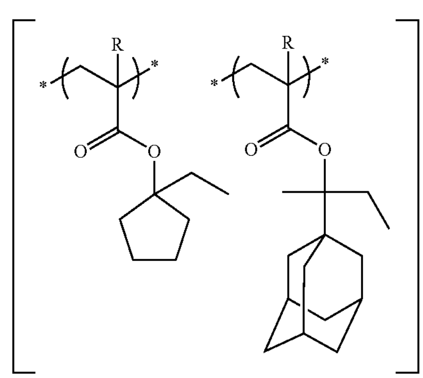

-continued
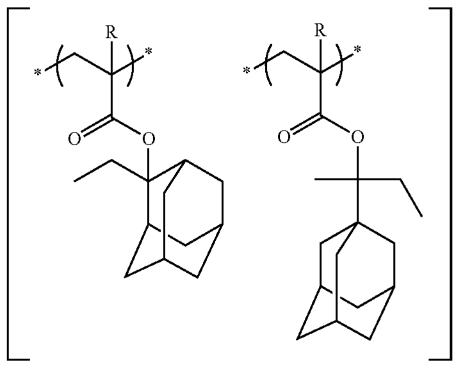
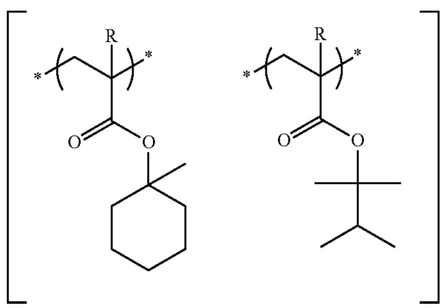
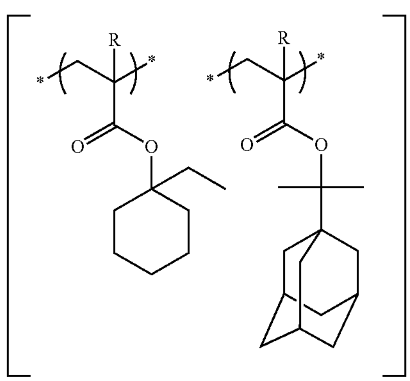
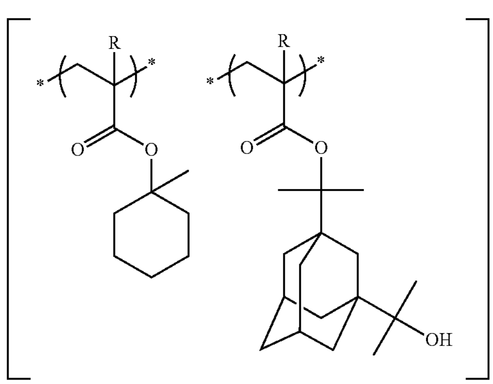
-continued
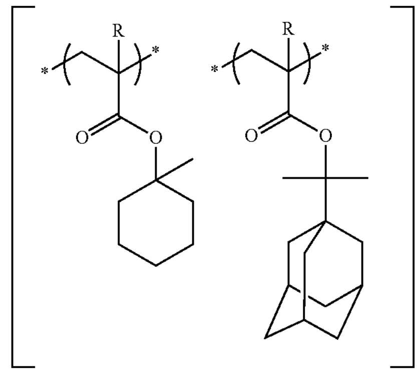
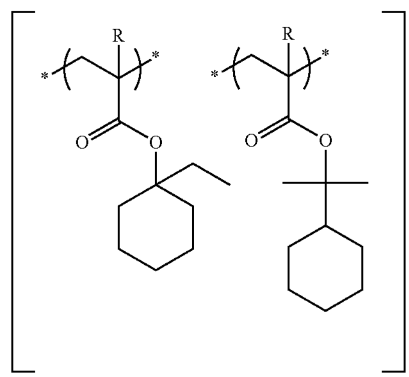
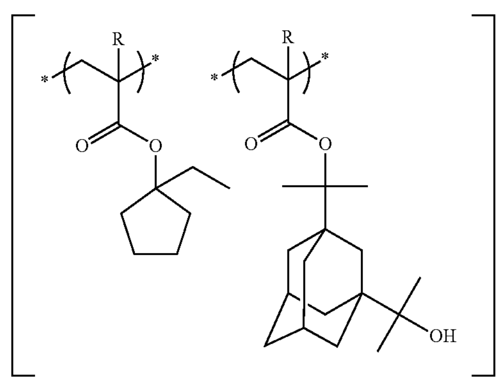
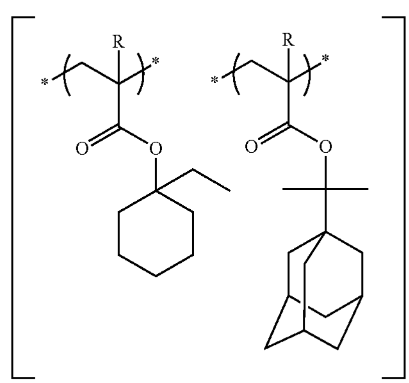

-continued

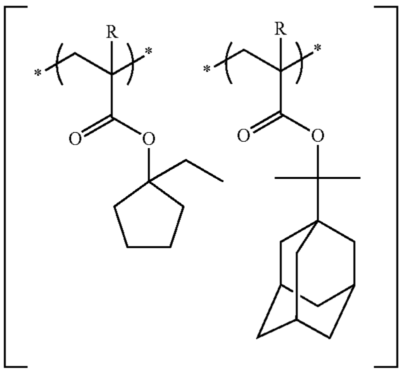

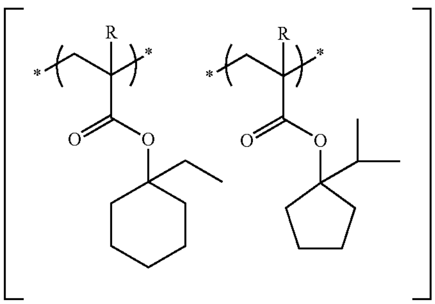

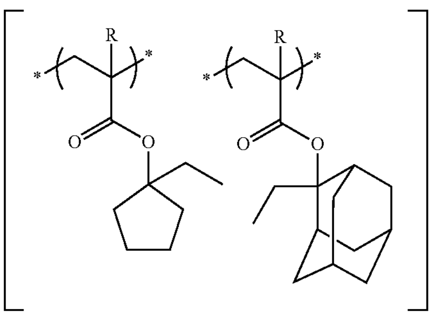

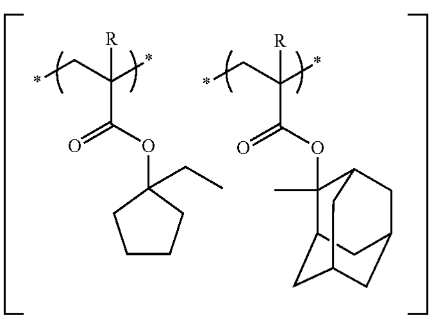

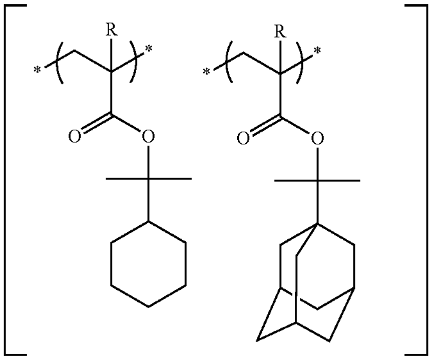

-continued

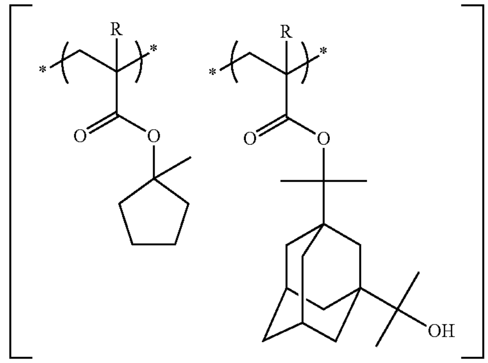

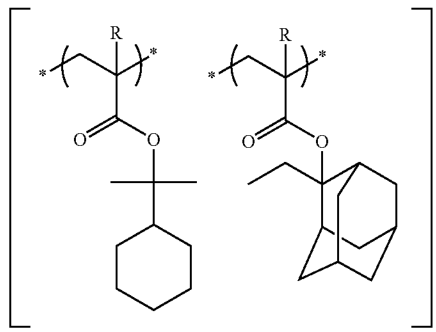

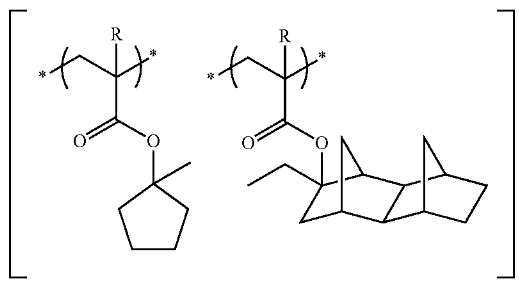

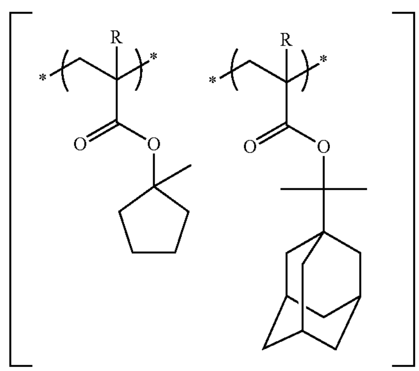

The alicyclic hydrocarbon-based acid-decomposable resin preferably has a lactone group. As for the lactone group, any group may be used as long as it has a lactone structure, but a group having a 5- to 7-membered ring lactone structure is preferred. The 5- to 7-membered ring lactone structure is preferably condensed with another ring structure in the form of forming a bicyclo or Spiro structure. The resin more preferably has a repeating unit containing a group having a lactone structure represented by any one of the following formulae (LC1-1) to (LC1-17). The group having a lactone structure may be bonded directly to the main chain. Among these lactone structures, preferred are groups represented by formulae (LC1-1), (LC1-4), (LC1-5), (LC1-6), (LC1-13), (LC1-

14) and (LC1-17). By virtue of using a specific lactone structure, the line edge roughness and development defect are improved.
LC1-1
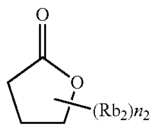
LC1-2
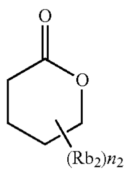
LC1-3
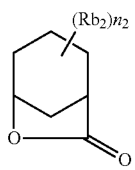
LC1-4
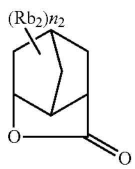
LC1-5
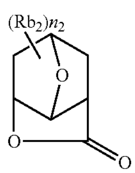
LC1-6
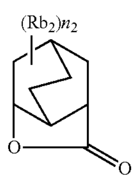
LC1-7
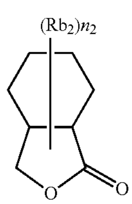
LC1-8
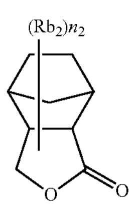
-continued
LC1-9
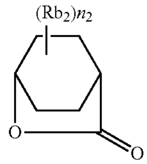
LC1-10
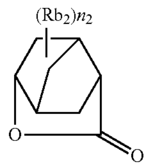
LC1-11
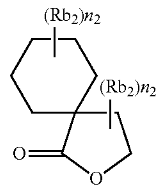
LC1-12
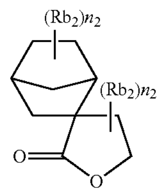
LC1-13
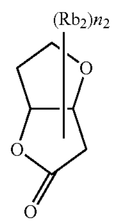
LC1-14
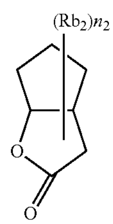
LC1-15
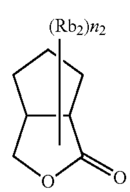
LC1-16
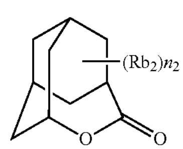

-continued

LC1-17

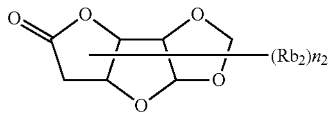

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. $n_2$ represents an integer of 0 to 4. When $n_2$ is an integer of 2 or more, each substituent ($Rb_2$) may be the same as or different from every other substituents and also, the plurality of substituents ($Rb_2$) may combine with each other to form a ring.

The repeating unit containing a group having a lactone structure represented by any one of formulae (LC1-1) to (LC1-17) include a repeating unit where at least one of $R_{13}'$ to $R_{16}'$ in formula (II-AB1) or (II-AB2) has a group represented by formulae (LC1-1) to (LC1-17) (for example, $R_5$ of —$COOR_5$ is a group represented by formulae (LC1-1) to (LC1-17)), and a repeating unit represented by the following formula (AI):

(AI)

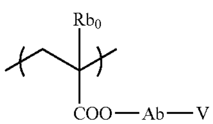

In formula (AI), $Rb_0$ represents a hydrogen atom, a halogen atom or an alkyl group having a carbon number of 1 to 4.

Preferred examples of the substituent which the alkyl group of $Rb_0$ may have include a hydroxyl group and a halogen atom.

The halogen atom of $Rb_0$ includes a fluorine atom, a chlorine atom, a bromine atom and an iodine atom.

$Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, or a divalent group formed by combining two or more of these groups and is preferably a single bond or a linking group represented by -$Ab_1$-$CO_2$—. $Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group represented by any one of formulae (LC1-1) to (LC1-17).

The lactone structure-containing repeating unit contained is preferably a unit represented by the following formula (III):

(III)

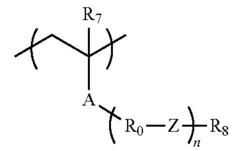

In formula (III), A represents an ester bond (a group represented by —COO—) or an amide bond (a group represented by —CONH—).

$R_0$ represents, when a plurality of $R_0$'s are present, each independently represents, an alkylene group, a cycloalkylene group or a combination thereof.

Z represents, when a plurality of Z's are present, each independently represents, an ether bond, an ester bond, an amide bond, a urethane bond, (a group represented by

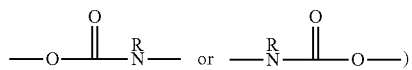

or a urea bond
(a group represented by

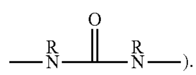

Here, R represents a hydrogen atom, an alkyl group, a cycloalkyl group or an aryl group.

$R_8$ represents a monovalent organic group having a lactone structure.

n is a repetition number of the structure represented by —$R_0$—Z— and represents an integer of 1 to 5, preferably 1.

$R_7$ represents a hydrogen atom, a halogen atom or an alkyl group.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkylene group and cycloalkylene group of $R_0$ and the alkyl group in $R_7$ each may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a chain alkylene group having a carbon number of 1 to 5, and examples thereof include a methylene group, an ethylene group and a propylene group. The cycloalkylene is preferably a cycloalkylene having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-17) and of these, a structure represented by (LC 1-4) is preferred. Structures where $n_2$ in (LC 1-1) to (LC 1-17) is an integer of 2 or less are more preferred.

$R_8$ is preferably a monovalent organic group having an unsubstituted lactone structure or a monovalent organic group containing a lactone structure having a methyl group, a cyano group or an alkoxy carbonyl group as the substituent, more preferably a monovalent organic group containing a lactone structure having a cyano group as the substituent (cyanolactone).

The lactone structure-containing repeating unit is more preferably a repeating unit represented by the following formula (III-1):

(III-1)

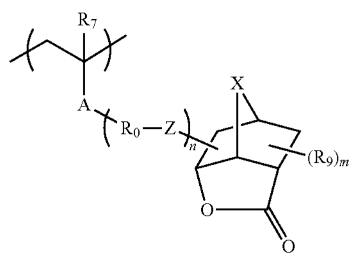

In formula (III-1), $R_7$, A, $R_0$, Z and n have the same meanings as in formula (III).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. The cycloalkyl group includes a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a butoxy group. These groups may have a substituent, and the substituent includes a hydroxyl group, an alkoxy group such as methoxy group and ethoxy group, a cyano group, and a halogen atom such as fluorine atom. $R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is an integer of 1 or more, at least one $R_9$ is preferably substituted at the α-position or β-position, more preferably at the α-position, of the carbonyl group of lactone The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

Specific examples of the repeating unit having a lactone structure-containing group are set forth below, but the present invention is not limited thereto. In specific examples, Rx represents a hydrogen atom, a methyl group, a hydroxymethyl group or a trifluoromethyl group. R represents a hydrogen atom, an alkyl group which may have a substituent, or a halogen atom and is preferably a hydrogen atom, a methyl group, a trifluoromethyl group, a hydroxymethyl group or an acetyloxymethyl group.

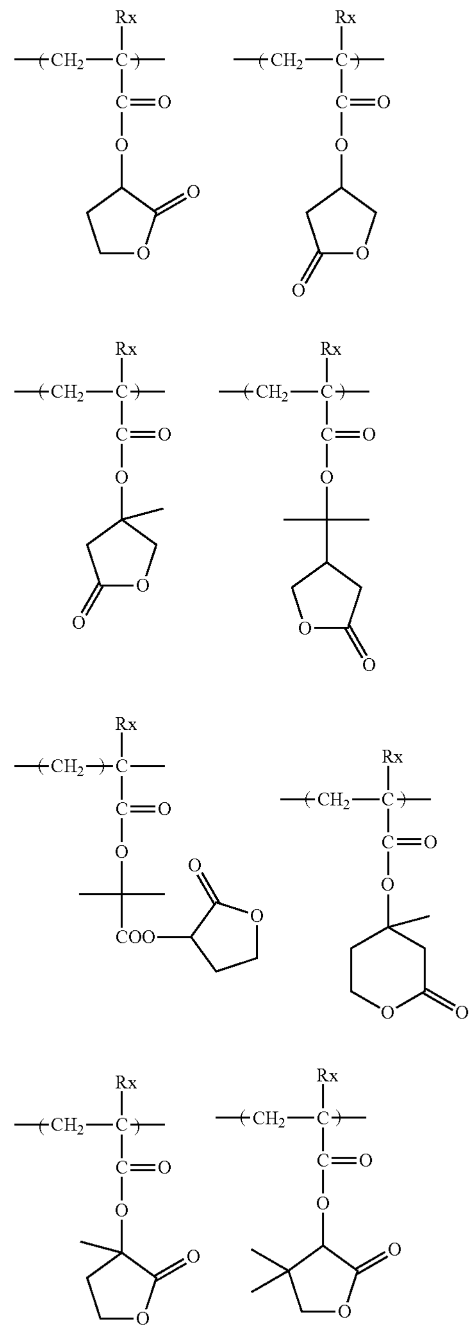

-continued
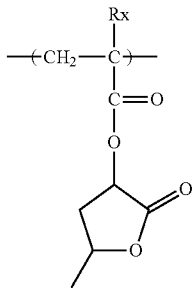
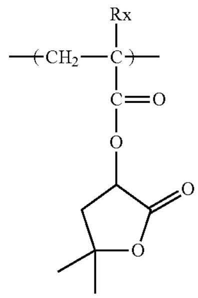
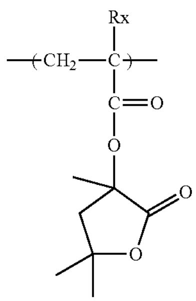
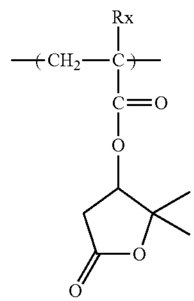
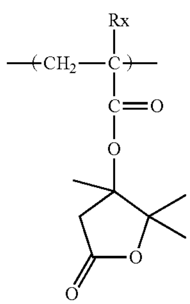
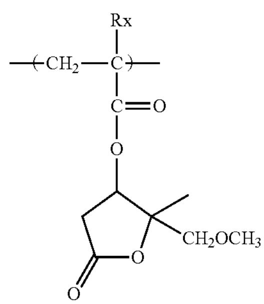
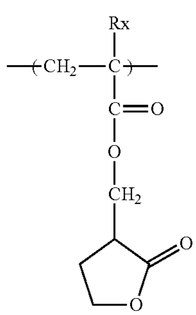
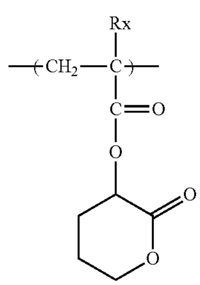
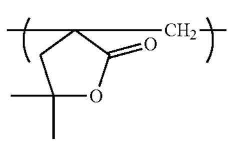
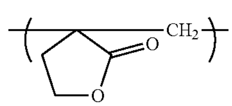
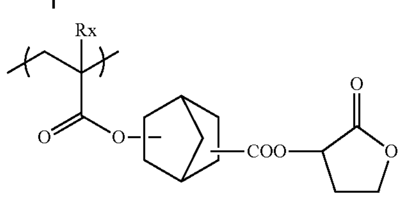
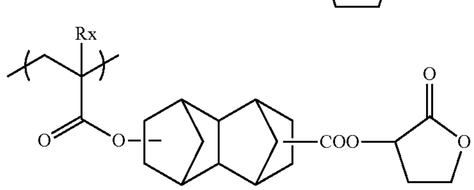
-continued
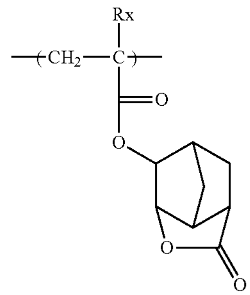
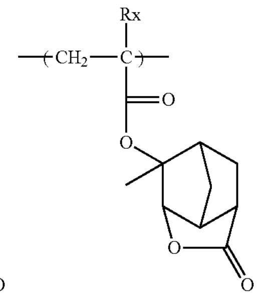
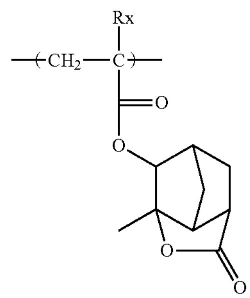
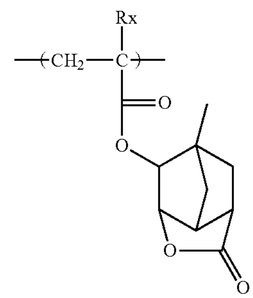
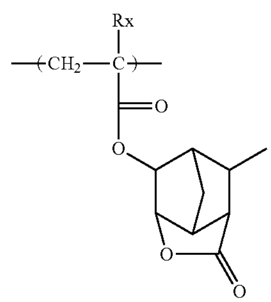
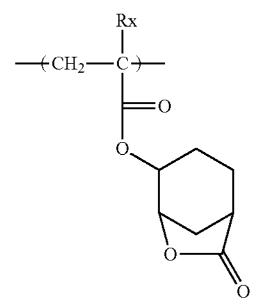
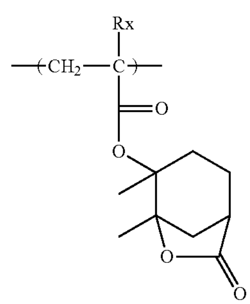
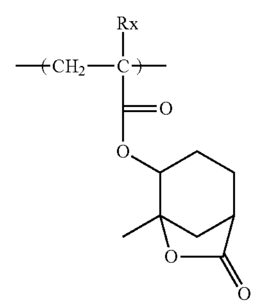
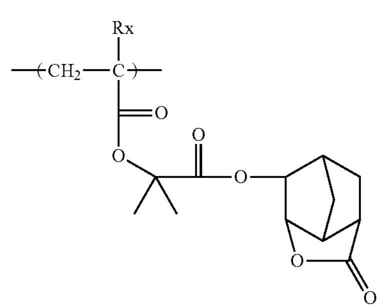

-continued
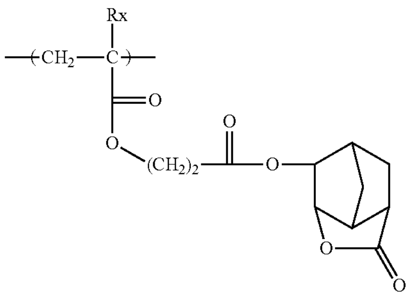
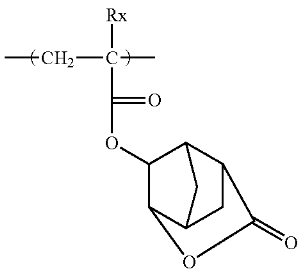
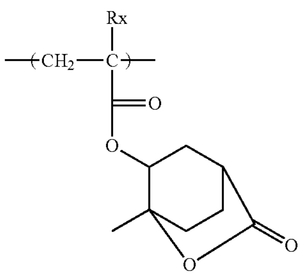
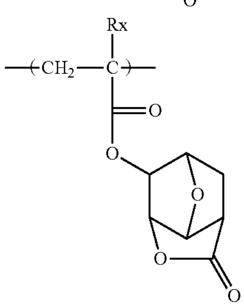
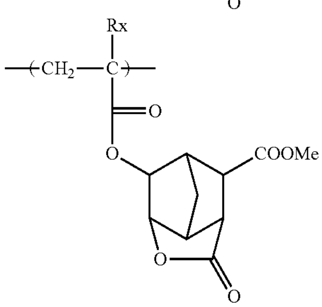
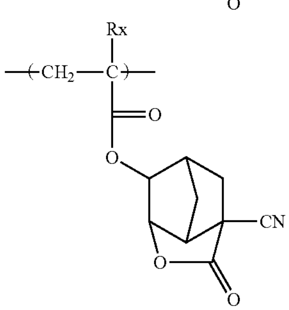
-continued
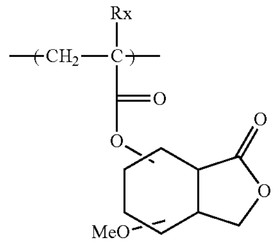
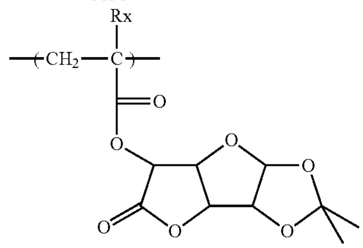
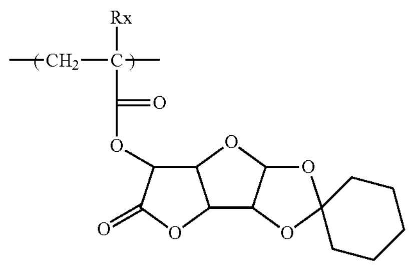
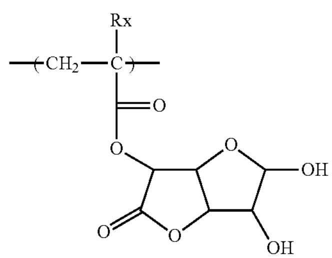
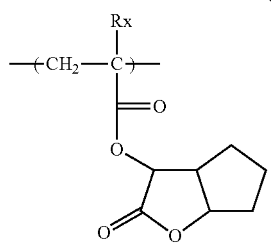
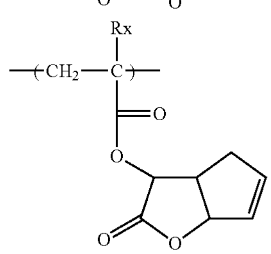
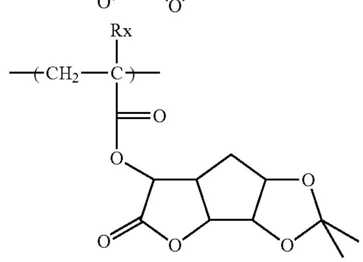

-continued
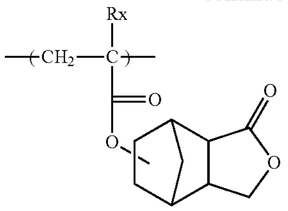
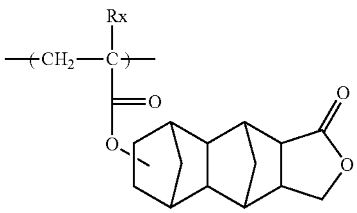
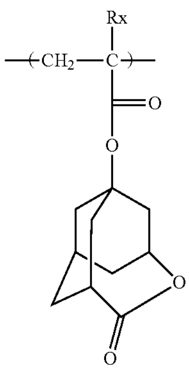
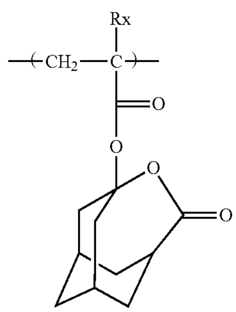
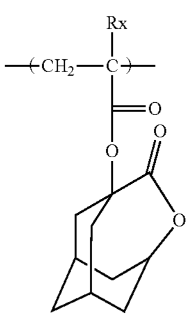
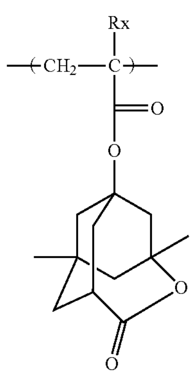
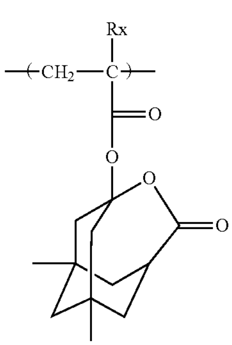
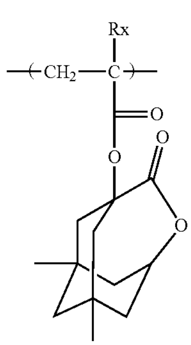
-continued
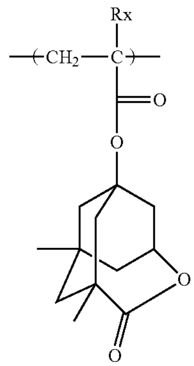
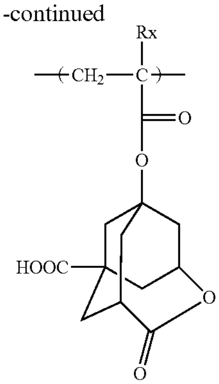
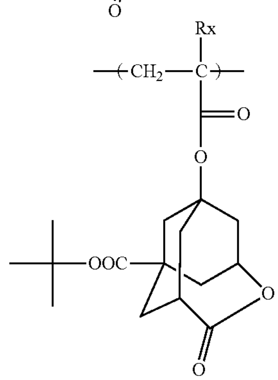
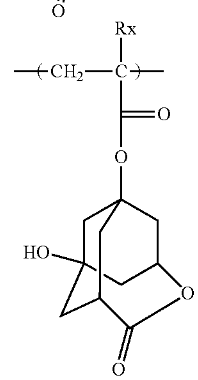
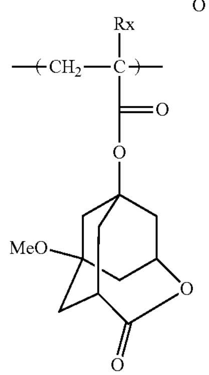
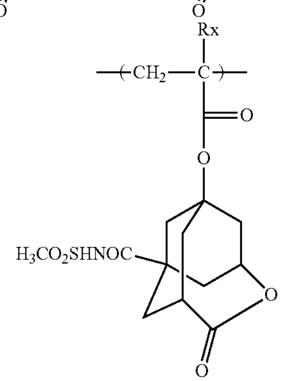
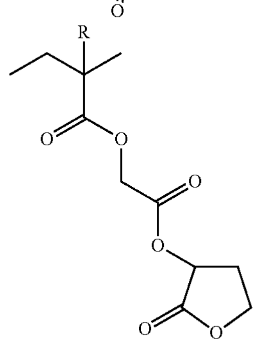
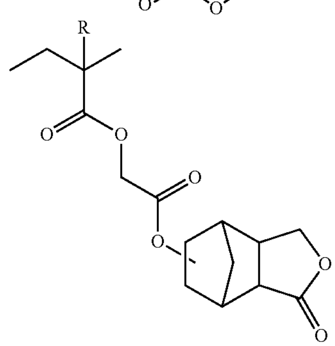

-continued
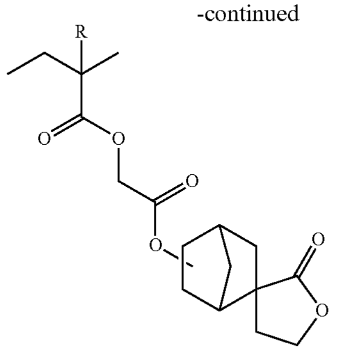
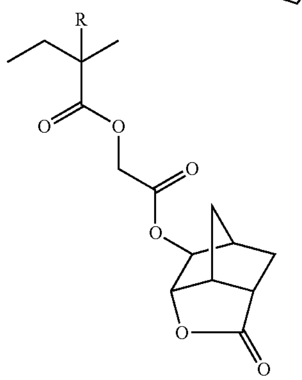
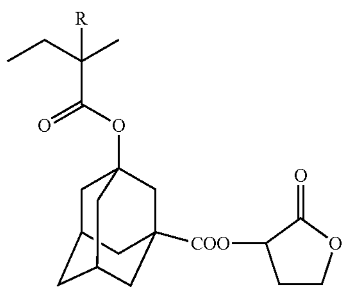
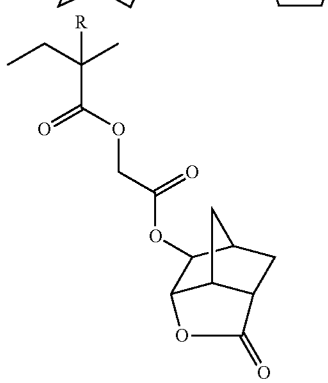
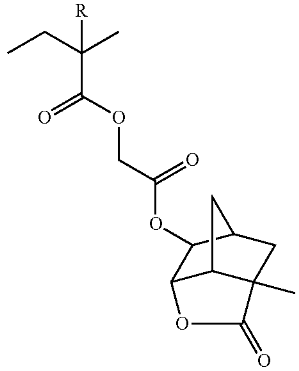
-continued
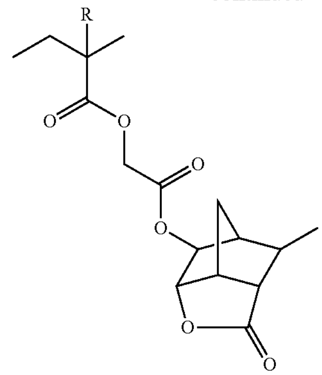
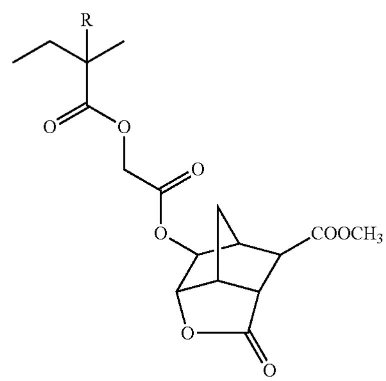
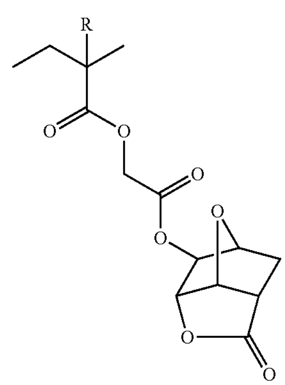
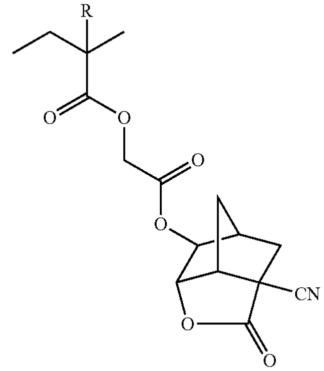

-continued
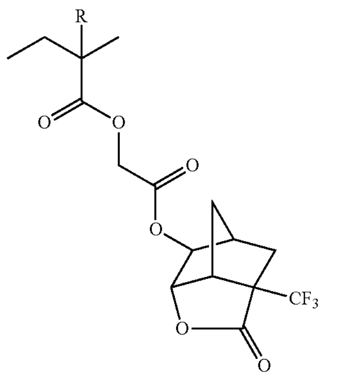
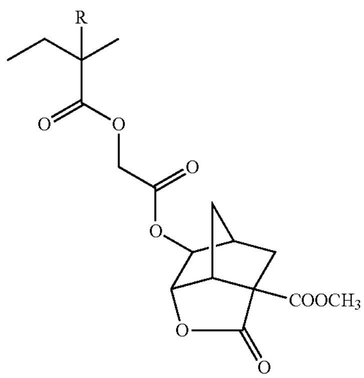
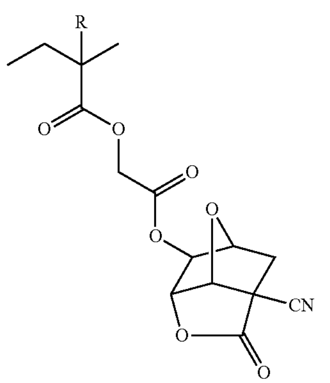
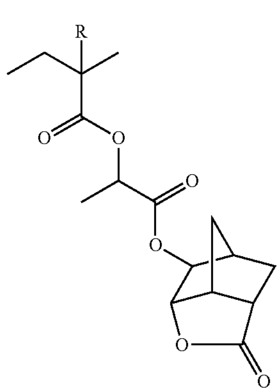
-continued
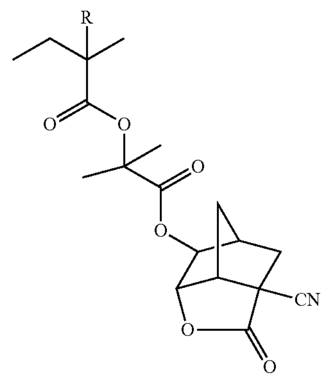
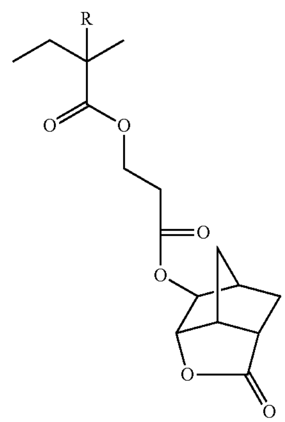
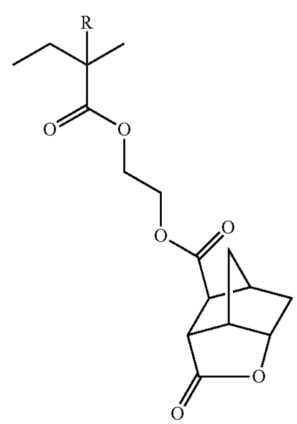
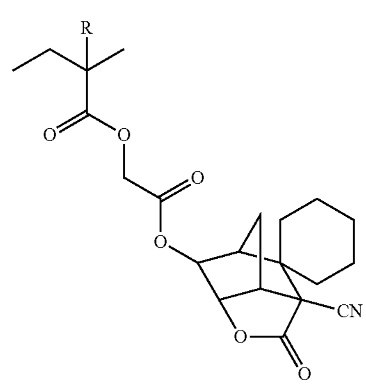

-continued
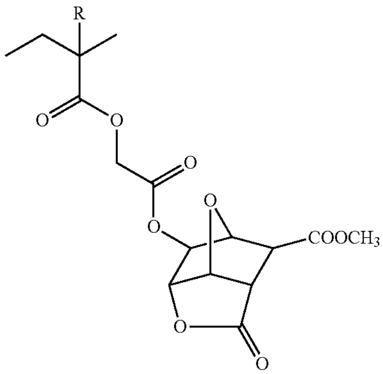
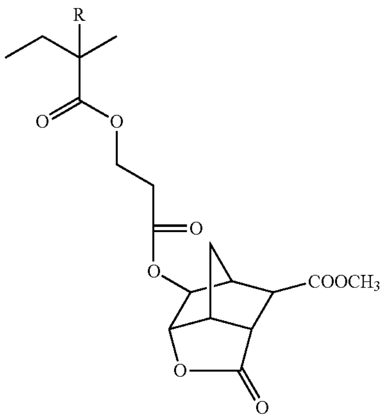
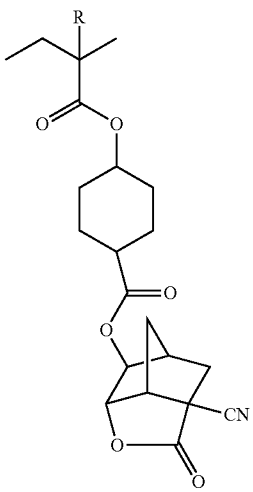
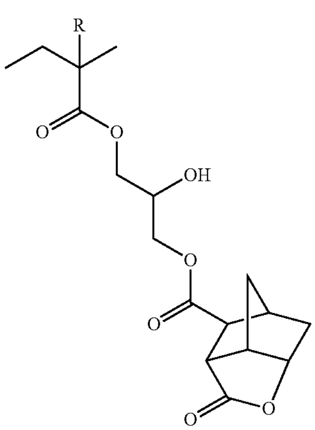
-continued
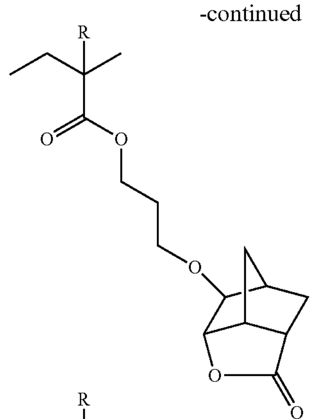
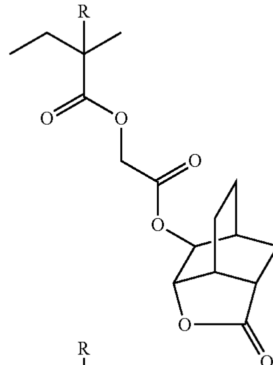
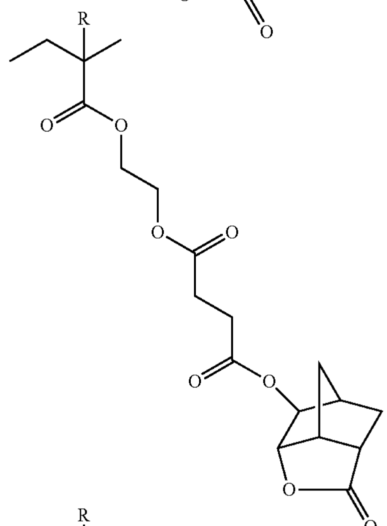
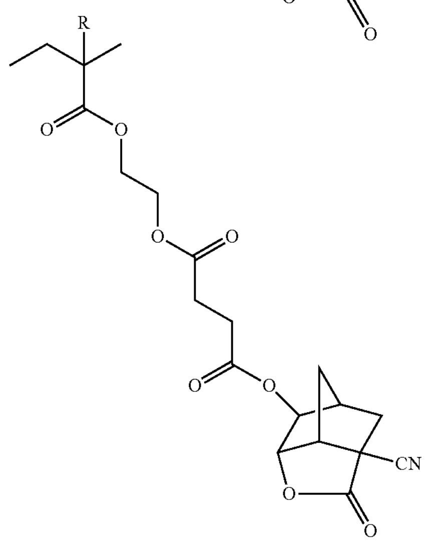

-continued

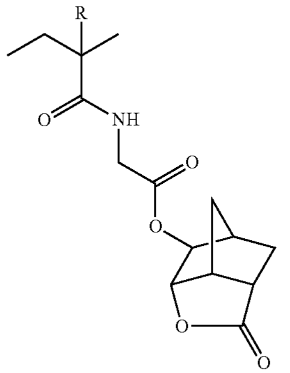

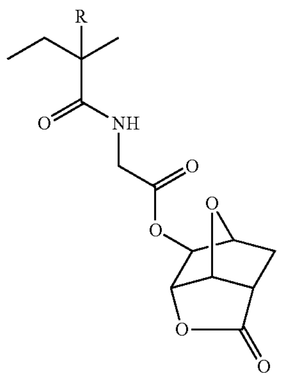

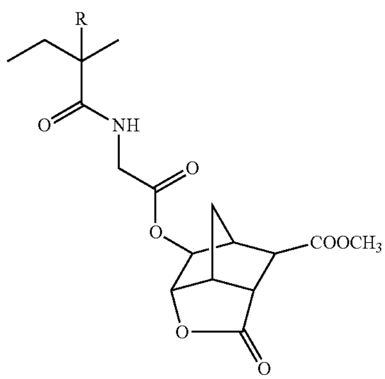

Two or more kinds of lactone repeating units may also be used in combination for raising the effects of the present invention. When used in combination, it is also preferred that two or more kinds of repeating units selected from lactone repeating units where n is 1 out of formula (III) are used in combination.

The alicyclic hydrocarbon-based acid-decomposable resin preferably contains a repeating unit having a polar group-containing organic group, more preferably a repeating unit having an alicyclic hydrocarbon structure substituted by a polar group. Thanks to this repeating unit, the adherence to substrate and the affinity for developer are enhanced. The alicyclic hydrocarbon structure of the polar group-substituted alicyclic hydrocarbon structure is preferably an adamantyl group, a diamantyl group or a norbornane group. The polar group is preferably a hydroxyl group or a cyano group.

The polar group-substituted alicyclic hydrocarbon structure is preferably a partial structure represented by the following formulae (VIIa) to (VIId):

(VIIa)

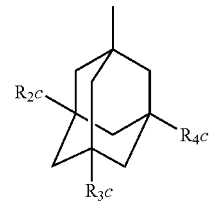

(VIIb)

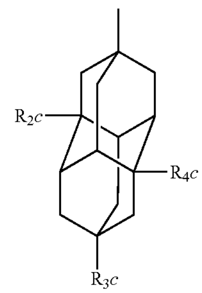

(VIIc)

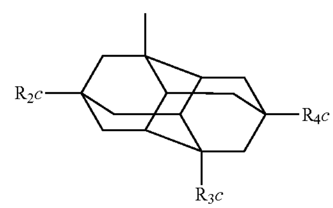

(VIId)

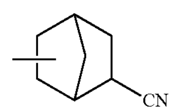

In formulae (VIIa) to (VIIc), each of $R_{2c}$ to $R_{4c}$ independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred.

In formula (VIIa), it is more preferred that two members out of $R_{2c}$ to $R_{4c}$ are a hydroxyl group and the remaining is a hydrogen atom.

The repeating unit having a group represented by formulae (VIIa) to (VIId) includes a repeating unit where at least one of $R_{13}'$ to $R_{16}'$ in formula (II-AB1) or (II-AB2) has a group represented by formulae (VIIa) to (VIId) (for example, $R_5$ of —$COOR_5$ is a group represented by formulae (VIIa) to (VIId)), and repeating units represented by the following formulae (AIIa) to (AIId):

(AIIa)

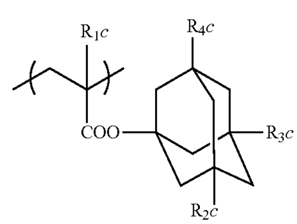

-continued (AIIb)

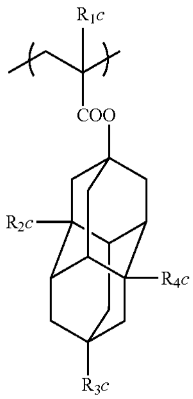

(AIIc)

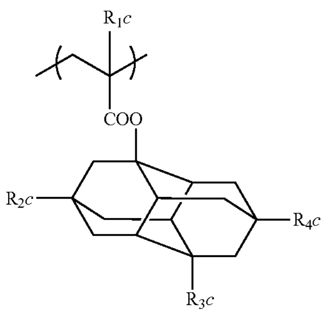

(AIId)

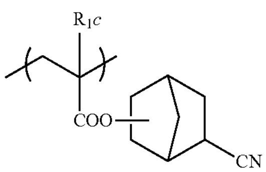

In formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formulae (VIIa) to (VIIc).

Specific examples of the repeating units represented by formulae (AIIa) to (AIId) are set forth below, but the present invention is not limited thereto.

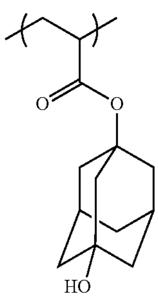

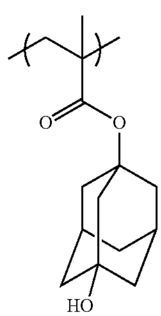

-continued

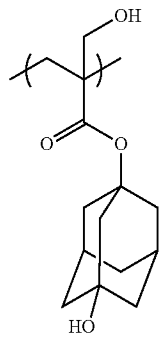

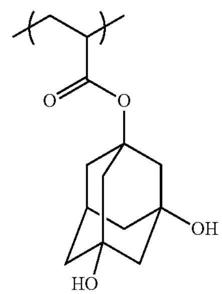

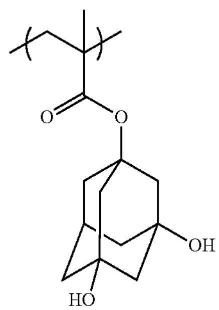

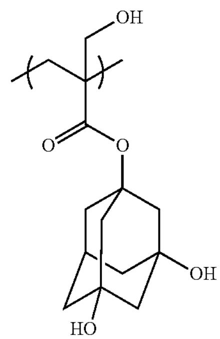

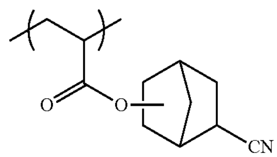

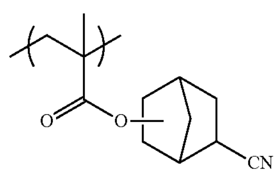

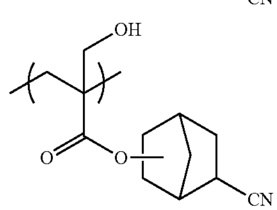

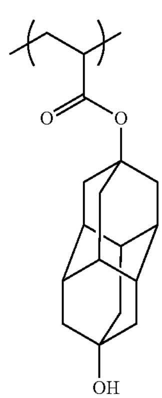

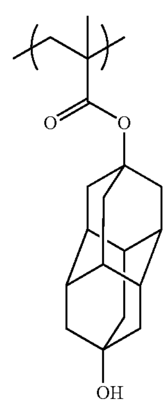

-continued

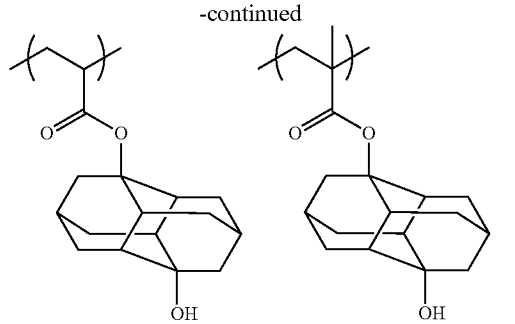

The alicyclic hydrocarbon-based acid-decomposable resin may contain a repeating unit represented by the following formula (VIII):

(VIII)

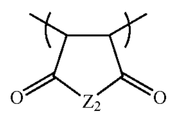

In formula (VIII), $Z_2$ represents —O— or —N($R_{41}$)—. $R_{41}$ represents a hydrogen atom, a hydroxyl group, an alkyl group or —$OSO_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

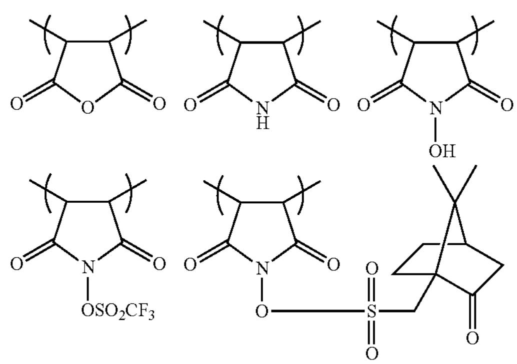

The alicyclic hydrocarbon-based acid-decomposable resin preferably contains a repeating unit having an alkali-soluble group, more preferably a repeating unit having a carboxyl group. By virtue of containing this repeating unit, the resolution increases in the usage of forming contact holes. As for the repeating unit having a carboxyl group, a repeating unit where a carboxyl group is directly bonded to the resin main chain, such as repeating unit by an acrylic acid or a methacrylic acid, a repeating unit where a carboxyl group is bonded to the resin main chain through a linking group, and a repeating unit where a carboxyl group is introduced into the terminal of the polymer chain by using a polymerization initiator or chain transfer agent having an alkali-soluble group at the polymerization, all are preferred. The linking group may have a monocyclic or polycyclic hydrocarbon structure. A repeating unit by an acrylic acid or a methacrylic acid is more preferred.

The alicyclic hydrocarbon-based acid-decomposable resin may further contain a repeating unit having from 1 to 3 groups represented by the following formula (F1). Thanks to this repeating unit, the performance in terms of line edge roughness is enhanced.

(F1)

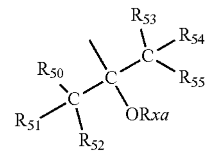

In formula (F1), each of $R_{50}$ to $R_{55}$ independently represents a hydrogen atom, a fluorine atom or an alkyl group, provided that at least one of $R_{50}$ to $R_{55}$ is a fluorine atom or an alkyl group with at least one hydrogen atom being replaced by a fluorine atom.

Rxa represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that $R_{50}$ to $R_{55}$ all are a fluorine atom.

The organic group represented by Rxa is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F1a):

(F1a)

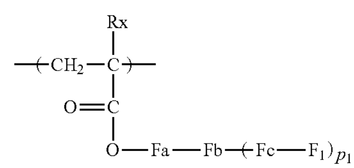

In formula (F1a), Rx represents a hydrogen atom, a halogen atom or an alkyl group (preferably having a carbon number of 1 to 4). Preferred examples of the substituent which the alkyl group of Rx may have include a hydroxyl group and a halogen atom.

Fa represents a single bond or a linear or branched alkylene group and is preferably a single bond.

Fb represents a monocyclic or polycyclic hydrocarbon group.

Fc represents a single bond or a linear or branched alkylene group and is preferably a single bond or a methylene group.

$F_1$ represents a group represented by formula (F1).

$p_1$ represents an integer of 1 to 3.

The cyclic hydrocarbon group in Fb is preferably a cyclopentylene group, a cyclohexylene group or a norbornylene group.

Specific examples of the repeating unit having a group represented by formula (F1) are set forth below, but the present invention is not limited thereto.

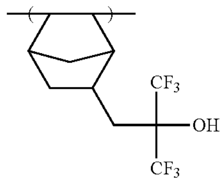

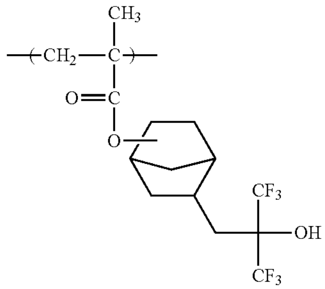

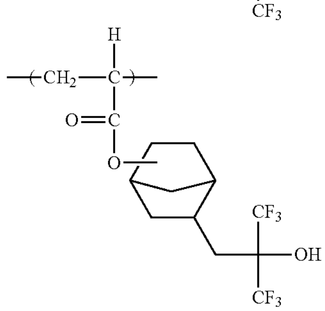

The alicyclic hydrocarbon-based acid-decomposable resin may further contain a repeating unit having an alicyclic hydrocarbon structure and not exhibiting acid decomposability. Thanks to this repeating unit, the dissolving out of low molecular components from the resist film to the immersion liquid at the immersion exposure can be reduced. Examples of this repeating unit include a repeating unit composed of 1-adamantyl(meth)acrylate, tricyclodecanyl(meth)acrylate or cyclohexyl(meth)acrylate.

Furthermore, it is preferred to contain a repeating unit having neither a hydroxyl group nor a cyano group represented by the following formula (IX):

(IX)

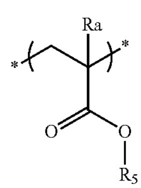

In formula (IX), $R_5$ represents a hydrocarbon group having at least one cyclic structure and having neither a hydroxyl group nor a cyano group.

Ra represents a hydrogen atom, an alkyl group or a —$CH_2$—O—$Ra_2$ group, wherein $Ra_2$ represents an alkyl group or an acyl group. Specific examples of Ra include H, $CH_3$ and $CF_3$.

The cyclic structure possessed by $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo [4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,$0^{2,6}$]decanyl group, with a norbornyl group and an adamantyl group being more preferred.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4, the substituted methyl group is preferably a methoxymethyl group, a methoxythiomethyl group, a benzyloxymethyl group, a tert-butoxymethyl group or a 2-methoxyethoxymethyl group, the substituted ethyl group is preferably a 1-ethoxyethyl group or a 1-methyl-1-methoxyethyl group, the acyl group is preferably an aliphatic acyl group having a carbon number of 1 to 6, such as formyl group, acetyl group, propionyl group, butyryl group, isobutyryl group, valeryl group and pivaloyl group, and the alkoxycarbonyl group is an alkoxycarbonyl group having a carbon number of 2 to 4.

The content of the repeating unit represented by formula (IX) having neither a hydroxyl group nor a cyano group is preferably from 0 to 40 mol %, more preferably from 0 to 20 mol %, based on all repeating units in the resin (A).

Specific examples of the repeating unit represented by formula (IX) are set forth below, but the present invention is not limited thereto.

In the formulae, Ra represents H, $CH_3$ or $CF_3$.

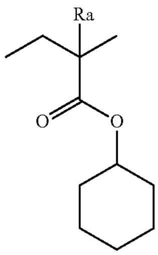
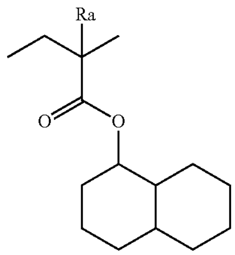
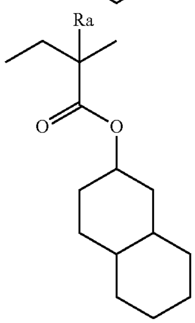
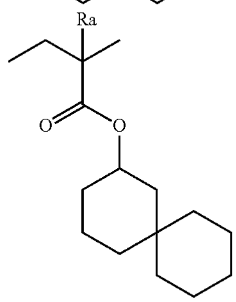
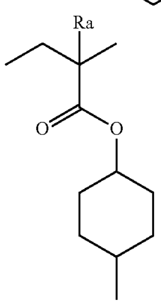
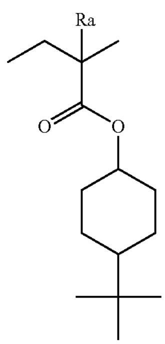
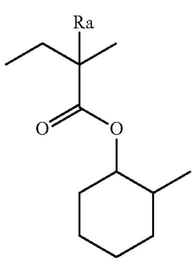
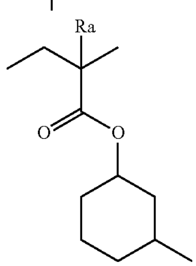
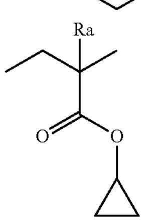
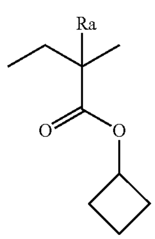
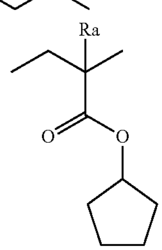
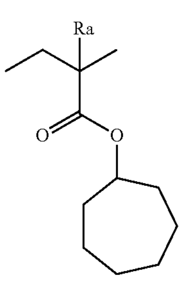
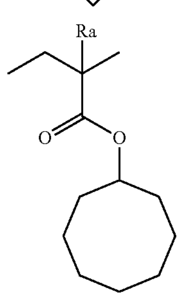

-continued

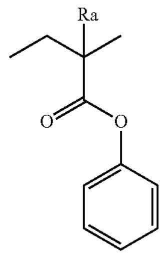
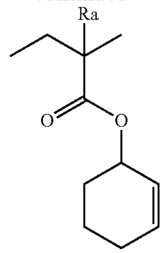
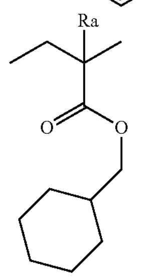
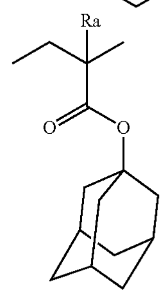
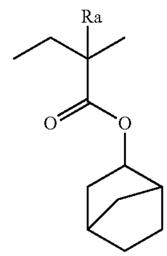
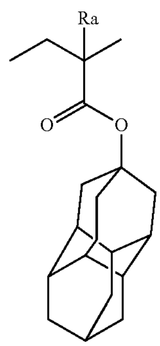
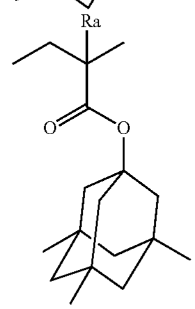
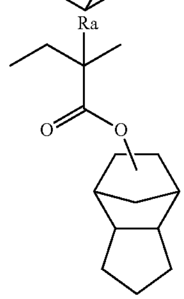

The alicyclic hydrocarbon-based acid-decomposable resin may contain, in addition to the above-described repeating units, various repeating units for the purpose of controlling the dry etching resistance, suitability for standard developer, adherence to substrate, resist profile and properties generally required of the resist, such as resolution, heat resistance and sensitivity.

Examples of such a repeating unit include, but are not limited to, repeating units corresponding to the monomers described below.

Thanks to such a repeating structural unit, the performance required of the alicyclic hydrocarbon-based acid-decomposable resin, particularly, (1) solubility in the coating solvent, (2) film-forming property (glass transition point), (3) solubility in an alkali developer and an organic solvent-containing developer, (4) film loss (selection of hydrophilic, hydrophobic or alkali-soluble group), (5) adherence of unexposed area to substrate, (6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers, vinyl esters, an acrylic acid and a methacrylic acid.

Other than these, an addition-polymerizable unsaturated compound copolymerizable with the monomers corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adherence to substrate, resist profile and performances generally required of the resist, such as resolution, heat resistance and sensitivity.

The preferred embodiment of the alicyclic hydrocarbon-based acid-decomposable resin includes the followings:

(1) a resin containing a repeating unit having an alicyclic hydrocarbon-containing partial structure represented by formulae (pI) to (pV) (side chain type), preferably a resin containing a (meth)acrylate-based repeating unit having a structure represented by formulae (pI) to (pV), and (2) a resin containing a repeating unit represented by formula (II-AB) (main chain type).

The resin of (2) further includes, for example:

(3) a resin having a repeating unit represented by formula (II-AB), a maleic anhydride derivative-based repeating unit, and a (meth)acrylate-based repeating unit (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the alicyclic hydrocarbon-based acid-decomposable resin, the content of the repeating unit containing a group having a lactone structure is preferably from 10 to 70 mol %, more preferably from 20 to 60 mol %, still more preferably from 25 to 40 mol %, based on all repeating structural units.

In the alicyclic hydrocarbon-based acid-decomposable resin, the content of the repeating unit having a polar group-containing organic group is preferably from 1 to 40 mol %, more preferably from 5 to 30 mol %, still more preferably from 5 to 20 mol %, based on all repeating structural units.

The content of the repeating structural unit based on the monomer as the further copolymerization component in the resin can also be appropriately set according to the desired resist performance but in general, the content thereof is preferably 99 mol % or less, more preferably 90 mol % or less, still more preferably 80 mol % or less, based on the total mol number of the repeating structural unit having an alicyclic hydrocarbon-containing partial structure represented by formulae (pI) to (pV) and the repeating unit represented by formula (II-AB).

In the case where the resist composition for organic solvent-based development of the present invention is used for ArF exposure, the resin (A) preferably has substantially no aromatic group in view of transparency to ArF light (specifically, in the resin, the proportion of the aromatic group-containing repeating unit is preferably 5 mol % or less, more preferably 3 mol % or less, and ideally 0 mol %, that is, the resin does not have an aromatic group). The resin (A) preferably has a monocyclic or polycyclic alicyclic hydrocarbon structure.

The alicyclic hydrocarbon-based acid-decomposable resin is preferably a resin where all repeating units are composed of a (meth)acrylate-based repeating unit (here, the (meth)acrylate-based repeating unit includes both a repeating unit derived from a (meth)acrylate and a repeating unit derived from a (meth)acrylic acid). In this case, all of the repeating units may be a methacrylate-based repeating unit, all of the repeating units may be an acrylate-based repeating unit, or all of the repeating units may be a mixture of methacrylate-based repeating unit/acrylate-based repeating unit, but the acrylate-based repeating unit preferably accounts for 50 mol % or less based on all repeating units.

The alicyclic hydrocarbon-based acid-decomposable resin is preferably a copolymer having at least three kinds of repeating units, that is, a (meth)acrylate-based repeating unit having a lactone structure, a (meth)acrylate-based repeating unit having an organic group substituted by at least either a hydroxyl group or a cyano group, and a (meth)acrylate-based repeating unit having an acid-decomposable group.

The resin is preferably a ternary copolymerization polymer containing from 20 to 50 mol % of the repeating unit having an alicyclic hydrocarbon-containing partial structure represented by formulae (pI) to (pV), from 20 to 50 mol % of the repeating unit having a lactone structure-containing group and from 5 to 30 mol % of the repeating unit having a polar group-substituted alicyclic hydrocarbon structure, or a quaternary copolymerization polymer further containing from 0 to 20 mol % of other repeating units.

The resin is more preferably a ternary copolymerization polymer containing from 20 to 50 mol % of the repeating unit having an acid-decomposable group represented by the following formulae (ARA-1) to (ARA-7), from 20 to 50 mol % of the repeating unit having a lactone structure-containing group represented by the following formulae (ARL-1) to (ARL-7) and from 5 to 30 mol % of the repeating unit having a polar group-substituted alicyclic hydrocarbon structure represented by the following formulae (ARH-1) to (ARH-3), or a quaternary copolymerization polymer further containing from 5 to 20 mol % of a repeating unit having a carboxyl group or a structure represented by formula (F1) or a repeating unit having an alicyclic hydrocarbon structure and not exhibiting acid decomposability.

(In the formulae, $Rxy_1$ represents a hydrogen atom or a methyl group, each of $Rxa_1$ and $Rxb_1$ independently represents a methyl group or an ethyl group, and $Rxc_1$ represents a hydrogen atom or a methyl group).

(ARA-1)

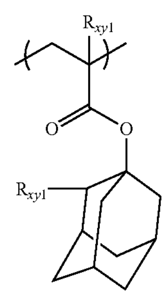

-continued
(ARA-2)
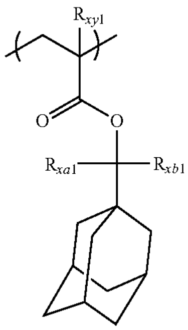
(ARA-3)
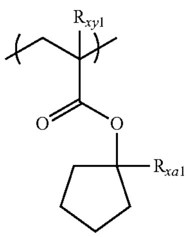
(ARA-4)
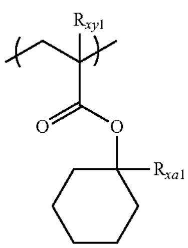
(ARA-5)
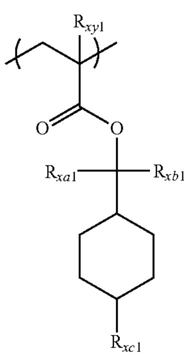
(ARA-6)
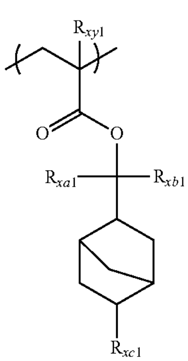
-continued
(ARA-7)
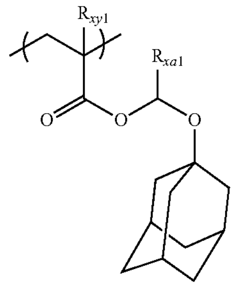
(In the formulae, $Rxy_1$ represents a hydrogen atom or a methyl group, $Rxd_1$ represents a hydrogen atom or a methyl group, and $Rxe_1$ represents a trifluoromethyl group, a hydroxyl group or a cyano group).
(ARL-1)
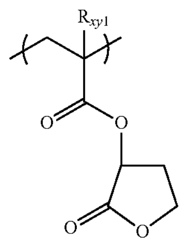
(ARL-2)
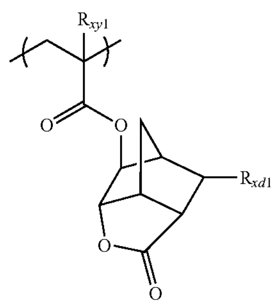
(ARL-3)
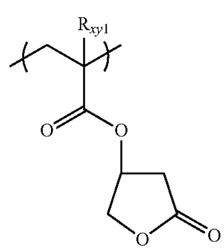
(ARL-4)
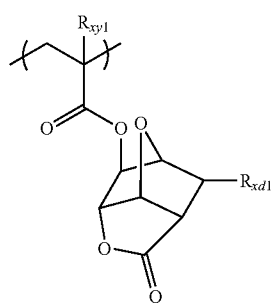

-continued (ARL-5)

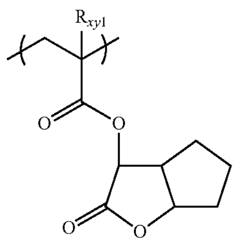

(ARL-6)

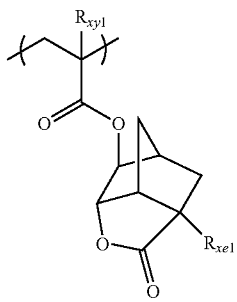

(ARL-7)

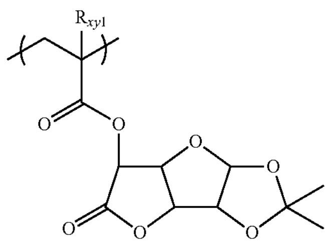

(In the formulae, $Rxy_1$ represents a hydrogen atom or a methyl group).

ARH-1

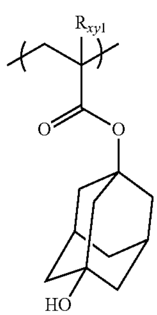

ARH-2

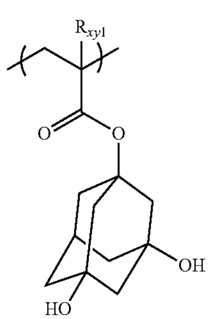

-continued

ARH-3

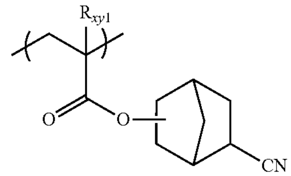

The alicyclic hydrocarbon-based acid-decomposable resin can be synthesized by an ordinary method (for example, radical polymerization). Examples of the general synthesis method include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane, diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the resist composition of the present invention. By the use of this solvent, production of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is poured in a solvent, and the desired polymer is recovered by a method such as powder or solid recovery. The concentration of the solute such as monomer and polymerization initiator in the reaction solution is from 5 to 50 mass %, preferably from 10 to 30 mass %. The reaction temperature is usually from 10 to 150° C., preferably from 30 to 120° C., more preferably from 60 to 100° C.

The purification may be performed by the same method as that for the resin (D) described later, and a normal method, for example, a liquid-liquid extraction method of combining water washing with an appropriate solvent to remove residual monomers or oligomer components, a purification method in a solution sate, such as ultrafiltration of extracting and removing only polymers having a molecular weight lower than a specific molecular weight, a reprecipitation method of adding dropwise the resin solution in a poor solvent to solidify the resin in the poor solvent and thereby remove residual monomers and the like, or a purification method in a solid state, such as washing of the resin slurry with a poor solvent after separation by filtration, may be employed.

The weight average molecular weight of the resin (A) is preferably from 1,000 to 200,000, more preferably from 1,000 to 20,000, still more preferably from 1,000 to 15,000, in terms of polystyrene by the GPC method. By virtue of setting the weight average molecular weight to be from 1,000 to 200,000, the heat resistance, dry etching resistance and developability can be prevented from deterioration and also, the film-forming property can be prevented from deterioration due to rise of the viscosity.

The polydispersity (molecular weight distribution) is usually from 1 to 5, preferably from 1 to 3, more preferably from 1.2 to 3.0, still more preferably from 1.2 to 2.0. As the polydispersity is smaller, the resolution and resist profile are more excellent, the side wall of the resist pattern is smoother, and the property in terms of roughness is more improved.

In the resist composition of the present invention, the amount of all resins for use in the present invention blended in the entire composition is preferably from 50 to 99.9 mass %, more preferably from 60 to 99.0 mass %, based on the entire solid content.

In the present invention, one kind of a resin may be used or a plurality of kinds of resins may be used in combination.

The alicyclic hydrocarbon-based acid-decomposable resin preferably contains no fluorine atom and no silicon atom in view of compatibility with the resin (D).

[2] (B) Compound Capable of Generating an Acid Upon Irradiation with an Actinic Ray or Radiation The resist composition for organic solvent-based development of the present invention contains a compound capable of generating an acid upon irradiation with an actinic ray or radiation (sometimes referred to as a "photo-acid generator" or a "component (B)").

The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with an actinic ray or radiation, preferred are the compounds represented by the following formulae (ZI), (ZII) and (ZIII):

ZI

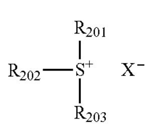

ZII

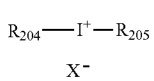

-continued

ZIII

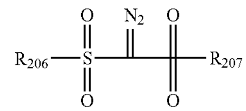

In formula (ZI), each of $R_{201}$, $R_{202}$ and $R_{203}$ independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae:

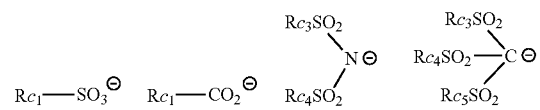

In the formulae, $Rc_1$ represents an organic group.

The organic group of $Rc_1$ includes an organic group having a carbon number of 1 to 30, and preferred examples thereof include an alkyl group, an aryl group, each of which may have a substituent, and a group where a plurality of these groups are connected through a single bond or a linking group such as —O—, —$CO_2$—, —S—, —$SO_3$— and —$SO_2N(Rd_1)$—. $Rd_1$ represents a hydrogen atom or an alkyl group.

Each of $Rc_3$, $Rc_4$ and $Rc_5$ independently represents an organic group. Preferred organic groups of $Rc_3$, $Rc_4$ and $Rc_5$ are the same as preferred organic groups in $Rc_1$. The organic group is most preferably a perfluoroalkyl group having a carbon number of 1 to 4.

$Rc_3$ and $Rc_4$ may combine to form a ring. The group formed by combining $Rc_3$ and $Rc_4$ includes an alkylene group and an arylene group, and a perfluoroalkylene group having a carbon number of 2 to 4 is preferred.

The organic group of $Rc_1$ and $Rc_3$ to $Rc_5$ is particularly preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light rises and the sensitivity is enhanced. Also, when $Rc_3$ and $Rc_4$ are combined to form a ring, the acidity of the acid generated upon irradiation with light rises and the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1) to (ZI-4) described later.

The compound may be a compound having a plurality of structures represented by formula (ZI). For example, the compound may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably compounds (ZI-1) to (ZI-4) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below. The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and includes a linear or branched alkyl group preferably having a carbon number of 1 to 10 (e.g., methyl, ethyl, propyl, butyl, pentyl). The alkyl group as $R_{201}$ to $R_{203}$ is preferably a linear or branched 2-oxoalkyl group or an alkoxycarbonylmethyl group.

The cycloalkyl group as $R_{201}$ to $R_{203}$ includes a cycloalkyl group preferably having a carbon number of 3 to 10 (e.g., cyclopentyl, cyclohexyl, norbornyl). The cycloalkyl group as $R_{201}$ to $R_{203}$ is preferably a cyclic 2-oxoalkyl group.

The linear, branched or cyclic 2-oxoalkyl group as $R_{201}$ to $R_{203}$ is preferably a group having >C=O at the 2-position of the above-described alkyl or cycloalkyl group. The linear, branched or cyclic 2-oxoalkyl group as $R_{201}$ to $R_{203}$ may have a double bond in the chain.

The alkoxy group in the alkoxycarbonylmethyl group as $R_{201}$ to $R_{203}$ includes an alkoxy group preferably having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

(ZI-3)

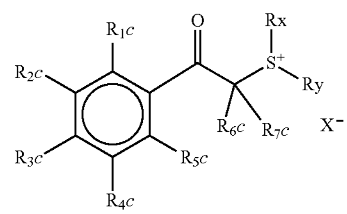

In formula (ZI-3), each of $R_{1c}$ to $R_{5c}$ independently represents a hydrogen atom, an alkyl group, a cycloalkyl group, an alkoxy group, a phenylthio group or a halogen atom.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, an allyl group or a vinyl group. As described later, these alkyl group and cycloalkyl group may be substituted by a carbonyl group, an alkoxycarbonyl group or the like.

Any two or more members out of $R_{1c}$ to $R_{7c}$ or a pair of $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{7c}$ or a pair of $R_x$ and $R_y$ include a butylene group and a pentylene group.

$X^-$ represents a non-nucleophilic anion, and examples thereof are the same as those of the non-nucleophilic anion of $X^-$ in formula (ZI).

The alkyl group as $R_{1c}$ to $R_{7c}$ may be either linear or branched and is, for example, a linear or branched alkyl group having a carbon number of 1 to 20, preferably a linear or branched alkyl group having a carbon number of 1 to 12 (such as methyl group, ethyl group, linear or branched propyl group, linear or branched butyl group and linear or branched pentyl group).

The cycloalkyl group as $R_{1c}$ to $R_{7c}$ is preferably a cycloalkyl group having a carbon number of 3 to 20 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group and linear or branched pentoxy group) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to this construction, the solubility in a solvent is more enhanced and generation of particles during storage is suppressed.

The aryl group as $R_{6c}$ and $R_{7c}$ is preferably an aryl group having a carbon number of 6 to 15, and examples thereof include a phenyl group and a naphthyl group.

The alkyl group as $R_x$ and $R_y$ is the same as the alkyl group of $R_{1c}$ to $R_{7c}$. The alkyl group as $R_x$ and $R_y$ may be substituted by an alkoxycarbonyl group, a carbonyl group or the like. The alkyl group as $R_x$ and $R_y$ is preferably a linear or branched 2-oxoalkyl group or an alkoxycarbonylmethyl group.

The cycloalkyl group as $R_x$ and $R_y$ is the same as the cycloalkyl group of $R_{1c}$ to $R_{7c}$. The cycloalkyl group as $R_x$ to $R_y$ is preferably a cyclic 2-oxoalkyl group.

The linear, branched or cyclic 2-oxoalkyl group includes a group having >C=O at the 2-position of the alkyl group or cycloalkyl group of $R_{1c}$ to $R_{7c}$.

The alkoxy group in the alkoxycarbonylalkyl group is the same as the alkoxy group of $R_{1c}$ to $R_{5c}$. The alkyl group is, for example, an alkyl group having a carbon number of 1 to 12, preferably a linear alkyl group having a carbon number of 1 to 5 (e.g., methyl, ethyl).

The allyl group is not particularly limited but is preferably an allyl group substituted by an unsubstituted, monocyclic or polycyclic cycloalkyl group.

The vinyl group is not particularly limited but is preferably a vinyl group substituted by an unsubstituted, monocyclic or polycyclic cycloalkyl group.

Each of $R_x$ and $R_y$ is preferably an alkyl group having a carbon number of 4 or more, more preferably 6 or more, still more preferably 8 or more.

At least one of $R_x$ and $R_y$ is preferably an alkyl group, and it is more preferred that both of $R_x$ and $R_y$ are an alkyl group.

The ring structure which may be formed by combining $R_x$ and $R_y$ with each other includes a 5- or 6-membered ring formed by divalent $R_x$ and $R_y$ (for example, an alkylene group having a carbon number of 1 to 3) together with the sulfur atom in formula (ZI-3), and a 5-membered ring (that is, a tetrahydrothiophene structure) is more preferred.

The compound (ZI-4) is a compound represented by the following formula (ZI-4):

(ZI-4)

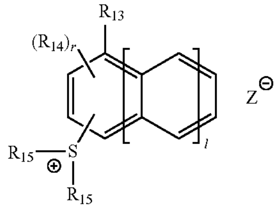

In formula (ZI-4), $R_{13}$ represents a hydrogen atom, a fluorine atom, a hydroxyl group, an alkyl group, a cycloalkyl group, an alkoxy group, an alkoxycarbonyl group, or a group having a monocyclic or polycyclic cycloalkyl skeleton.

$R_{14}$ represents, when a plurality of Ras are present, each independently represents, a hydroxyl group, an alkyl group, a cycloalkyl group, an alkoxy group, an alkoxycarbonyl group, an alkylcarbonyl group, an alkylsulfonyl group, cycloalkylsulfonyl group or a group having a monocyclic or polycyclic cycloalkyl skeleton.

Each $R_{15}$ independently represents an alkyl group, a cycloalkyl group or a naphthyl group. Two $R_{15}$'s may combine with each other to form a ring.

l represents an integer of 0 to 2.

r represents an integer of 0 to 10.

$Z^-$ represents a non-nucleophilic anion, and examples thereof are the same as those of the non-nucleophilic anion of $X^-$ in formula (ZI).

In formula (ZI-4), the alkyl group as $R_{13}$, $R_{14}$ and $R_{15}$ is a linear or branched alkyl group preferably having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

Examples of the cycloalkyl group of $R_{13}$, $R_{14}$ and $R_{15}$ include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl and adamantyl. Above all, cyclopropyl, cyclopentyl, cyclohexyl, cycloheptyl and cyclooctyl are preferred.

The alkoxy group of $R_{13}$ and $R_{14}$ is a linear or branched alkoxy group preferably having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ and $R_{14}$ is a linear or branched alkoxycarbonyl group preferably having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The alkylsulfonyl group and cycloalkylsulfonyl group of $R_{14}$ are a linear, branched or cyclic alkylsulfonyl or cycloalkylsulfonyl group preferably having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

The group having a monocyclic or polycyclic cycloalkyl skeleton of $R_{13}$ and $R_{14}$ includes, for example, a monocyclic or polycyclic cycloalkyloxy group and an alkoxy group having a monocyclic or polycyclic cycloalkyl skeleton. These groups may further have a substituent.

The monocyclic or polycyclic cycloalkyloxy group of $R_{13}$ and $R_{14}$ is preferably a monocyclic or polycyclic cycloalkyloxy group having a total carbon number of 7 or more, more preferably a total carbon number of 7 to 15, and preferably has a monocyclic cycloalkyl skeleton. The monocyclic cycloalkyloxy group having a total carbon number of 7 or more indicates a cycloalkyloxy group (e.g., cyclopropyloxy, cyclobutyloxy, cyclopentyloxy, cyclohexyloxy, cyclobutyloxy, cyclooctyloxy, cyclododecanyloxy) having an arbitrary substituent such as alkyl group (e.g., methyl, ethyl, propyl, butyl, pentyl, hexyl, heptyl, octyl, dodecyl, 2-ethylhexyl, isopropyl, sec-butyl, tert-butyl, iso-amyl), hydroxyl group, halogen atom (e.g., fluorine, chlorine, bromine, iodine), nitro group, cyano group, amido group, sulfonamido group, alkoxy group (e.g., methoxy, ethoxy, hydroxyethoxy, propoxy, hydroxypropoxy, butoxy), alkoxycarbonyl group (e.g., methoxycarbonyl, ethoxycarbonyl), acyl group (e.g., formyl, acetyl, benzoyl), acyloxy group (e.g., acetoxy, butyryloxy) and carboxy group, where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl skeleton of $R_{13}$ and $R_{14}$ preferably has a total carbon number of 7 or more, more preferably a total carbon number of 7 to 15, and is preferably alkoxy group having a monocyclic cycloalkyl skeleton. The alkoxy group having a total carbon number of 7 or more and having a monocyclic cycloalkyl skeleton indicates an alkoxy group (e.g., methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy, iso-amyloxy) substituted by the above-described monocyclic cycloalkyl group which may have a substituent, where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Preferred examples of the alkoxy group having a total carbon number of 7 or more and having a polycyclic cycloalkyl skeleton include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

l is preferably 0 or 1, more preferably 1, and r is preferably a number of 0 to 2.

Examples of the substituent which each of the groups of $R_{13}$, $R_{14}$ and $R_{15}$ may have include a halogen atom (e.g., fluorine), a hydroxyl group, a carboxyl group, a cyano group, a nitro group, an alkoxy group, an alkoxyalkyl group, an alkoxycarbonyl group and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyl group and cyclohexyloxycarbonyl group.

As for the ring structure which may be formed by combining two $R_{15}$'s with each other, a group capable of forming a 5- or 6-membered ring together with the sulfur atom in formula (ZI-4) is preferred, and a group capable of forming a 5-membered ring (that is, a tetrahydrothiophene ring) is more preferred. Examples of the substituent on the ring structure formed by combining two $R_{15}$'s with each other include a hydroxyl group, a carboxyl group, a cyano group, a nitro group, an alkoxy group, an alkoxyalkyl group, an alkoxycarbonyl group, an alkoxycarbonyloxy group, an alkyl group and a cycloalkyl group. A plurality of substituents may be present on the ring structure, and these substituents may combine with each other to form a ring (an aromatic or non-aromatic hydrocarbon ring, an aromatic or non-aromatic heterocycle, or a polycyclic condensed ring formed by combining two or more of these rings).

In formula (ZI-4), $R_{15}$ is preferably, for example, a methyl group, an ethyl group, a naphthyl group, or a divalent group of combining two $R_{15}$'s to form a tetrahydrothiophene ring structure together with the sulfur atom.

The substituent which $R_{13}$ and $R_{14}$ may have is preferably a hydroxyl group, an alkoxy group, an alkoxycarbonyl group or a halogen atom (particularly a fluorine atom).

Specific preferred examples of the cation in the compound represented by formula (ZI-4) are set forth below.

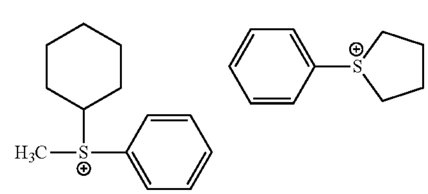

-continued
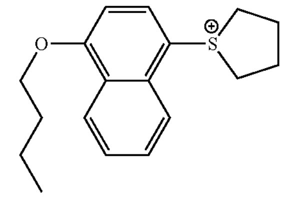
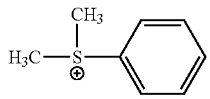
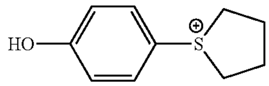
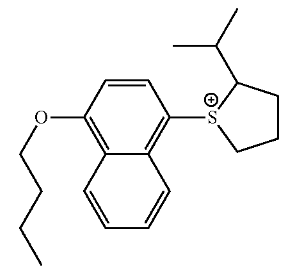
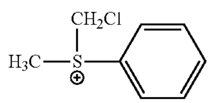
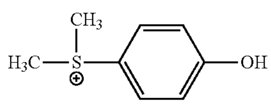
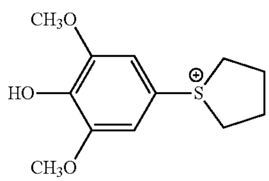
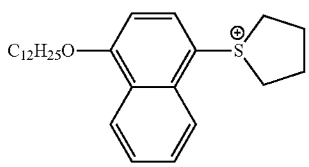
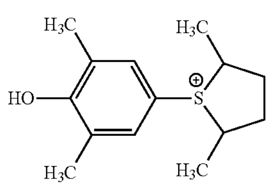
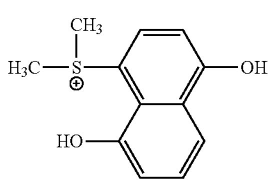
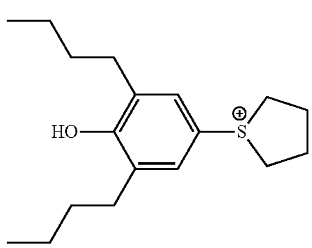
-continued
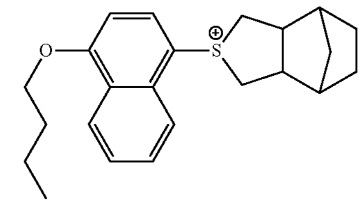
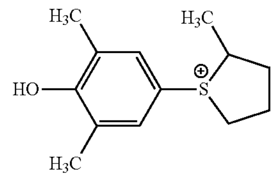
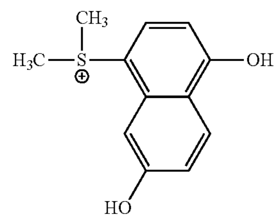
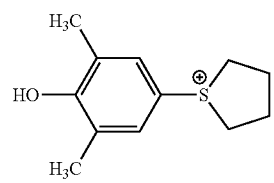
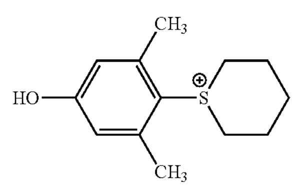
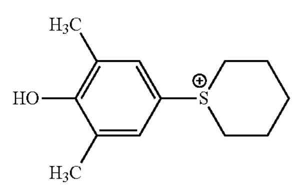
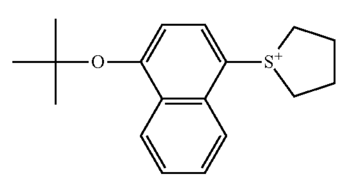
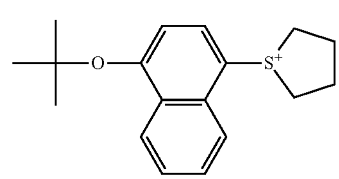

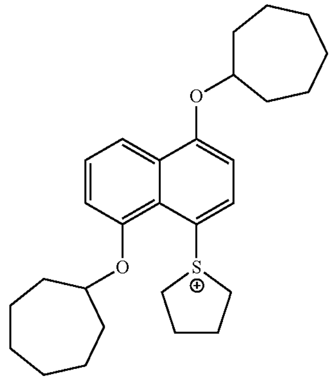
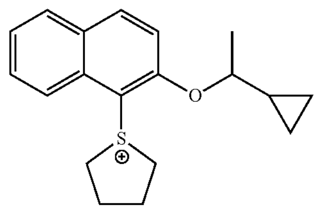
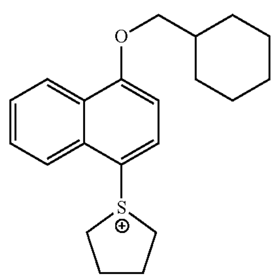
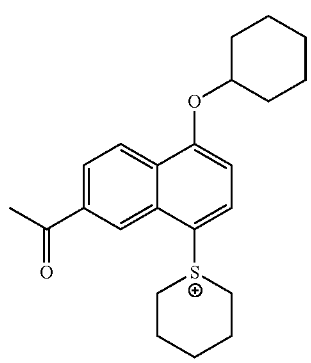
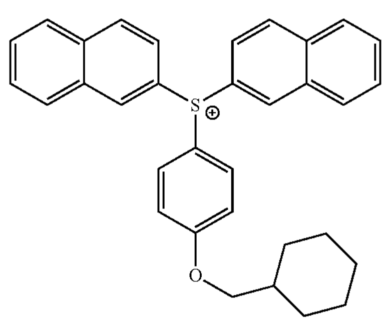
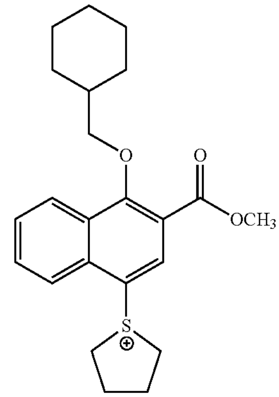
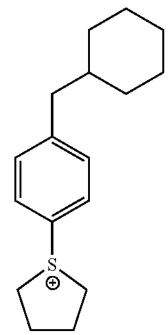
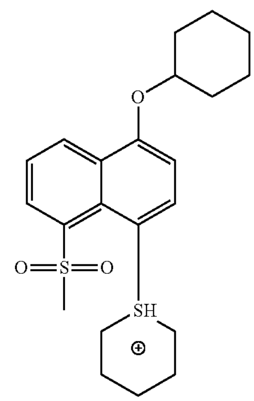
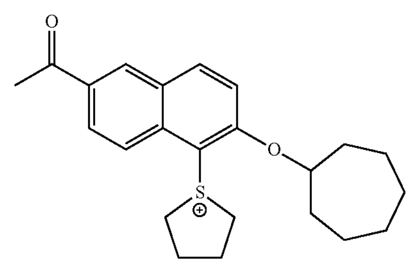
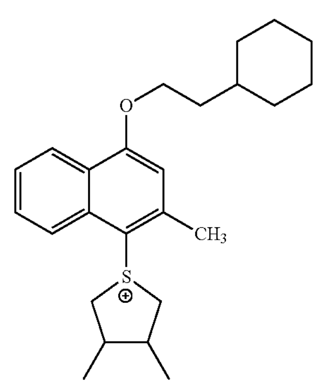

-continued
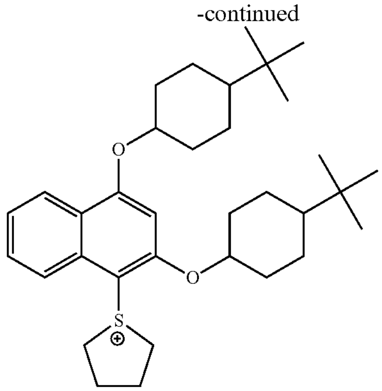
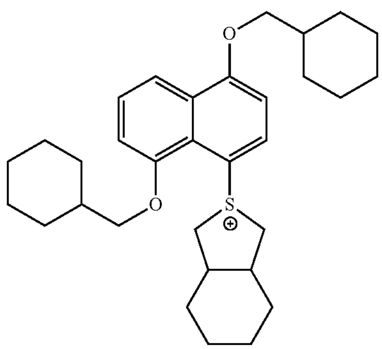
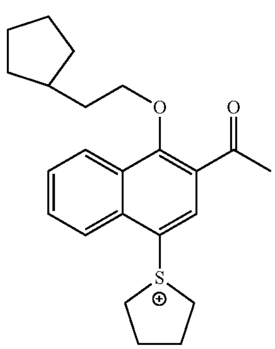
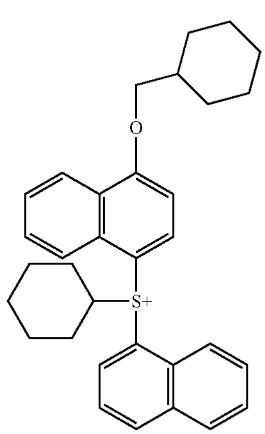
-continued
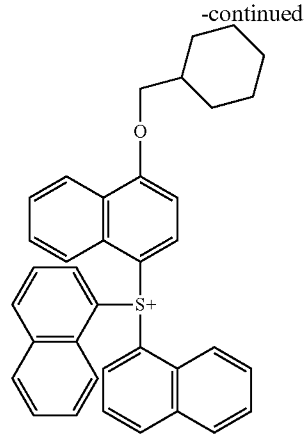
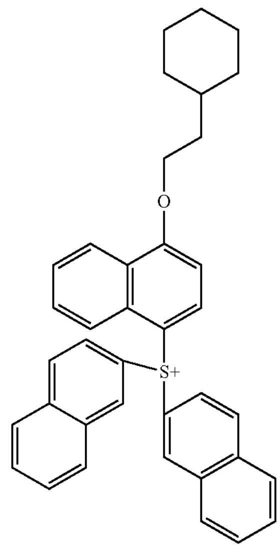
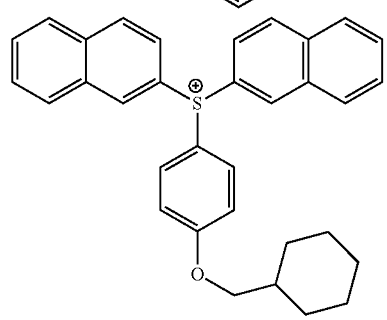
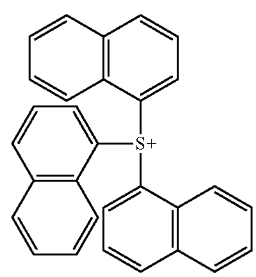
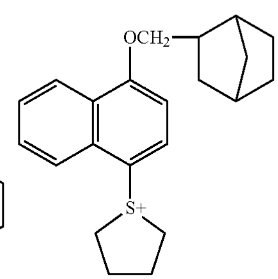
In formulae (ZII) and (ZIII), each of $R_{204}$ to $R_{207}$ independently represents an aryl group, an alkyl group or a cycloalkyl group.
The aryl group of $R_{204}$ to $R_{207}$ is preferably a phenyl group or a naphthyl group, more preferably a phenyl group.

The alkyl group as $R_{204}$ to $R_{207}$ may be either linear or branched and is preferably a linear or branched alkyl group having a carbon number of 1 to 10 (e.g., methyl, ethyl, propyl, butyl, pentyl).

The cycloalkyl group as $R_{204}$ to $R_{207}$ is preferably a cycloalkyl group having a carbon number of 3 to 10 (e.g., cyclopentyl, cyclohexyl, norbornyl).

Each of $R_{204}$ to $R_{207}$ may have a substituent. Examples of the substituent which each of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (ZI).

Out of the compounds capable of generating an acid upon irradiation with an actinic ray or radiation, preferred compounds further include the compounds represented by the following formulae (ZIV), (ZV) and (ZVI):

ZIV $$Ar_3—SO_2—SO_2—Ar_4$$

ZV

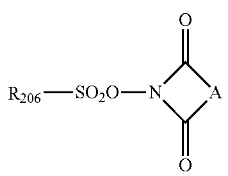

ZVI

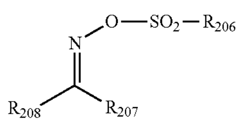

In formulae (ZIV) to (ZVI), each of $Ar_3$ and $Ar_4$ independently represents an aryl group.

$R_{206}$ represents an alkyl group or an aryl group.

Each of $R_{207}$ and $R_{208}$ independently represents an alkyl group, an aryl group or an electron-withdrawing group (a cyano group and a fluoroalkyl group (preferably having a carbon number of 1 to 4, for example, $CF_3$), etc). $R_{207}$ is preferably an aryl group.

$R_{208}$ is preferably an electron-withdrawing group, more preferably a cyano group or a fluoroalkyl group (preferably having a carbon number of 1 to 4, for example, $CF_3$).

A represents an alkylene group, an alkenylene group or an arylene group.

Specific examples of the aryl group of $Ar_3$, $Ar_4$, $R_{206}$, $R_{207}$ and $R_{208}$ are the same as specific examples of the aryl group as $R_{201}$, $R_{202}$ and $R_{203}$ in formula (ZI-1).

Specific examples of the alkyl group of $R_{206}$, $R_{207}$ and $R_{208}$ are the same as specific examples of the alkyl group as $R_{201}$, $R_{202}$ and $R_{203}$ in formula (ZI-2).

The alkylene group of A includes an alkylene group having a carbon number of 1 to 12 (e.g., methylene, ethylene, propylene, isopropylene, butylene, isobutylene), the alkenylene of A includes an alkenylene group having a carbon number of 2 to 12 (e.g., ethynylene, propenylene, butenylene), and the arylene group of A includes an arylene group having a carbon number of 6 to 10 (e.g., phenylene, tolylene, naphthylene).

As for the compound capable of generating an acid upon irradiation with an actinic ray or radiation, the compounds represented by formulae (ZI) to (ZIII) are preferred.

The compound (B) is preferably a compound capable of generating a fluorine atom-containing aliphatic sulfonic acid or a fluorine atom-containing benzenesulfonic acid upon irradiation with an actinic ray or radiation.

The compound (B) preferably has a triphenylsulfonium structure.

The compound (B) is preferably a triphenylsulfonium salt compound having a fluorine-unsubstituted alkyl or cycloalkyl group in the cation moiety.

In the compound capable of decomposing upon irradiation with an actinic ray or radiation to generate an acid, the non-nucleophilic anion $X^-$ and $Z^-$ is more preferably a sulfonate anion corresponding to a sulfonic acid represented by the following formula (I'). The compound (B) having such a sulfonate anion generates a sulfonic acid represented by formula (I') upon irradiation with an actinic ray or radiation and, as described later, this sulfonic acid has a cyclic organic group as the group A. The cyclic organic group is of high bulk as compared with a chain group and therefore, a sulfonic acid generated in the exposed area is easily kept within the exposed area, so that the possibility of allowing the acid to diffuse into the unexposed area and bring about an unintended reaction (for example, an acid decomposition reaction of the resin (A) in the unexposed area) can be more reduced and in particular, excellent performance in terms of LWR can be obtained.

(I')

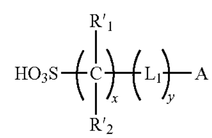

In formula (I'), each of $R'_1$ and $R'_2$ independently represents a group selected from a hydrogen atom, a fluorine atom and an alkyl group, and when a plurality of $R'_1$s and $R'_2$s are present, these may be the same or different.

$L_1$ represents a divalent linking group and when a plurality of $L_1$'s are present, these may be the same or different (here, y represents a repetition number of $L_1$).

A represents a cyclic organic group.

x represents an integer of 0 to 20.

y represents an integer of 0 to 10.

The alkyl group in $R'_1$ and $R'_2$ may have a substituent (preferably a fluorine atom) and is preferably an alkyl group having a carbon number of 1 to 4, more preferably a perfluoroalkyl group having a carbon number of 1 to 4. Specific examples thereof include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R'_1$ and $R'_2$ is preferably a fluorine atom or $CF_3$.

$L_1$ is not particularly limited and examples thereof include —COO—, —OCO—, —CO—, —O—, —S—, —SO—, —$SO_2$—, an alkylene group, a cycloalkylene group and an alkenylene group. The number of atoms constituting $L_1$ is preferably from 1 to 20, more preferably from 1 to 3. Among the groups above, —COO—, —OCO—, —CO— and —O— are preferred, and —COO— and —OCO— are more preferred.

The cyclic organic group of A is not particularly limited, and examples thereof include an alicyclic group, an aryl group and a heterocyclic group (an aromatic heterocycle or a non-aromatic heterocycle, including, for example, tetrahydropyrane ring and lactone ring structures).

The alicyclic group as A may be monocyclic or polycyclic and is preferably a monocyclic cycloalkyl group such as cyclopentyl group, cylohexyl group and cyclooctyl group, or a polycycloalkyl group such as norbornyl group, tricyclodecanyl group, tetracyclodecanyl group, tetracyclododecanyl group and adamantyl group. Above all, a norbornyl group, a tricyclodecanyl group, a tetracyclodecanyl group, a tetracyclododecanyl group and an adamantyl group, which are an alicyclic group having a bulky structure with a carbon number of 7 or more, are preferred from the standpoint that the diffusion in the film during the PEB (post-exposure heating) step can be suppressed and MEEF (mask error enhancement factor) can be improved.

Examples of the aryl group as A include a benzene ring, a naphthalene ring, a phenanthrene ring and an anthracene ring. Among these, naphthalene having low absorbance is preferred in view of absorbance of light at 193 nm.

Examples of the heterocyclic group as A include a furan ring, a thiophene ring, a benzofuran ring, a benzothiophene ring, a dibenzofuran ring, a dibenzothiophene ring, a pyridine ring and a piperidine ring. Among these, a furan ring, a thiophene ring, a pyridine ring and a piperidine ring are preferred.

Examples of the cyclic organic group include a lactone structure, and specific examples thereof include lactone structures represented by formulae (LC1-1) to (LC1-17) which the resin (A) may have.

The cyclic organic group may have a substituent, and examples of the substituent include a halogen atom, an alkyl group (either linear or branched, preferably having a carbon number of 1 to 12), a cycloalkyl group (may be monocyclic, polycyclic or spirocyclic, preferably having a carbon number of 3 to 20), an aryl group (preferably having a carbon number of 6 to 14), a hydroxy group, a cyano group, an alkoxy group, an ester group, an amido group, a urethane group, a ureido group, a thioether group, a sulfonamido group, a sulfonic acid ester group, and a group composed of two or more species selected from these atoms and groups. Incidentally, the carbon constituting the cyclic organic group (the carbon contributing to ring formation) may be carbonyl carbon.

x is preferably an integer of 1 to 12, more preferably from 1 to 4, still more preferably 1.

y is preferably an integer of 0 to 8, more preferably from 0 to 4.

The sulfonic acid represented by formula (I') is more preferably a sulfonic acid represented by the following formula (II') or (III'). That is, the non-nucleophilic anion $X^-$ and $Z^-$ in the compound capable of decomposing upon irradiation with an actinic ray or radiation to generate an acid is more preferably a sulfonate anion corresponding to the sulfonic acid represented by the following formula (II') or (III').

(II')

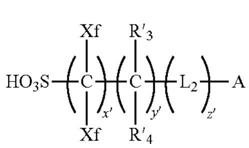

-continued (III')

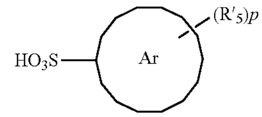

In formula (II'), each Xf independently represents a fluorine atom or an alkyl group substituted by at least one fluorine atom.

Each of $R'_3$ and $R'_4$ independently represents a hydrogen atom or an alkyl group, and when a plurality of $R'_3$s and $R'_4$s are present, these may be the same or different.

$L_2$ represents a divalent linking group, and when a plurality of $L_2$'s are present, these may be the same or different.

A represents a cyclic organic group.

x' represents an integer of 0 to 20.

y' represents an integer of 0 to 10.

z' represents an integer of 0 to 10.

Here, $1 \le x'+y'+z'$.

In formula (III'), Ar represents an aryl group and may have a substituent in addition to a sulfonic acid group and $R'_5$.

$R'_5$ represents a group having a hydrocarbon group.

p represents an integer of 0 or more.

The acid represented by formula (II') is described in detail below.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples thereof include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

Examples of the alkyl group of $R'_3$ and $R'_4$ are the same as those of the alkyl group in $R'_1$ and $R'_2$.

X' is preferably an integer of 1 to 10, more preferably from 1 to 5.

y' is preferably an integer of 0 to 4, more preferably 0.

z' is preferably an integer of 0 to 8, more preferably from 0 to 4.

The divalent linking group of $L_2$ is not particularly limited and examples thereof are the same as those of the linking group in $L_1$ (here, z' represents a repetition number of $L_2$).

Examples of the cyclic organic group A are the same as those in formula (I').

The acid represented by formula (III') is described in detail below.

In formula (III'), the aryl group of Ar is preferably an aromatic ring having a carbon number of 6 to 30.

Specific examples include a benzene ring, a naphthalene ring, a pentalene ring, an indene ring, an azulene ring, a heptalene ring, an indecene ring, a perylene ring, a pentacene ring, an acenaphthalene ring, phenanthrene ring, an anthracene ring, a naphthacene ring, a pentacene ring, a chrysene ring, a triphenylene ring, an indene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring. Among these, a benzene ring, a naphthalene ring and an anthracene ring are preferred, and a benzene ring is more preferred.

Ar may have a substituent in addition to $R'_5$ and a sulfonic acid, and examples of the substituent other than $R'_5$ include a halogen atom (e.g., fluorine, chlorine, bromine, iodine), a hydroxyl group, a cyano group, a nitro group and a carboxyl group. In the case of having two or more substituents, at least two substituents may combine with each other to form a ring.

Examples of the hydrocarbon group-containing group represented by $R'_5$ include an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear or branched alkyl group, such as methyl group, ethyl group, propyl group, butyl group, heptyl group, hexyl group, dodecyl group and 2-ethylhexyl group; an alkenyl group such as vinyl group, propenyl group and hexenyl group; an acetylene group; an alkynyl group such as propynyl group and hexynyl group; an aryl group such as phenyl group and tolyl group; and an acyl group such as benzoyl group, acetyl group and tolyl group.

Examples of the hydrocarbon group in the hydrocarbon group-containing group represented by $R'_5$ includes an acyclic hydrocarbon group and a cyclic aliphatic group, and those having a carbon number of 3 to more are preferred.

As for $R'_5$, the carbon atom adjacent to Ar is preferably a tertiary or quaternary carbon atom.

Examples of the acyclic hydrocarbon group as $R'_5$ include an isopropyl group, a tert-butyl group, a tert-pentyl group, a neopentyl group, a s-butyl group an isobutyl group, an isohexyl group, a 3,3-dimethylpentyl group and a 2-ethylhexyl group. The upper limit of the carbon number of the alicyclic hydrocarbon group is preferably 12 or less, more preferably 10 or less.

Examples of the cyclic aliphatic group as $R'_5$ include a cycloalkyl group such as cyclobutyl group, cyclopentyl group, cyclohexyl group, cycloheptyl group and cyclooctyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group and a pinenyl group. These groups may have a substituent. The upper limit of the carbon number of the cyclic aliphatic group is preferably 15 or less, more preferably 12 or less.

In the case where the alicyclic hydrocarbon group or cyclic aliphatic group has a substituent, examples of the substituent include a halogen atom such as fluorine atom, chlorine atom, bromine atom and iodine atom, an alkoxy group such as methoxy group, ethoxy group and tert-butoxy group, an aryloxy group such as phenoxy group and p-tolyloxy group, an alkylthioxy group such as methylthioxy group, ethylthioxy group and tert-butylthioxy group, an arylthioxy group such as phenylthioxy group and p-tolylthioxy group, an alkoxycarbonyl group such as methoxycarbonyl group, butoxycarbonyl group and phenoxycarbonyl group, an acetoxy group, a linear or branched alkyl group such as methyl group, ethyl group, propyl group, butyl group, heptyl group, hexyl group, dodecyl group and 2-ethylhexyl group, a cyclic alkyl group such as cyclohexyl group, an alkenyl group such as vinyl group, propenyl group and hexenyl group, an acetylene group, an alkynyl group such as propynyl group and hexynyl group, an aryl group such as phenyl group and tolyl group, a hydroxy group, a carboxy group, a sulfonic acid group, a carbonyl group and a cyano group.

Specific examples of the cyclic aliphatic group and alicyclic hydrocarbon group as $R'_5$ are set forth below.

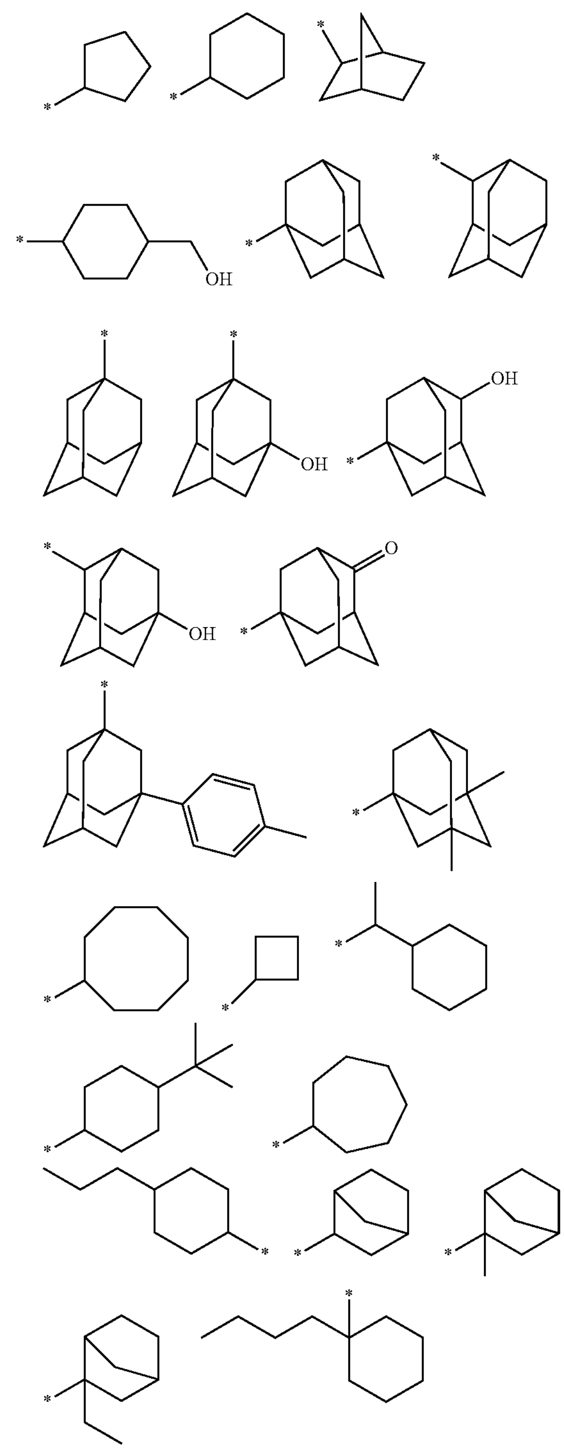

-continued

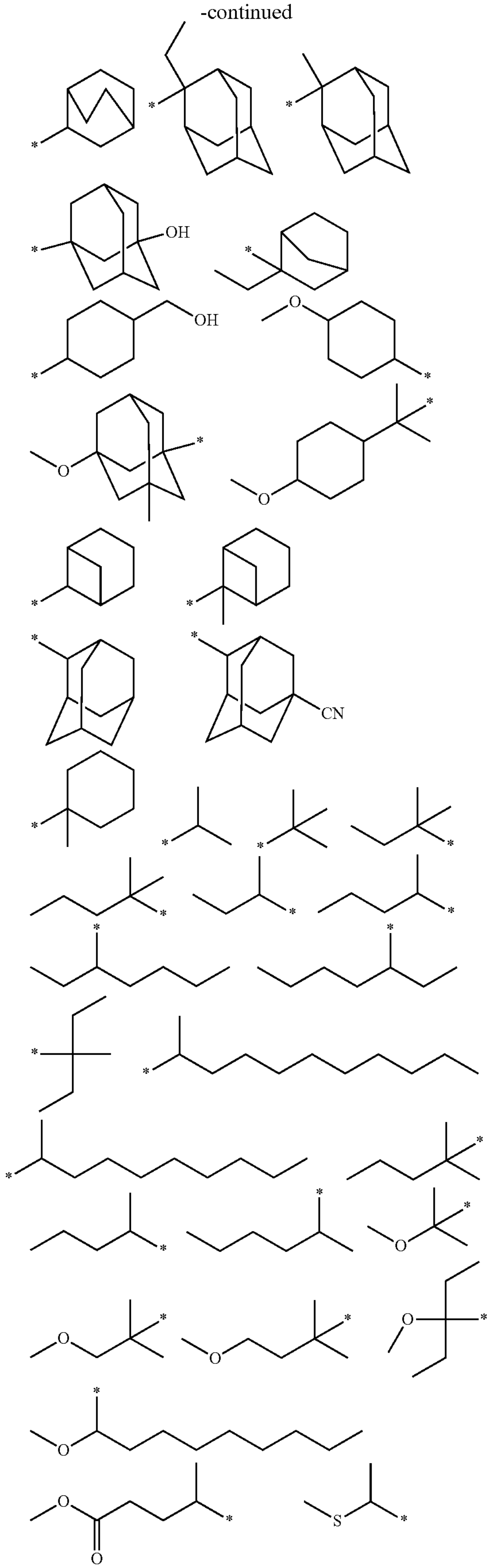

-continued

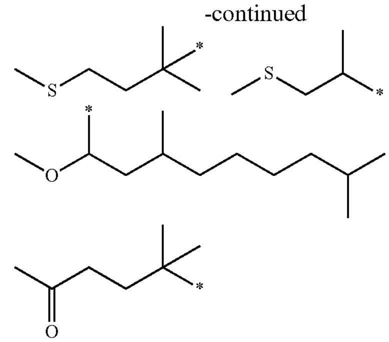

Among these, the following structures are more preferred in view of suppressing acid diffusion.

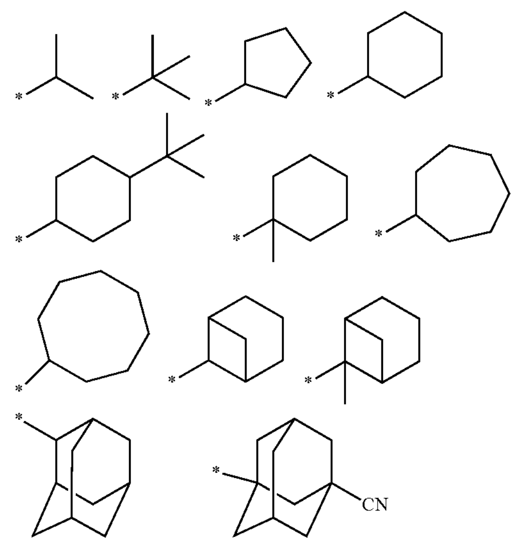

p represents an integer of 0 or more, and the upper limit thereof is not particularly limited as long as it is a chemically possible number. From the standpoint of suppressing acid diffusion, p is an integer of usually from 0 to 5, preferably from 1 to 4, more preferably from 2 to 3, and most preferably 3.

In the light of suppressing acid diffusion, $R'_5$ is preferably substituted at the o-position with respect to the sulfonic acid group of the aryl ring, and a structure where $R'_5$ is substituted at two o-positions is more preferred.

In one embodiment, the compound (B) for use in the present invention is a compound capable of generating an acid represented by the following formula (BII):

(BII)

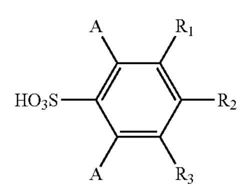

In the formula, A is the same as $R'_5$ in formula (III'), and two A's may be the same or different. Each of $R_1$ and $R_3$ independently represents a hydrogen atom, a hydrocarbon group-containing group, a halogen atom, a hydroxyl group, a cyano group or a nitro group. Specific examples of the hydrocarbon group-containing group are the same as the groups exemplified above.
Specific examples of the acid represented by formula (I') are set forth below.
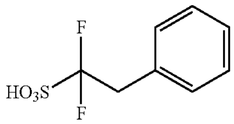
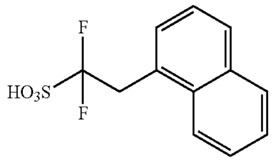
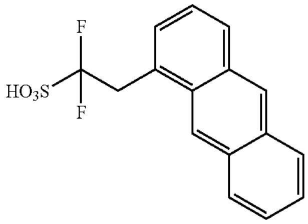
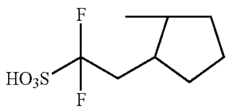
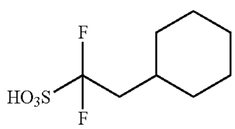
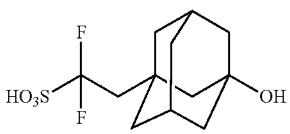
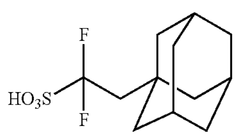
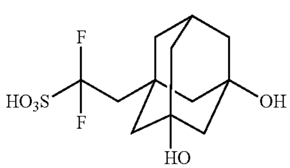
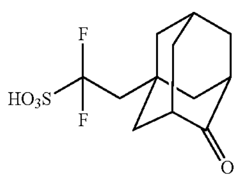
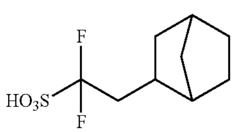
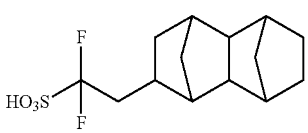
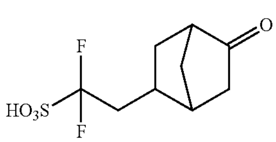
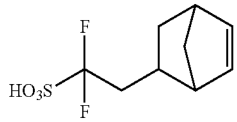
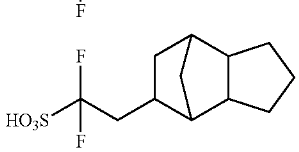
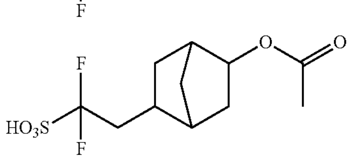
-continued
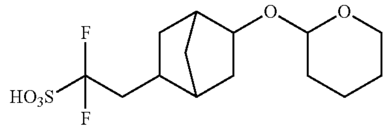
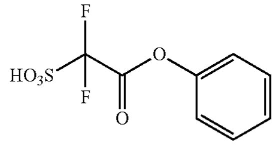
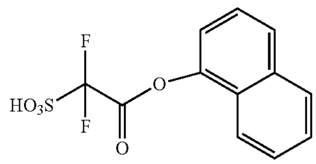
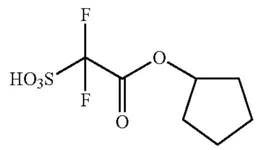
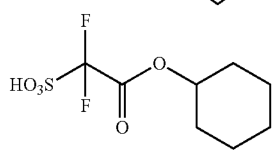
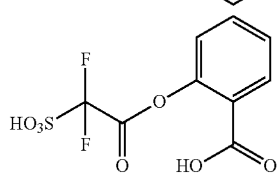
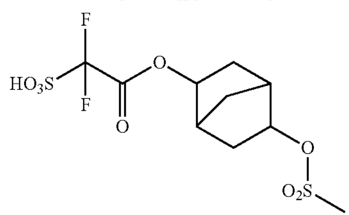
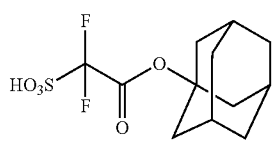
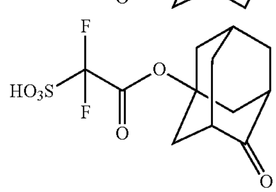
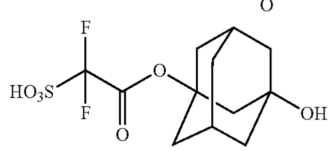
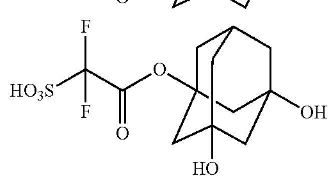

-continued
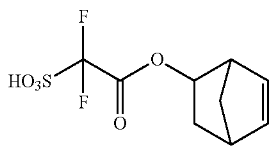
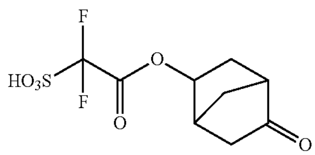
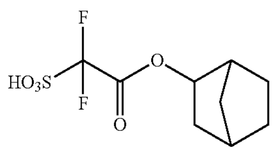
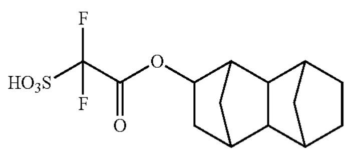
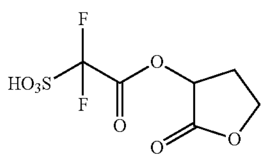
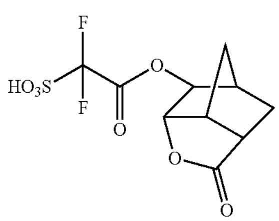
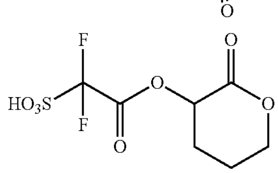
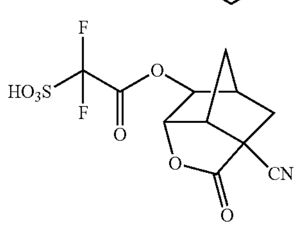
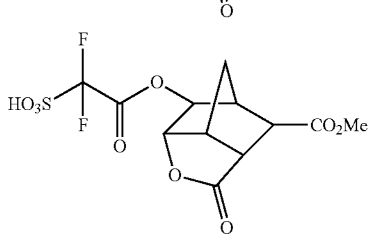
-continued
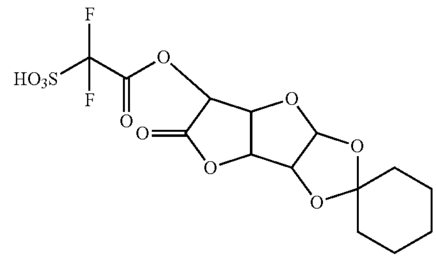
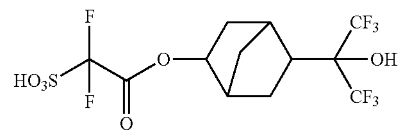
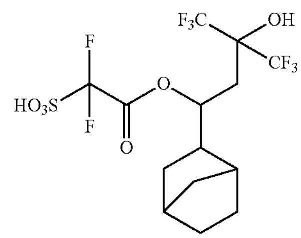
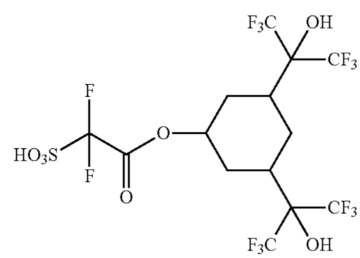
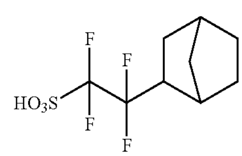
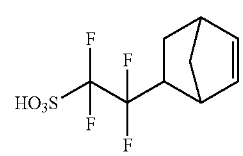
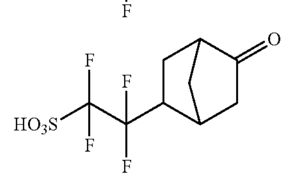
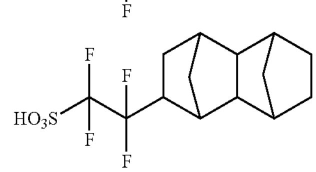
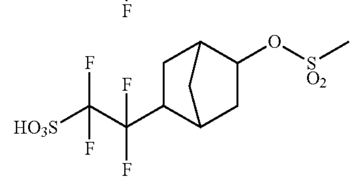
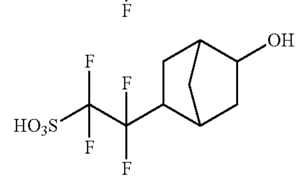

-continued
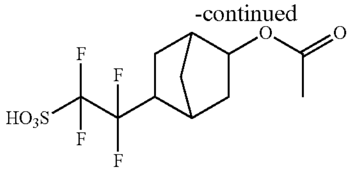
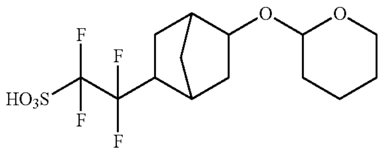
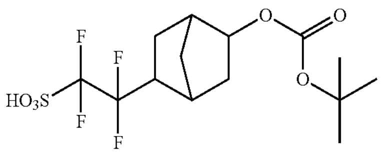
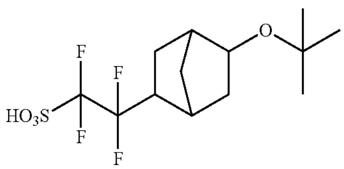
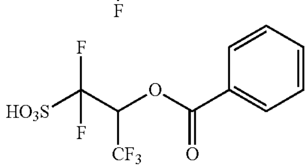
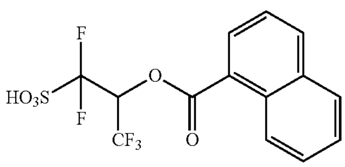
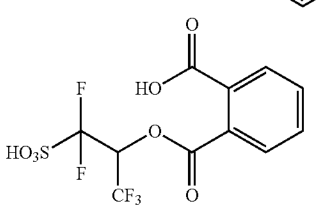
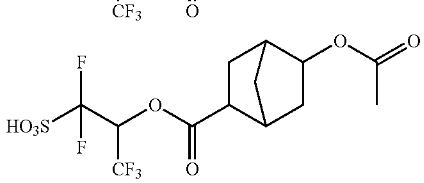
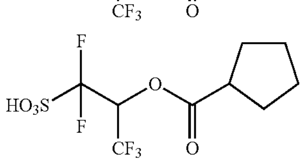
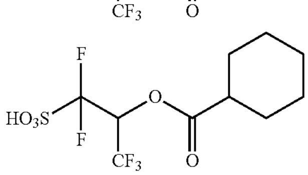
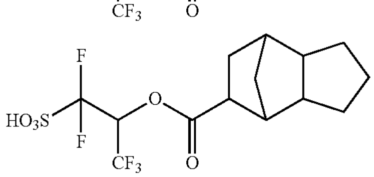
-continued
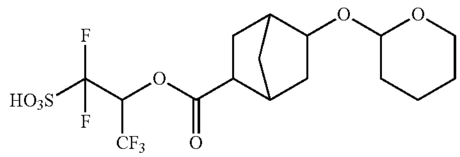
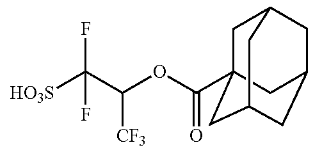
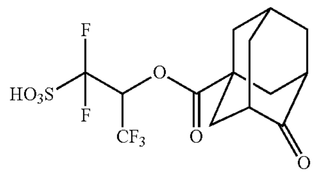
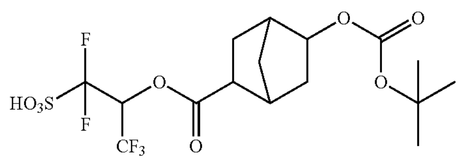
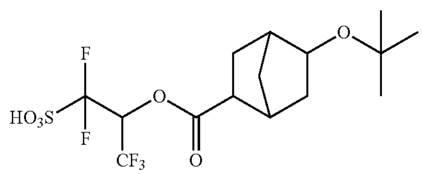
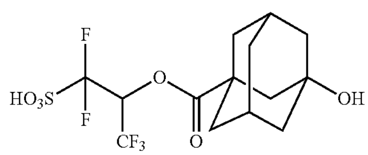
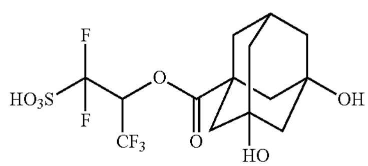
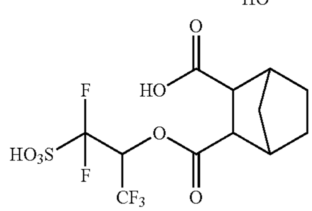
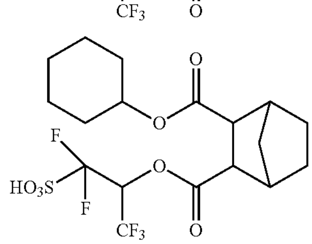
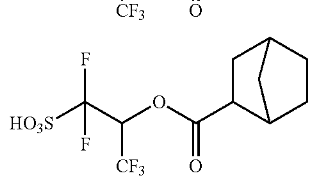

-continued
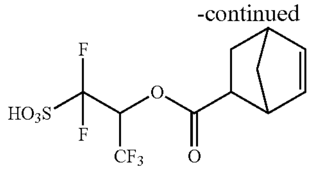
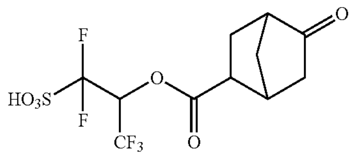
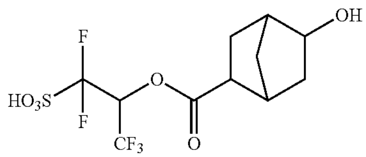
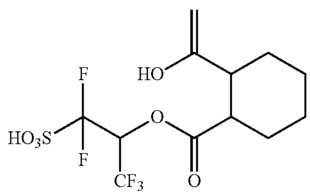
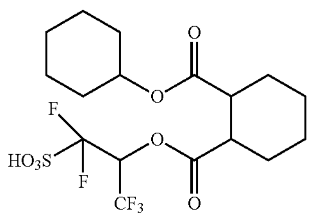
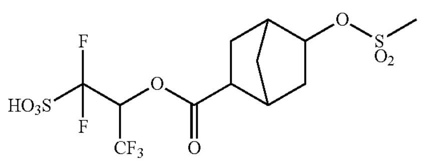
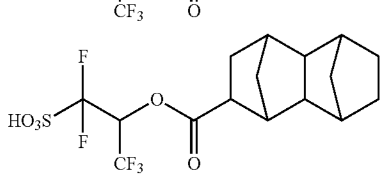
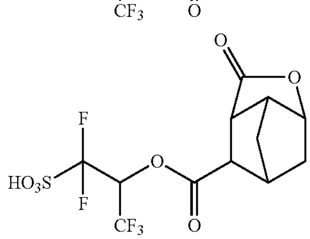
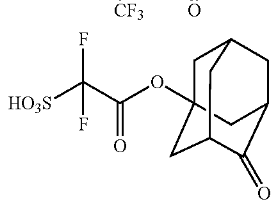
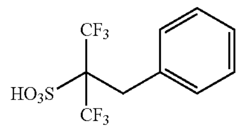
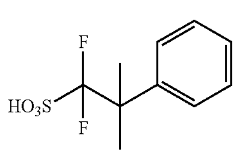
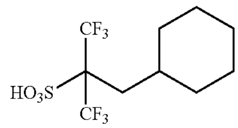
-continued
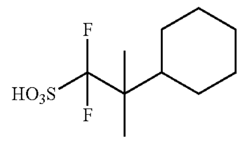
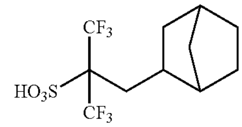
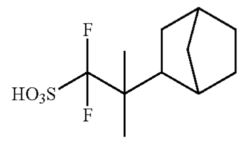
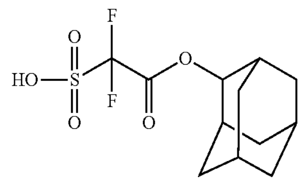
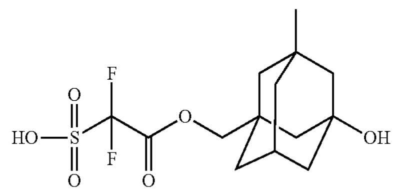
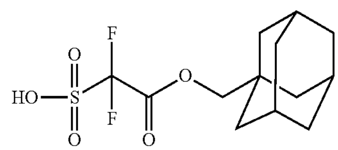
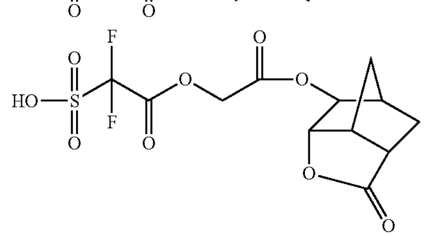
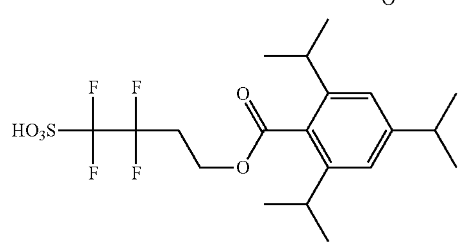
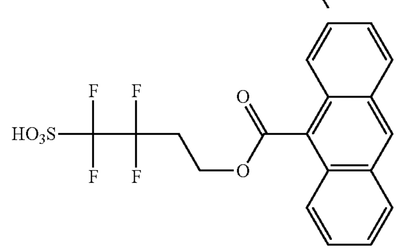
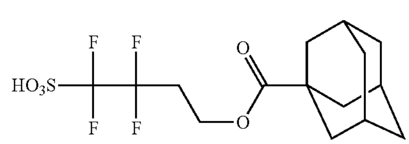
Among these specific examples, more preferred are the acids shown below.

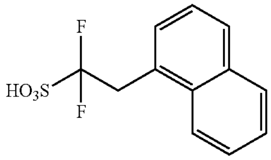
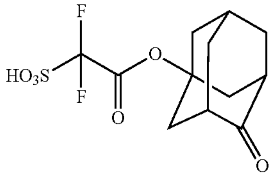
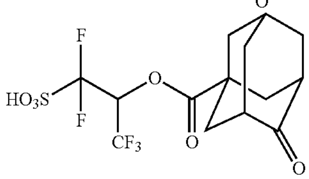
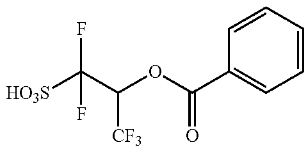
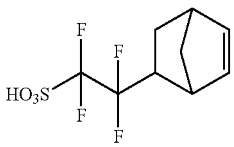
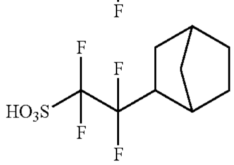
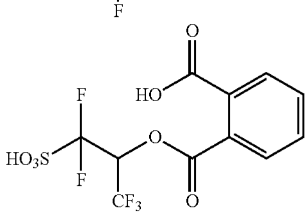
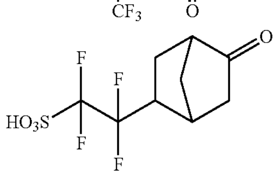
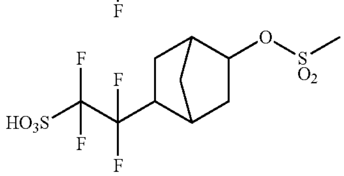
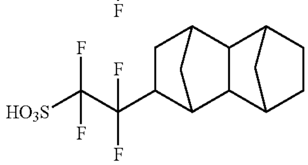
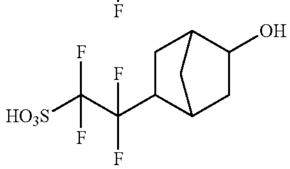
-continued
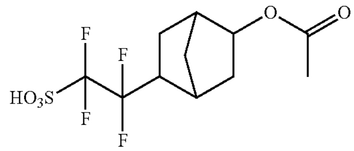
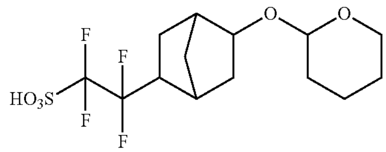
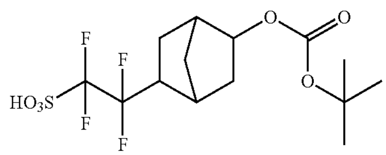
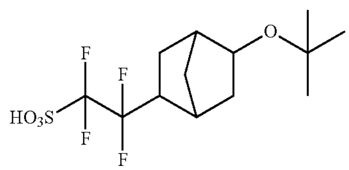
Out of the compounds capable of generating an acid upon irradiation with an actinic ray or radiation, particularly preferred examples are set forth below.
(z1)
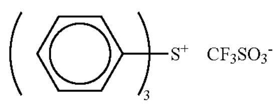
(z2)
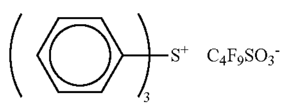
(z3)
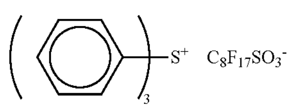
(z4)
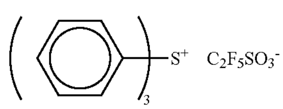
(z5)
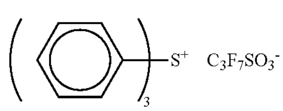
(z6)
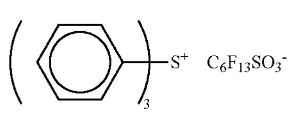

-continued
(z7)
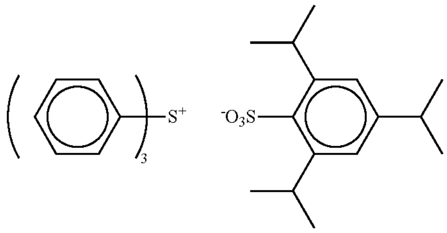
(z8)
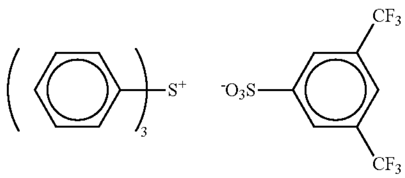
(z9)
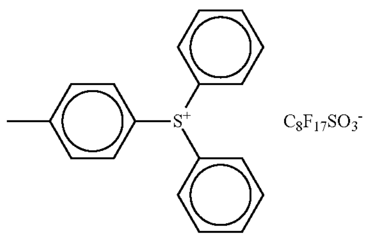
(z10)
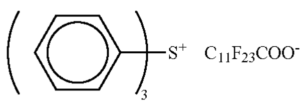
(z11)
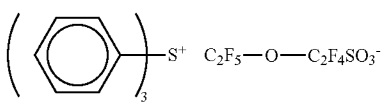
(z12)
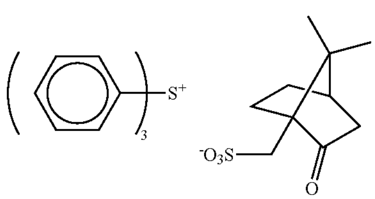
(z13)
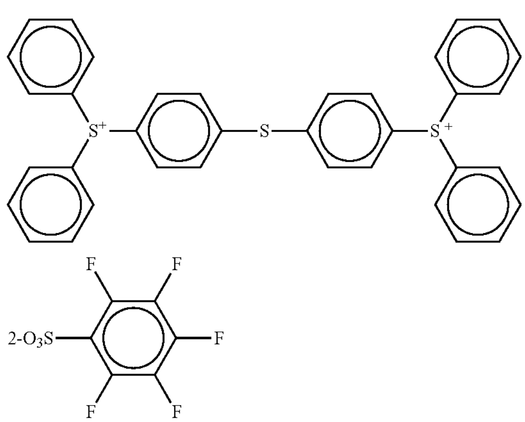
-continued
(z14)
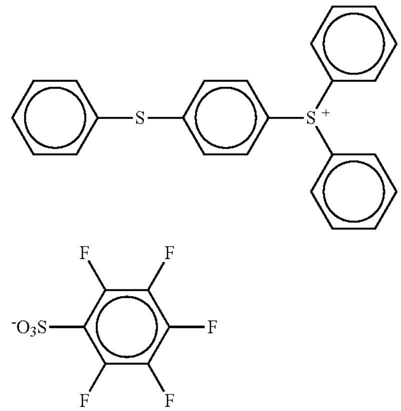
(z15)
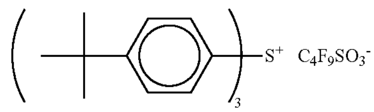
(z16)
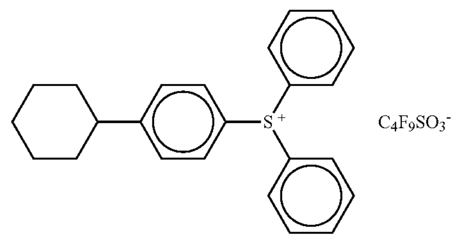
(z17)
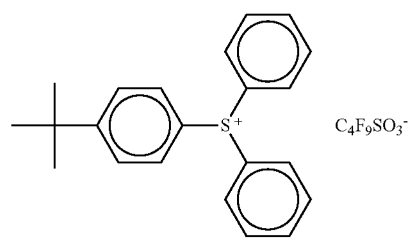
(z18)
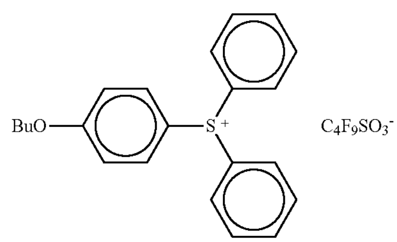
(z19)
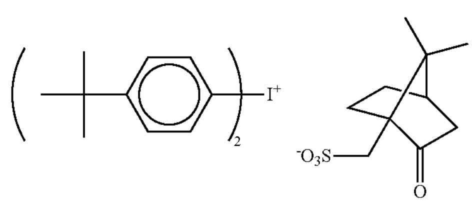
(z20)
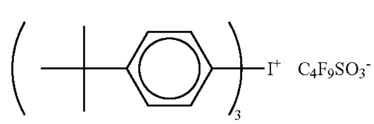

-continued
(z21)
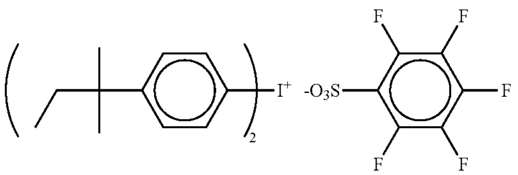
(z22)
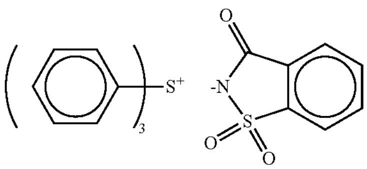
(z23)
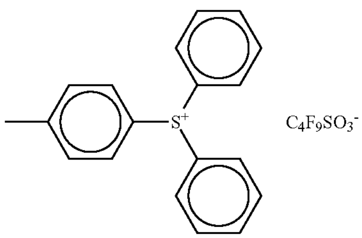
(z24)
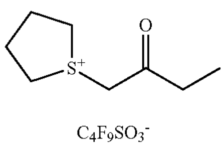
(z25)
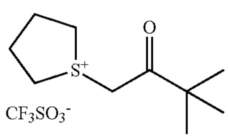
(z26)
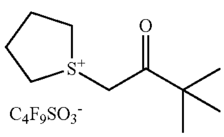
(z27)
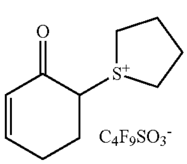
(z28)
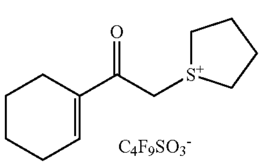
(z29)
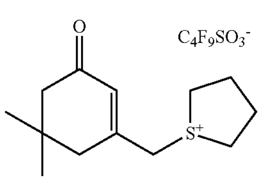
-continued
(z30)
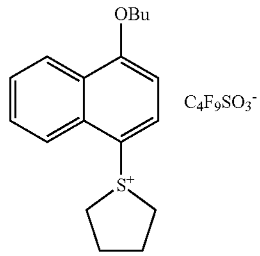
(z31)
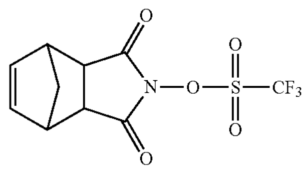
(z32)
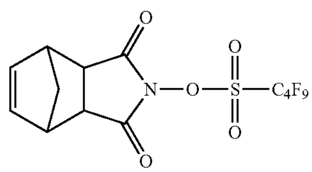
(z33)
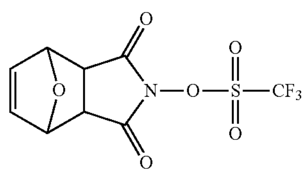
(z34)
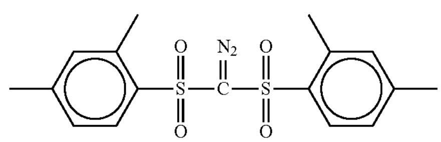
(z35)
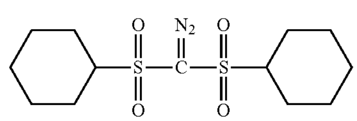
(z36)
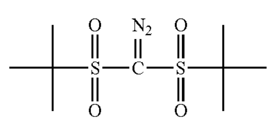
(z37)
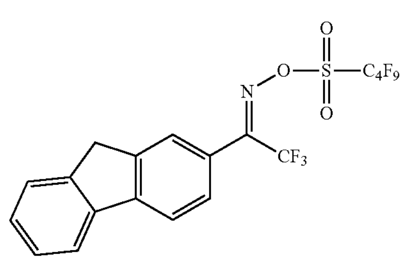

-continued
(z38)
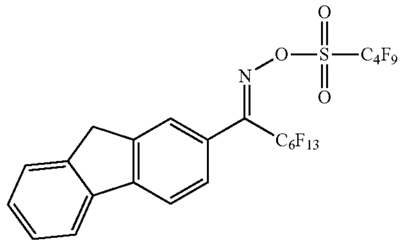
(z39)
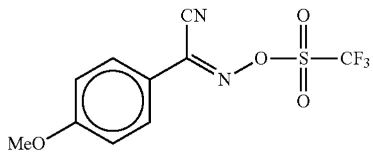
(z40)
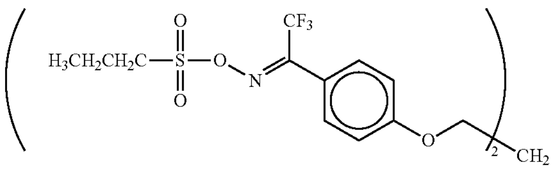
(z41)
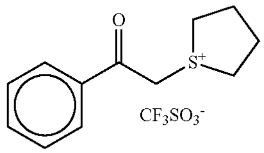
(z42)
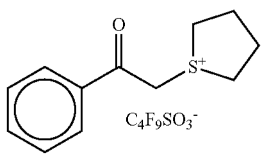
(z43)
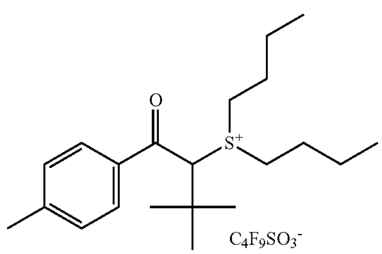
(z44)
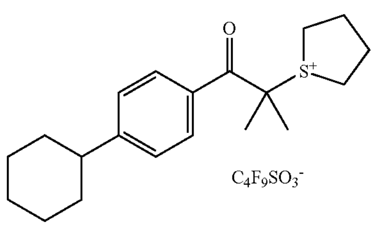
(z45)
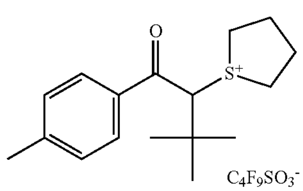
-continued
(z46)
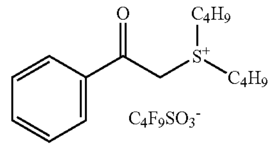
(z47)
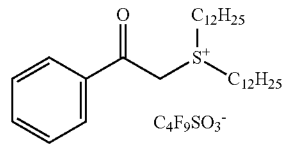
(z48)
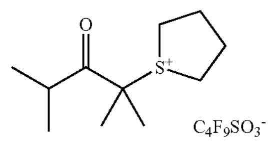
(z49)
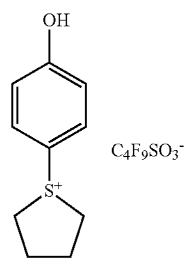
(z50)
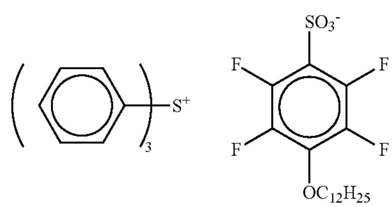
(z51)
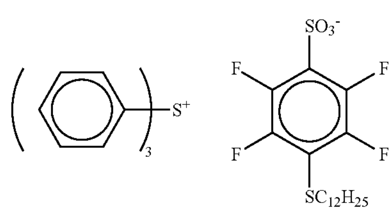
(z52)
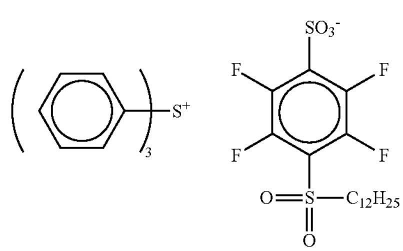
(z53)
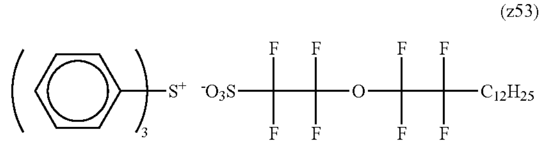
(z54)
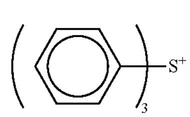

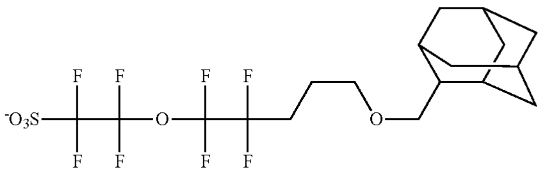
(z55)
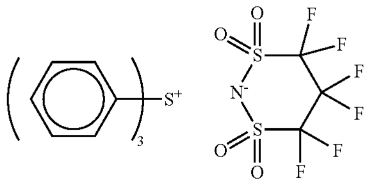
(z56)
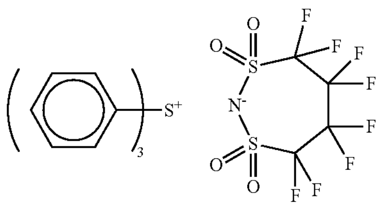
(z57)
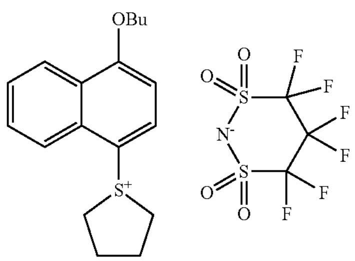
(z58)
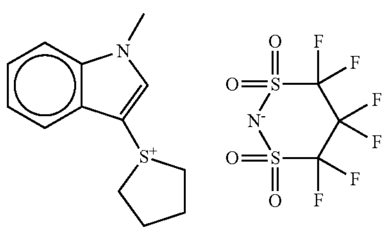
(z59)
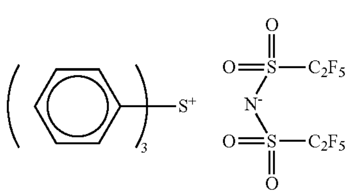
(z60)
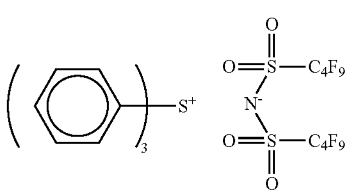
(z61)
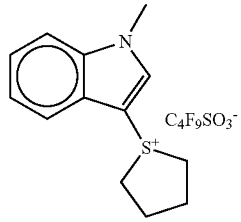
(z62)
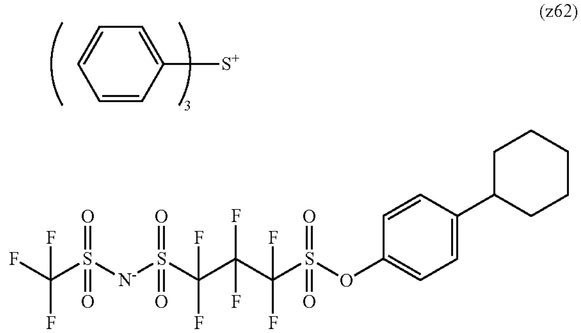
(z63)
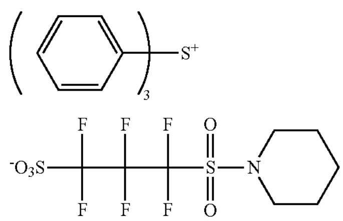
(z64)
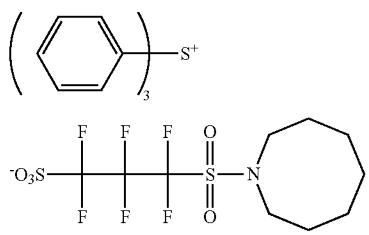
(z65)
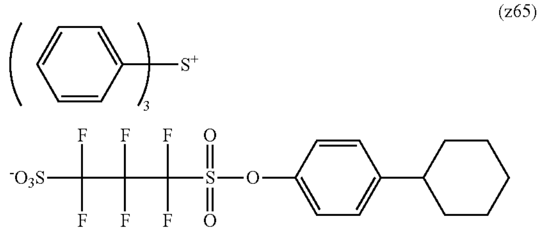
(z66)
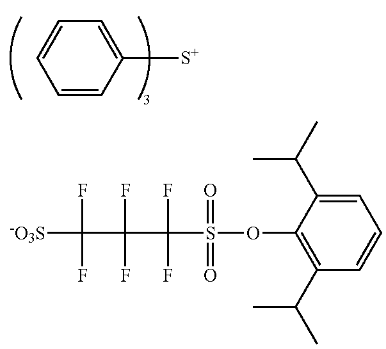

-continued
(z67)
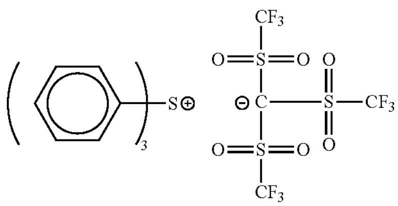
(z68)
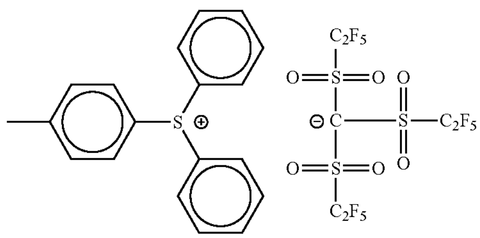
(z69)
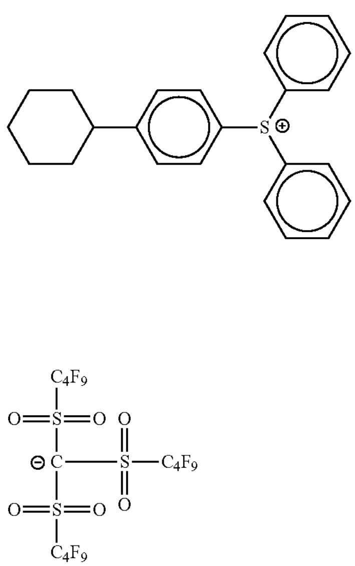
(z70)
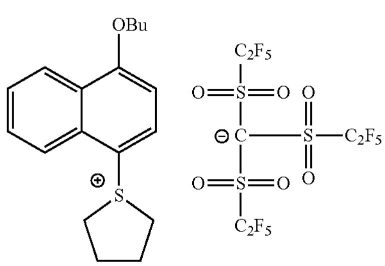
(z71)
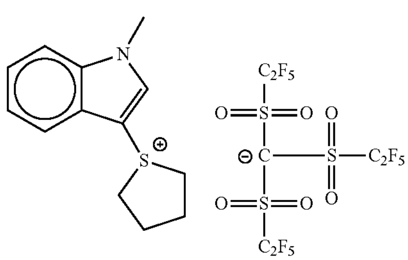
-continued
(z72)
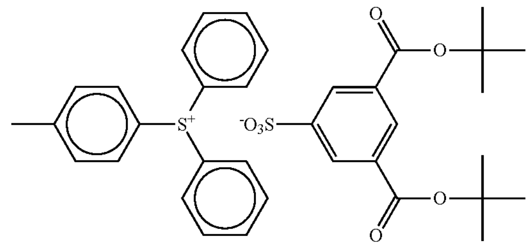
(z73)
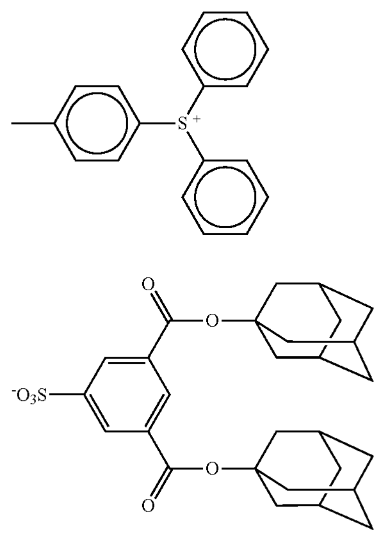
(z74)
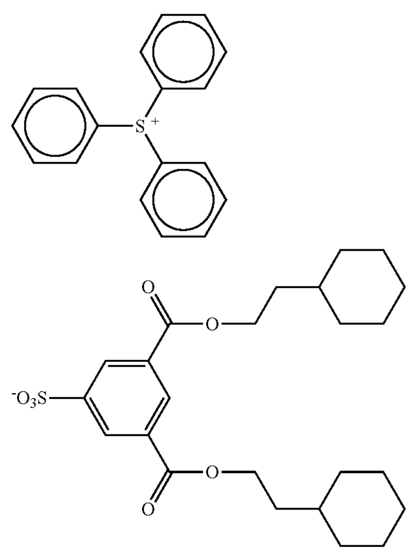
(z75)
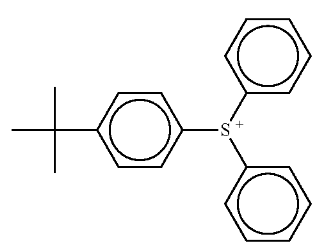

-continued

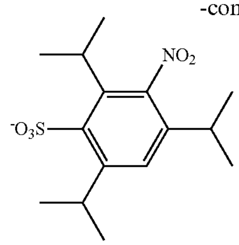

(z76)

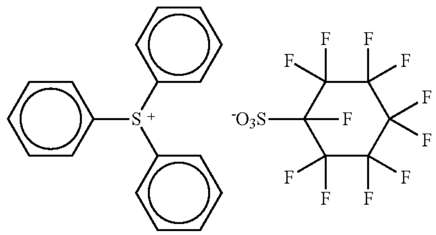

(z77)

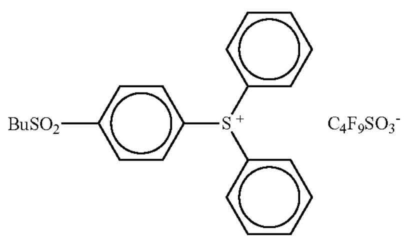

(z78)

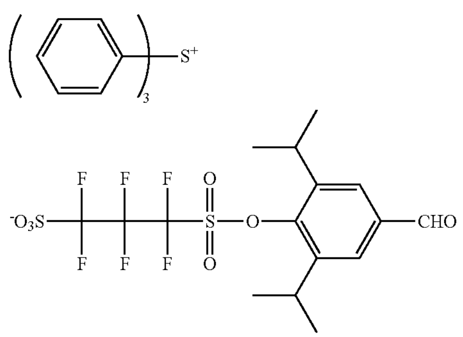

As for the photo-acid generator, one kind may be used alone, or two or more kinds may be used in combination. In the case of using two or more kinds of photo-acid generators in combination, compounds capable of generating two kinds of organic acids differing in the number of all atoms excluding hydrogen atom by 2 or more are preferably combined.

The content of the photo-acid generator is preferably from 0.1 to 20 mass %, more preferably from 0.5 to 10 mass %, still more preferably from 1 to 7 mass %, based on the entire solid content of the resist composition for organic solvent-based development.

As for the photo-acid generator, (B') a compound capable of generating an acid having a log P value of 1.5 to 12.0 upon irradiation with an actinic ray or radiation is preferred.

In the present invention, the log P value of the acid generated from the compound capable of generating an acid upon irradiation with an actinic ray or radiation is from 1.5 to 12.0, preferably from 2.0 to 11.0, more preferably from 2.5 to 10.5.

By setting the log P value to be from 1.5 to 12.0, in the pattern formation by organic solvent-based development using an organic solvent-containing developer (preferably an organic solvent), a pattern improved in the line edge roughness and excellent in the in-plane uniformity of line width as well as in the bridge margin can be obtained. The reasons therefor are not clearly known, but it is presumed that with a log P value in the range above, dissolution of the generated acid and photo-acid generator in an organic solvent-containing developer proceeds more uniformly and smoothly. More specifically, when the log P value is set to 12.0 or less, the hydrophobicity of the generated acid and the anion part of the photo-acid generator is considered to be optimized to an appropriate range, as a result, in the organic solvent-based development step, the generated acid or photo-acid generator is prevented from hydrophobic aggregation with each other and the development is allowed to uniformly proceed, whereby the above-described good performances can be obtained. On the other hand, when the log P value is set to 1.5 or more, the generated acid and photo-acid generator are considered to satisfactorily dissolve in the organic solvent-containing developer, as a result, precipitation of an insoluble matter is suppressed and the above-described good performances can be obtained. Furthermore, by virtue of setting the log P value to be from 1.5 to 12.0, a pattern with good bridge margin can be obtained, and this is presumed to result because enhancement of development uniformity makes the line pattern difficult to swell, as a result, bridging between patterns is reduced and the bridge margin is improved.

The problem of line edge roughness or in-plane uniformity of line width is similarly pointed out also in the pattern forming method using an alkali developer, but these are a performance greatly susceptible to solubility of the resist composition at the development and when an organic solvent-containing developer (preferably an organic solvent) is used, the optimal range of the photo-acid generator suitably used in a resist composition is considered to naturally vary.

Here, the log P value is a logarithm of octanol/water partition coefficient and is known as an important parameter indicative of the hydrophilicity/hydrophobicity of a molecule. The methods for determining the log P value of a compound are roughly classified into a method of actually measuring the value by experiment and a method of determining the value by computation.

The calculation method of the log P value is described below. In the case of actually measuring the log P value, the value can be actually measured and determined by the method described in the publication below. Also, in the case of calculating the log P value by computation, the log P value calculated by computation (referred to as C Log P value) can be determined by computation using the fragment method described in the publication below or using the following commercially available software package 1 or 2. In the context of the present invention, this C Log P value is used whenever the log P value is discussed, and the numerical value of log P value set forth in the specification is a numerical value of "C Log P value" computed using the following software package 2.

Publication: C. Hansch and A. Leo, Substituent Constants for Correlation Analysis in Chemistry and Biology, John Wiley & Sons, New York (1969)

Software package 1: MedChem Software (Release 3.54, August 1991, Medicinal Chemistry Project, Pomona College, Claremont, Calif.)

Software package 2: Chem Draw Ultra ver. 8.0 (April 2003, CambridgeSoft Corporation, USA)

The compound capable of generating an acid having a log P value of 1.5 to 12.0 is preferably a compound containing in its anion structure a group having a non-fluorine-substituted hydrocarbon skeleton having a carbon number of 2 or more. Thanks to this compound, in the pattern formation by organic solvent-based development using an organic solvent-containing developer (preferably an organic solvent), the line edge roughness is more improved and the in-plane uniformity of line width and the bridge margin become better. The compound is more preferably a compound containing in its anion structure a group having a non-fluorine-substituted hydrocarbon skeleton having a carbon number of 3 or more, still more preferably a compound containing in its anion structure a group having a non-fluorine-substituted hydrocarbon skeleton having a carbon number of 4 or more.

Examples of the group having a non-fluorine-substituted hydrocarbon skeleton having a carbon atom of 2 or more include a linear, branched or cyclic alkyl group, an alkoxy group, an alkoxycarbonyl group, an alkylthio group, an acylamino group, an oxoalkyl group, an alkylsulfonyloxy group, an alkylsulfonyl group, an alkylsulfonylamino group and an alkylaminosulfonyl group each having a non-fluorine-substituted hydrocarbon structure having a carbon number of 2 or more. The group may also be a divalent or trivalent linking group having a non-fluorine-substituted hydrocarbon skeleton having a carbon number of 2 or more.

Preferred examples of the group having a non-fluorine-substituted hydrocarbon skeleton having a carbon atom of 2 or more include:

a non-fluorine-substituted alkyl group such as ethyl group, isopropyl group, n-butyl group, isobutyl group, tert-butyl group, n-pentyl group, cyclopentyl group, neopentyl group, tert-amyl group, n-hexyl group, cyclohexyl group, n-octyl group, n-dodecyl group, n-hexadecyl group, n-octadecyl group, 2-ethylhexyl group, adamantyl group, norbornyl group, menthyl group, adamantylmethyl group, adamantylethyl group and cyclohexylethyl group;

a non-fluorine-substituted alkoxy group such as ethoxy group, isopropoxy group, n-butoxy group, isobutoxy group, tert-butoxy group, n-pentyloxy group, cyclopentyloxy group, neopentyloxy group, tert-amyloxy group, n-hexyloxy group, cyclohexyloxy group, n-octyloxy group, n-dodecyloxy group, n-hexadecyloxy group, n-octadecyloxy group, 2-ethylhexyloxy group, adamantyloxy group, norbornyloxy group, menthyloxy group, adamantylmethoxy group, adamantylethoxy group and cyclohexylethoxy group;

an alkoxycarbonyl group where the alkoxy group above is linked with a carbonyl group;

an alkylthio group where the oxygen atom of the alkoxy group above is replaced by a sulfur atom;

an oxoalkyl group where an oxo group is substituted at an arbitrary position of the alkyl group above, an acylamino group where the alkyl group above is linked with a —C(=O)N($Rx_1$)-group (wherein $Rx_1$ represents a hydrogen atom or an alkyl group);

an alkylsulfonyloxy group where the alkyl group above is linked with an —$SO_2O$— group;

an alkylsulfonyl group where the alkyl group above is linked with an —$SO_2$— group;

an alkylsulfonylamino group where the alkyl group above is linked with an —$SO_2N(Rx_1)$-group (wherein $Rx_1$ represents a hydrogen atom or an alkyl group); and an alkylaminosulfonyl group represented by $(Rx_1)(Rx_2)NSO_2$— (wherein $Rx_1$ represents a hydrogen atom or an alkyl group, $Rx_2$ represents a non-fluorine-substituted alkyl group having a carbon number of 2 or more, and $Rx_1$ and $Rx_2$ may combine to form a monocyclic or polycyclic ring structure having a non-fluorine-substituted hydrocarbon skeleton having a carbon number of 2 or more).

The non-fluorine-substituted skeleton having a carbon number of 2 or more may be present at any position in the molecule but is preferably present at the molecular end.

Examples of the compound that contains in its anion structure a group having a non-fluorine-substituted hydrocarbon skeleton having a carbon number of 2 or more and generates an acid having a log P value of 1.5 to 12.0 include the following acid-generating compounds, but the present invention is not limited thereto.

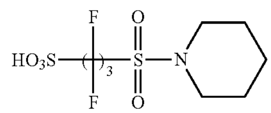

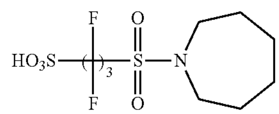

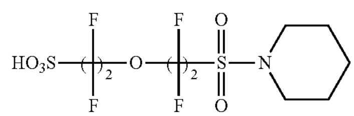

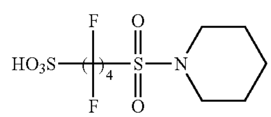

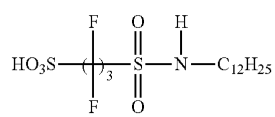

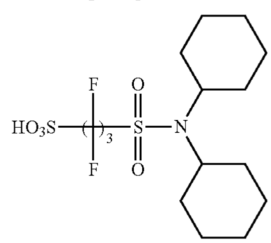

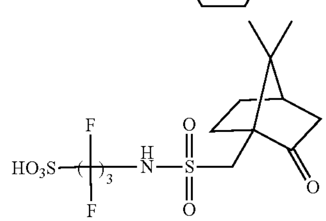

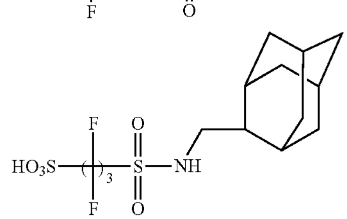

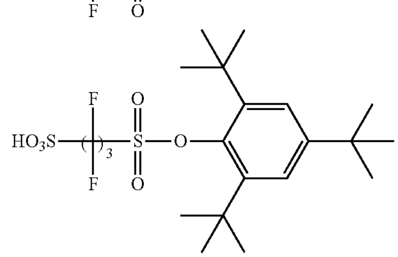

-continued

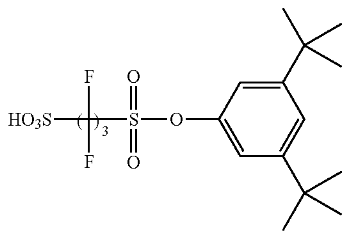

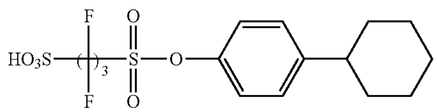

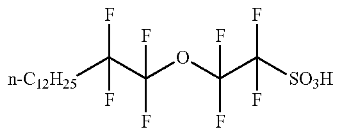

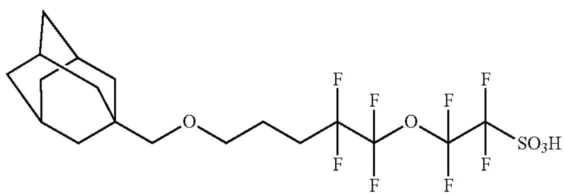

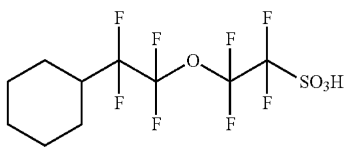

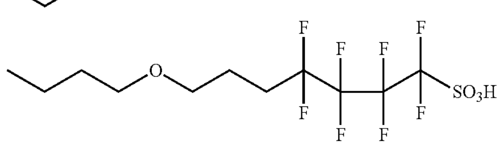

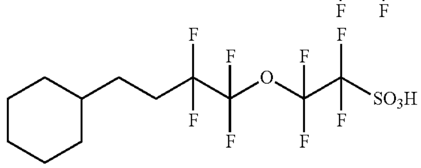

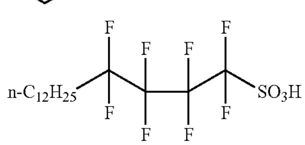

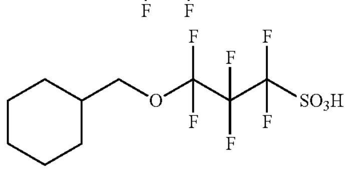

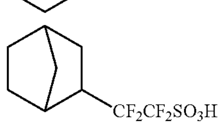

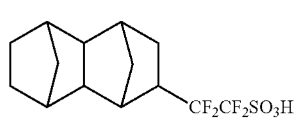

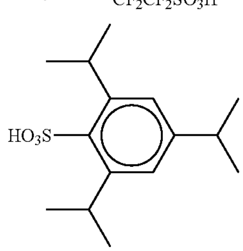

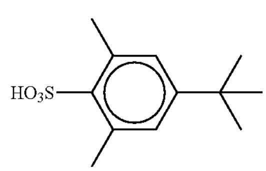

-continued

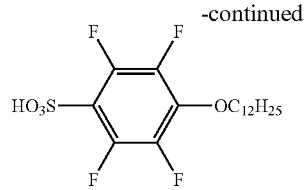

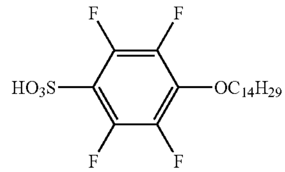

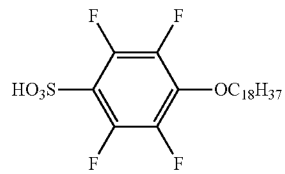

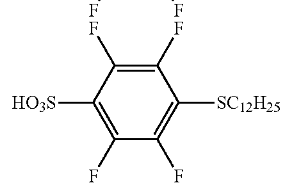

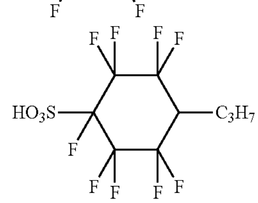

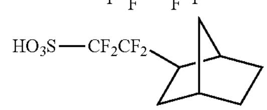

Another preferred embodiment of the compound capable of generating an acid having a log P value of 1.5 to 12.0 is a compound capable of generating a sulfonic acid represented by the following formula (I) or (I'):

$$HO_3S-A_1-A_2-\overset{O}{\underset{O}{\overset{\|}{\underset{\|}{S}}}}-A_3-A_4-Ra \tag{I}$$

$$(HO_3S-A_1-A_2-\overset{O}{\underset{O}{\overset{\|}{\underset{\|}{S}}}}-A_3-A_4\!)_n\!-Rb \tag{I'}$$

In formulae (I) and (I'), $A_1$ represents a divalent linking group, each of $A_2$ and $A_3$ independently represents a single bond, an oxygen atom or —N(Rxb)-, Rxb represents a hydrogen atom, an aryl group, an alkyl group or a cycloalkyl group, $A_4$ represents a single bond or —C(=O)—, Ra represents a hydrogen atom or an organic group, n represents 2 or 3, Rb represents an n-valent linking group, and when $A_3$ is —N(Rxb)-, Ra and Rxb, or Rb and Rxb may combine to form a ring.

The divalent linking group as $A_1$ is preferably an organic group having a carbon number of 1 to 20, more preferably an alkylene group (preferably having a carbon number of 1 to 10, more preferably a carbon number of 2 to 6, still more preferably a carbon number of 3 to 4). The alkylene chain may contain a linking group such as oxygen atom, sulfur atom, —C(=O)— group and ester group.

The divalent linking group as $A_1$ is still more preferably an alkylene group substituted by a fluorine atom, yet still more preferably an alkylene group where from 30 to 100% by number of the hydrogen atom is replaced by a fluorine atom. In the case of an alkylene group substituted by a fluorine atom, the carbon atom bonded to the —$SO_3H$ group preferably has a fluorine atom. A perfluoroalkylene group is preferred, and a perfluoroethylene group, a perfluoropropylene group and a perfluorobutylene group are most preferred.

The aryl group in Rxb may have a substituent and is preferably an aryl group having a carbon number of 6 to 14, and examples thereof include a phenyl group and a naphthyl group.

The alkyl group as Rxb may have a substituent and is preferably a linear or branched alkyl group having a carbon number of 1 to 20, and the alkyl chain may contain an oxygen atom. Specifically, the alkyl group includes a linear alkyl group such as methyl group, ethyl group, n-propyl group, n-butyl group, n-pentyl group, n-hexyl group, n-octyl group, n-dodecyl group, n-tetradecyl group and n-octadecyl group, and a branched alkyl group such as isopropyl group, isobutyl group, tert-butyl group, neopentyl group and 2-ethylhexyl group.

Incidentally, the alkyl group having a substituent includes particularly a group where a cycloalkyl group is substituted on a linear or branched alkyl group (for example, an adamantylmethyl group, an adamantylethyl group, a cycohexylethyl group and a camphor residue).

The cycloalkyl group as Rxb may have a substituent and is preferably a cycloalkyl group having a carbon number of 3 to 20, and the cycloalkyl group may contain an oxygen atom in the ring. Specific examples thereof include a cyclopropyl group, a cyclopentyl group, a cyclohexyl group, a norbornyl group and an adamantyl group.

Ra represents a hydrogen atom or a monovalent organic group.

The monovalent organic group as Ra preferably has a carbon number of 1 to 20, and examples thereof include an alkyl group, a cycloalkyl group, an aryl group, an aralkyl group and an alkenyl group.

Examples of the alkyl group, cycloalkyl group and aryl group as Ra are the same as those for Rxb.

The aralkyl group as Ra is preferably an aralkyl group having a carbon number of 7 to 20, and examples thereof include a benzyl group, a phenethyl group, a naphthylmethyl group and a naphthylethyl group.

The alkenyl group as Ra includes a group having a double bond at an arbitrary position of the alkyl group described for Rxb.

The n-valent linking group as Rb preferably has a carbon number of 1 to 20. In the case of n=2 in formula (I'), examples of the divalent linking group as Rb include an alkylene group (preferably having a carbon number of 1 to 20), an arylene group (preferably having a carbon number of 6 to 10), an aralkylene group (preferably having a carbon number of 7 to 13) and an alkenylene group (preferably having a carbon number of 2 to 12). These groups each may have a substituent.

In the case of n=3, examples of the trivalent linking group as Rb include a trivalent group resulting from removing an arbitrary hydrogen atom of the divalent linking group above.

When $A_3$ is —N(Rxb)-, the ring formed by combining Ra and Rxb or combining Rb and Rxb is preferably a nitrogen atom-containing ring having a carbon umber of 4 to 10 and may be either monocyclic or polycyclic. Also, the ring may contain an oxygen atom.

Examples of the substituent which the groups above each may have include a halogen atom, a hydroxyl group, a nitro group, a cyano group, a carboxy group, a cycloalkyl group (preferably having a carbon number of 3 to 20), an aryl group (preferably having a carbon number of 6 to 14), an alkoxy group (preferably having a carbon number of 1 to 20), an acyl group (preferably having a carbon number of 2 to 20), and an acyloxy group (preferably having a carbon number of 2 to 20). As for the cyclic structure in the aryl group, cycloalkyl group and the like, examples of the substituent further include an alkyl group (preferably having a carbon number of 1 to 20).

The sulfonic acid of formula (I) or (I') is preferably a sulfonic acid group represented by any one of the following formulae (IA) to (IC) and (I'A) to (I'C):

(IA)

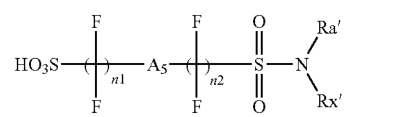

(IB)

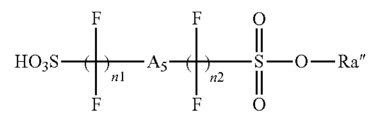

(IC)

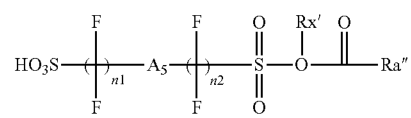

(I'A)

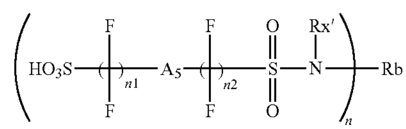

(I'B)

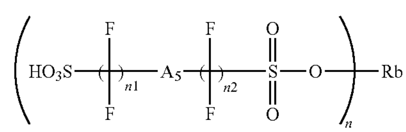

(I'C)

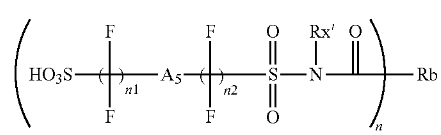

In formulae (IA) to (IC) and (I'A) to (I'C), Ra' has the same meaning as Ra in formula (I), Rb and n have the same meanings as Rb and n in formula (I'), Ra" represents an alkyl group, an aryl group, an aralkyl group or an alkenyl group, Rx' has the same meaning as Rxb in formulae (I) and (I'), n1 represents an integer of 1 to 10, n2 represents an integer of 0 to 10, and $A_5$ represents a single bond, —O—, an alkylene group, a cycloalkylene group, an arylene group, a sulfonyl group, —NH—, a divalent linking group derived from a heterocycle, or a divalent linking group composed by combining two or more thereof.

The alkylene group and cycloalkylene group as $A_5$ are preferably a non-fluorine-substituted alkylene group and a non-fluorine-substituted cycloalkylene group, respectively.

The arylene group of $A_5$ includes an arylene group having a carbon number of 6 to 10 (e.g., phenylene).

The heterocycle for the divalent linking group derived from a heterocycle of $A_5$ includes a cycloalkyl group containing a nitrogen atom in the ring and having a carbon number of 2 to 8 (e.g., piperazine).

In formula (IA), Ra' and Rx' are preferably combined to form a ring. By virtue of forming a ring structure, the stability is enhanced and in turn, the storage stability of the composition using the compound is enhanced. The ring formed preferably has a carbon number of 4 to 20 and may be either monocyclic or polycyclic. The ring may contain an oxygen atom.

Examples of the alkyl group, aryl group, aralkyl group and alkenyl group as Ra" are the same as those of the alkyl group, aryl group, aralkyl group and alkenyl group as Ra.

n1+n2 is preferably from 2 to 8, more preferably from 2 to 6.

Specific preferred examples of the sulfonic acid represented by formula (I) or (I') are set forth below, but the present invention is not limited thereto.

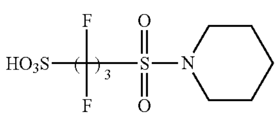

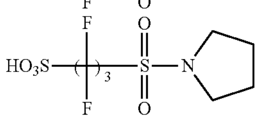

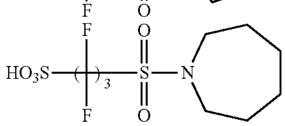

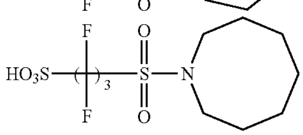

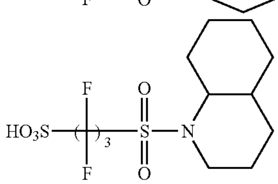

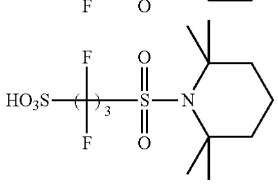

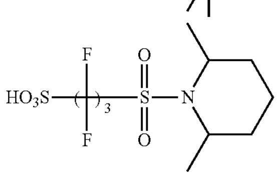

-continued

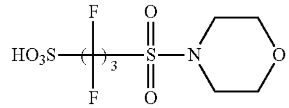

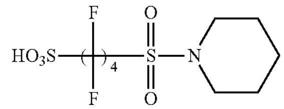

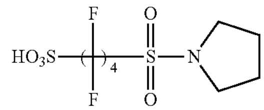

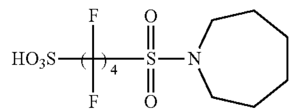

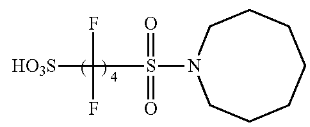

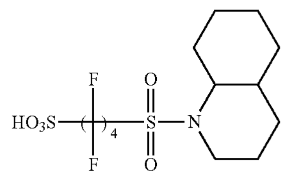

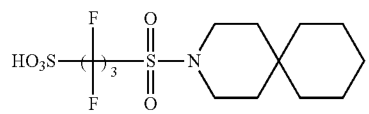

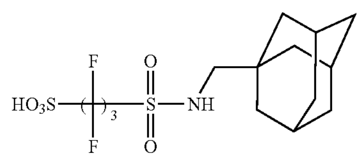

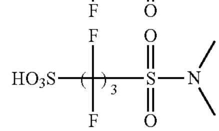

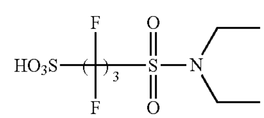

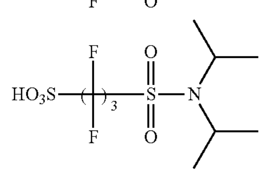

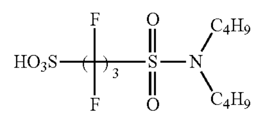

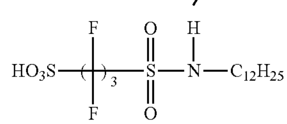

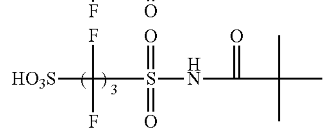

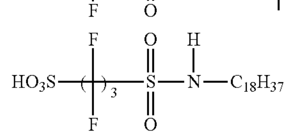

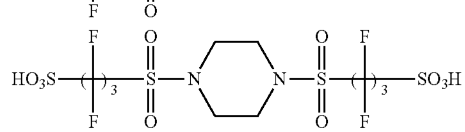

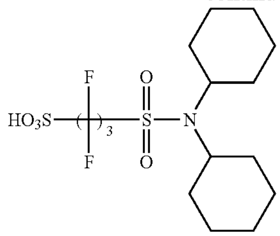
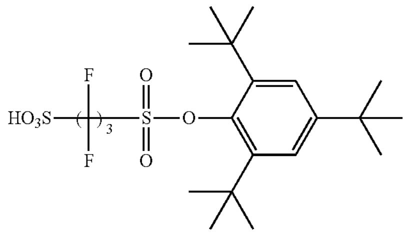
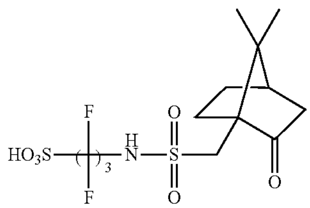
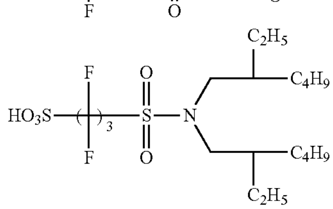
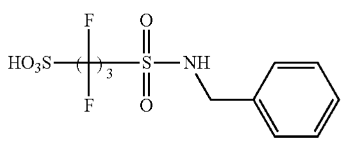
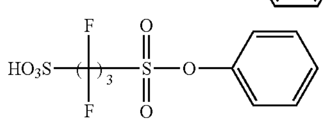
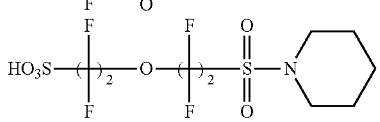
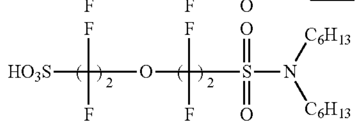
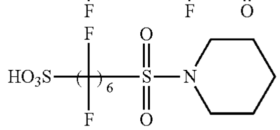
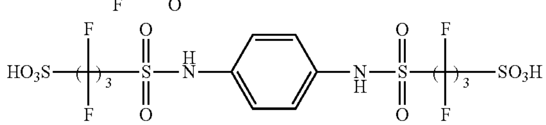
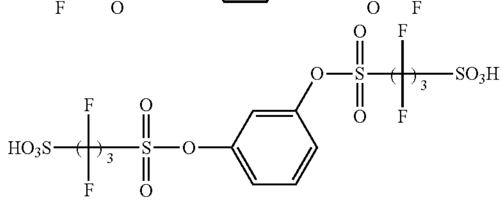
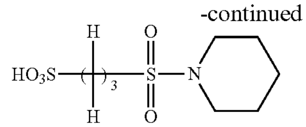
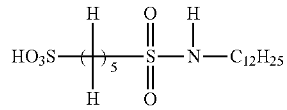
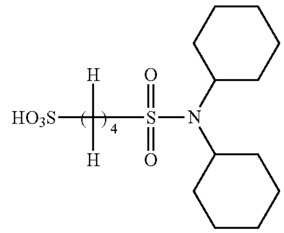
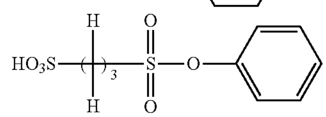
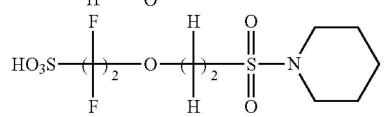
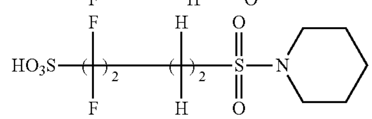
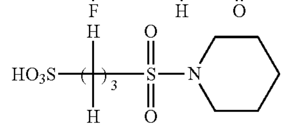
Among these, a compound having in its anion structure a non-fluorine-substituted hydrocarbon skeleton having a carbon number of 2 or more is more preferred.
Examples thereof include the following compounds, but the present invention is not limited thereto.
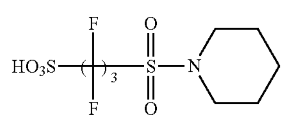
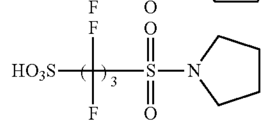
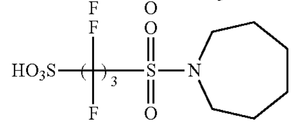
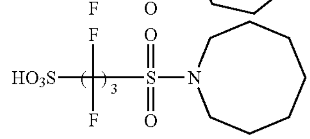
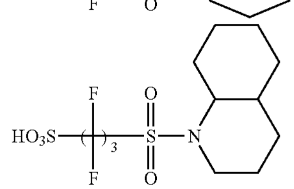

-continued
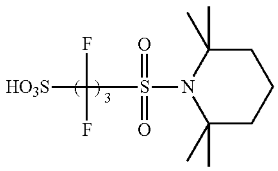
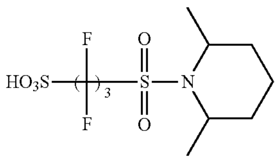
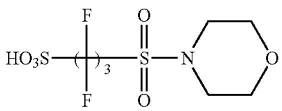
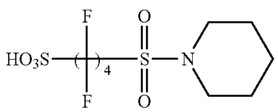
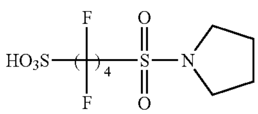
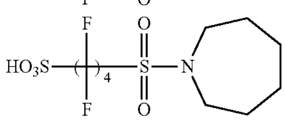
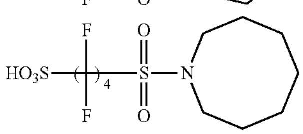
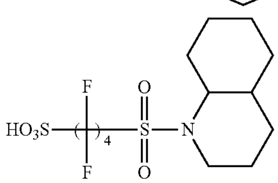
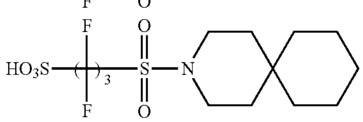
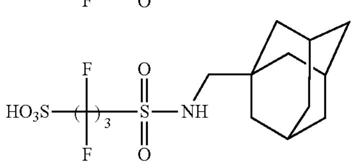
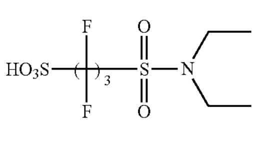
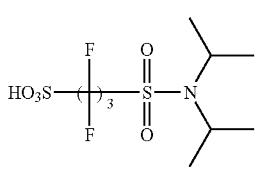
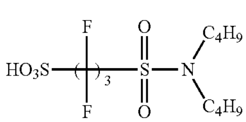
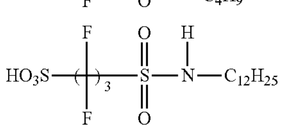
-continued
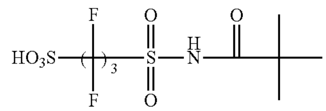
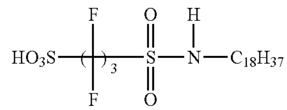
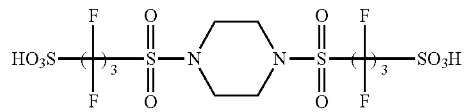
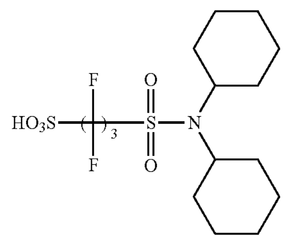
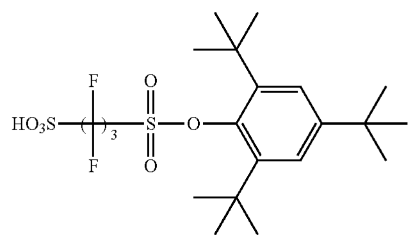
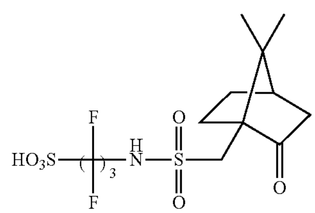
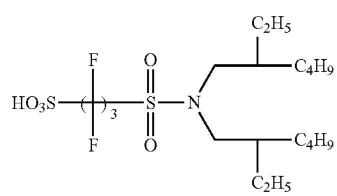
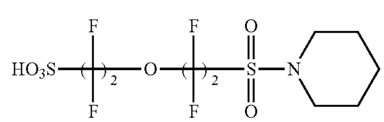
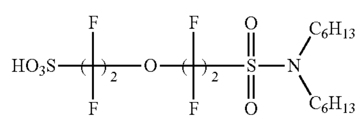
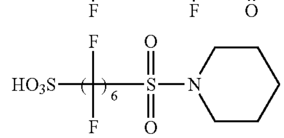
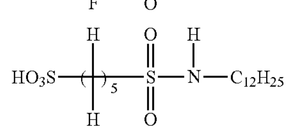

-continued

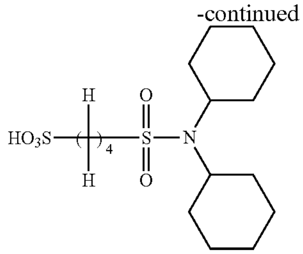

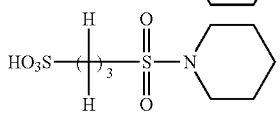

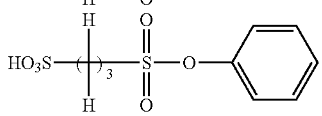

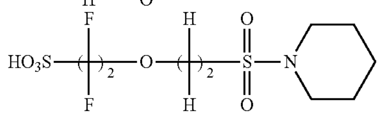

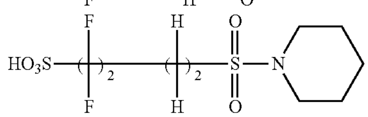

Still another preferred embodiment of the compound capable of generating an acid having a log P value of 1.5 to 12.0 is a compound capable of generating a sulfonic acid represented by the following formula (II):

(II)

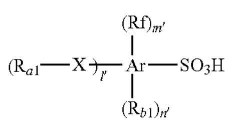

In formula (II), Rf represents a fluorine atom or a fluorine atom-containing organic group, each of $R_{a1}$ and $R_{b1}$ independently represents an organic group, Ar represents an aromatic group, X represents —SO—, —$SO_2$—, —S— or —O—, l' represents an integer of 0 to 6, m' represents an integer of 0 to 5, and n' represents an integer of 0 to 5.

In formula (II), examples of the organic group of $R_{a1}$ and $R_{b1}$ include an alkyl group, an aryl group, a cycloalkyl group, an alkoxy group, an aryloxy group, an aralkyl group, an aralkyloxy group, a cycloalkoxy group, an alkoxycarbonyl group, an aryloxycarbonyl group, an acyloxy group, an alkylthio group, an arylthio group, an acyl group, an acylamino group, an alkenyl group, an alkenyloxy group, an arylcarbonyloxy group, an alkylcarbonyloxy group, an alkylaminocarbonyl group, an alkylcarbonylamino group, an alkylsilyloxy group and a cyano group. A plurality of these organic groups may be linked together through a single bond, an ether bond, an ester bond, an amido bond, a sulfide bond, a urea bond or the like. The organic group of $R_{a1}$ and $R_{b1}$ preferably has a carbon number of 2 to 30, more preferably a carbon number of 4 to 30, still more preferably a carbon number of 6 to 30, a yet still more preferably a carbon number of 8 to 24.

The alkyl group as the organic group of $R_{a1}$ and $R_{b1}$ is preferably a linear or branched alkyl group having a carbon number of 1 to 30, and examples thereof include a methyl group, an ethyl group, a propyl group, an isopropyl group, an n-butyl group, a sec-butyl group, a tert-butyl group, a hexyl group, a heptyl group, an octyl group, a nonyl group, a decyl group, an undecyl group and a dodecyl group. The alkyl group may have a substituent. Preferred examples of the substituent of the alkyl group include an alkoxy group, a cycloalkyl group, an acyl group, an acyloxy group, a chlorine atom, a bromine atom, an iodine atom, a hydroxyl group and a carboxyl group.

Examples of the aryl group as the organic group of $R_{a1}$ and $R_{b1}$ include a phenyl group, a tolyl group, a mesityl group and a naphthyl group. Preferred examples of the substituent of the aryl group include an alkyl group, a cycloalkyl group, an alkoxy group, an acyloxy group, an acyl group, a formyl group, a nitro group, an acylamino group, a sulfonylamino group, a halogen atom, an aryl group, an alkoxycarbonyl group, a chlorine atom, a bromine atom, an iodine atom, a hydroxyl group, a carboxyl group and a cyano group.

The cycloalkyl group as the organic group of $R_{a1}$ and $R_{b1}$ is preferably a monocyclic or polycyclic cycloalkyl group having a carbon number of 3 to 30, and examples thereof include a cyclopropyl group, a cyclobutyl group, a cyclopentyl group, a cyclohexyl group, a norbornyl group and an adamantyl group. The cycloalkyl group may have a substituent. Preferred examples of the substituent of the cycloalkyl group include an alkyl group, a cycloalkyl group, an alkoxy group, an acyl group, an acyloxy group, a chlorine atom, a bromine atom, an iodine atom, a hydroxyl group and a carboxyl group.

The alkoxy group as the organic group of $R_{a1}$ and $R_{b1}$ is preferably a linear or branched alkoxy group having a carbon number of 1 to 30, and examples thereof include a methoxy group, an ethoxy group, a propoxy group, an isopropoxy group, an n-butoxy group, an isobutoxy group, a sec-butoxy group, a tert-butoxy group, a hexyloxy group, a heptyloxy group, an octyloxy group, a nonyloxy group, a decyloxy group, an undecyloxy group and a dodecyloxy group. The alkoxy group may have a substituent. Preferred examples of the substituent of the alkoxy group include an alkoxy group, an aryl group, an acyl group, an acyloxy group, a chlorine atom, a bromine atom, an iodine atom, a cycloalkyl group, a cycloalkoxy group, a siloxane group, a hydroxyl group and a carboxyl group.

The aryloxy group as the organic group of $R_{a1}$ and $R_{b1}$ is preferably an aryloxy group having a carbon number of 6 to 20, and examples thereof include a phenoxy group. The aryloxy group may have a substituent. Preferred examples of the substituent of the aryloxy group include an alkyl group, a cycloalkyl group, an alkoxy group, an acyl group, a formyl group, a nitro group, an acylamino group, a sulfonylamino group, a chlorine atom, a bromine atom, an iodine atom, an alkoxycarbonyl group, a cyano group, a hydroxyl group and a carboxyl group.

The aralkyl group as the organic group of $R_{a1}$ and $R_{b1}$ is preferably an aralkyl group having a carbon number of 7 to 12, and examples thereof include a benzyl group and a phenethyl group. The aralkyl group may have a substituent. Preferred examples of the substituent of the aralkyl group include an alkyl group, a cycloalkyl group, an alkoxy group, an acyl group, a formyl group, a nitro group, an acylamino group, a sulfonylamino group, a chlorine atom, a bromine atom, an iodine atom, an alkoxycarbonyl group, a cyano group, a hydroxyl group and a carboxyl group.

The aralkyloxy group is preferably an aralkyloxy group having a carbon number of 6 to 20, and examples of the aralkyloxy group include a benzyloxy group and a phenethyloxy group. The aralkyloxy group may have a substituent.

Preferred examples of the substituent of the aralkyloxy group include an alkyl group, a cycloalkyl group, an alkoxy group, an acyl group, a formyl group, a nitro group, an acylamino group, a sulfonylamino group, a chlorine atom, a bromine atom, an iodine atom, an alkoxycarbonyl group, a cyano group, a hydroxyl group and a carboxyl group.

The cycloalkoxy group as the organic group of $R_{a1}$ and $R_{b1}$ is preferably a monocyclic or polycyclic cycloalkoxy group having a carbon number of 3 to 30, and examples thereof include a cyclopropoxy group, a cyclobutoxy group, a cyclopentyloxy group, a cyclohexyloxy group, a norbornyloxy group, a menthyloxy group and an adamantyloxy group. The cycloalkoxy group may have a substituent. Preferred examples of the substituent of the cycloalkoxy group include an alkyl group, an alkoxy group, an acyl group, an acyloxy group, a chlorine atom, a bromine atom, an iodine atom, a hydroxyl group and a carboxyl group.

The alkoxycarbonyl group as the organic group of $R_{a1}$ and $R_{b1}$ is preferably an alkoxycarbonyl group having a carbon number of 2 to 30, and examples thereof include a methoxycarbonyl group, an ethoxycarbonyl group, a butoxycarbonyl group, an octyloxycarbonyl group and a dodecyloxycarbonyl group. The alkoxycarbonyl group may have a substituent. Preferred examples of the substituent of the alkoxycarbonyl group include an alkoxy group, an acyl group, an acyloxy group, a cycloalkyl group, a chlorine atom, a bromine atom, an iodine atom, a hydroxyl group and a carboxyl group.

The aryloxycarbonyl group as the organic group of $R_{a1}$ and $R_{b1}$ is preferably an aryloxycarbonyl group having a carbon number of 6 to 20, and examples thereof include a phenoxycarbonyl group. The aryloxycarbonyl group may have a substituent. Preferred examples of the substituent of the aryloxycarbonyl group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acyloxy group as the organic group of $R_{a1}$ and $R_{b1}$ is preferably an acyloxy group having a carbon number of 1 to 30, and examples thereof include an acetoxy group, a methylbutynoyloxy group, a methyldecynoyloxy group, a propionyloxy group, a butyryloxy group, a valeryloxy group, a palmitoyloxy group and a benzoyloxy group. The acyloxy group may have a substituent. Preferred examples of the substituent of the acyloxy group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The alkylthio group as the organic group of $R_{a1}$ and $R_{b1}$ is preferably an alkylthio group having a carbon number of 1 to 30, and examples thereof include a methylthio group, an ethylthio group, a propylthio group, an isopropylthio group, an n-butylthio group, a sec-butylthio group, a tert-butylthio group, a hexylthio group, a heptylthio group, an octylthio group, a nonylthio group, a decylthio group, an undecylthio group and a dodecylthio group. The alkylthio group may have a substituent. Preferred examples of the substituent of the alkylthio group include an alkoxy group, an acyl group, an acyloxy group, a cycloalkyl group, a chlorine atom, a bromine atom, an iodine atom, a hydroxyl group and a carboxyl group.

The arylthio group as the organic group of $R_{a1}$ and $R_{b1}$ is preferably an arylthio group having a carbon number of 6 to 20, and examples thereof include a phenylthio group. The arylthio group may have a substituent. Preferred examples of the substituent of the arylthio group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acyl group as the organic group of $R_{a1}$ and $R_{b1}$ is preferably an acyl group having a carbon number of 1 to 30, and examples thereof include an acetyl group, a propionyl group, a pivaloyl group, a butyryl group, a valeryl group, a palmitoyl group and a benzoyl group. The acyl group may have a substituent. Preferred examples of the substituent of the acyl group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acylamino group as the organic group of $R_{a1}$ and $R_{b1}$ is preferably an acylamino group having a carbon number of 1 to 30, and examples thereof include an acetylamino group, a propionylamino group, a pivaloylamino group, a butyrylamino group and a benzoylamino group. The acylamino group may have a substituent. Preferred examples of the substituent of the acylamino group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The alkenyl group as the organic group of $R_{a1}$ and $R_{b1}$ is preferably an alkenyl group having a carbon number of 2 to 30, and examples thereof include a vinyl group, a propenyl group and a butenyl group. The alkenyl group may have a substituent. Preferred examples of the substituent of the alkenyl group include an alkoxy group, an acyl group, an acyloxy group, a cycloalkyl group, a chlorine atom, a bromine atom, an iodine atom, a hydroxyl group and a carboxyl group.

The alkenyloxy group as the organic group of $R_{a1}$ and $R_{b1}$ is preferably an alkenyloxy group having a carbon number of 2 to 30, and examples thereof include a vinyloxy group, a propenyloxy group and a butenyloxy group. The alkenyloxy group may have a substituent. Preferred examples of the substituent of the alkenyloxy group include an alkoxy group, an acyl group, an acyloxy group, a cycloalkyl group, a chlorine atom, a bromine atom, an iodine atom, a hydroxyl group and a carboxyl group.

The arylcarbonyloxy group as the organic group of $R_{a1}$ and $R_{b1}$ is preferably an arylcarbonyloxy group having a carbon number of 7 to 20, and examples thereof include a phenylcarbonyloxy group. The arylcarbonyloxy group may have a substituent. Preferred examples of the substituent of the arylcarbonyloxy group include an alkyl group, a cycloalkyl group, an alkoxy group, an acyl group, a formyl group, a nitro group, an acylamino group, a sulfonylamino group, an alkoxycarbonyl group, a cyano group, a chlorine atom, a bromine atom, an iodine atom, a hydroxyl group and a carboxyl group.

The alkylcarbonyloxy group as the organic group of $R_{a1}$ and $R_{b1}$ is preferably an alkylcarbonyloxy group having a carbon number of 2 to 30, and examples thereof include a methylcarbonyloxy group, an ethylcarbonyloxy group, a propylcarbonyloxy group and a butylcarbonyloxy group. The alkylcarbonyloxy group may have a substituent. Preferred examples of the substituent of the alkylcarbonyloxy group include an alkoxy group, an acyl group, an acyloxy group, a cycloalkyl group, a chlorine atom, a bromine atom, an iodine atom, a hydroxyl group and a carboxyl group.

The alkylaminocarbonyl group as the organic group of $R_{a1}$ and $R_{b1}$ is preferably an alkylaminocarbonyl group having a carbon number of 2 to 30, and examples thereof include a methylaminocarbonyl group, an ethylaminocarbonyl group, a propylaminocarbonyl group and a butylaminocarbonyl group. The alkylaminocarbonyl group may have a substituent. Preferred examples of the substituent of the alkylaminocarbonyl group include an alkoxy group, an acyl group, an acyloxy group, a cycloalkyl group, a chlorine atom, a bromine atom, an iodine atom, a hydroxyl group and a carboxyl group.

The alkylcarbonylamino group as the organic group of $R_{a1}$ and $R_{b1}$ is preferably an alkylcarbonylamino group having a carbon number of 2 to 30, and examples thereof include a methylcarbonylamino group, an ethylcarbonylamino group, a propylcarbonylamino group and a butylcarbonylamino group. The alkylcarbonylamino group may have a substituent. Preferred examples of the substituent of the alkylcarbonylamino group include an alkoxy group, an acyl group, an acyloxy group, a cycloalkyl group, a chlorine atom, a bromine atom, an iodine atom, a hydroxyl group and a carboxyl group.

The alkylsilyloxy group as the organic group of $R_{a1}$ and $R_{b1}$ is preferably an alkylsilyloxy group having a carbon number of 1 to 30, and examples thereof include a trimethylsilyloxy group and tert-butyldimethylsilyloxy group. The alkylsilyloxy group may have a substituent. Preferred examples of the substituent of the alkylsilyloxy group include an alkoxy group, an acyl group, an acyloxy group, a cycloalkyl group, a chlorine atom, a bromine atom, an iodine atom, a hydroxyl group and a carboxyl group.

The alkyl or cycloalkyl group contained in these alkyl, cycloalkyl, alkoxy, aralkyloxy, cycloalkoxy, alkoxycarbonyl, acyloxy, alkylthio, acyl and acylamino groups may have one linkage group or a plurality of linkage groups, such as oxygen atom, sulfur atom and ester group, in the alkyl or cycloalkyl chain.

Each of $R_{a1}$ and $R_{b1}$ is preferably an alkyl group, an aryl group, a cycloalkyl group, an alkoxy group, an aryloxy group, an aralkyl group, an aralkyloxy group, a cycloalkoxy group, an alkylthio group, an arylthio group, an acyl group, an acylamino group, an alkenyl group, an alkenyloxy group, an arylcarbonyloxy group, an alkylcarbonyloxy group, an alkylcarbonylamino group or an alkylsilyloxy group. Each of $R_{a1}$ and $R_{b1}$ is more preferably an alkyl group, an aryl group, a cycloalkyl group, an alkoxy group, an aryloxy group, an aralkyl group, an aralkyloxy group, a cycloalkoxy group, an alkylthio group, an arylthio group, an acyl group, an acylamino group, an alkenyl group, an alkenyloxy group, an arylcarbonyloxy group or an alkylcarbonylamino group, still more preferably an alkyl group, an aryl group, a cycloalkyl group, an alkoxy group, an aryloxy group, an aralkyl group, an aralkyloxy group, a cycloalkoxy group, an acylamino group, an alkenyl group, an alkenyloxy group, an arylcarbonyloxy group or an alkylcarbonylamino group.

In the case where l' and n' are an integer of 2 or more, each $R_{a1}$ or $R_{b1}$ may be the same as or different from every other $R_{a1}$ or $R_{b1}$.

Rf represents a fluorine atom or a fluorine atom-containing organic group, and the fluorine atom-containing organic group includes a group where the hydrogen atom of the organic group as $R_{a1}$ and $R_{b1}$ is partially or entirely replaced by a fluorine atom. In the case where m' is an integer of 2 or more, each Rf may be the same as or different from every other Rf.

The sum of the carbon numbers of Rf, $R_{a1}$ and $R_{b1}$ is preferably from 4 to 34, more preferably from 6 to 30, still more preferably from 8 to 24. By virtue of adjusting the carbon number of Rf, $R_{a1}$ and $R_{b1}$, the diffusibility of acid can be controlled, and the resolution rises.

The aromatic group of Ar is preferably an aromatic group having a carbon number 6 to 20, more preferably an aryl group, and examples thereof include a phenyl group and a naphthyl group. The aromatic group may further have a substituent. Preferred examples of the substituent which the aromatic group may further have include a nitro group, a sulfonylamino group, a chlorine atom, a bromine atom, an iodine atom and a carboxyl group.

l' is preferably an integer of 0 to 3, more preferably from 0 to 2, still more preferably or 2.

n' is preferably an integer of 0 to 3, more preferably from 0 to 2, still more preferably 0 or 1.

m' is preferably an integer of 2 to 5, more preferably 3 or 4, still more preferably 4.

The sulfonic acid represented by formula (II) is preferably represented by the following formula (IIa), more preferably represented by formula (IIb), still more preferably represented by formula (IIc). In the formulae, $R_{a1}$, Rf, X, l', m' and n' have the same meanings as $R_{a1}$, Rf, X, l', m' and n' in formula (II). R has the same meaning as $R_{a1}$.

(IIa)

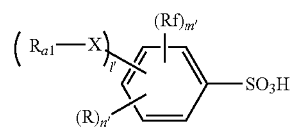

(IIb)

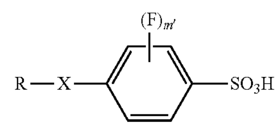

(IIc)

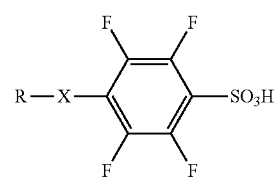

Specific preferred examples of the sulfonic acid represented by formula (II) are set forth below, but the present invention is not limited thereto.

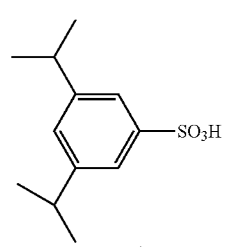

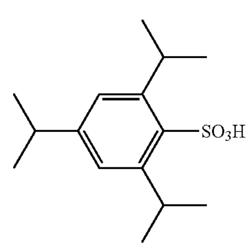

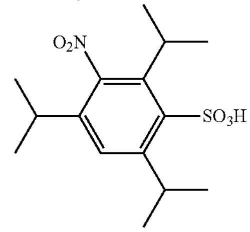

-continued
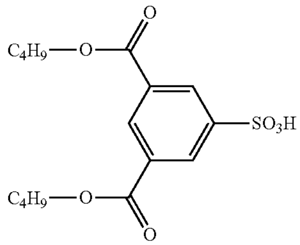
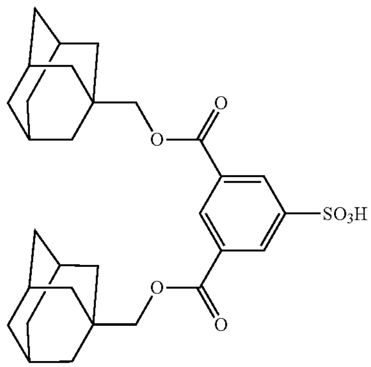
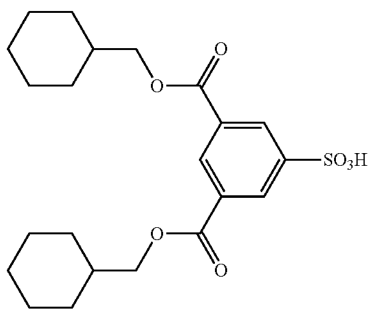
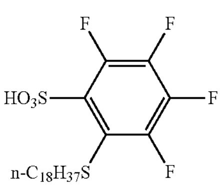
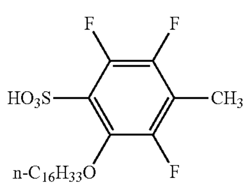
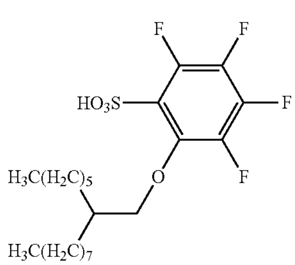
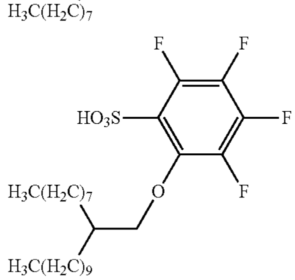
-continued
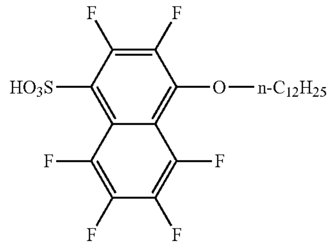
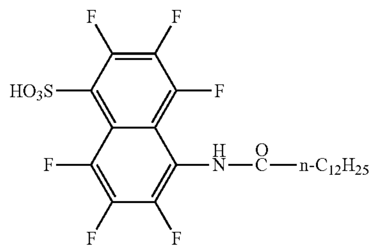
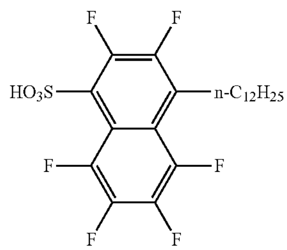
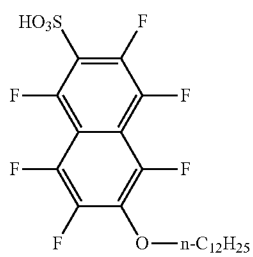
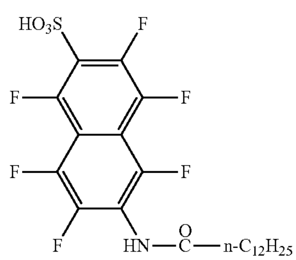
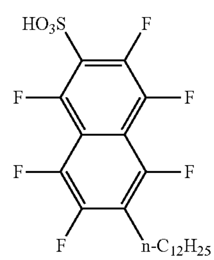
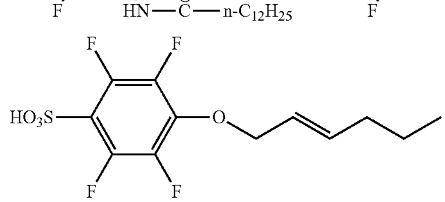
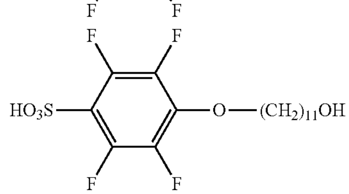

-continued
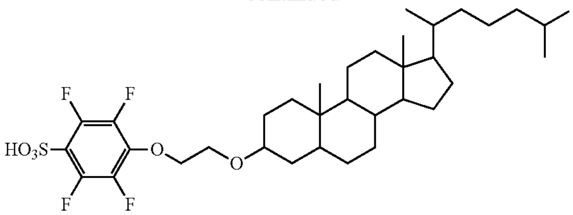
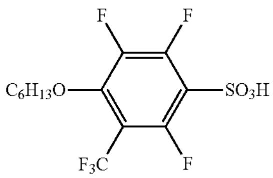
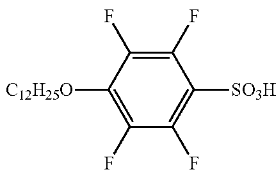
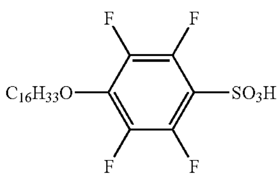
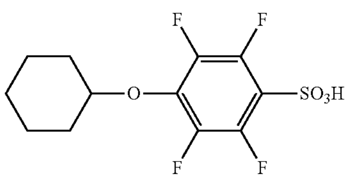
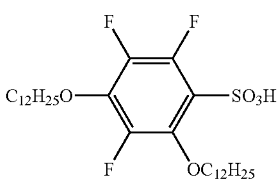
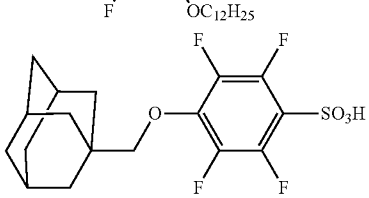
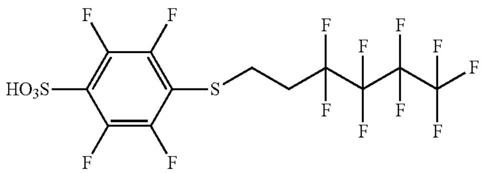
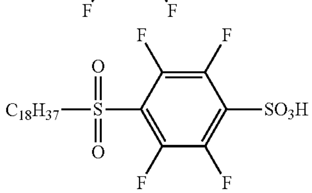
-continued
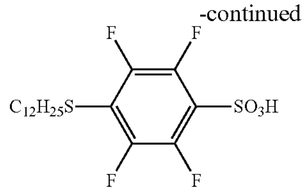
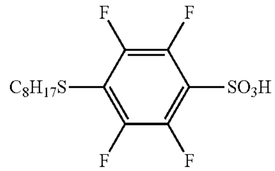
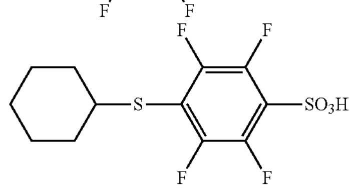
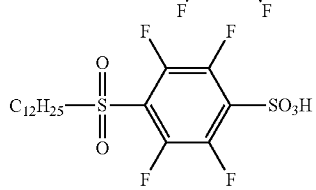
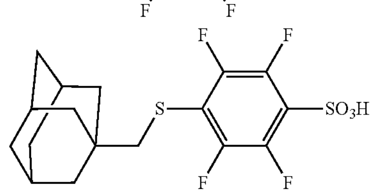
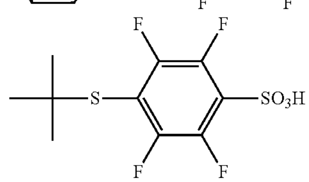
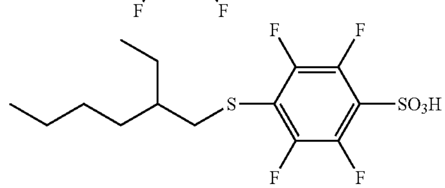
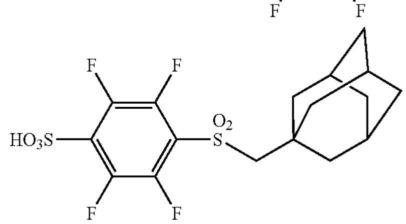
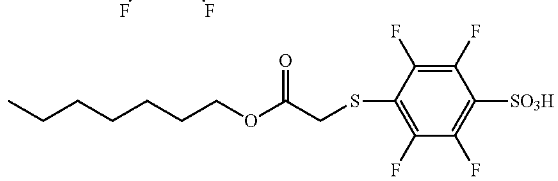
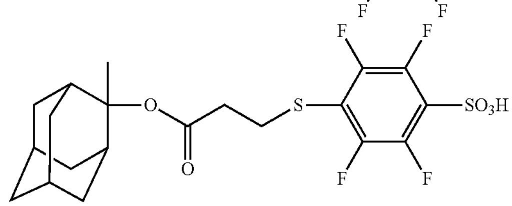

-continued
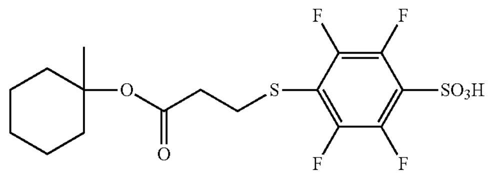
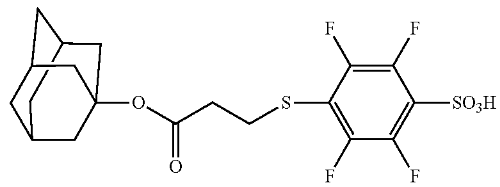
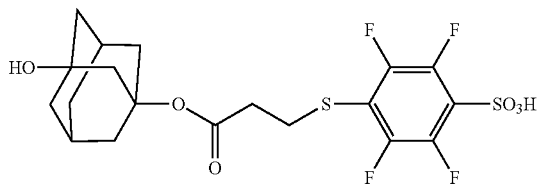
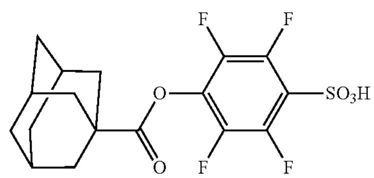
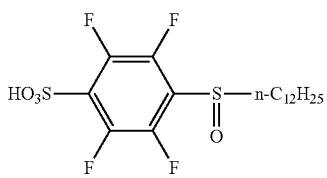
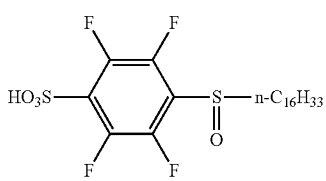
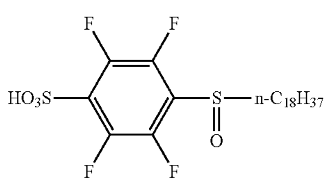
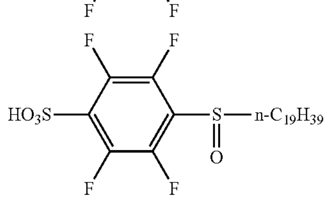
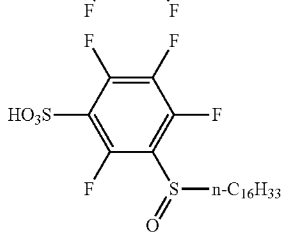
-continued
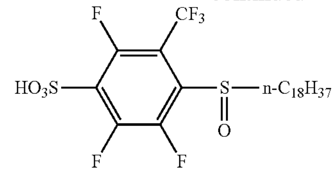
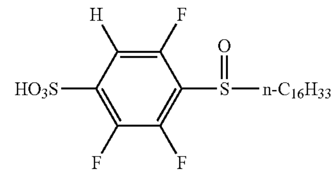
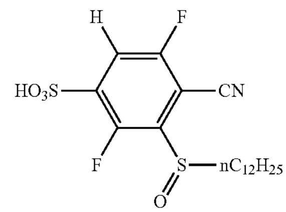
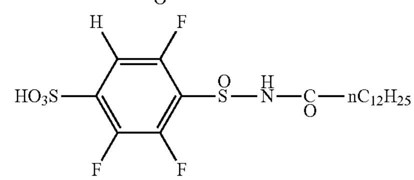
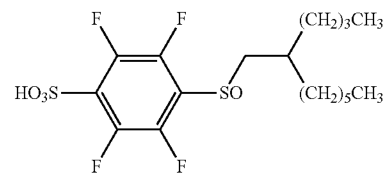
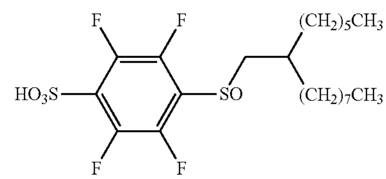
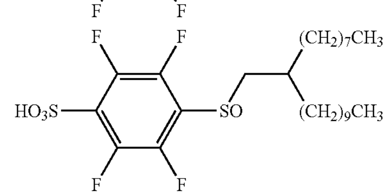
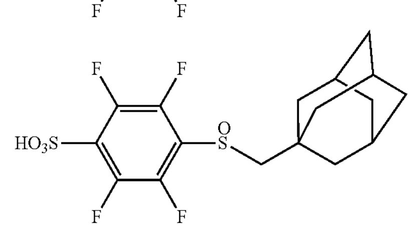
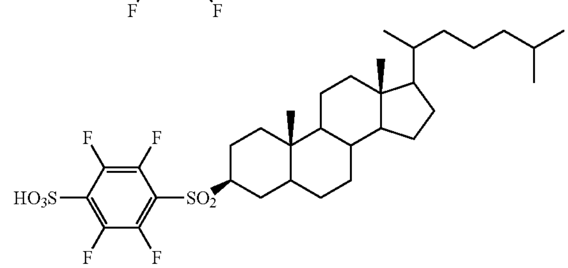

Among these, a compound having in its anion structure a non-fluorine-substituted hydrocarbon skeleton having a carbon number of 2 or more is more preferred.

The compound capable of generating a sulfonic acid represented by formula (I), (I') or (II) upon irradiation with an actinic ray or radiation is preferably one member selected from sulfonium salt and iodonium salt compounds of the sulfonic acid represented by formula (I), (I') or (II) or one member selected from ester compounds of the sulfonic acid represented by formula (I), (I') or (II), more preferably a compound represented by formulae (B1) to (B5):

(B1)

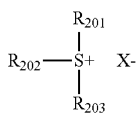

(B2)

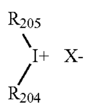

(B3)

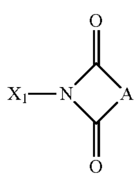

(B4)

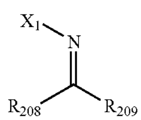

(B5)

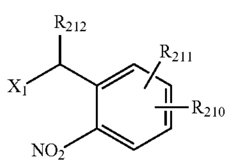

In formula (B1), each of $R_{201}$, $R_{202}$ and $R_{203}$ has the same meaning as the organic group of $R_{201}$, $R_{202}$ and $R_{203}$ in formula (ZI).

$X^-$ represents a sulfonate anion after removing a hydrogen atom from the sulfonic acid (—$SO_3H$) represented by formula (I), (I') or (II).

Specific examples of the organic group as $R_{201}$, $R_{202}$ and $R_{203}$ include the corresponding groups in the compounds (B1a), (B1b) and (B1c) described later.

The compound may be a compound having a plurality of structures represented by formula (B1), for example, a compound having a structure where at least one of $R_{201}$ to $^{8}{}_{203}$ in the compound represented by formula (B1) is bonded to at least one of $R_{201}$ to $R_{203}$ in another compound represented by formula (B1).

The component (B1) is more preferably a compound (B1a), (B1b) or (B1c) described below.

The compound (B1a) is an arylsulfonium compound where at least one of $R_{201}$ to $R_{203}$ in formula (B1) is an aryl group, that is, a compound having an arylsulfonium as the cation. The arylsulfonium as cation in the compound (B1a) has the same meaning as the arylsulfonium as cation in the compound (ZI-1).

The compound (B1b) is described below.

The compound (B1b) is a compound where each of $R_{201}$ to $R_{203}$ in formula (B1) independently represents an aromatic ring-free organic group. The aromatic ring as used herein includes an aromatic ring containing a heteroatom. The aromatic ring-free organic group represented by $R_{201}$ to $R_{203}$ in the compound (B1b) has the same meaning as the aromatic ring-free organic group represented by $R_{201}$ to $R_{203}$ in the compound (ZI-2).

The compound (B1c) is a compound represented by the following formula (B1c), and this is a compound having an arylacylsulfonium salt structure.

(B1c)

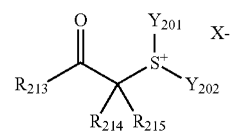

In formula (B1c), $R_{213}$ represents an aryl group which may be substituted, and is preferably a phenyl group or a naphthyl group.

Preferred examples of the substituent on $R_{213}$ include an alkyl group, an alkoxy group, an acyl group, a nitro group, a hydroxyl group, an alkoxycarbonyl group and a carboxy group.

$R_{214}$ and $R_{215}$ has the same meanings as $R_{6c}$ and $R_{7c}$ in formula (ZI-3).

$Y_{201}$ and $Y_{202}$ has the same meanings as $R_x$ and $R_y$ in formula (ZI-3).

The pairs $R_{213}$ and $R_{214}$, $R_{214}$ and $R_{215}$, and $Y_{201}$ and $Y_{202}$ each may combine to form a ring structure. The ring structure formed may contain an oxygen atom, a sulfur atom, an ester bond or an amide bond. Examples of the group formed by combining each of the pairs $R_{213}$ and $R_{214}$, $R_{214}$ and $R_{215}$, and $Y_{201}$ and $Y_{202}$ include a butylene group and a pentylene group.

$X^-$ represents a sulfonate anion after removing hydrogen atom from the sulfonic acid (—$SO_3H$) represented by formula (I), (I') or (II).

In formula (B2), $R_{204}$ and $R_{205}$ have the same meanings as $R_{204}$ and $R_{205}$ in formula (ZII).

$X^-$ represents a sulfonate anion after removing a hydrogen atom from the sulfonic acid (—$SO_3H$) represented by formula (I), (I') or (II).

In formula (B3), A represents a substituted or unsubstituted alkylene, alkenylene or arylene group.

$X_1$ represents a monovalent group after removing a hydrogen atom from the sulfonic acid (—$SO_3H$) represented by formula (I), (I') or (II).

In formula (B4), $R_{208}$ represents a substituted or unsubstituted alkyl, cycloalkyl or aryl group.

$R_{209}$ represents an alkyl group, a cyano group, an oxoalkyl group or an alkoxycarbonyl group and is preferably a halogen-substituted alkyl group or a cyano group.

$X_1$ represents a monovalent group after removing a hydrogen atom from the sulfonic acid (—$SO_3H$) represented by formula (I), (I') or (II).

In formula (B5), each of $R_{210}$ and $R_{211}$ independently represents a hydrogen atom, an alkyl group, a cyano group, a nitro group or an alkoxycarbonyl group and is preferably a halogen-substituted alkyl group, a nitro group or a cyano group.

$R_{212}$ represents a hydrogen atom, an alkyl group, a cyano group or an alkoxycarbonyl group.

$X_1$ represents a monovalent group after removing a hydrogen atom from the sulfonic acid (—$SO_3H$) represented by formula (I), (I') or (II).

A compound represented by formula (B1) is preferred, and compounds represented by formulae (B1a) to (B1c) are more preferred.

The compound (B') preferably has a triphenylsulfonium structure.

The compound (B') is preferably a triphenylsulfonium salt compound having a non-fluorine-substituted alkyl or cycloalkyl group in the cation moiety.

Out of the compounds capable of generating an acid having a log P value of 1.5 to 12.0 upon irradiation with an actinic ray or radiation, preferred examples are set forth below, but the present invention is not limited thereto.

b1

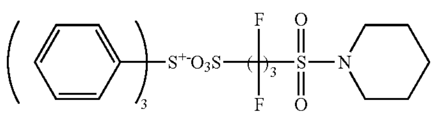

b2

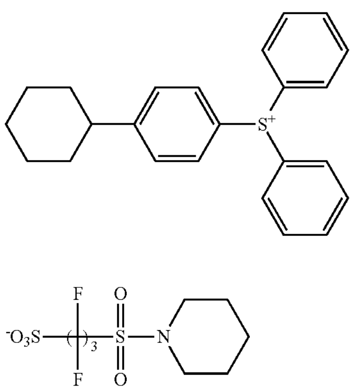

b3

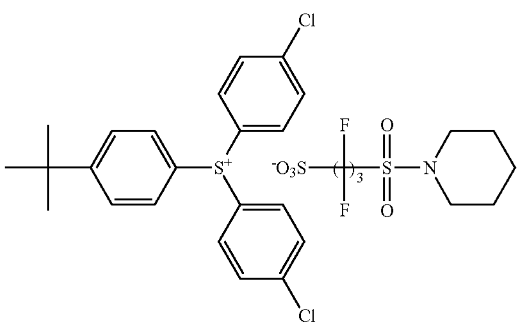

b4

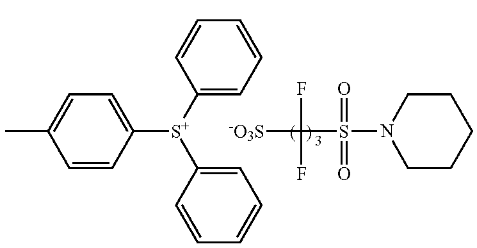

-continued b5

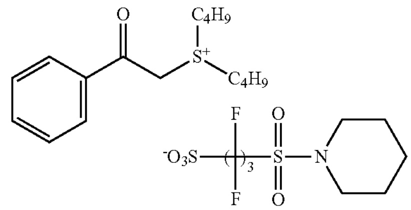

b6

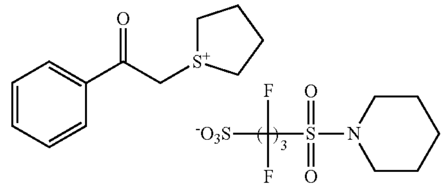

b7

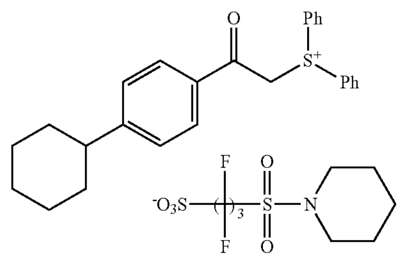

b8

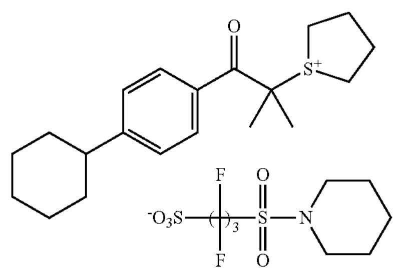

b9

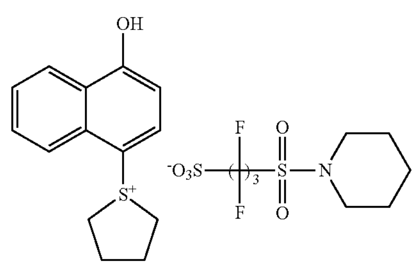

b10

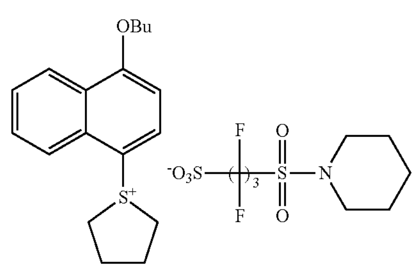

-continued
b11
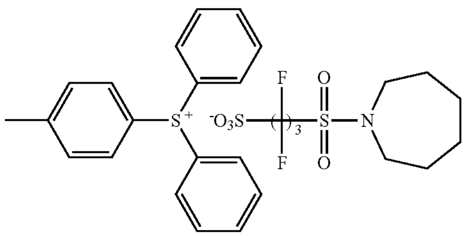
b12
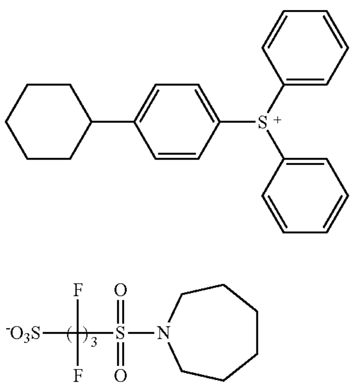
b13
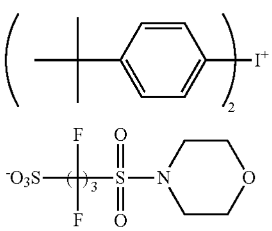
b14
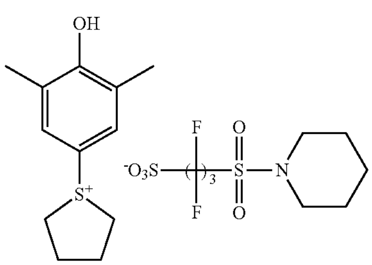
b15
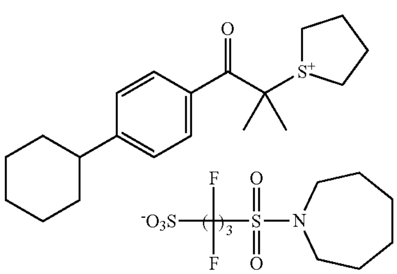
b16
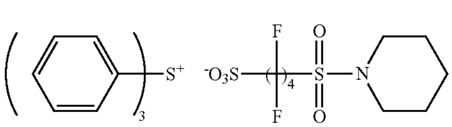
-continued
b17
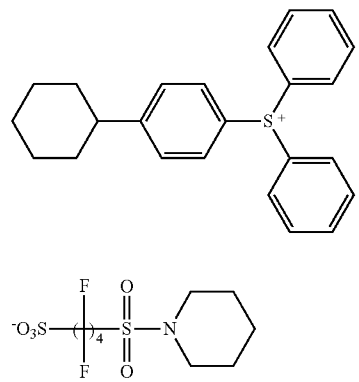
b18
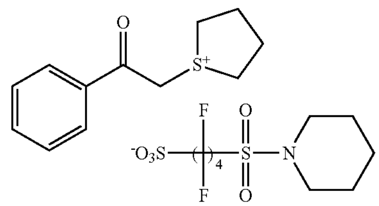
b19
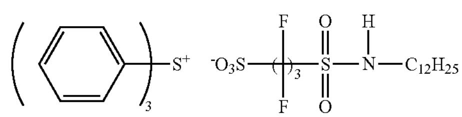
b20
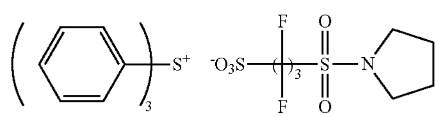
b21
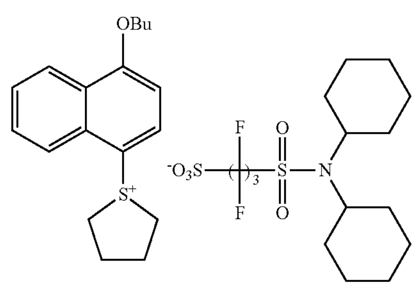
b22
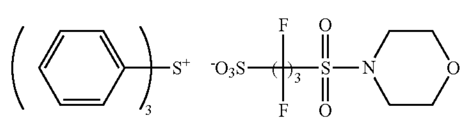
b23
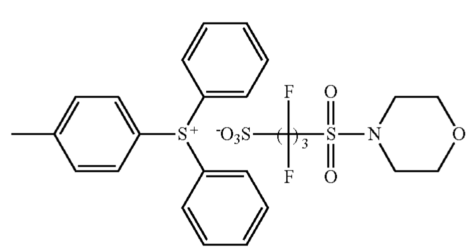

-continued
b24
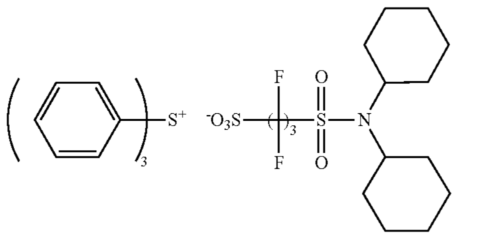
b25
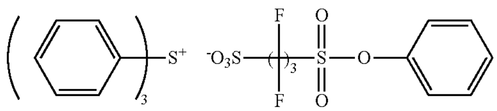
b26
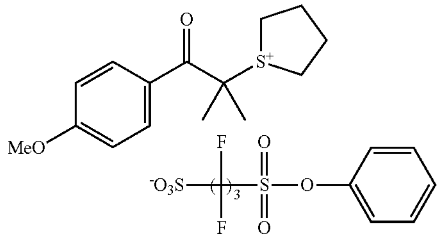
b27
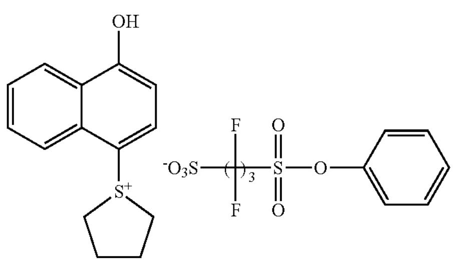
b28
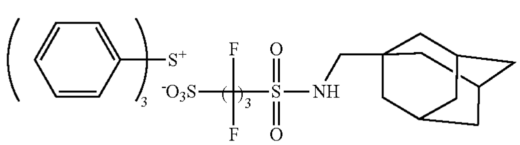
b29
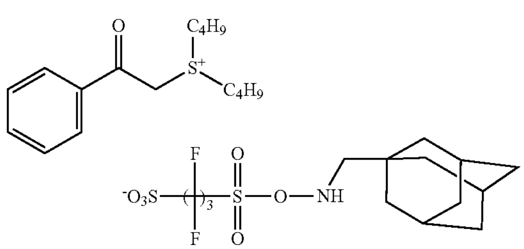
b30
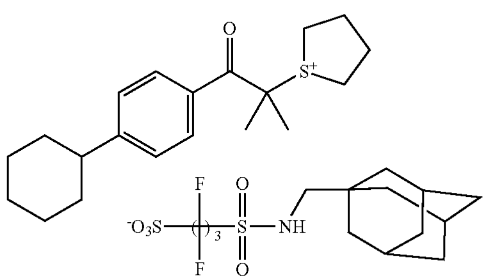
-continued
b31
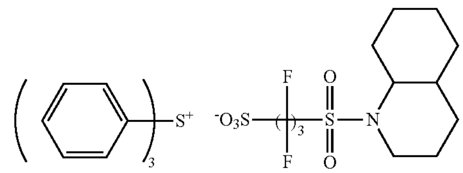
b32
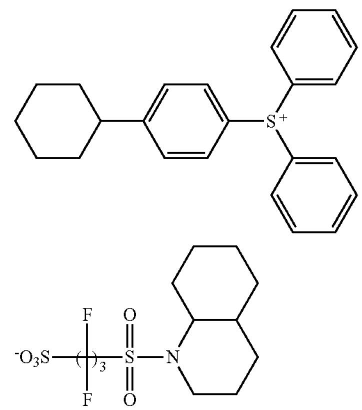
b33
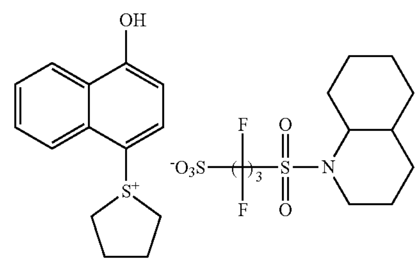
b34
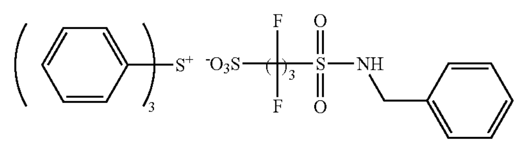
b35
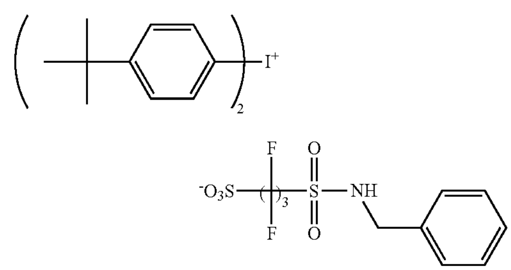
b36
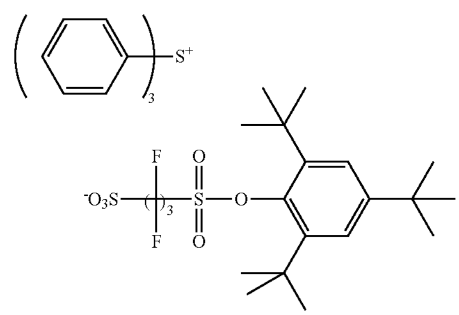

-continued
b37
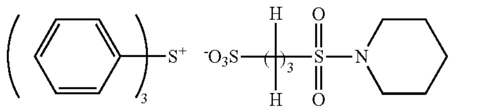
b38
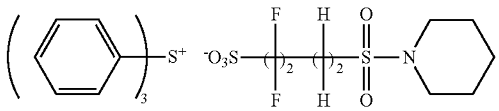
(b39)
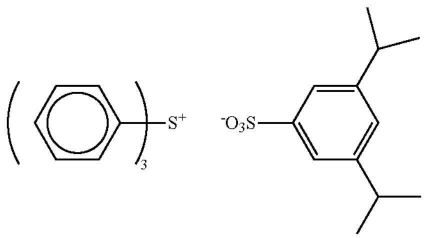
(b40)
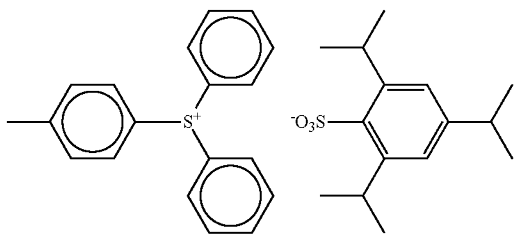
(b41)
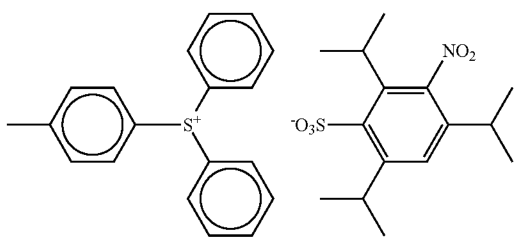
(b42)
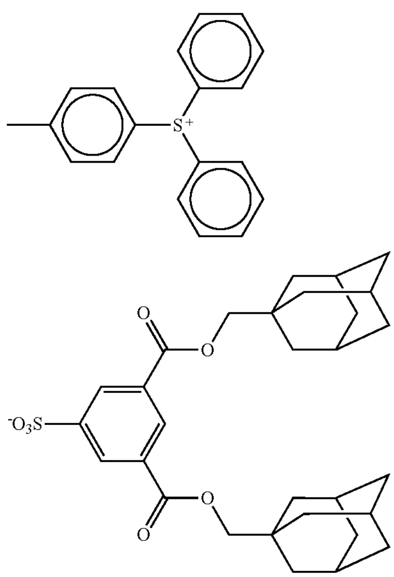
-continued
(b43)
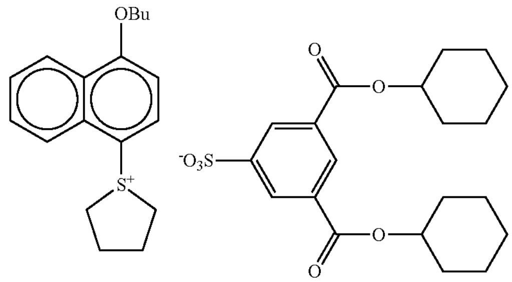
(b44)
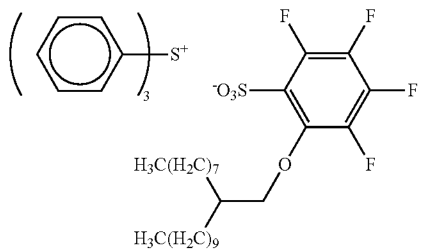
(b45)
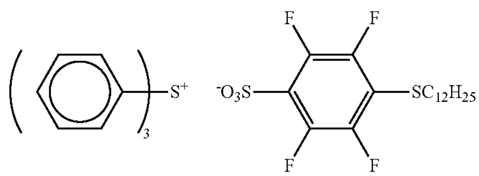
(b46)
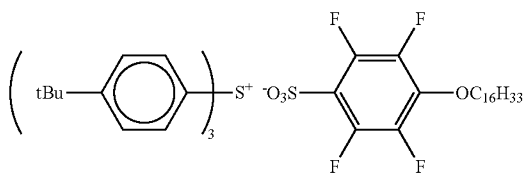
(b47)
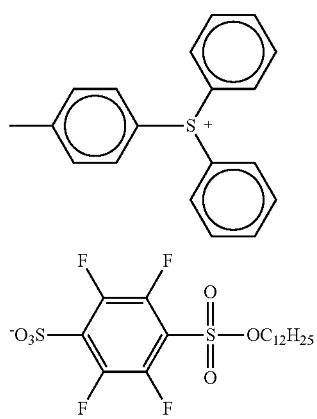
(b48)
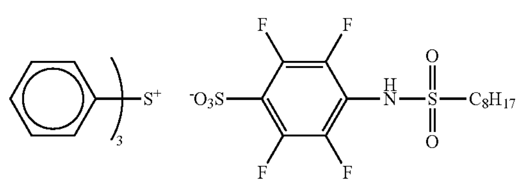

(b49)
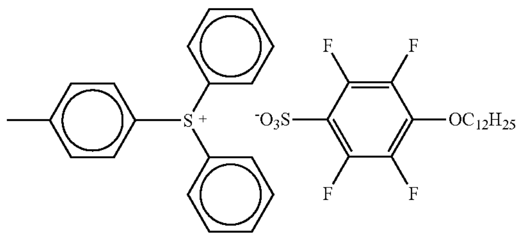
(b50)
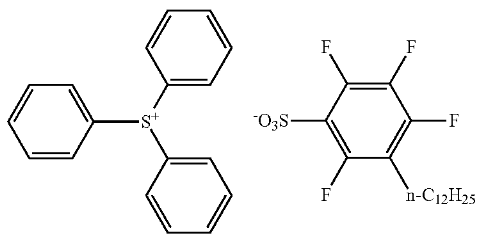
(b51)
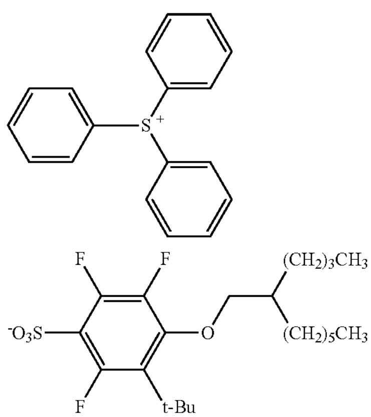
(b52)
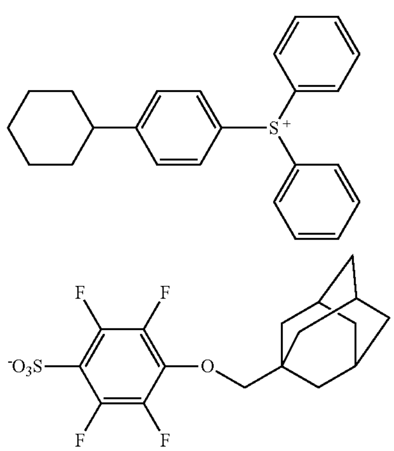
(b53)
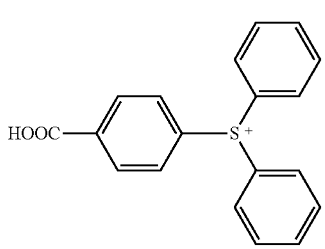
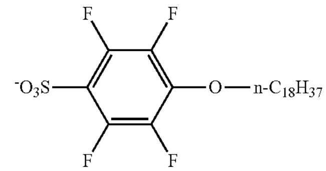
(b54)
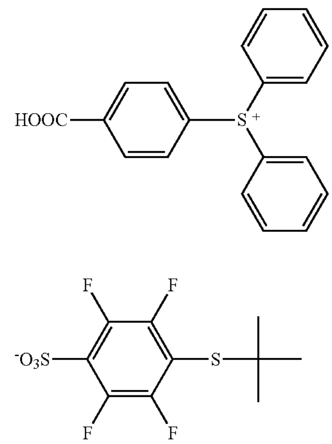
(b55)
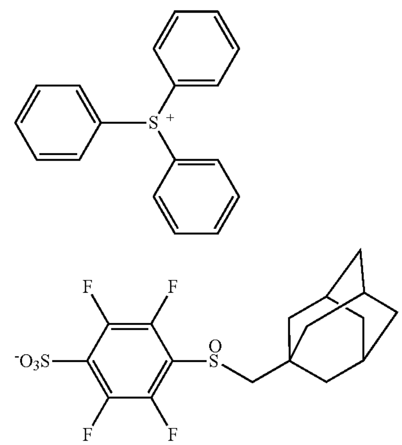
(b56)
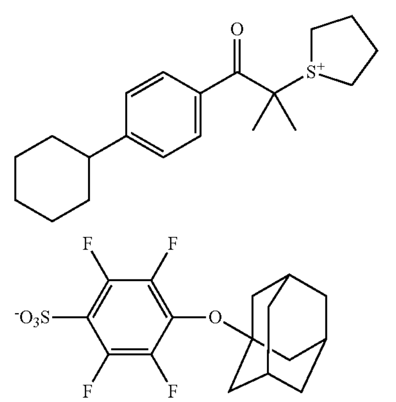
(b57)
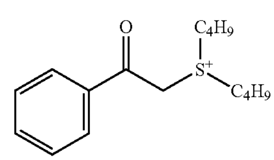

-continued
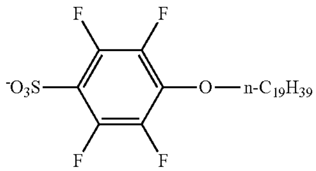
(b58)
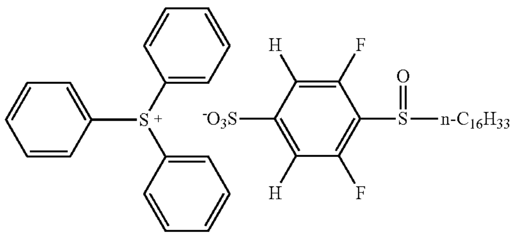
(b59)
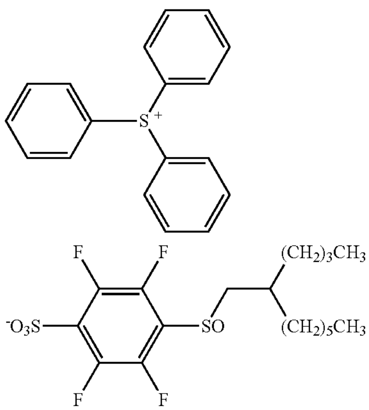
(b60)
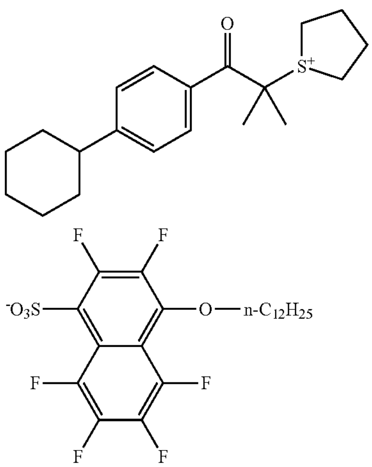
(b61)
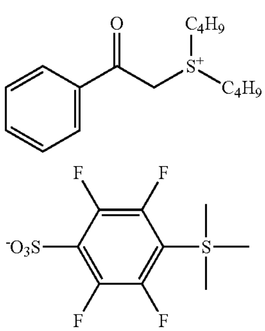
-continued
(b62)
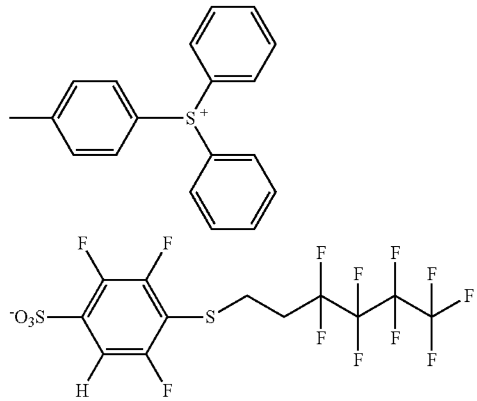
(b63)
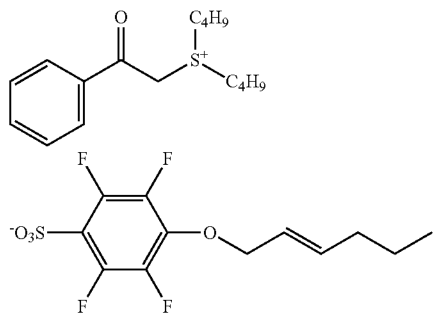
(b64)
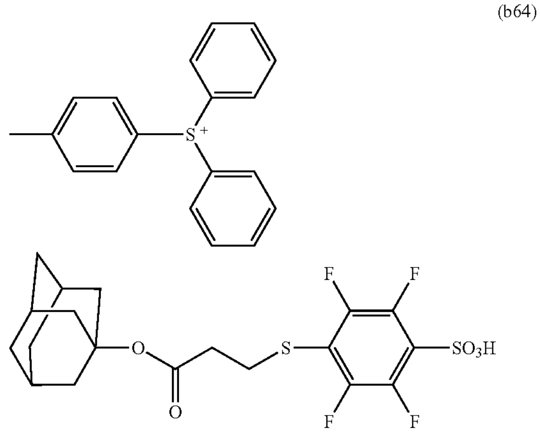
(b65)
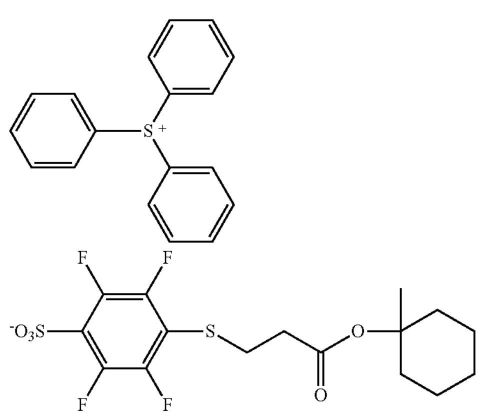
b66
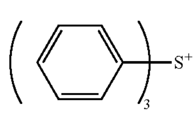

-continued
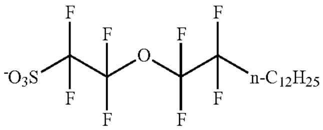
b67
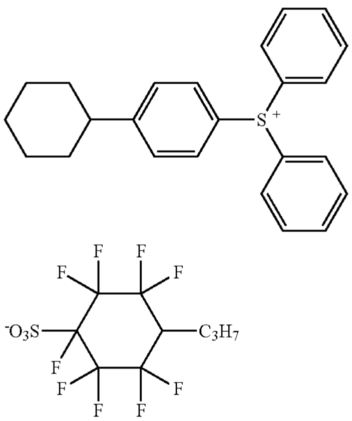
b68
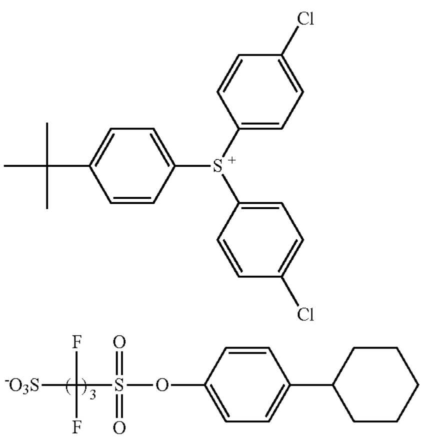
b69
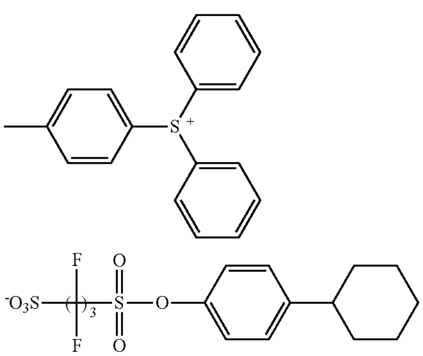
b70
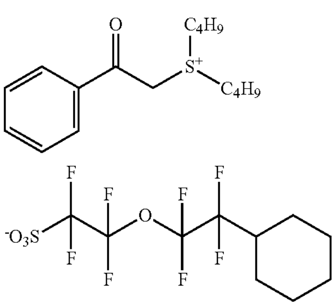
-continued
b71
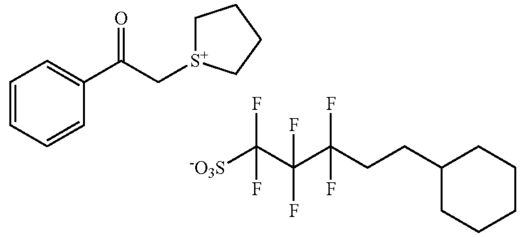
b72
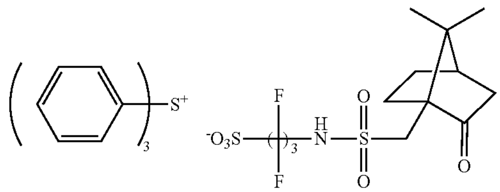
b73
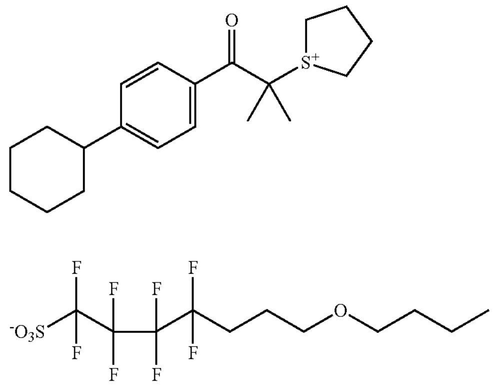
b74
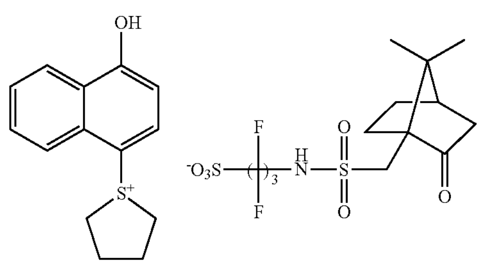
b75
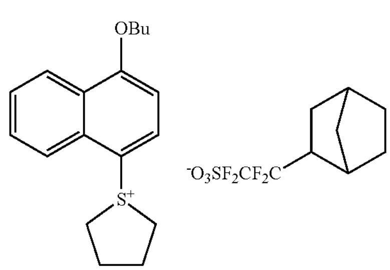
b76
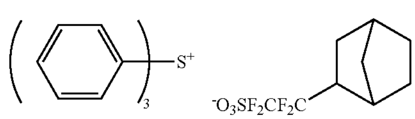

-continued b77

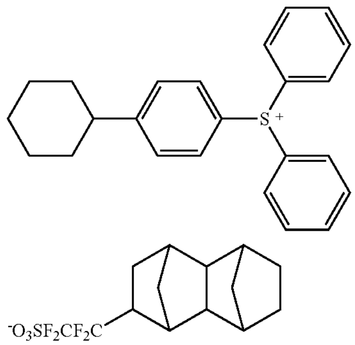

b78

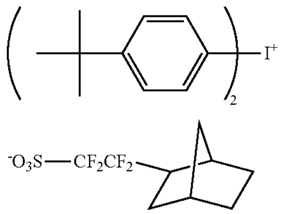

b79

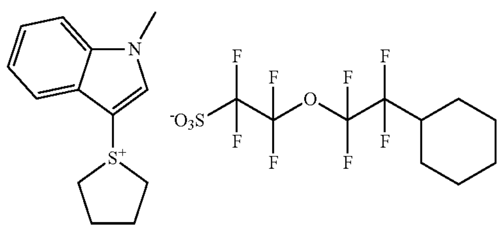

b80

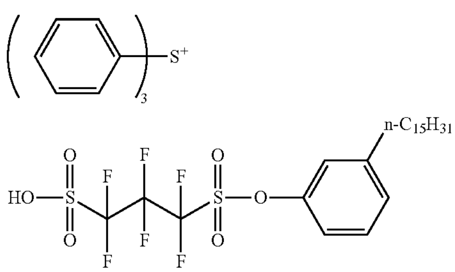

b81

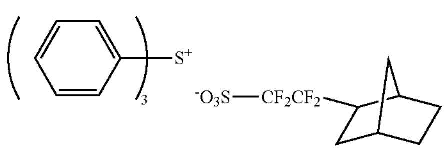

b82

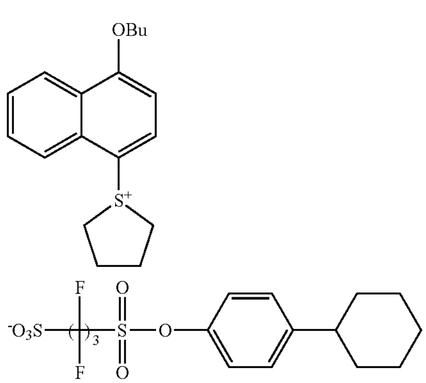

-continued b83

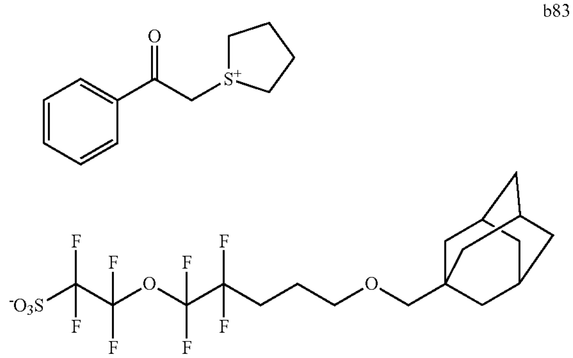

(b84)

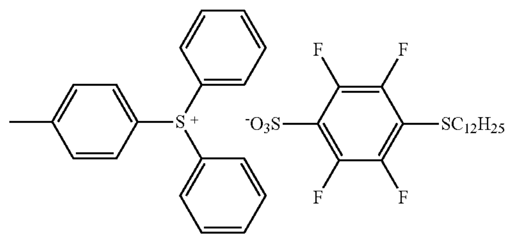

In using two or more kinds of acid generators in combination, two or more kinds of compounds (B') may be used or the compound (B') may be used in combination with other acid generators.

In the case of the compound (B') and other acid generators in combination, the ratio of acid generators used is, in terms of the molar ratio (compound (B')/other acid generators), usually from 99/1 to 20/80, preferably from 99/1 to 40/60, more preferably from 99/1 to 50/50.

[3] (C) Solvent

Examples of the solvent which can be used for dissolving respective components described above to prepare a resist composition include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used is a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) between the solvent containing a hydroxyl group and the solvent not containing a hydroxyl group is usually from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

The solvent is preferably a mixed solvent of two or more kinds of solvents including propylene glycol monomethyl ether acetate.

[4] (D) Resin Having at Least Either a Fluorine Atom or a Silicon Atom

The resist composition of the present invention preferably contains (D) a resin having at least either a fluorine atom or a silicon atom particularly when the resist composition is applied to immersion exposure. The resin (D) is unevenly distributed to the film surface layer and when the immersion medium is water, the static/dynamic contact angle on the resist film surface for water as well as the followability of immersion liquid can be enhanced. Thanks to addition of the resin (D), the receding contact angle on the surface is enhanced. The receding contact angle of the film is preferably from 60 to 90°, more preferably 70° or more.

The resin (D) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and this is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called expansion/contraction method.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important, and the resist is required to have a performance of allowing a liquid droplet to follow the high-speed scanning of an exposure head with no remaining The fluorine atom or silicon atom in the resin (D) may be present in the main chain of the resin or may be substituted on the side chain.

The resin (D) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being replaced by a fluorine atom and may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

Specific examples of the fluorine atom-containing alkyl group, fluorine atom-containing cycloalkyl group and fluorine atom-containing aryl group are set forth below, but the present invention is not limited thereto.

(F2)

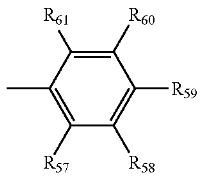

(F3)

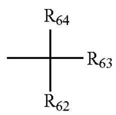

(F4)

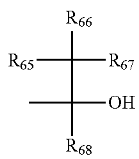

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom. It is preferred that $R_{57}$ to $R_{61}$ and $R_{65}$ to $R_{67}$ all are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

Specific examples of the repeating unit having a fluorine atom are set forth below, but the present invention is not limited thereto.

In specific examples, $X_1$ represents a hydrogen atom, —$CH_3$, —F or —$CF_3$, and $X_2$ represents —F or —$CF_3$.

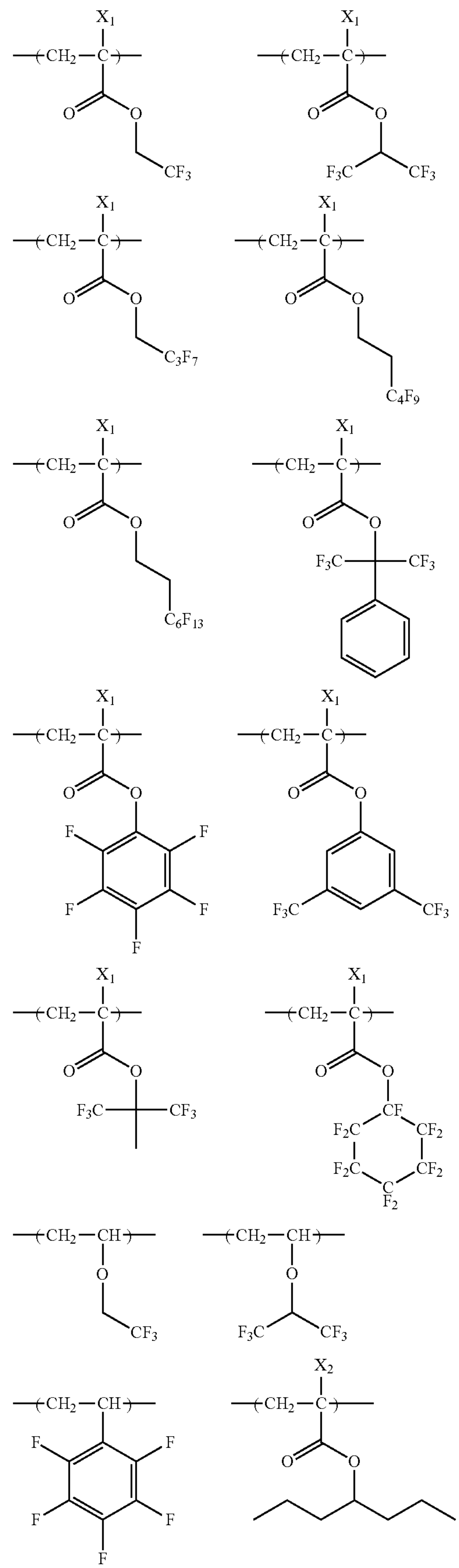

-continued

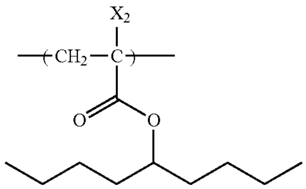

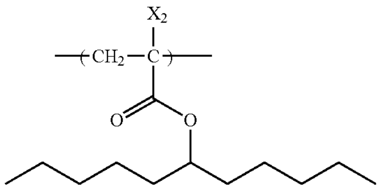

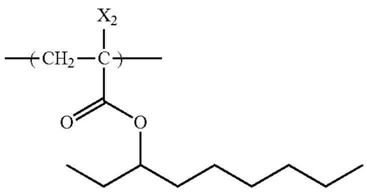

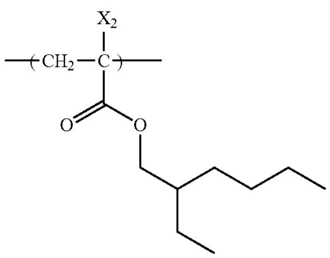

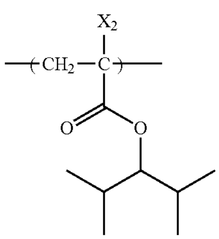

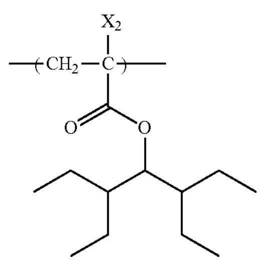

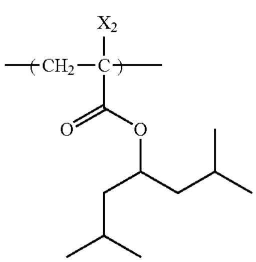

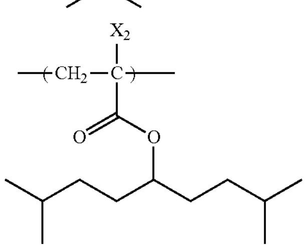

-continued

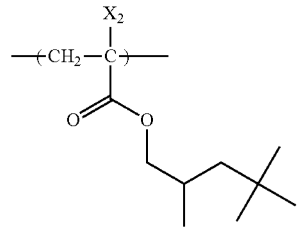

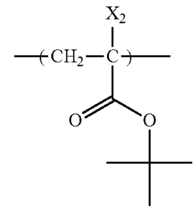

The resin (D) may contain a silicon atom and is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

(CS-1)

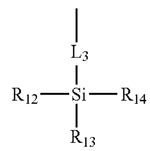

(CS-2)

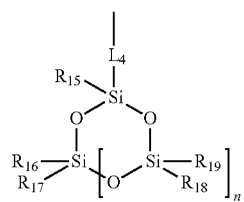

(CS-3)

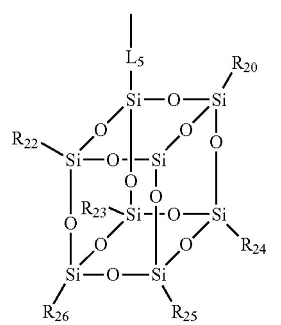

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group includes an alkylene group, a cycloalkylene group, a phenyl group, an ether bond, a thioether bond, a carbonyl group, an ester bond, an amide bond, a urethane bond, a ureylene bond and a combination of two or more of these groups and bonds.

n represents an integer of 1 to 5. n is preferably an integer of 2 to 4.

The resin (D) includes a resin containing at least one member selected from the group consisting of repeating units represented by the following formulae (C-I) to (C-V):

(C-I)

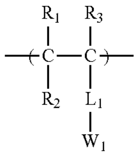

(C-II)

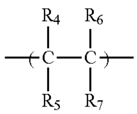

(C-III)

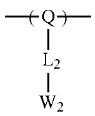

(C-IV)

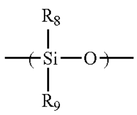

(C-V)

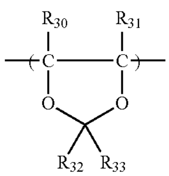

In formulae (C-I) to (C-V), each of $R_1$ to $R_3$ independently represents a hydrogen atom, a fluorine atom, a linear or branched alkyl group (preferably having a carbon number of 1 to 4), or a linear or branched fluorinated alkyl group (preferably having a carbon number of 1 to 4).

Each of $W_1$ and $W_2$ represents an organic group having at least either a fluorine atom or a silicon atom.

Each of $R_4$ to $R_7$ independently represents a hydrogen atom, a fluorine atom, a linear or branched alkyl group (preferably having a carbon number of 1 to 4), or a linear or branched fluorinated alkyl group (preferably having a carbon number of 1 to 4), provided that at least one of $R_4$ to $R_7$ represents a fluorine atom. $R_4$ and $R_5$, or $R_6$ and $R_7$ may form a ring.

$R_8$ represents a hydrogen atom or a linear or branched alkyl group (preferably having a carbon number of 1 to 4).

$R_9$ represents a linear or branched alkyl group (preferably having a carbon number of 1 to 4), or a linear or branched fluorinated alkyl group (preferably having a carbon number of 1 to 4).

Each of $L_1$ and $L_2$ represents a single bond or a divalent linking group and is the same as $L_3$ to $L_5$ in formulae (CS-1) to (CS-3).

Q represents a monocyclic or polycyclic aliphatic group, that is, an atomic group for forming an alicyclic structure including the two bonded carbon atoms (C—C). The monocyclic aliphatic group is preferably a cycloalkyl group having a carbon number of 3 to 9, and examples thereof include a cyclopentyl group, a cyclohexyl group, a cyclobutyl group and a cyclooctyl group. The polycyclic aliphatic group includes a group containing, for example, a bicyclo, tricyclo or tetracyclo structure having a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. A part of carbon atoms in the cycloalkyl group may be substituted by a heteroatom such as oxygen atom.

Each of $R_{30}$ and $R_{31}$ independently represents a hydrogen or fluorine atom.

Each of $R_{32}$ and $R_{33}$ independently represents an alkyl group, a cycloalkyl group, a fluorinated alkyl group or a fluorinated cycloalkyl group.

Here, the repeating unit represented by formula (C-V) has at least one fluorine atom in at least one member out of $R_{30}$, $R_{31}$, $R_{32}$ and $R_{33}$.

The resin (D) preferably has a repeating unit represented by formula (C-I), more preferably a repeating unit represented by the following formulae (C-Ia) to (C-Id):

(C-Ia)

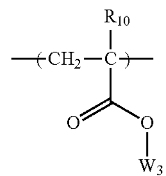

(C-Ib)

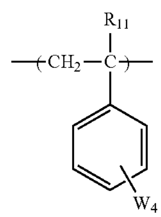

(C-Ic)

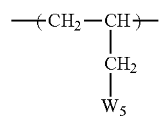

(C-Id)

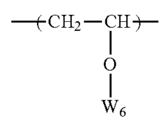

In formulae (C-Ia) to (C-Id), each of $R_{10}$ and $R_{11}$ represents a hydrogen atom, a fluorine atom, a linear or branched alkyl group (preferably having a carbon number of 1 to 4), or a linear or branched fluorinated alkyl group (preferably having a carbon number of 1 to 4).

Each of $W_3$ to $W_6$ represents an organic group having one or more atoms of at least either a fluorine atom or a silicon atom.

When $W_1$ to $W_6$ are an organic group having a fluorine atom, the organic group is preferably a fluorinated linear or branched alkyl group (preferably having a carbon number of 1 to 20), a fluorinated cycloalkyl group (preferably having a carbon number of 3 to 20), or a fluorinated linear, branched or cyclic alkyl ether group (preferably having a carbon number of 1 to 20).

Examples of the fluorinated alkyl group of $W_1$ to $W_6$ include trifluoroethyl group, pentafluoropropyl group, hexafluoroisopropyl group, hexafluoro(2-methyl)isopropyl group, heptafluorobutyl group, heptafluoroisopropyl group, octafluoroisobutyl group, nonafluorohexyl group, nonafluoro-tert-butyl group, perfluoroisopentyl group, perfluorooctyl group and perfluoro(trimethyl)hexyl group.

When $W_1$ to $W_6$ are an organic group having a silicon atom, the organic group is preferably a group having an alkylsilyl structure or a cyclic siloxane structure. Specific examples thereof include the groups represented by formulae (CS-1) to (CS-3).

Specific examples of the repeating unit represented by formula (C-I) are set forth below, but the present invention is not limited thereto. In the formulae, X represents a hydrogen atom, —$CH_3$, —F or —$CF_3$.

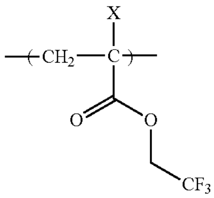
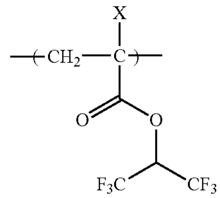
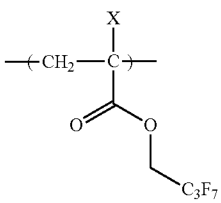
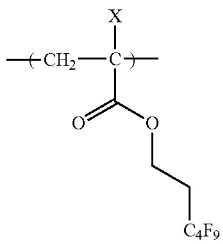
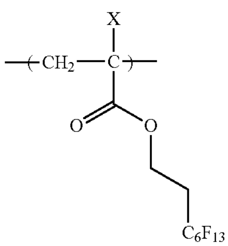
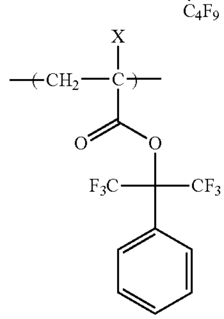
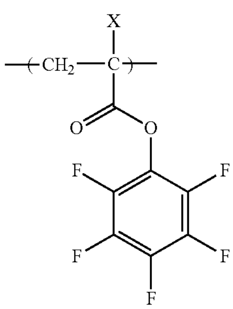
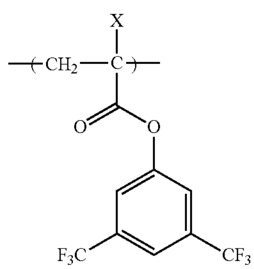
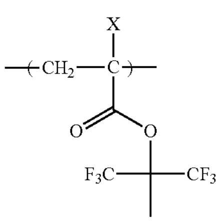
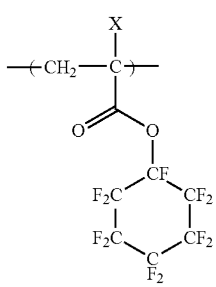
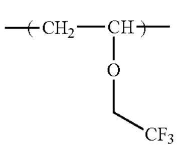
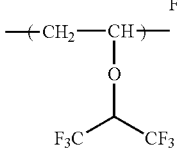

-continued

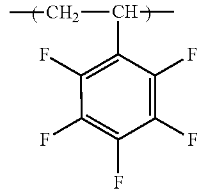
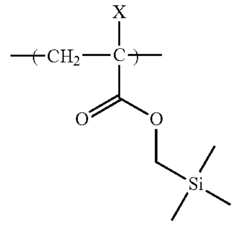
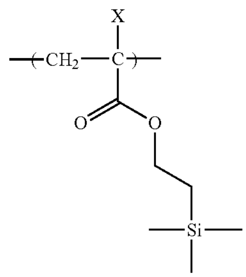
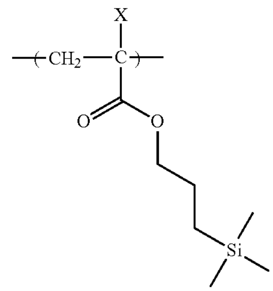
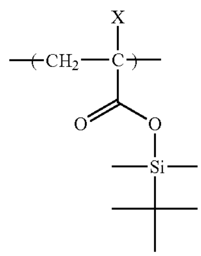
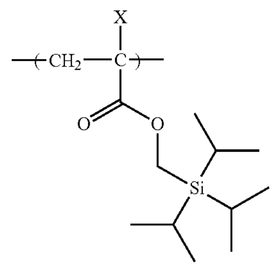
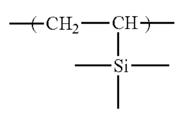
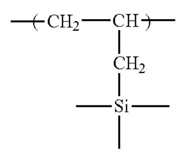
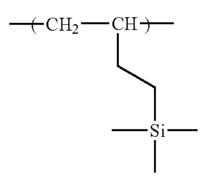
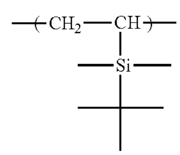
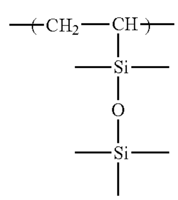
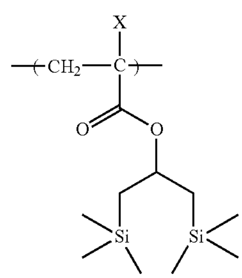
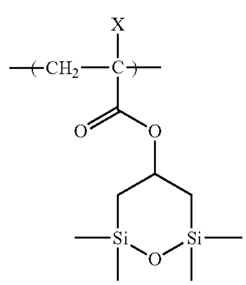

-continued

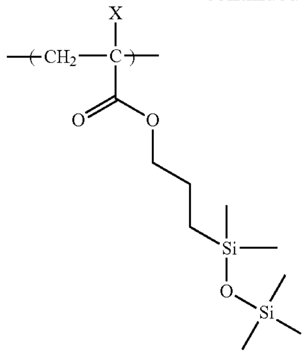

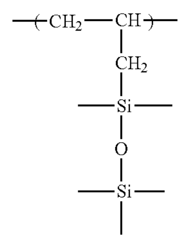

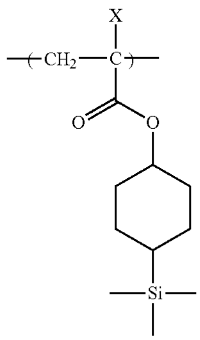

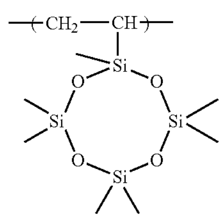

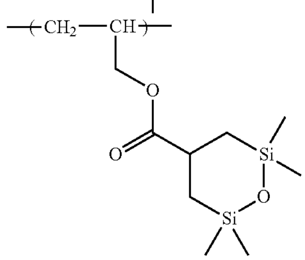

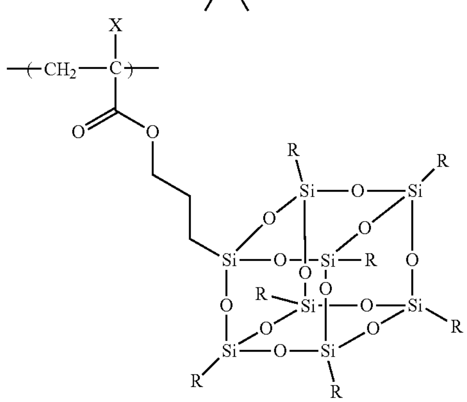

R = $CH_3$, $C_2H_5$, $C_3H_7$, $C_4H_9$

The resin (D) is preferably any one resin selected from the following (D-1) to (D-6):

(D-1) a resin containing (a) a repeating unit having a fluoroalkyl group (preferably having a carbon number of 1 to 4), more preferably a resin containing only the repeating unit (a), (D-2) a resin containing (b) a repeating unit having a trialkylsilyl group or a cyclic siloxane structure, more preferably a resin containing only the repeating unit (b), (D-3) a resin containing (a) a repeating unit having a fluoroalkyl group (preferably having a carbon number of 1 to 4) and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 6 to 20), more preferably a copolymerization resin of the repeating unit (a) and the repeating unit (c), (D-4) a resin containing (b) a repeating unit having a trialkylsilyl group or a cyclic siloxane structure and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 6 to 20), more preferably a copolymerization resin of the repeating unit (b) and the repeating unit (c), (D-5) a resin containing (a) a repeating unit having a fluoroalkyl group (preferably having a carbon number of 1 to 4) and (b) a repeating unit having a trialkylsilyl group or a cyclic siloxane structure, more preferably a copolymerization resin of the repeating unit (a) and the repeating unit (b), and (D-6) a resin containing (a) a repeating unit having a fluoroalkyl group (preferably having a carbon number of 1 to 4), (b) a repeating unit having a trialkylsilyl group or a cyclic siloxane structure, and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 6 to 20), more preferably a copolymerization resin of the repeating unit (a), the repeating unit (b) and the repeating unit (c).

As for the repeating unit (c) having a branched alkyl group, a cycloalkyl group, a branched alkenyl group, a cycloalkenyl group or an aryl group in the resins (D-3), (D-4) and (D-6), an appropriate functional group can be introduced considering the hydrophilicity/hydrophobicity, interaction and the like, but in view of followability of immersion liquid or receding contact angle, a functional group having no polar group is preferred.

In the resins (D-3), (D-4) and (D-6), the content of the repeating unit (a) having a fluoroalkyl group and/or the repeating unit (b) having a trialkylsilyl group or a cyclic siloxane structure is preferably from 20 to 99 mol %.

The resin (D) is preferably a resin containing a repeating unit represented by the following formula (IF). In the case where the resin (D) contains a repeating unit represented by formula (IF), the amount of the repeating unit represented by formula (IF) is from 1 to 100 mol %, preferably from 5 to 95 mol %, more preferably from 20 to 80 mol %, based on all repeating units constituting the resin (D).

(IF)

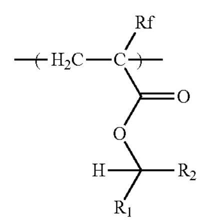

In formula (IF), Rf represents a fluorine atom or an alkyl group with at least one hydrogen atom being replaced by a fluorine atom, $R_1$ represents an alkyl group, and $R_2$ represents a hydrogen atom or an alkyl group.

In formula (IF), the alkyl group with at least one hydrogen atom being replaced by a fluorine atom of Rf is preferably an alkyl group having a carbon number of 1 to 3, more preferably a trifluoromethyl group.

The alkyl group of $R_1$ is preferably a linear or branched alkyl group having a carbon number of 3 to 10, more preferably a branched alkyl group having a carbon number of 3 to 10.

$R_2$ is preferably a linear or branched alkyl group having a carbon number of 1 to 10, more preferably a linear or branched alkyl group having a carbon number of 3 to 10.

Specific examples of the repeating unit represented by formula (IF) are set forth below, but the present invention is not limited thereto.

X=F or $CF_3$

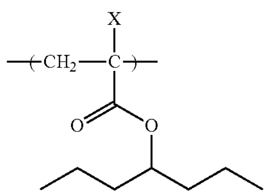

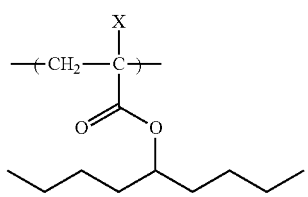

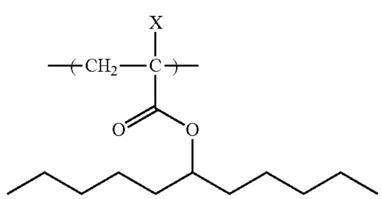

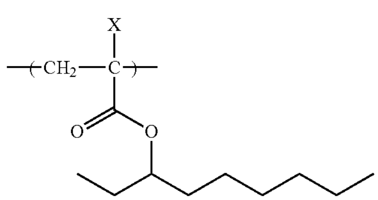

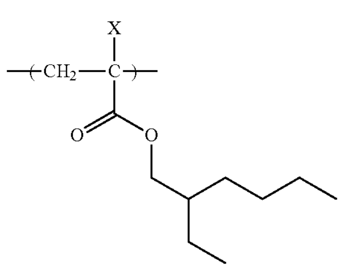

-continued

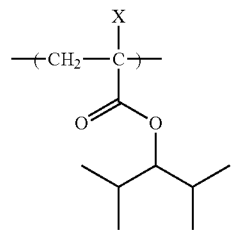

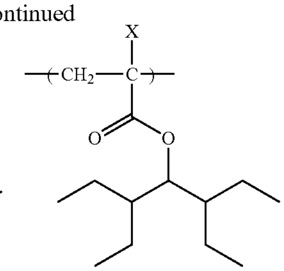

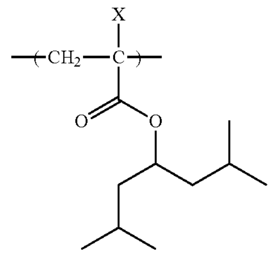

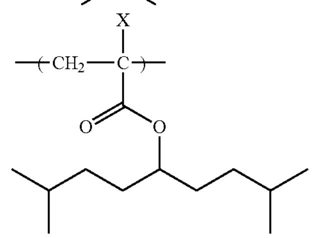

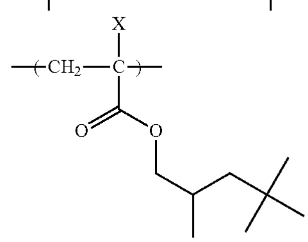

The repeating unit represented by formula (IF) can be formed by polymerizing a compound represented by the following formula (If):

(If)

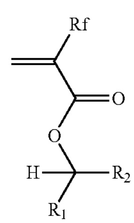

In formula (If), Rf represents a fluorine atom or an alkyl group with at least one hydrogen atom being replaced by a fluorine atom, $R_1$ represents an alkyl group, and $R_2$ represents a hydrogen atom or an alkyl group.

Rf, $R_1$ and $R_2$ in formula (If) have the same meanings as Rf, $R_1$ and $R_2$ in formula (IF).

As for the compound represented by formula (If), a commercially available product or a compound synthesized may be used. In the case of synthesizing the compound, this can be attained by converting 2-trifluoromethylmethacrylic acid into acid chloride and then esterifying the acid chloride.

The resin (D) containing a repeating unit represented by formula (IF) preferably contains a repeating unit represented by the following formula (IIIF). In the case where the resin (D) contains a repeating unit represented by formula (IIIF), the amount of the repeating unit represented by formula (IIIF) is from 1 to 100 mol %, preferably from 5 to 95 mol %, more preferably from 20 to 80 mol %, based on all repeating units constituting the resin (D).

(IIIF)

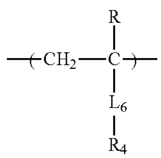

In formula (IIIF), $R_4$ represents an alkyl group, a cycloalkyl group, an aryl group, a cyano group, an alkenyl group, a cycloalkenyl group, a trialkylsilyl group, a group having a cyclic siloxane structure, or a group formed by combining two or more of these groups. Such a group may be substituted by a silicon atom-containing group or a fluorine atom.

$L_6$ represents a single bond or a divalent linking group.

R represents a hydrogen atom or an alkyl group, and the alkyl group may be substituted by a fluorine atom or the like. The alkyl group represented by R is preferably an alkyl group having a carbon number of 1 to 4. R is preferably a hydrogen atom, a methyl group or a trifluoromethyl group, more preferably a hydrogen atom or a methyl group.

In formula (IIIF), the alkyl group of $R_4$ is preferably a linear or branched alkyl group having a carbon number of 3 to 20.

The cycloalkyl group is preferably a cycloalkyl group having a carbon number of 3 to 20.

The aryl group is preferably an aryl group having a carbon number of 6 to 20, more preferably a phenyl group.

The alkenyl group is preferably an alkenyl group having a carbon number of 3 to 20.

The cycloalkenyl group is preferably a cycloalkenyl group having a carbon number of 3 to 20.

The trialkylsilyl group is preferably a trialkylsilyl group having a carbon number of 3 to 20.

The group having a cyclic siloxane structure is preferably a group containing a cyclic siloxane structure having a carbon number of 3 to 20.

$R_4$ is preferably an unsubstituted alkyl group or an alkyl group substituted by a fluorine atom, more preferably an unsubstituted alkyl group.

The divalent linking group of $L_6$ is preferably an ester bond (a group represented by —COO—), an alkylene group (preferably having a carbon number of 1 to 5), an ether bond, a phenylene group, or a divalent linking group composed by combining two or more of these bond and groups.

$L_6$ is preferably a single bond, a methylene group, an ethylene group or an ether bond.

Specific examples of the resin (D) having a repeating unit represented by formula (IF) are set forth below, but the present invention is not limited thereto.

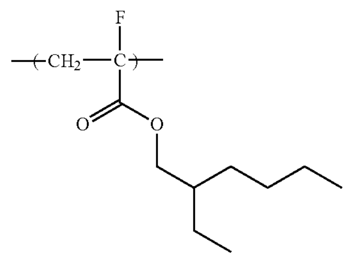

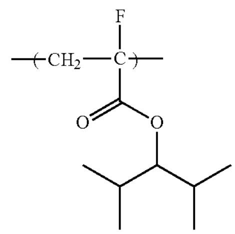

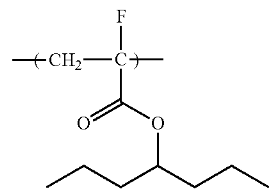

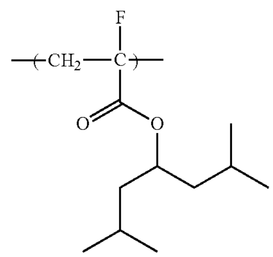

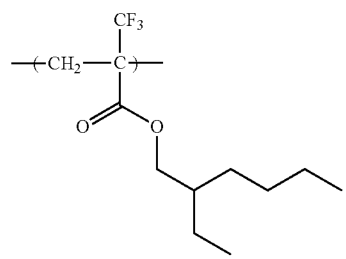

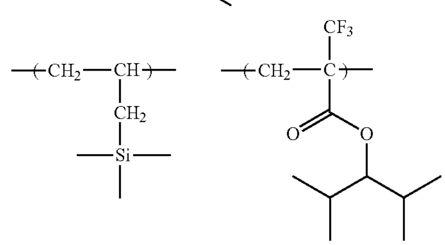

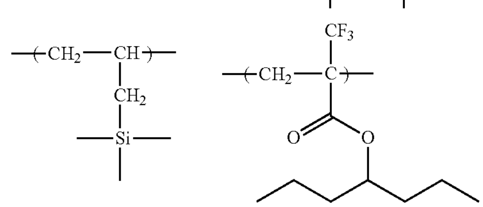

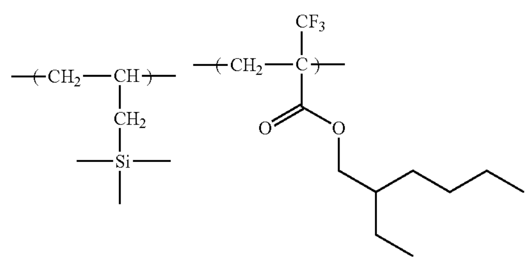

-continued
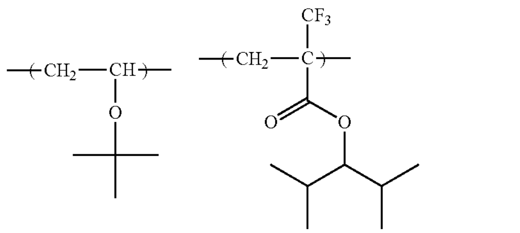
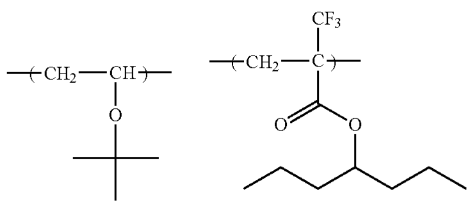
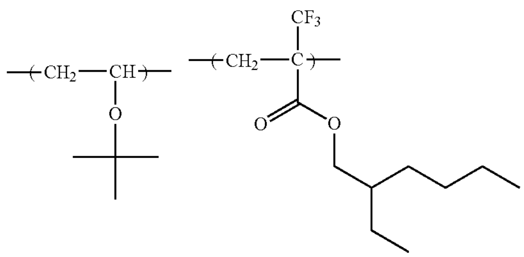
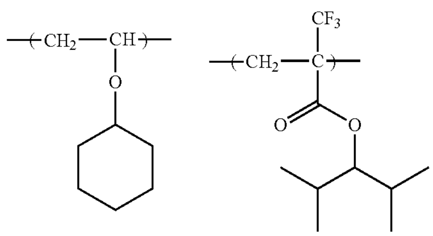
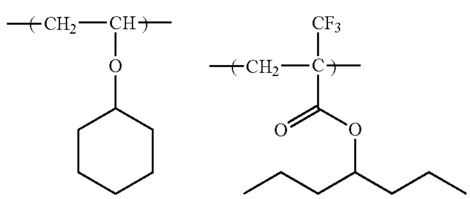
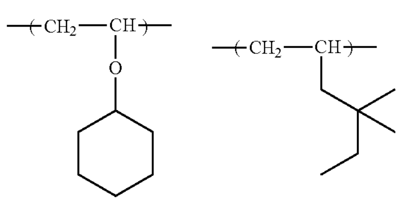
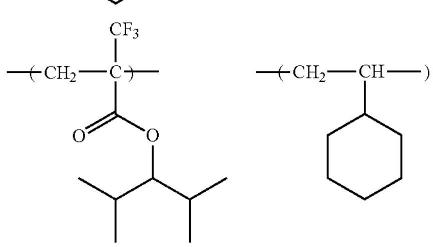
-continued
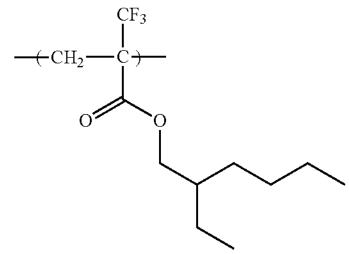
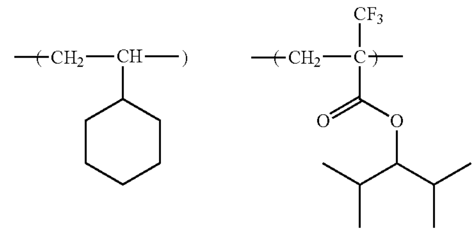
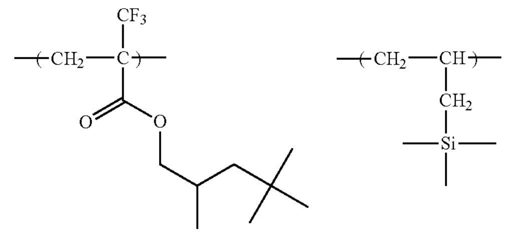
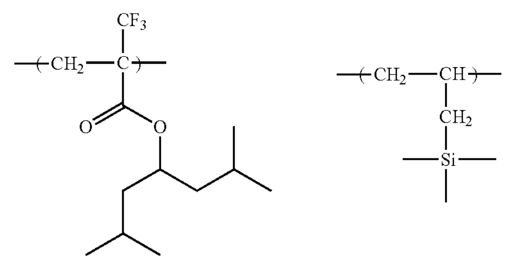
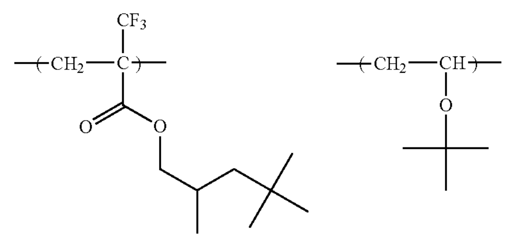
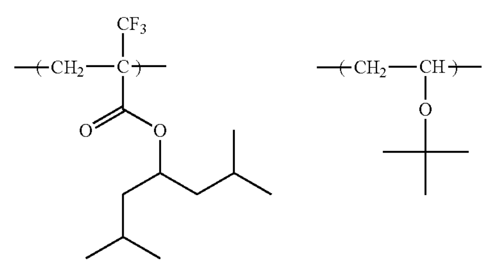
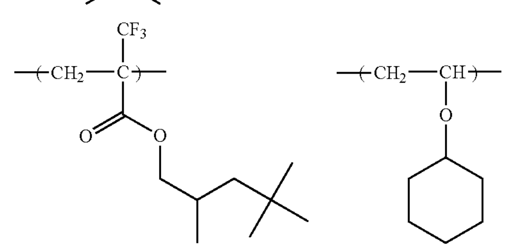

-continued

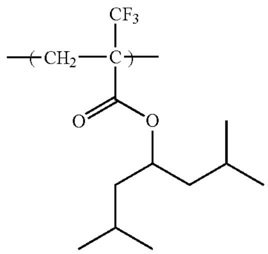
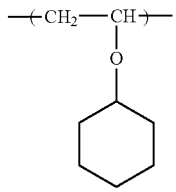
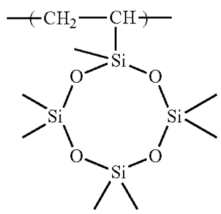
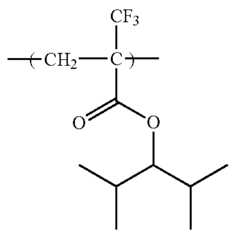
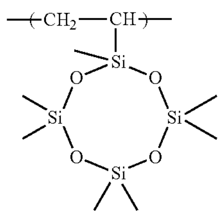
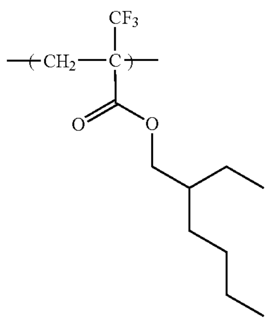
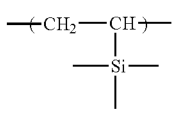
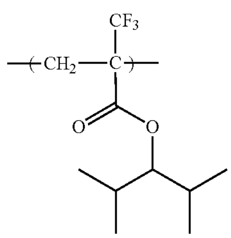
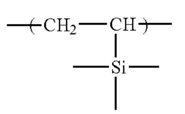
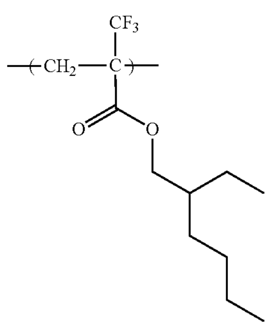
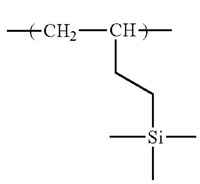
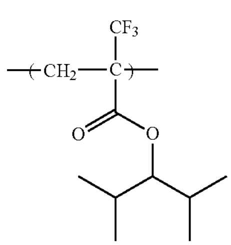

-continued

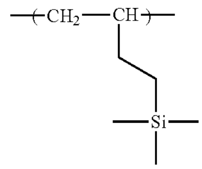
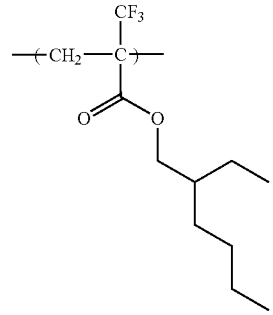
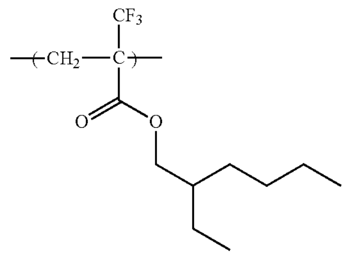
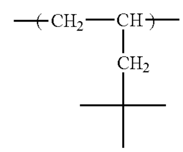
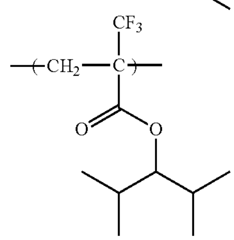
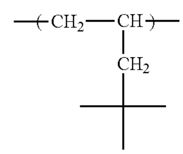
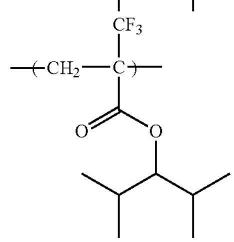
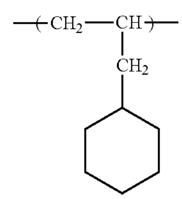

The resin (D) is preferably a resin containing a repeating unit represented by the following formula (IIF) and a repeating unit represented by the following formula (IIIF).

(IIF)

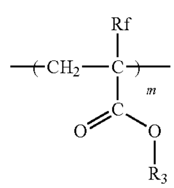

(IIIF)

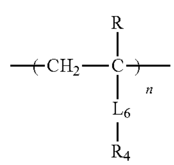

In formulae (IIF) and (IIIF), Rf represents a fluorine atom or an alkyl group with at least one hydrogen atom being replaced by a fluorine atom.

$R_3$ represents an alkyl group, a cycloalkyl group, an alkenyl group, a cycloalkenyl group, or a group composed by combining two or more of these groups.

$R_4$ represents an alkyl group, a cycloalkyl group, an aryl group, a cyano group, an alkenyl group, a cycloalkenyl group, a trialkylsilyl group, a group having a cyclic siloxane structure, or a group composed by combining two or more of these groups. Such a group may be substituted by a silicon atom-containing group or a fluorine atom.

R represents a hydrogen atom or an alkyl group, and the alkyl group may be substituted by a fluorine atom or the like. The alkyl group represented by R is preferably an alkyl group having a carbon number of 1 to 4. R is preferably a hydrogen atom, a methyl group or a trifluoromethyl group, more preferably a hydrogen atom or a methyl group.

$L_6$ represents a single bond or a divalent linking group.

m and n define the molar ratio of the above-described repeating units and satisfy $0<m<100$, $0<n<100$, and $m+n=100$.

In formula (IIF), Rf has the same meaning as Rf in formula (IF).

The alkyl group of $R_3$ and $R_4$ is preferably a linear or branched alkyl group having a carbon number of 3 to 20.

The cycloalkyl group of $R_3$ and $R_4$ is preferably a cycloalkyl group having a carbon number of 3 to 20.

The alkenyl group of $R_3$ and $R_4$ is preferably an alkenyl group having a carbon number of 3 to 20.

The cycloalkenyl group of $R_3$ and $R_4$ is preferably a cycloalkenyl group having a carbon number of 3 to 20.

The aryl group of $R_4$ is preferably an aryl group having a carbon number of 6 to 20, more preferably a phenyl group.

The trialkylsilyl group of $R_4$ is preferably a trialkylsilyl group having a carbon number of 3 to 20.

The group having a cyclic siloxane structure is preferably a group containing a cyclic siloxane structure having a carbon number of 3 to 20.

In the alkyl group, cycloalkyl group, aryl group, alkenyl group, cycloalkenyl group and trialkylsilyl group of $R_3$ and $R_4$, a functional group can be introduced, but in view of followability of immersion liquid, a functional group not having a polar group is preferred, and each of the groups above is more preferably unsubstituted.

Each of $R_3$ and $R_4$ is preferably an unsubstituted alkyl group or an alkyl group substituted by a fluorine atom, more preferably unsubstituted alkyl group.

The divalent linking group of $L_6$ is preferably an ester bond (a group represented by —COO—), an alkylene group (preferably having a carbon number of 1 to 5), an ether bond or a phenylene group.

$L_6$ is preferably a single bond, a methylene group, an ethylene group or an ether bond.

m and n preferably satisfy m=from 30 to 70, n=from 30 to 70 and m+n=100, more preferably m=from 40 to 60, n=from 40 to 60 and m+n=100.

Specific examples of the resin (D) having a repeating unit represented by formula (IIF) and a repeating unit represented by formula (IIIF) are set forth below, but the present invention is not limited thereto.

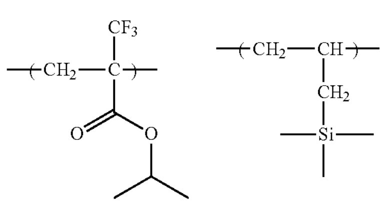

-continued

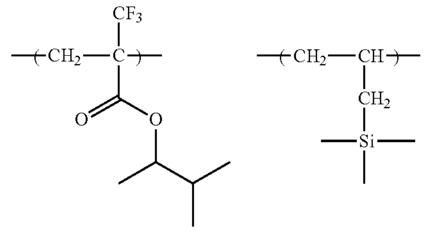

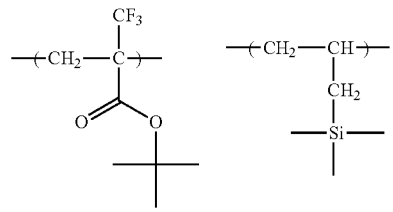

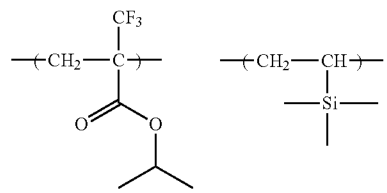

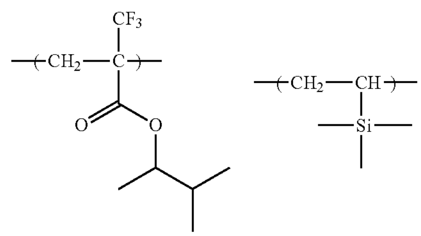

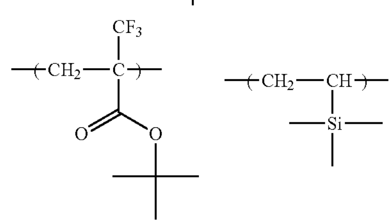

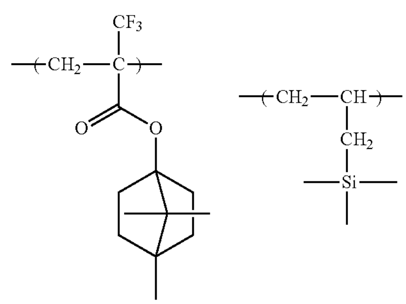

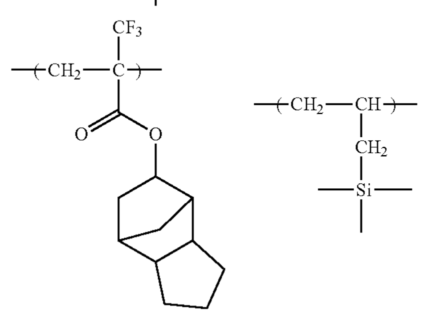

-continued
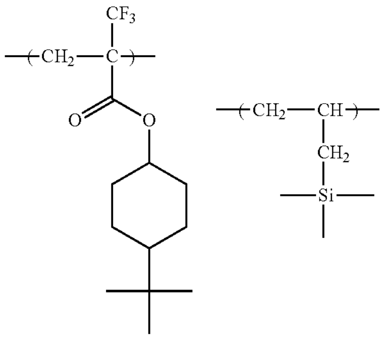
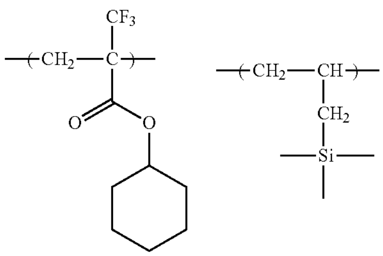
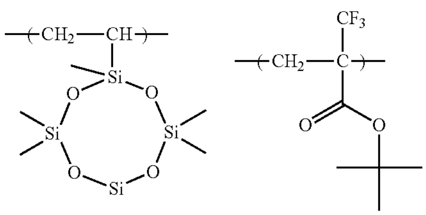
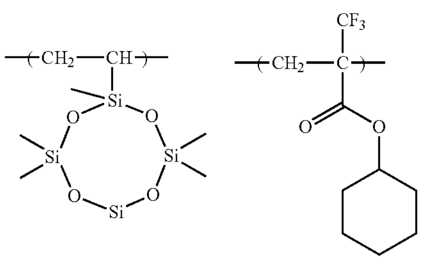
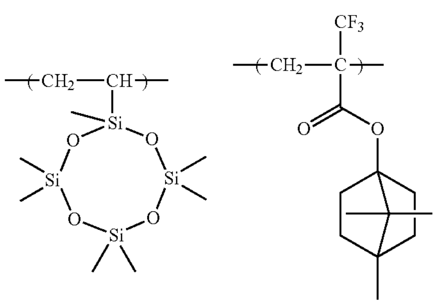
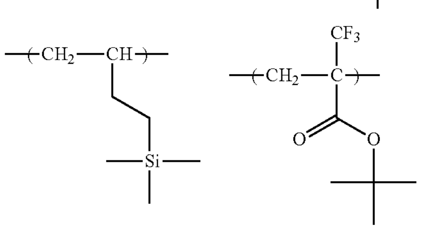
-continued
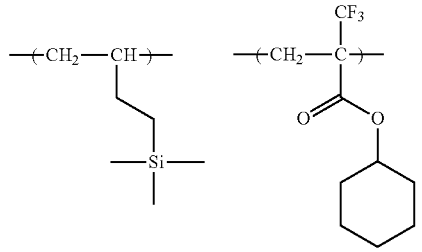
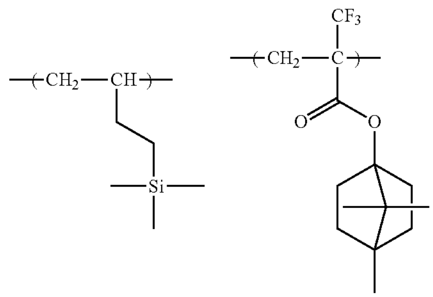
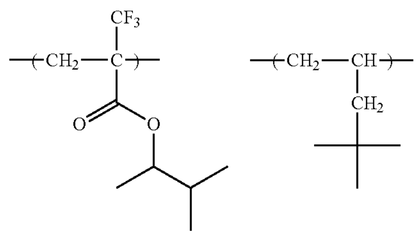
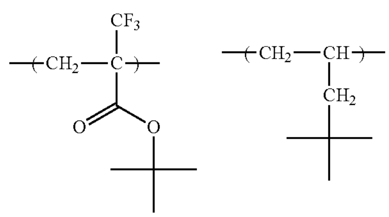
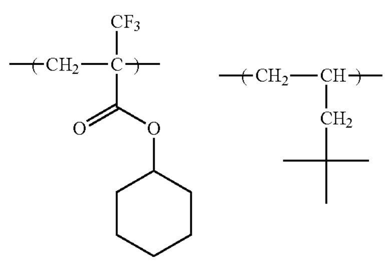
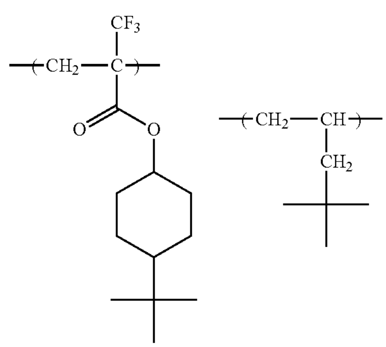

-continued

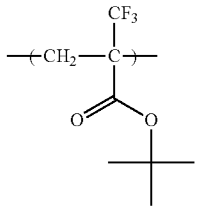

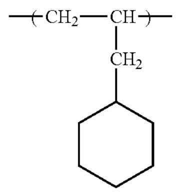

The resin (D) may contain a repeating unit represented by the following formula (VIII):

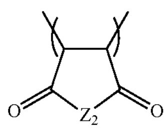

(VIII)

In formula (VIII), $Z_2$ represents —O— or —N($R_{41}$)—. $R_{41}$ represents a hydrogen atom, a hydroxyl group, an alkyl group or —$OSO_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

The resin (D) is preferably solid at ordinary temperature (25° C.). Furthermore, the glass transition temperature (Tg) is preferably from 50 to 200° C., more preferably from 80 to 160° C.

When the resin is solid at 25° C., this means that the melting point is 25° C. or more.

The glass transition temperature (Tg) can be measured by a scanning calorimeter (Differential Scanning Calorimeter). For example, the glass transition temperature can be measured by once heating and then cooling the sample, again raising the temperature at 5° C./min, and analyzing the value when the specific volume is changed.

The resin (D) is preferably stable to an acid and insoluble in an alkali developer.

In view of followability of immersion liquid, the resin (D) preferably contains none of (x) an alkali-soluble group, (y) a group capable of decomposing by the action of an alkali (alkali developer) to increase the solubility in an alkali developer, and (z) a group capable of decomposing by the action of an acid to increase the solubility in a developer.

In the resin (D), the total amount of repeating units having an alkali-soluble group or a group whose solubility in an alkali developer increases by the action of an acid or alkali is usually 50 mol % or less, preferably 20 mol % or less, more preferably from 0 to 10 mol %, still more preferably from 0 to 5 mol %, based on all repeating units constituting the resin (D).

Also, unlike a surfactant generally used for resists, the resin (D) does not have an ionic bond or a hydrophilic group such as (poly(oxyalkylene)) group. If the resin (D) contains a hydrophilic polar group, the followability of immersion water tends to decrease. Therefore, it is more preferred not to contain a polar group selected from a hydroxyl group, alkylene glycols and a sulfone group. Furthermore, an ether group bonded to the carbon atom of the main chain through a linking group is preferably not contained because the hydrophilicity increases and the followability of immersion liquid deteriorates. On the other hand, an ether group bonded directly to the carbon atom of the main chain as in formula (IIIF) can sometimes express activity as a hydrophobic group and is preferred.

Examples of the alkali-soluble group (x) include groups having a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

Examples of the group (y) capable of decomposing by the action of an alkali (alkali developer) to increase the solubility in an alkali developer include a lactone group, an ester group, a sulfonamide group, an acid anhydride and an acid imide group.

Examples of the group (z) capable of decomposing by the action of an acid to increase the solubility in a developer include the same groups as those of the acid-decomposable group in the resin (A).

However, the repeating unit represented by the following formula (pA-c) is not or scarcely decomposed by the action of an acid as compared with the acid-decomposable group of the resin (A) and is regarded as substantially non-acid-decomposable.

(pA-c)

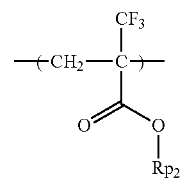

In formula (pA-c), $Rp_2$ represents a hydrocarbon group having a tertiary carbon atom bonded to the oxygen atom in the formula.

In the case where the resin (D) contains a silicon atom, the silicon atom content is preferably from 2 to 50 mass %, more preferably from 2 to 30 mass %, based on the molecular weight of the resin (D). Also, the silicon atom-containing repeating unit preferably occupies from 10 to 100 mass %, more preferably from 20 to 100 mass %, in the resin (D).

In the case where the resin (D) contains a fluorine atom, the fluorine atom content is preferably from 5 to 80 mass %, more preferably from 10 to 80 mass %, based on the molecular weight of the resin (D). Also, the fluorine atom-containing repeating unit preferably occupies from 10 to 100 mass %, more preferably from 30 to 100 mass %, in the resin (D).

The standard polystyrene-reduced weight average molecular of the resin (D) is preferably from 1,000 to 100,000, more preferably from 1,000 to 50,000, still more preferably from 2,000 to 15,000, yet still more preferably from 3,000 to 15,000.

One kind of a resin (D) may be used alone, or two or more kinds thereof may be used in combination.

The residual monomer amount in the resin (D) is preferably from 0 to 10 mass %, more preferably from 0 to 5 mass %, still more preferably from 0 to 1 mass %. Also, in view of resolution, resist profile, and side wall, roughness or the like of the resist pattern, the molecular weight distribution (Mw/Mn, also called polydispersity) is preferably from 1 to 5, more preferably from 1 to 3, still more preferably from 1 to 1.5.

The amount added of the resin (D) in the resist composition is preferably from 0.1 to 20 mass %, more preferably from 0.1 to 10 mass %, still more preferably from 0.1 to 5 mass %, even still more preferably from 0.2 to 3.0 mass %, yet even still more preferably from 0.3 to 2.0 mass %, based on the entire solid content of the resist composition.

In the resin (D), similarly to the resin (A), it is of course preferred that the amount of impurities such as metal is small, but the content of residual monomers or oligomer components is preferably not more than a specified value, for example, is 0.1 mass % by HPLC. By satisfying these conditions, not only the resist can be improved in the sensitivity, resolution, process stability, pattern profile and the like but also a resist free from extraneous substances in liquid or change with aging in the sensitivity and the like can be obtained.

As for the resin (D), various commercially available products may be used or the resin may be synthesize by an ordinary method (for example, radical polymerization)). Examples of the general synthesis method include a batch polymerization method of dissolving monomer species and a polymerization initiator in a solvent and heating the solution, thereby effecting the polymerization, and a dropping polymerization method of adding dropwise a solution containing monomer species and a polymerization initiator to a heated solvent over 1 to 10 hours. A dropping polymerization method is preferred. Examples of the reaction solvent include ethers such as diisopropyl ether, tetrahydrofuran, 1,4-dioxane, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the polymerization initiator include azobisisobutyronitrile, azobisdimethylvaleronitrile and dimethyl 2,2'-azobis(2-methylpropionate). A chain transfer agent may also be used, if desired. The concentration of the solute such as monomer, polymerization initiator and chain transfer agent in the reaction solution is usually from 5 to 50 mass %, preferably from 20 to 50 mass %, more preferably from 30 to 50 mass %. The reaction temperature is usually from 10 to 150° C., preferably from 30 to 120° C., more preferably from 60 to 100° C.

After the completion of reaction, the reaction product is allowed to cool to room temperature and purified. The purification may be performed by a normal method, for example, a liquid-liquid extraction method of combining water washing with an appropriate solvent to remove residual monomers or oligomer components; a purification method in a solution sate, such as ultrafiltration of extracting and removing only polymers having a molecular weight lower than a specific molecular weight; a reprecipitation method of adding dropwise the resin solution in a poor solvent to solidify the resin in the poor solvent and thereby remove residual monomers and the like; or a purification method in a solid state, such as washing of the resin slurry with a poor solvent after separation by filtration. For example, the resin is precipitated as a solid through contact with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent used may be appropriately selected according to the kind of the polymer from, for example, a hydrocarbon (an aliphatic hydrocarbon such as pentane, hexane, heptane and octane; an alicyclic hydrocarbon such as cyclohexane and methylcyclohexane; and an aromatic hydrocarbon such as benzene, toluene and xylene), a halogenated hydrocarbon (a halogenated aliphatic hydrocarbon such as methylene chloride, chloroform and carbon tetrachloride; and a halogenated aromatic hydrocarbon such as chlorobenzene and dichlorobenzene), a nitro compound (e.g., nitromethane, nitroethane), a nitrile (e.g., acetonitrile, benzonitrile), an ether (a chain ether such as diethyl ether, diisopropyl ether and dimethoxyethane; and a cyclic ether such as tetrahydrofuran and dioxane), a ketone (e.g., acetone, methyl ethyl ketone, diisobutyl ketone), an ester (e.g., ethyl acetate, butyl acetate), a carbonate (e.g., dimethyl carbonate, diethyl carbonate, ethylene carbonate, propylene carbonate), an alcohol (e.g., methanol, ethanol, propanol, isopropyl alcohol, butanol), a carboxylic acid (e.g., acetic acid), water, and a mixed solvent containing such a solvent. Among these, the precipitation or reprecipitation solvent is preferably a solvent containing at least an alcohol (particularly methanol or the like) or water. In such a solvent containing at least an alcohol, the ratio of the alcohol (particularly methanol or the like) to other solvents (for example, esters such as ethyl acetate and ethers such as tetrahydrofuran) is approximately, for example, the former/the latter (volume ratio, at 25° C.)=from 10/90 to 99/1, preferably the former/the latter (volume ratio, at 25° C.)=from 30/70 to 98/2, more preferably the former/the latter (volume ratio, at 25° C.)=from 50/50 to 97/3.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The nozzle aperture at the time of feeding the polymer solution into a precipitation or reprecipitation solvent (poor solvent) is preferably 4 mmϕ or less (for example, from 0.2 to 4 mmϕ), and the feeding rate (dropping rate) of the polymer solution into the poor solvent is, for example, in terms of the linear velocity, from 0.1 to 10 m/sec, preferably on the order of 0.3 to 5 m/sec.

The precipitation or reprecipitation operation is preferably performed under stirring. Examples of the stirring blade which can be used for stirring include a disc turbine, a fan turbine (including paddle), a curved vane turbine, a feathering turbine, a Pfaudler type, a bull margin type, an angled vane fan turbine, a propeller, a multistage type, an anchor type (or horseshoe type), a gate type, a double ribbon and a screw. The stirring is preferably further performed for 10 minutes or more, more preferably 20 minutes or more, after the completion of feed of the polymer solution. If the stirring time is short, the monomer content in the polymer particle may not be sufficiently reduced. The mixing and stirring of the polymer solution and the poor solvent may also be performed using a line mixer instead of the stirring blade.

The temperature at the precipitation or reprecipitation may be appropriately selected by taking into account the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank, according to a known method such as batch system and continuous system.

The precipitated or reprecipitated particulate polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble.

More specifically, there may be used a method comprising, after the completion of radical polymerization reaction, precipitating a resin by bringing the polymer into contact with a solvent in which the polymer is sparingly soluble or insoluble (step a), separating the resin from the solution (step b), anew dissolving the resin in a solvent to prepare a resin solution A (step c), precipitating a resin solid by bringing the resin solution A into contact with a solvent in which the resin is sparingly soluble or insoluble and which is in a volumetric amount of less than 10 times (preferably a volumetric amount of 5 times or less) the resin solution A (step d), and separating the precipitated resin (step e).

As for the solvent used at the preparation of the resin solution A, a solvent similar to the solvent used for dissolving the monomer at the polymerization reaction may be used, and the solvent may be the same as or different from the solvent used at the polymerization reaction.

[5] (E) Basic Compound

The resist composition for use in the present invention preferably contains (E) a basic compound for reducing the change of performance with aging from exposure to heating.

Preferred examples of the basic compound include a compound having a structure represented by the following formulae (A) to (E):

(A)

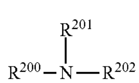

(B)

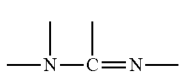

(C)

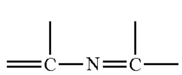

(D)

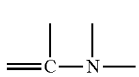

(E)

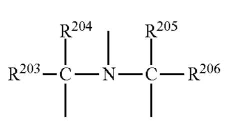

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

Each of $R^{203}$, $R^{204}$, $R^{205}$ and $R^{206}$, which may be the same or different, represents an alkyl group having a carbon number of 1 to 20.

The alkyl group in these formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure is changed to a carboxylate, such as acetate, adamantane-1-carboxylate and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One of these basic compounds is used alone, or two or more kinds thereof are used in combination.

The amount of the basic compound used is usually from 0.001 to 10 mass %, preferably from 0.01 to 5 mass %, based on the solid content of the resist composition.

The ratio between the acid generator and the basic compound used in the composition is preferably acid generator/basic compound (by mol)=from 2.5 to 300. That is, the molar ratio is preferably 2.5 or more in view of sensitivity and resolution and is preferably 300 or less from the standpoint of suppressing reduction in the resolution due to thickening of the resist pattern with aging from exposure to heat treatment. The acid generator/basic compound (by mol) is more preferably from 5.0 to 200, still more preferably from 7.0 to 150.

[6] (F) Surfactant

The resist composition for use in the present invention may further contain or may not contain a surfactant and in the case of containing a surfactant, it is preferred to contain any fluorine-containing and/or silicon-containing surfactant (a fluorine-containing surfactant, a silicon-containing surfactant or a surfactant containing both a fluorine atom and a silicon atom) or two or more kinds thereof.

When the resist composition of the present invention contains a surfactant, a resist pattern with good sensitivity, resolution and adherence as well as little development defects can be obtained in using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204D, 208G, 218G, 230G, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene))acrylate and/or a (poly(oxyalkylene))methacrylate, and the copolymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), and a copolymer of a $C_3F_7$ group-containing acrylate (or methacrylate) with a (poly(oxyethylene)) acrylate (or methacrylate) and a (poly(oxypropylene))acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some of them may be used in combination.

The amount of the surfactant used is preferably from 0.01 to 10 mass %, more preferably from 0.1 to 5 mass %, based on the entire amount of the resist composition (excluding the solvent).

On the other hand, by setting the amount added of the surfactant to 10 ppm or less based on the entire amount of the resist composition (excluding the solvent), the resin (D) is more unevenly distributed to the surface, so that the resist film surface can be made hydrophobic and the followability of water at the immersion exposure can be enhanced.

[7] (G) Onium Carboxylate

The resist composition for use in the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. The carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably an anion of the carboxylic acid with the alkyl group being partially or entirely fluorine-substituted. The alkyl chain may contain an oxygen atom. Thanks to such a construction, the transparency to light of 220 nm or less is ensured, the sensitivity and resolution are enhanced, and the iso/dense bias and exposure margin are improved.

Examples of the anion of fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

[8] Basic Compound or Ammonium Salt Compound Whose Basicity Decreases Upon Irradiation with an Actinic Ray or Radiation The resist composition for use in the present invention may contain a basic compound or ammonium salt compound whose basicity decreases upon irradiation with an actinic ray or radiation (hereinafter sometimes referred to as a "compound (PA)").

The compound (PA) is preferably (PA') a compound having a basic functional group or an ammonium group and a group capable of generating an acidic functional group upon irradiation with an actinic ray or radiation. That is, the compound (PA) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

The compound which is generated due to decomposition of the compound (PA) or (PA') upon irradiation with an actinic ray or radiation and whose basicity is decreased includes compounds represented by the following formulae (PA-I), (PA-II) and (PA-III), and from the standpoint that excellent effects can be attained in a high level in terms of both LWR and DOF, compounds represented by formulae (PA-II) and (PA-III) are preferred.

The compound represented by formula (PA-I) is described below.

$$Q\text{-}A_1\text{-}(X)_n\text{—}B\text{—}R \qquad \text{(PA-I)}$$

In formula (PA-I), $A_1$ represents a single bond or a divalent linking group.

Q represents —$SO_3H$ or —$CO_2H$. Q corresponds to an acidic functional group that is generated upon irradiation with an actinic ray or radiation.

X represents —$SO_2$— or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group as $A_1$ is preferably a divalent organic group having a carbon number of 2 to 12, and examples thereof include an alkylene group and a phenylene group. An alkylene group having at least one fluorine atom is preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group in Rx is preferably a monovalent organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Here, the alkyl group having a substituent includes particularly a group where a cycloalkyl group is substituted on a linear or branched alkyl group (for example, an adamantylmethyl group, an adamantylethyl group, a cycohexylethyl group and a camphor residue).

The cycloalkyl group in Rx may have a substituent and is preferably a cycloalkyl group having a carbon number of 3 to 20, and the cycloalkyl group may contain an oxygen atom in the ring.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent, and examples thereof include a group having a double bond at an arbitrary position of the alkyl group described for Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. From the standpoint of enhancing the basicity, it is preferred that all atoms adjacent to nitrogen atom contained in the structure are a carbon atom or a hydrogen atom. Also, in view of enhancing the basicity, an electron-withdrawing functional group (e.g., carbonyl group, sulfonyl group, cyano group, halogen atom) is preferably not bonded directly to nitrogen atom.

The monovalent organic group as the monovalent organic group (group R) containing such a structure is preferably an organic group having a carbon number of 4 to 30, and examples thereof include an alkyl group, a cycloalkyl group, an aryl group, an aralkyl group and an alkenyl group. These groups each may have a substituent.

The alkyl group, cycloalkyl group, aryl group, aralkyl group and alkenyl group in the alkyl group, cycloalkyl group, aryl group, aralkyl group and alkenyl group as R containing a basic functional group or an ammonium group are the same as the alkyl group, cycloalkyl group, aryl group, aralkyl group and alkenyl group described for Rx.

Examples of the substituent which the groups above each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include one or two alkyl groups (preferably having a carbon number of 1 to 20).

When B is —N(Rx)—, R and Rx preferably combine together to form a ring. By virtue of forming a ring structure, the stability is enhanced and the composition using this compound is also enhanced in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure composed by combining two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, examples of the substituent further include an alkyl group (preferably having a carbon number of 1 to 15). As for the aminoacyl group, examples of the substituent further include one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

The compound represented by formula (PA-II) is described below.

$$Q_1\text{-}X_1\text{—NH—}X_2\text{-}Q_2 \qquad \text{(PA-II)}$$

In formula (PA-II), each of $Q_1$ and $Q_2$ independently represents a monovalent organic group, provided that either one of $Q_1$ and $Q_2$ has a basic functional group. $Q_1$ and $Q_2$ may combine together to form a ring and the ring formed may have a basic functional group.

Each of $X_1$ and $X_2$ independently represents —CO— or —$SO_2$—.

Here, —NH— corresponds to an acidic functional group that is generated upon irradiation with an actinic ray or radiation.

The monovalent organic group of $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group of $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group of $Q_1$ and $Q_2$ may have a substituent and is preferably a cycloalkyl group having a carbon number of 3 to 20, and the ring may contain an oxygen atom or a nitrogen atom.

The aryl group of $Q_1$ and $Q_2$ may have a substituent and is preferably an aryl group having a carbon number of 6 to 14.

The aralkyl group of $Q_1$ and $Q_2$ may have a substituent and is preferably an aralkyl group having a carbon number of 7 to 20.

The alkenyl group of $Q_1$ and $Q_2$ may have a substituent and includes a group having a double bond at an arbitrary position of the alkyl group above.

Examples of the substituent which these groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Preferred examples of the partial structure of the basic functional group which at least either $Q_1$ or $Q_2$ has are the same as those of the basic functional group in R of formula (PA-I).

When $Q_1$ and $Q_2$ combine together to form a ring and the ring formed has a basic functional group, examples of the structure thereof include a structure where the organic group of $Q_1$ or $Q_2$ is further bonded by an alkylene group, an oxy group, an imino group or the like.

In formula (PA-II), at least either one of $X_1$ and $X_2$ is preferably —$SO_2$—.

The compound represented by formula (PA-III) is described below.

$$Q_1\text{-}X_1\text{—NH—}X_2\text{-}A_2\text{-}(X_3)_m\text{—B-}Q_3 \qquad \text{(PA-III)}$$

In formula (PA-III), each of $Q_1$ and $Q_3$ independently represents a monovalent organic group, provided that either one of $Q_1$ and $Q_3$ has a basic functional group. $Q_1$ and $Q_3$ may combine together to form a ring, and the ring formed may have a basic functional group.

Each of $X_1$, $X_2$ and $X_3$ independently represents —CO— or —$SO_2$—.

$A_2$ represents a divalent linking group.

B represents a single bond, an oxygen atom or —N(Qx)-.

Qx represents a hydrogen atom or a monovalent organic group.

When B is —N(Qx)-, $Q_3$ and Qx may combine together to form a ring. m represents 0 or 1.

Here, —NH— corresponds to an acidic functional group that is generated upon irradiation with an actinic ray or radiation.

$Q_1$ has the same meaning as $Q_1$ in formula (PA-II).

Examples of the organic group of $Q_3$ are the same as those of the organic group of $Q_1$ and $Q_2$ in formula (PA-II).

The divalent linking group of $A_2$ is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroalkylene group having a carbon number of 2 to 4.

The monovalent organic group of Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —$SO_2$—.

The compound (PA) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

(PA1)

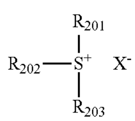

(PA2)

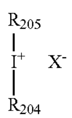

In formula (PA1), each of $R_{201}$, $R_{202}$ and $R_{203}$ independently represents an organic group, and specific examples thereof are the same as those for $R_{201}$, $R_{202}$ and $R_{203}$ of formula (ZI) in the component (B).

$X^-$ represents a sulfonate or carboxylate anion resulting from removal of a hydrogen atom in the —$SO_3H$ moiety or —COOH moiety of the compound represented by formula (PA-I), or an anion resulting from removal of a hydrogen atom in the —NH— moiety of the compound represented by formula (PA-II) or (PA-III).

In formula (PA2), each of $R_{204}$ and $R_{205}$ independently represents an aryl group, an alkyl group or a cycloalkyl group. Specific examples thereof are the same as those for $R_{204}$ and $R_{205}$ of formula (ZII) in the component (B).

$X^-$ represents a sulfonate or carboxylate anion resulting from removal of a hydrogen atom in the —$SO_3H$ moiety or —COOH moiety of the compound represented by formula (PA-I), or an anion resulting from removal of a hydrogen atom in the —NH— moiety of the compound represented by formula (PA-II) or (PA-III).

The compound (PA) decomposes upon irradiation with an actinic ray or radiation to generate, for example, a compound represented by formula (PA-I), (PA-II) or (PA-III).

The compound represented by formula (PA-I) is a compound having a sulfonic acid or carboxylic acid group together with a basic functional group or an ammonium group and thereby being reduced in or deprived of the basicity or changed from basic to acidic as compared with the compound (PA).

The compound represented by formula (PA-II) or (PA-III) is a compound having an organic sulfonylimino or organic carbonylimino group together with a basic functional group and thereby being reduced in or deprived of the basicity or changed from basic to acidic as compared with the compound (PA).

In the present invention, the expression "reduced in the basicity upon irradiation with an actinic ray or radiation" means that the acceptor property for a proton (an acid generated upon irradiation with an actinic ray or radiation) of the compound (PA) is decreased by the irradiation with an actinic ray or radiation. The expression "reduced in the acceptor property" means that when an equilibrium reaction of producing a noncovalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

A compound (PA) whose basicity decreases upon irradiation with an actinic ray or radiation is contained in the resist film, so that in the unexposed area, the acceptor property of the compound (PA) is sufficiently brought out and an unintended reaction between an acid diffused from the exposed area or the like and the resin (A) can be inhibited, whereas in the exposed area, the acceptor property of the compound (PA) decreases and the intended reaction of an acid with the resin (A) unfailingly occurs. By virtue of such an operation mechanism, a pattern excellent in terms of line width roughness (LWR), depth of focus (DOF) and pattern profile is considered to be obtained.

The basicity can be confirmed by measuring the pH, or a calculated value can be computed using a commercially available software.

Specific examples of the compound (PA) whose basicity decreases upon irradiation with an actinic ray or radiation include those described in JP-A-2006-208781 and JP-A-2006-330098.

Specific examples of the compound (PA) capable of generating a compound represented by formula (PA-I) upon irradiation with an actinic ray or radiation are set forth below, but the present invention is not limited thereto.

(PA-1)

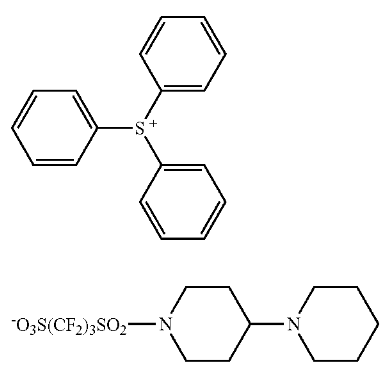

(PA-2)

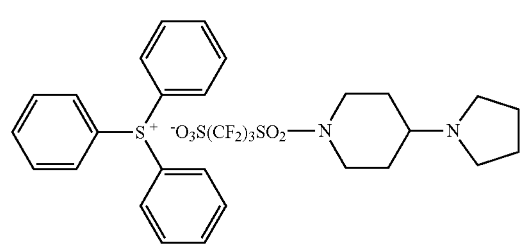

-continued
(PA-3)
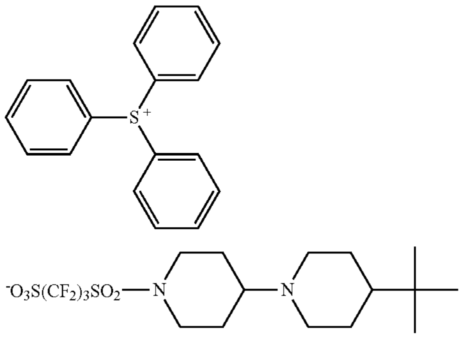
(PA-4)
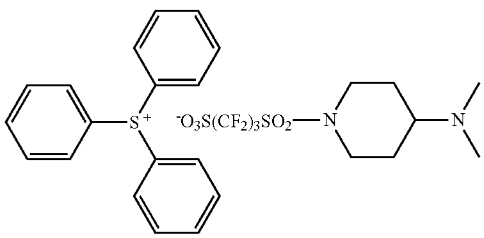
(PA-5)
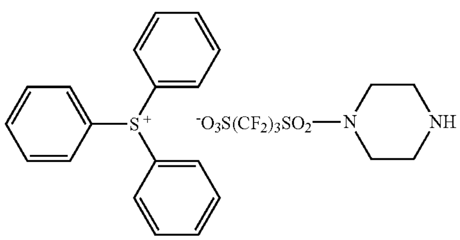
(PA-6)
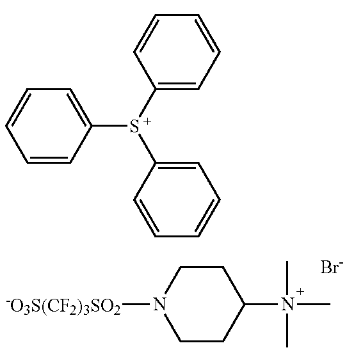
(PA-7)
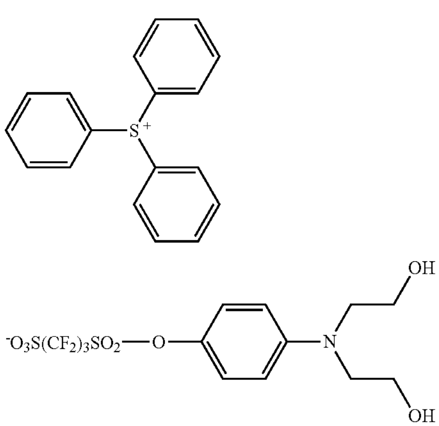
-continued
(PA-8)
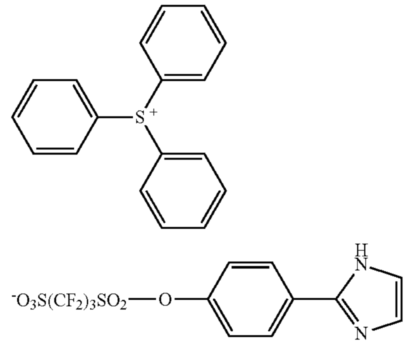
(PA-9)
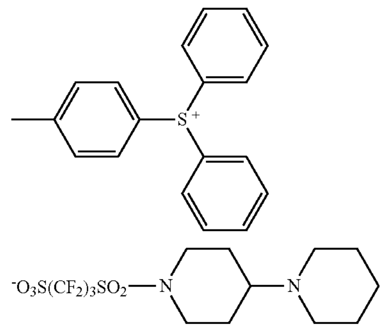
(PA-10)
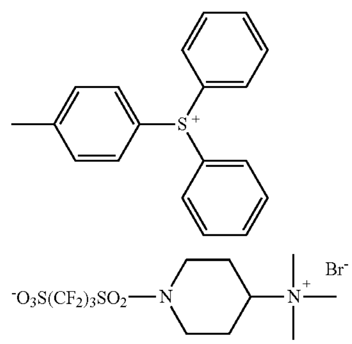
(PA-11)
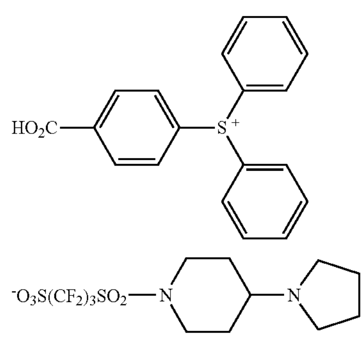
(PA-12)
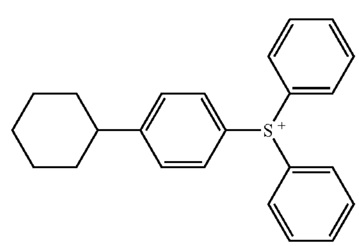

-continued
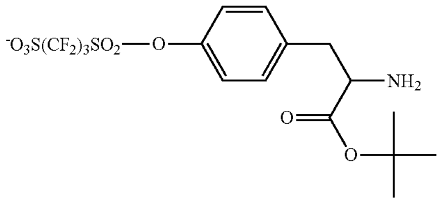
(PA-13)
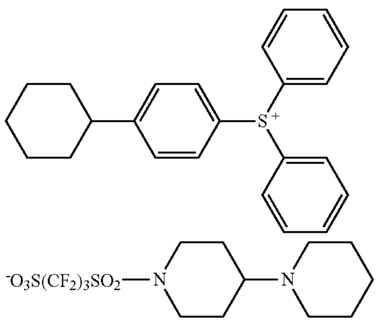
(PA-14)
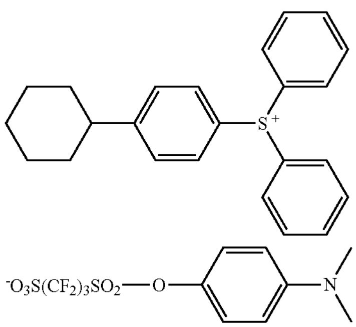
(PA-15)
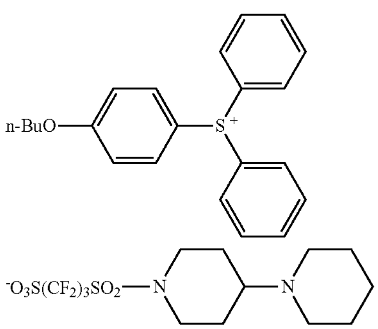
(PA-16)
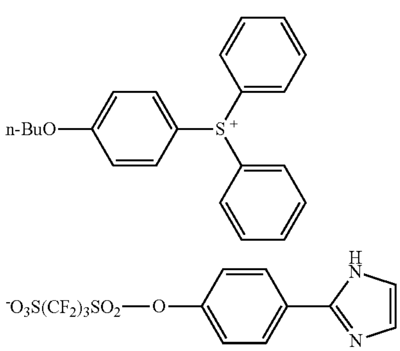
(PA-17)
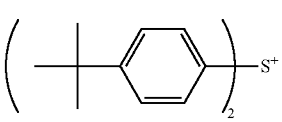
-continued
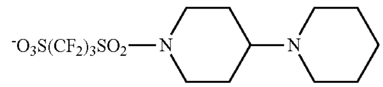
(PA-18)
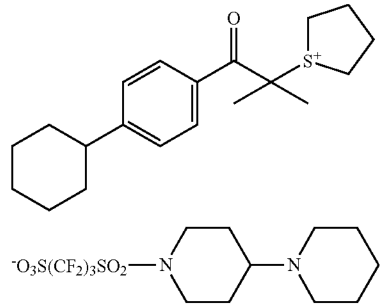
(PA-19)
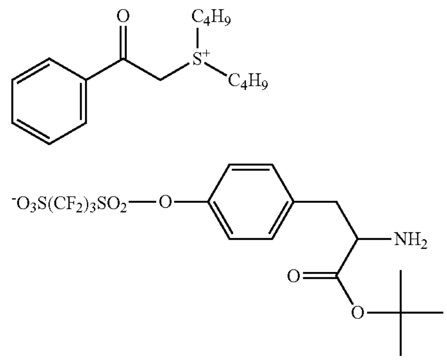
(PA-20)
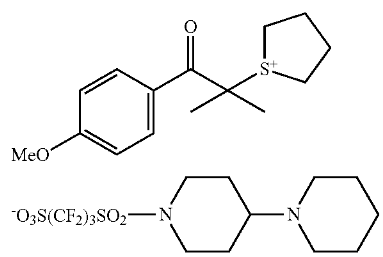
(PA-21)
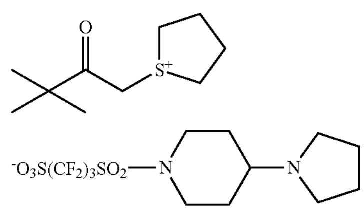
(PA-22)
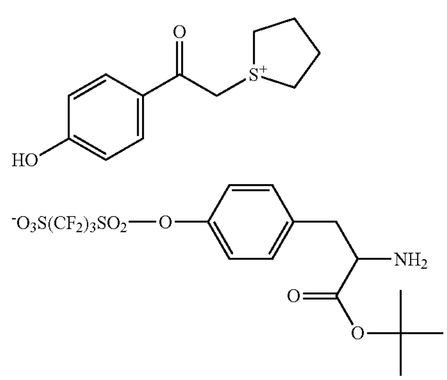

-continued
(PA-23)
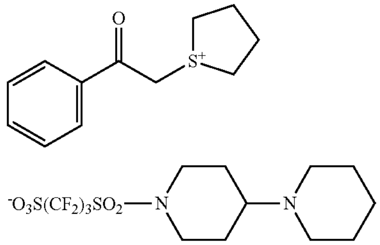
(PA-24)
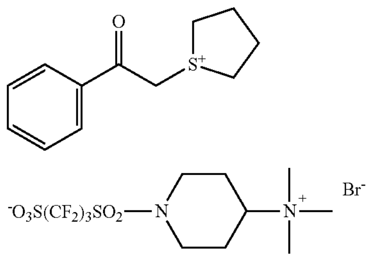
(PA-25)
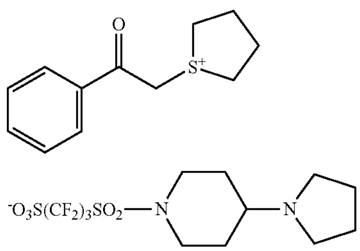
(PA-26)
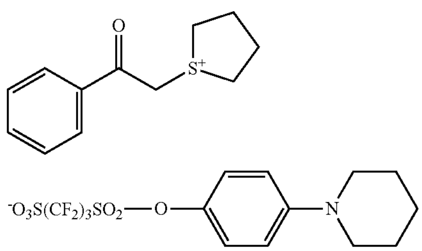
(PA-27)
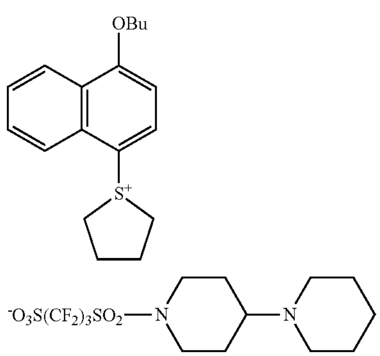
(PA-28)
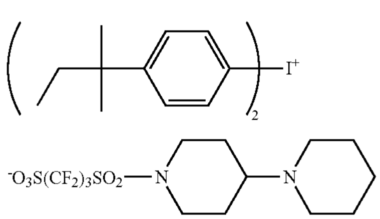
-continued
(PA-29)
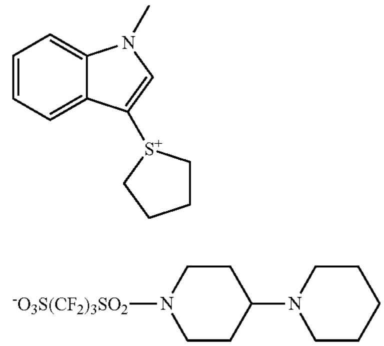
(PA-30)
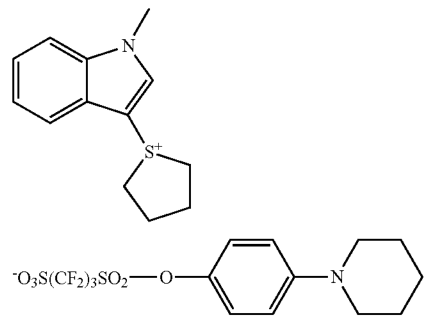
(PA-31)
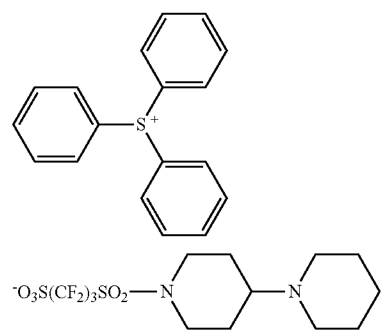
(PA-32)
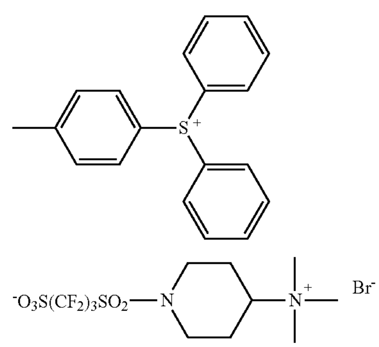
(PA-33)
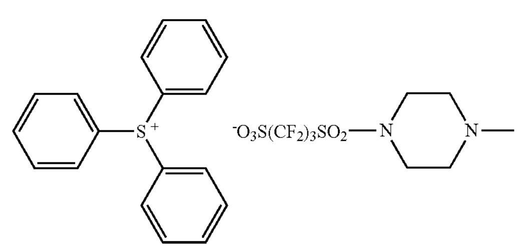

-continued
(PA-34)
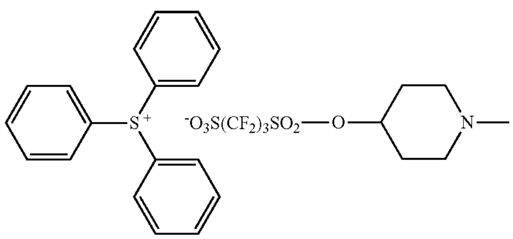
(PA-35)
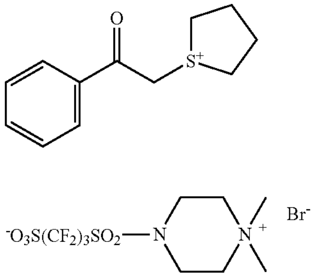
(PA-36)
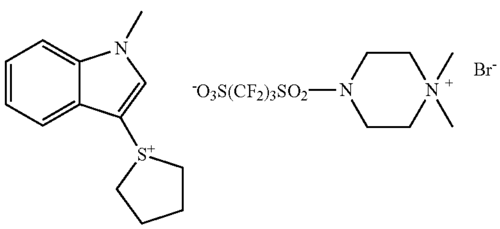
(PA-37)
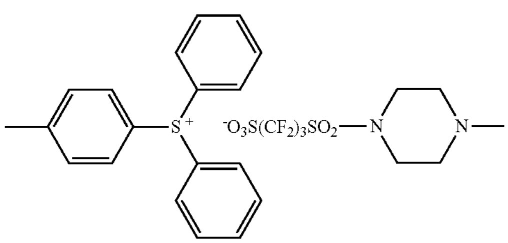
(PA-38)
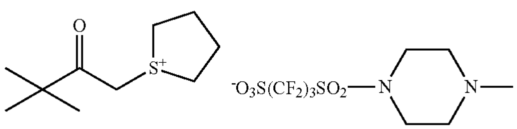
(PA-39)
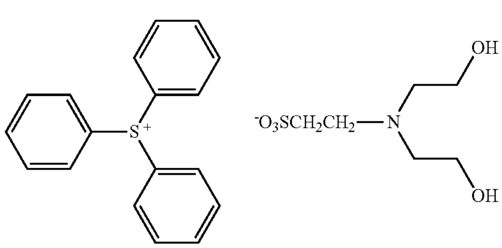
-continued
(PA-40)
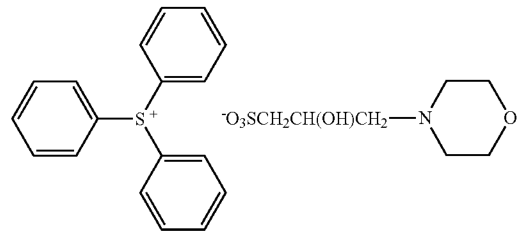
(PA-41)
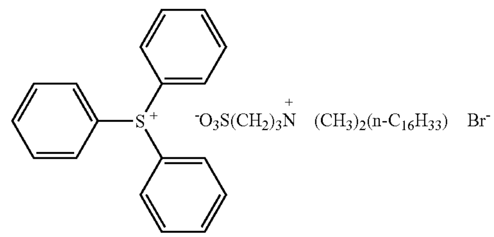
(PA-42)
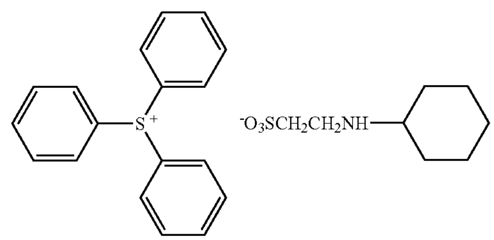
(PA-43)
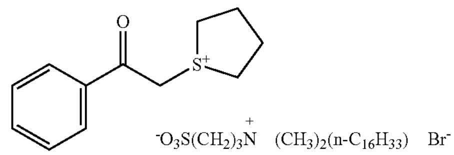
(PA-44)
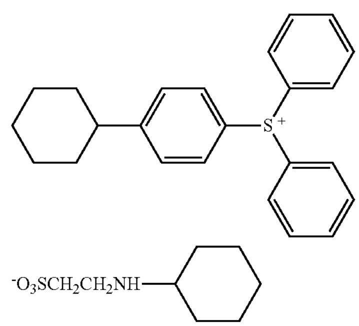
(PA-45)
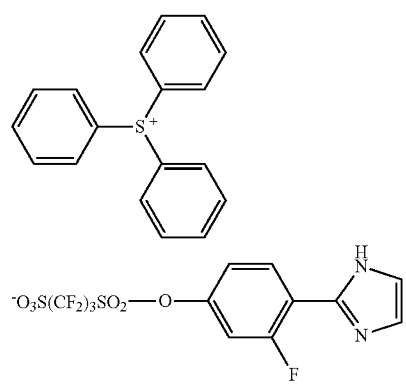

-continued
(PA-46)
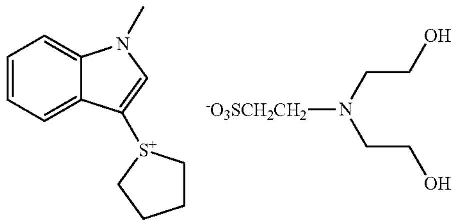
(PA-47)
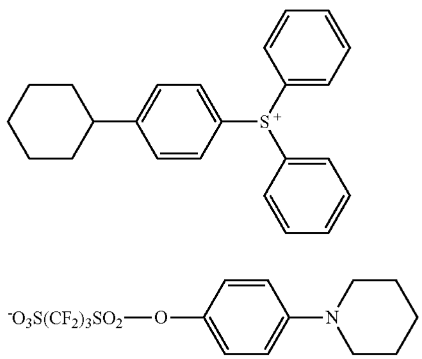
(PA-48)
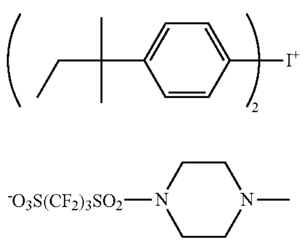
(PA-49)
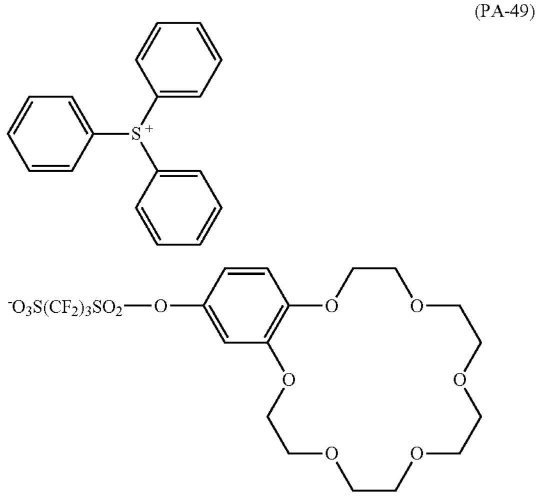
(PA-50)
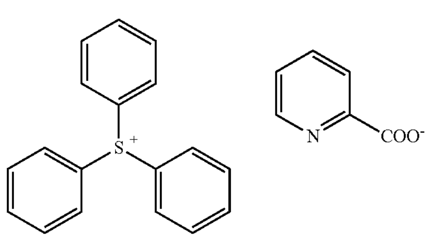
-continued
(PA-51)
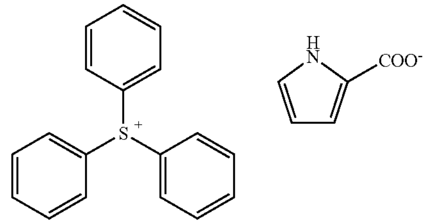
(PA-52)
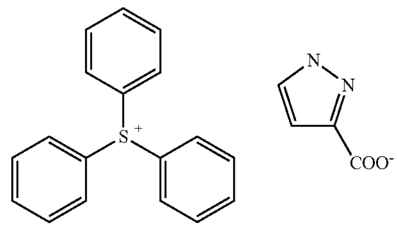
(PA-53)
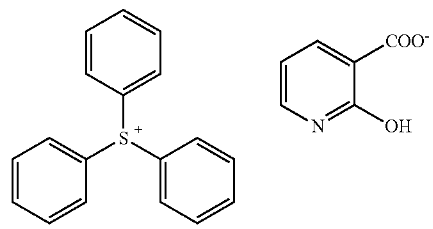
(PA-54)
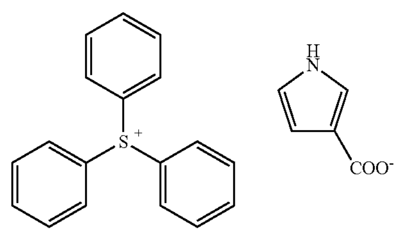
(PA-55)
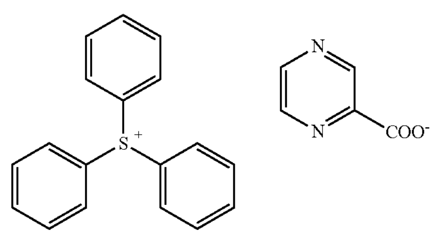
(PA-56)
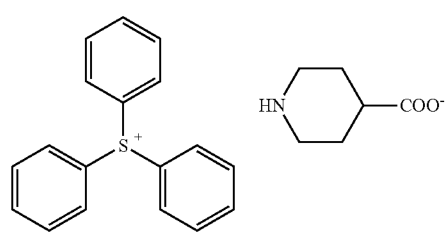
(PA-57)
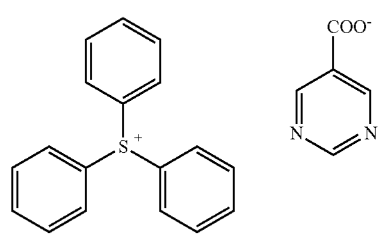

-continued (PA-58)

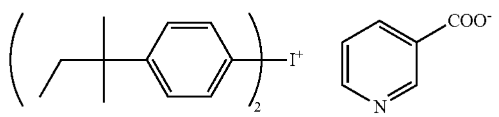

(PA-59)

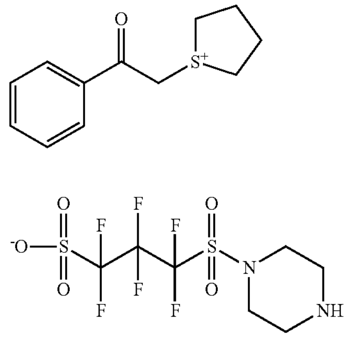

(PA-60)

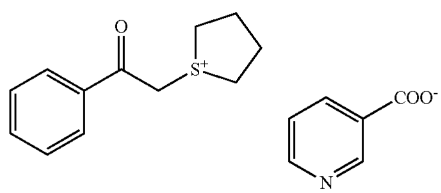

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may also be performed in accordance with the synthesis method described in JP-A-7-333851.

Specific examples of the compound (PA) capable of generating a compound represented by formula (PA-II) or (PA-III) upon irradiation with an actinic ray or radiation are set forth below, but the present invention is not limited thereto.

(PA-61)

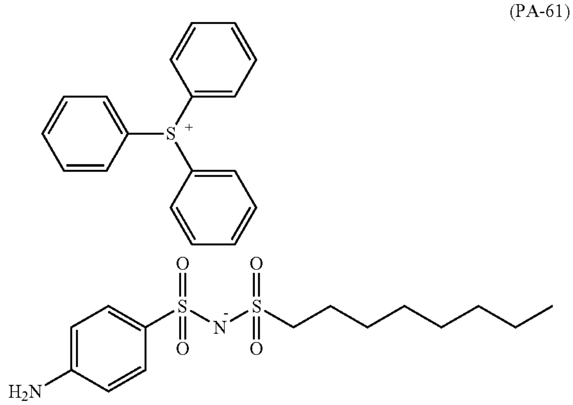

-continued (PA-62)

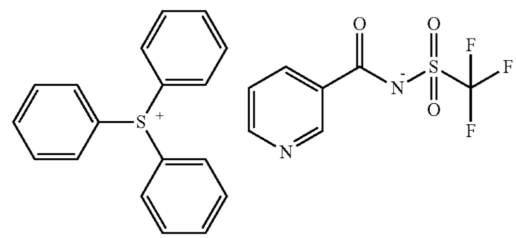

(PA-63)

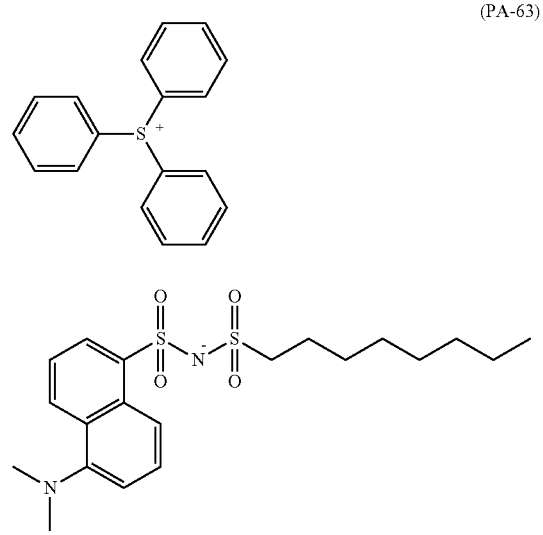

(PA-64)

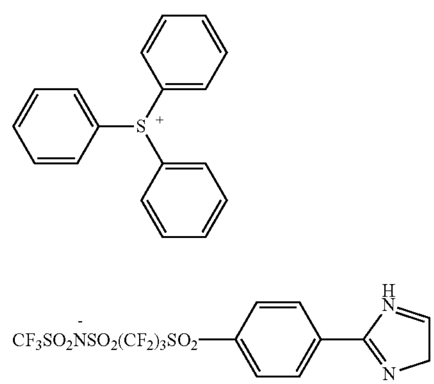

(PA-65)

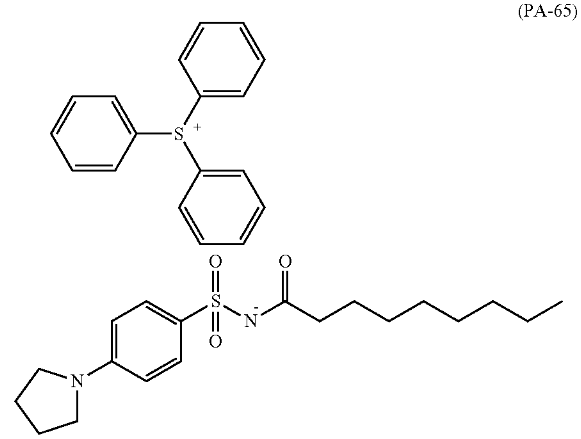

-continued
(PA-66)
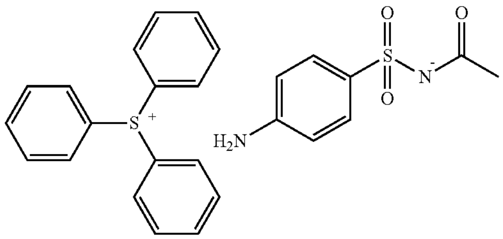
(PA-67)
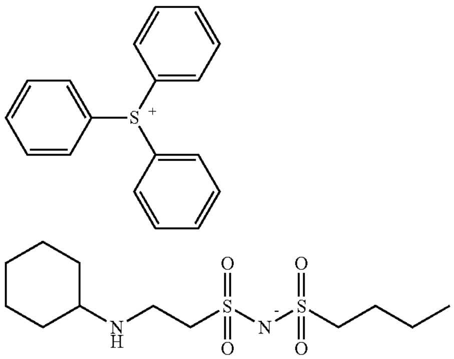
(PA-68)
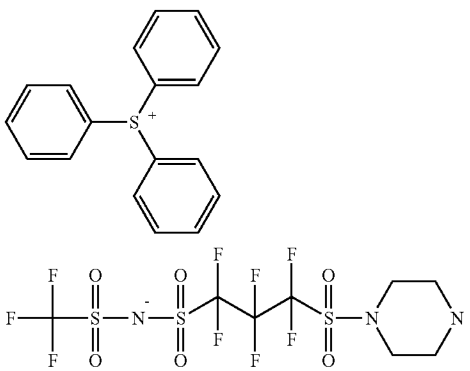
(PA-69)
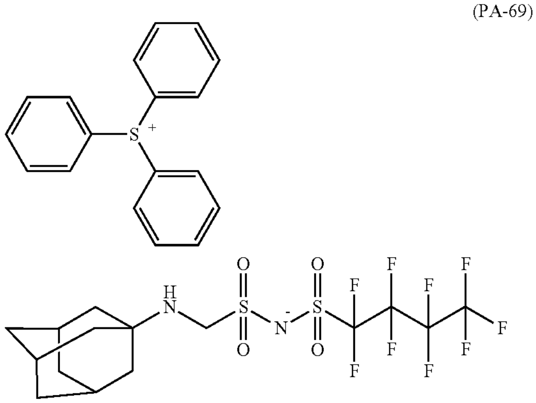
(PA-70)
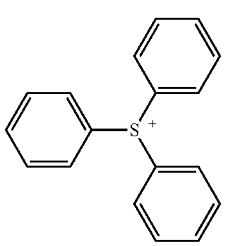
-continued
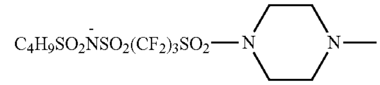
(PA-71)
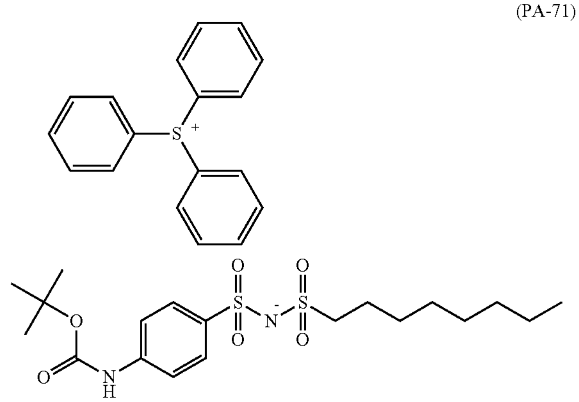
(PA-72)
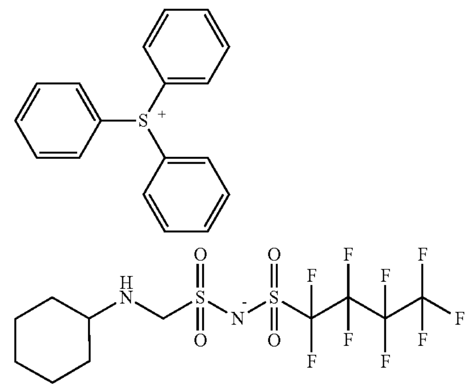
(PA-73)
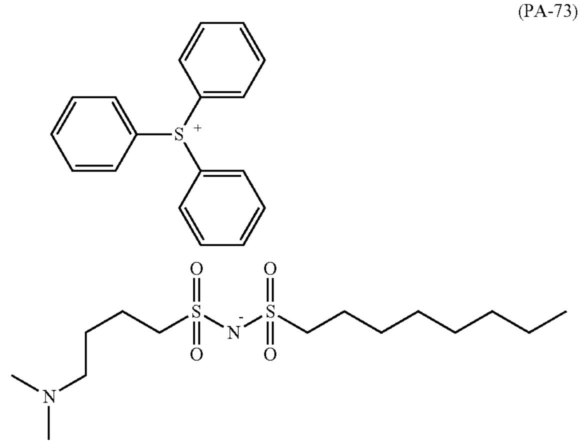
(PA-74)
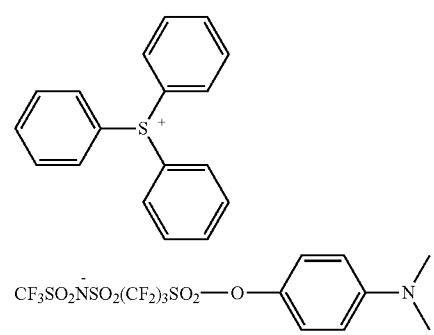

-continued
(PA-75)
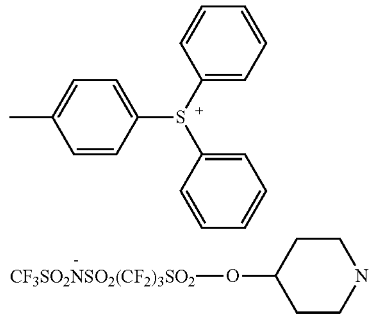
(PA-76)
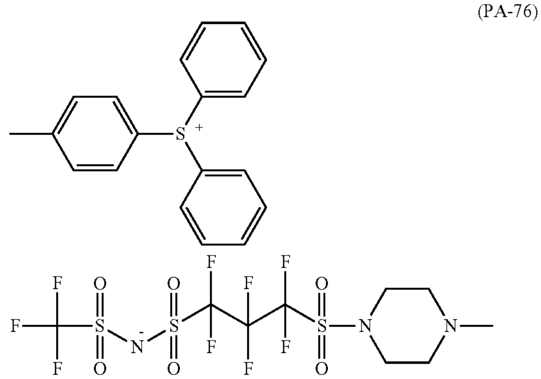
(PA-77)
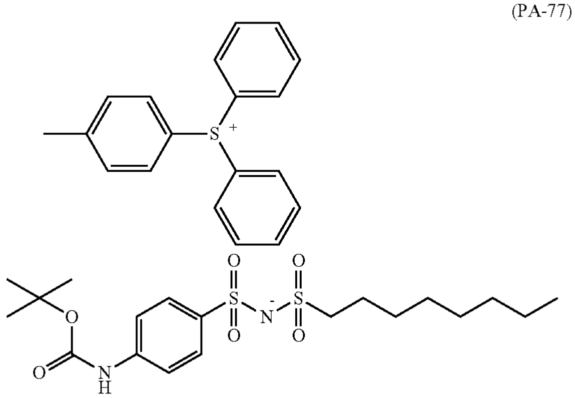
(PA-78)
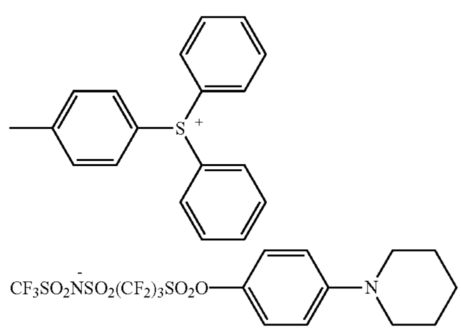
(PA-79)
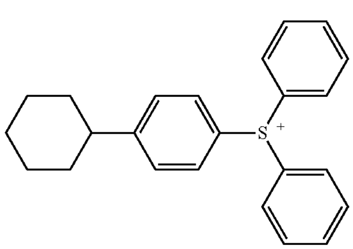
-continued
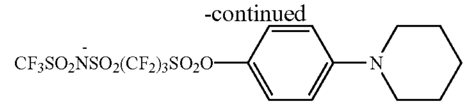
(PA-80)
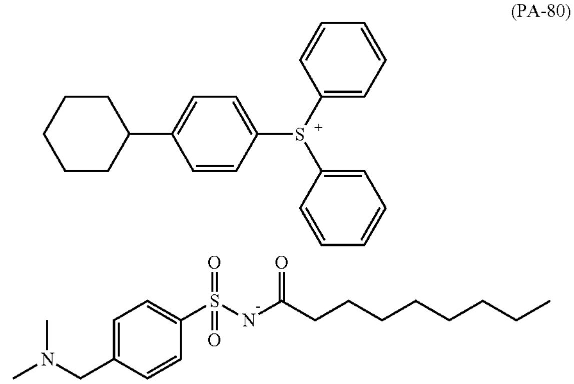
(PA-81)
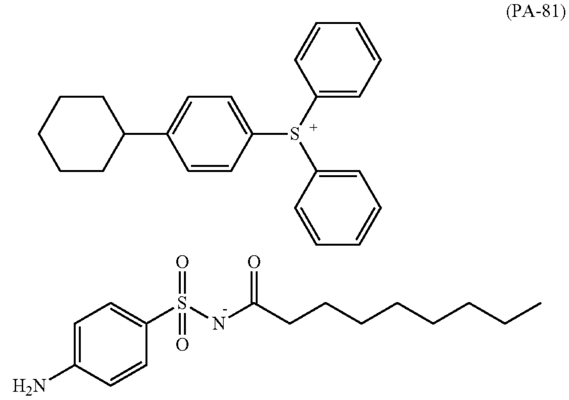
(PA-82)
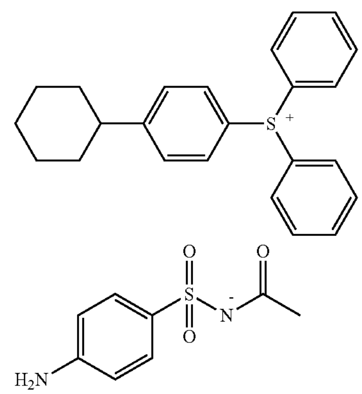
(PA-83)
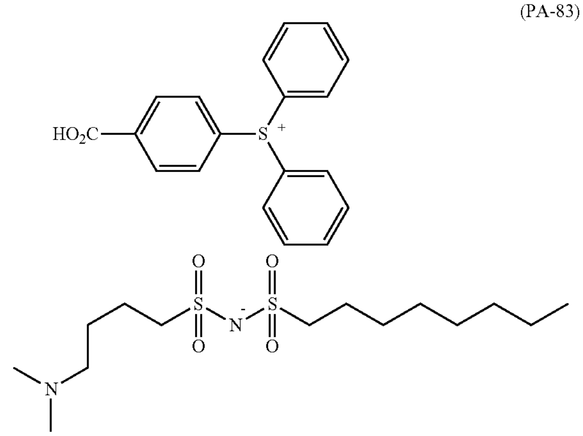

-continued
(PA-84)
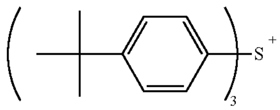
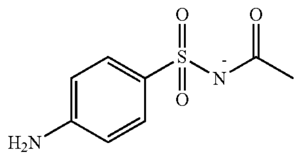
(PA-85)
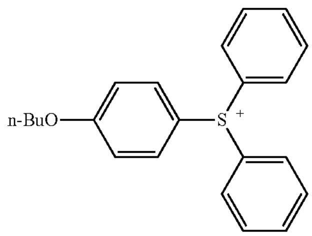
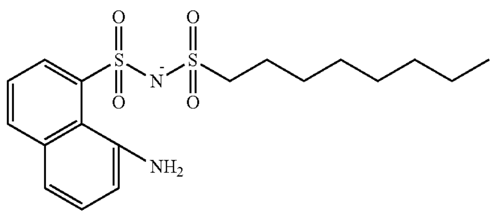
(PA-86)
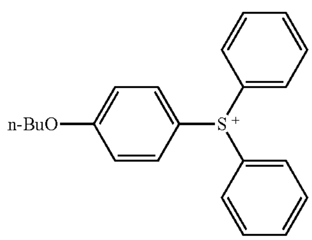
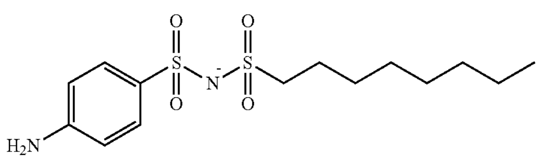
(PA-87)
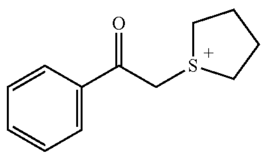
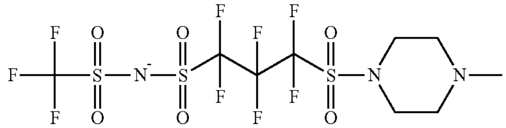
(PA-88)
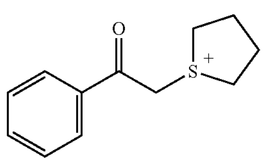
-continued
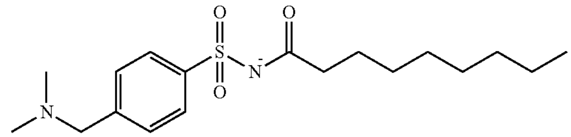
(PA-89)
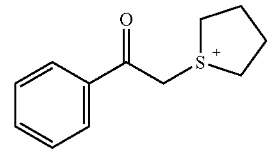
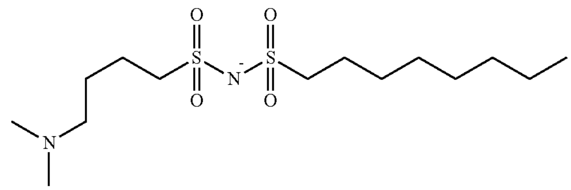
(PA-90)
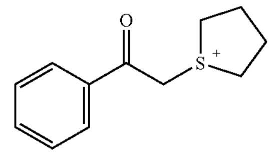
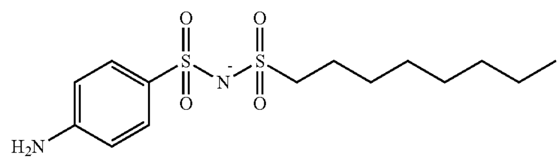
(PA-91)
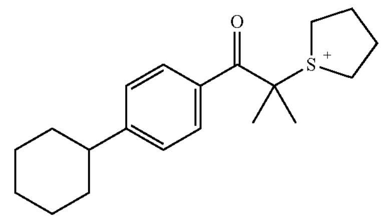
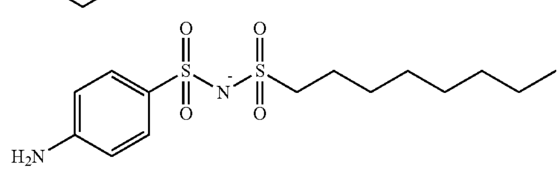
(PA-92)
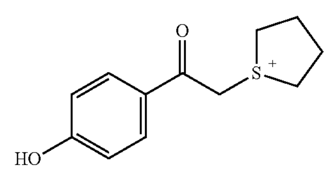
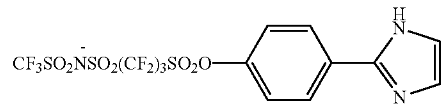
(PA-93)
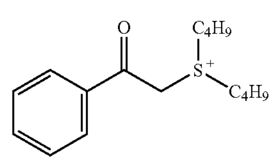

-continued
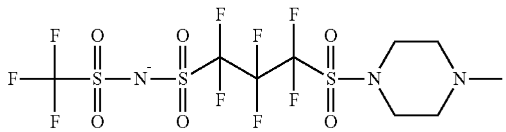
(PA-94)
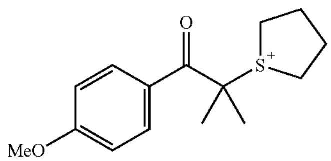
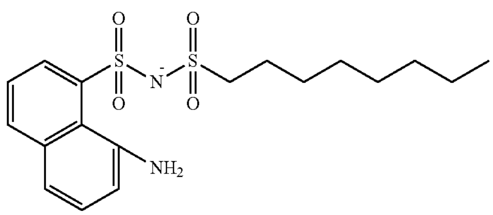
(PA-95)
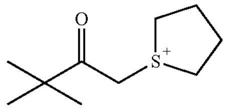
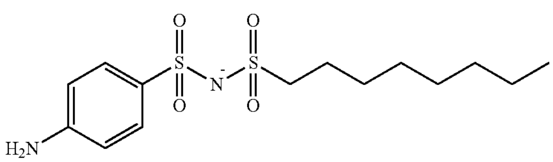
(PA-96)
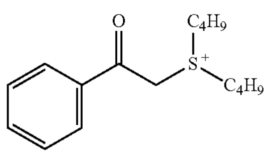
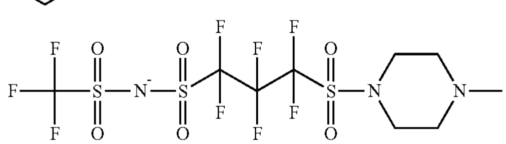
(PA-97)
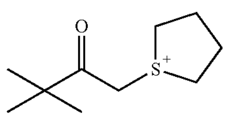
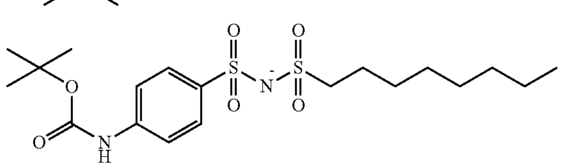
(PA-98)
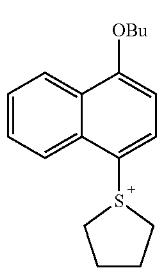
-continued
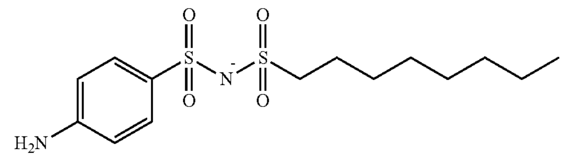
(PA-99)
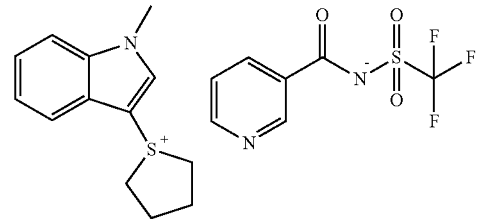
(PA-100)
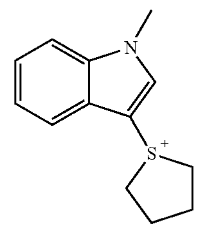
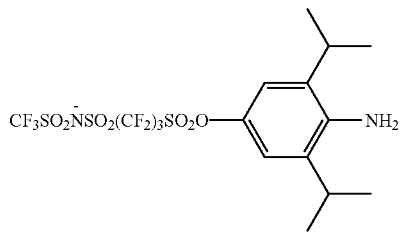
(PA-101)
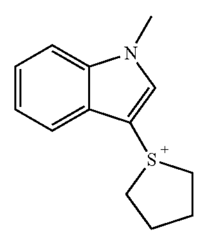
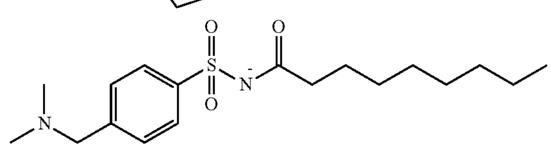
(PA-102)
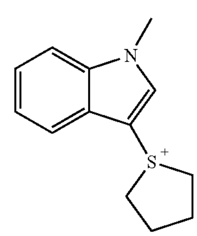
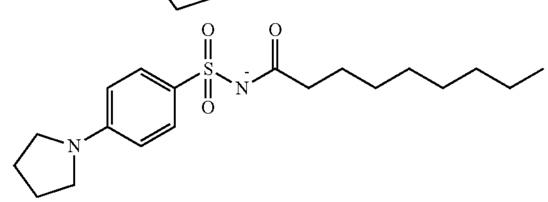

-continued (PA-103)

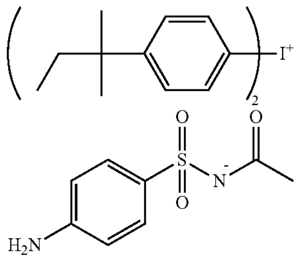

(PA-104)

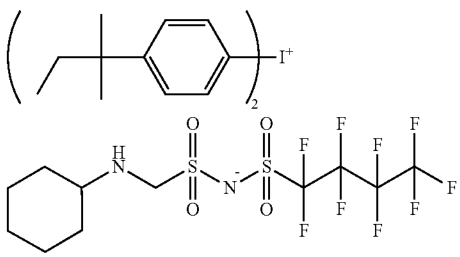

(PA-105)

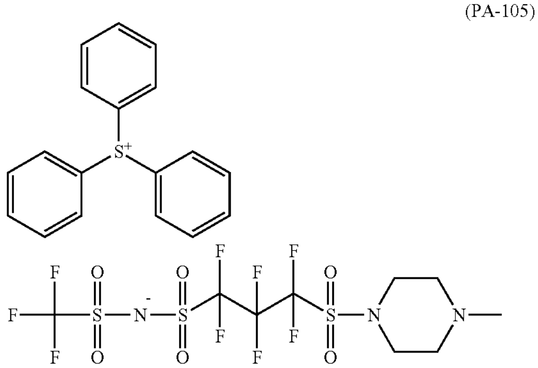

(PA-106)

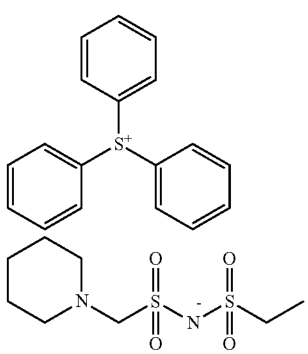

(PA-107)

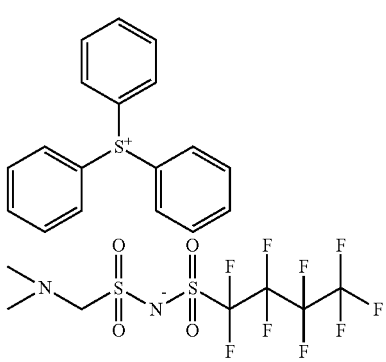

These compounds can be easily synthesized by using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) or (PA-III) can be synthesized by reacting an amine or alcohol with an anhydride (e.g., $(R'O_2C)_2O$, $(R'SO_2)_2O$) or an acid chloride compound ($R'O_2CCl$, $R'SO_2Cl$) under basic conditions (R' is, for example, a methyl group, an n-octyl group, a trifluoromethyl group). In particular, the synthesis may be performed in accordance with synthesis examples and the like in JP-A-2006-330098.

The molecular weight of the compound (PA) is preferably from 500 to 1,000.

The content of the compound (PA) in the resist composition for use in the present invention is preferably from 0.1 to 20 mass %, more preferably from 0.1 to 10 mass %, based on the solid content of the composition.

As for the compound (PA), one kind of a compound is used alone, or two or more kinds of compounds are used. Also, the compound (PA) may be used in combination with a basic compound described above.

[9] (H) Other Additives

The resist composition for use in the present invention may further contain, for example, a dye, a plasticizer, a photosensitizer, a light absorber, an alkali-soluble resin, a dissolution inhibiting agent, and a compound for accelerating dissolution in an alkali developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

The solid content concentration of the resist composition for use in the present invention is usually from 1.0 to 10 mass %, preferably from 2.0 to 5.7 mass %, more preferably from 2.0 to 5.3 mass %. When the solid content concentration is in this range, the resist solution can be uniformly applied on a substrate and moreover, a resist pattern with excellent performance in terms of line edge roughness can be formed. The reasons therefor are not clearly know, but it is considered that by setting the solid content concentration to 10 mass % or less, preferably 5.7 mass % or less, the materials, particularly the photo-acid generator, in the resist solution are prevented from aggregation and as a result, a uniform resist film can be formed.

The solid content concentration is a weight percentage of the weight of resist components excluding solvents, based on the total weight of the resist composition.

EXAMPLES

The present invention is described in greater detail below by referring to Examples, but the contents of the present invention should not be construed as being limited thereto.

Preparation of Resist

<Preparation of Resist>

The components shown in the Tables 4 to 6 were dissolved to prepare a solution having a solid content concentration of 4 mass %, and the obtained solution was filtered through a polyethylene filter having a pore size of 0.03 μm to prepare Resist Compositions Ar-01 to Ar-84.

The resins used in Examples and Comparative Examples were synthesized by a known method.

<Resin>

(1)

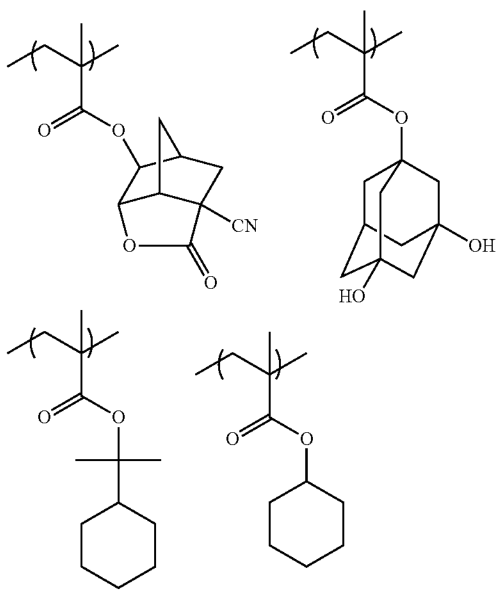

(2)

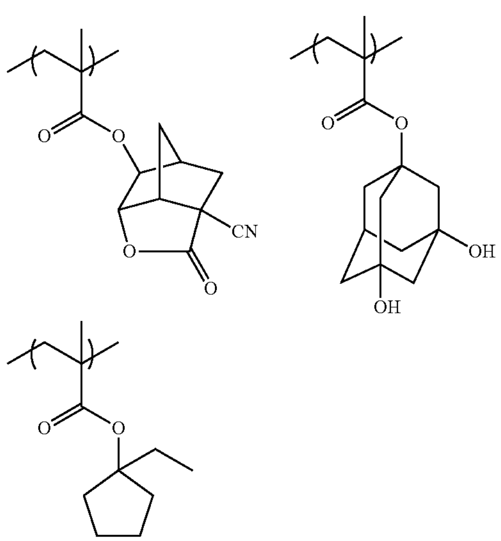

-continued (3)

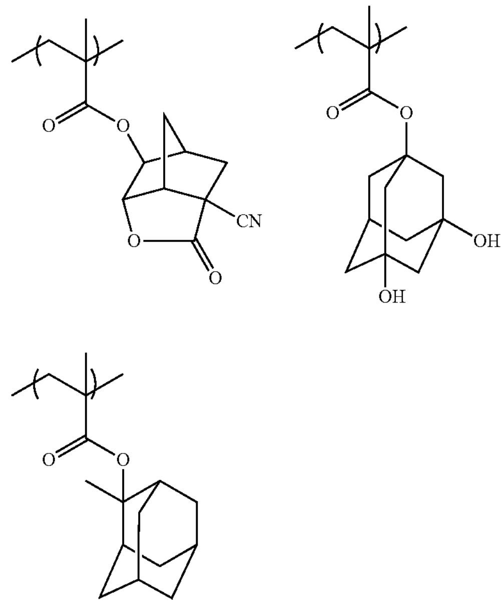

(4)

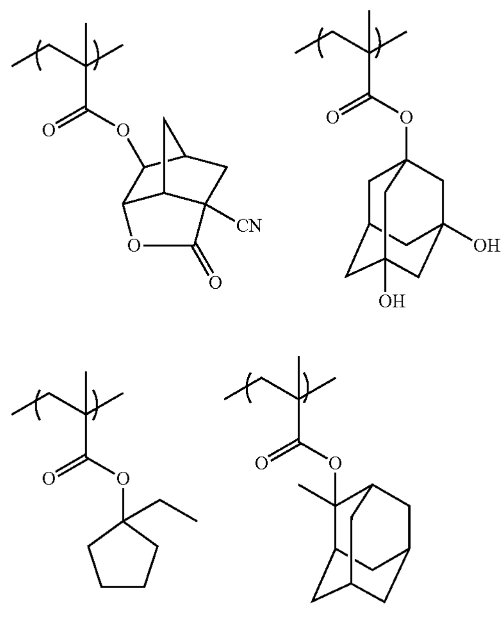

(5)

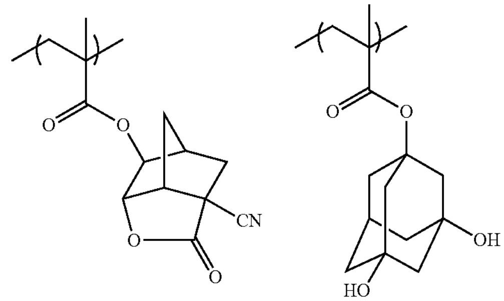

-continued
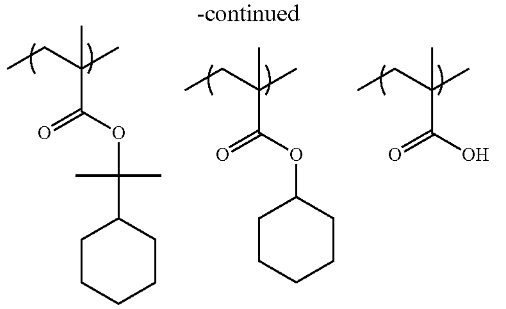
(6)
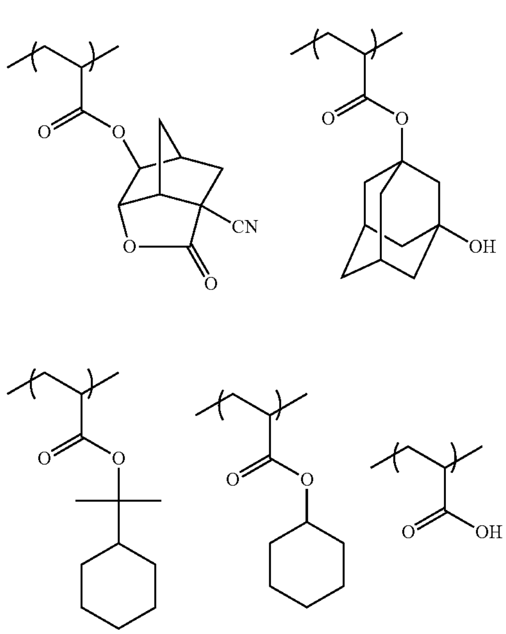
(7)
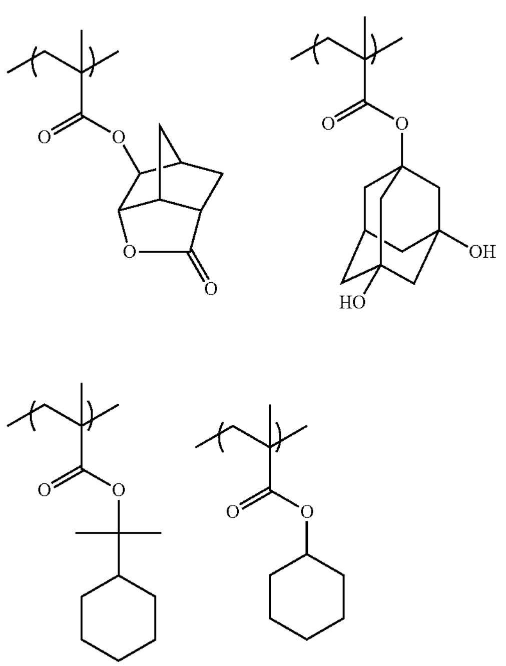
-continued
(8)
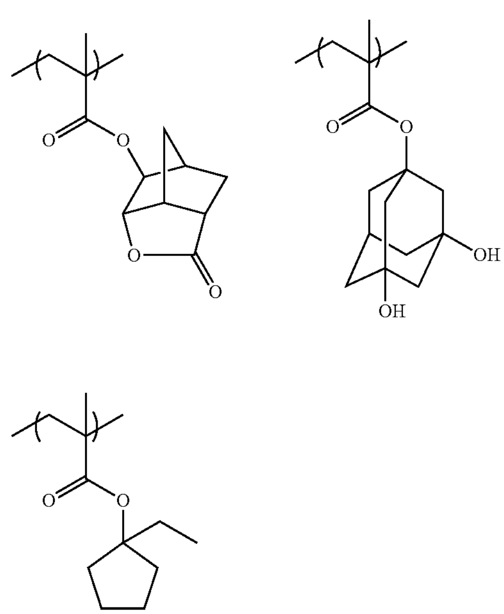
(9)
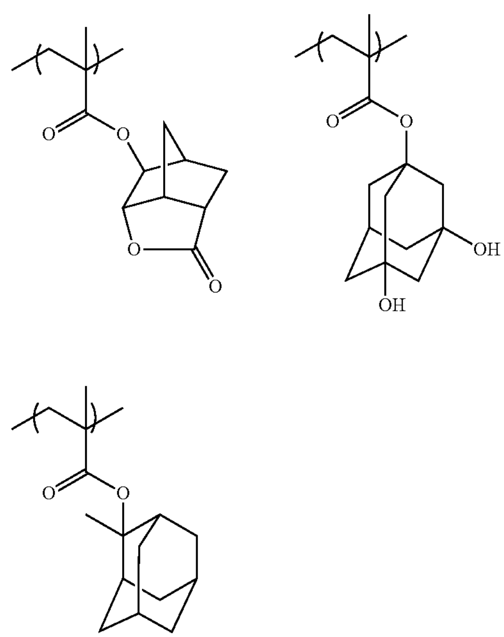
(10)
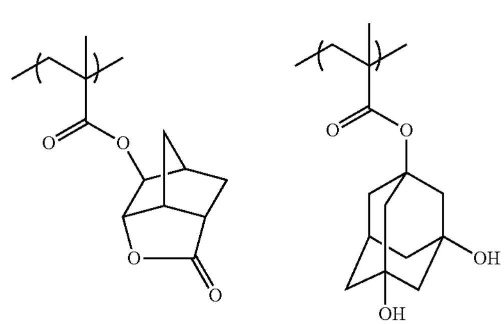

-continued
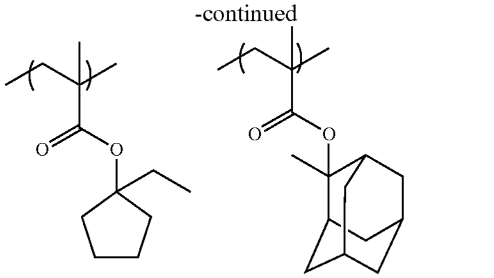
(11)
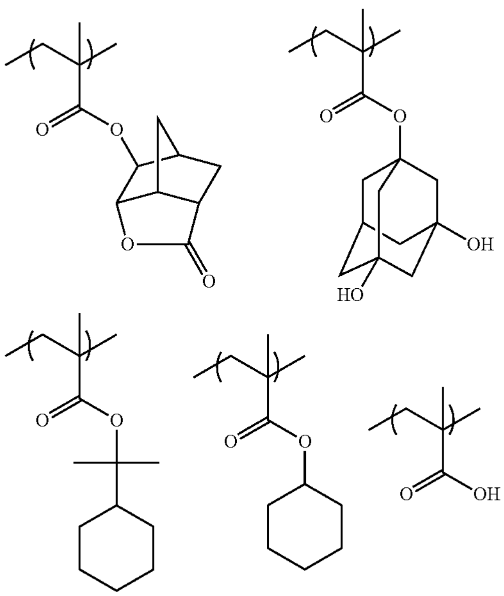
(12)
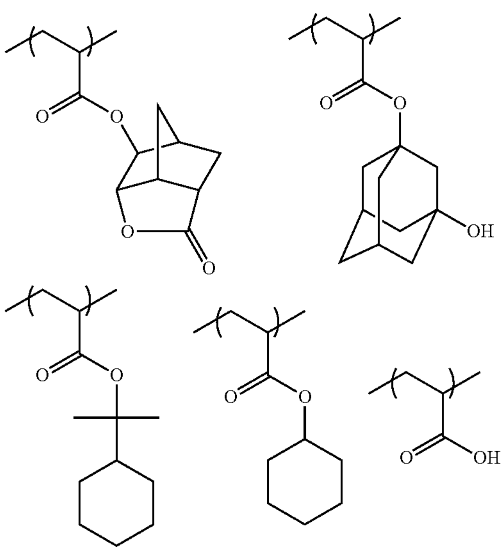
(13)
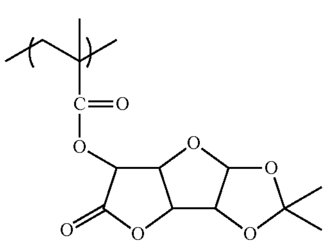
-continued
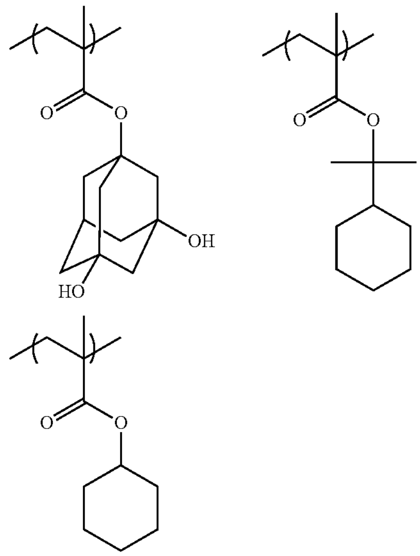
(14)
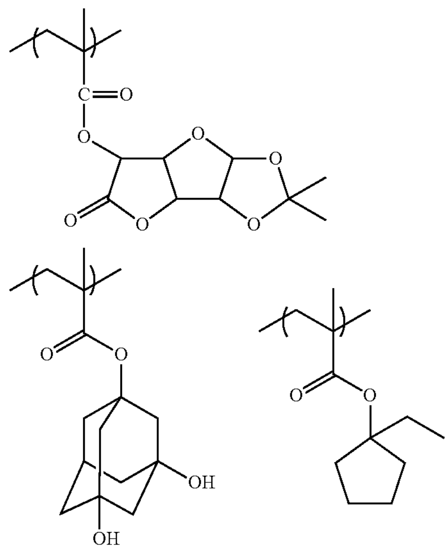
(15)
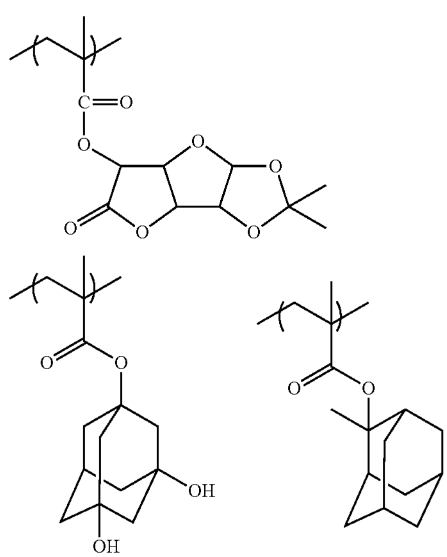

-continued
(16)
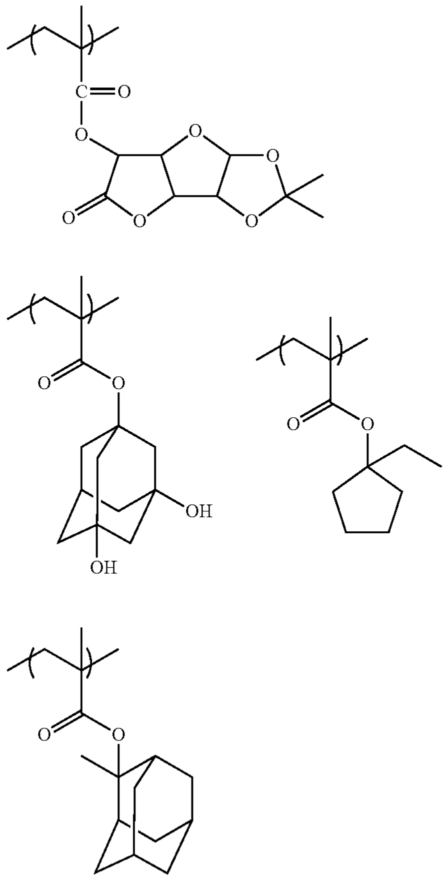
(17)
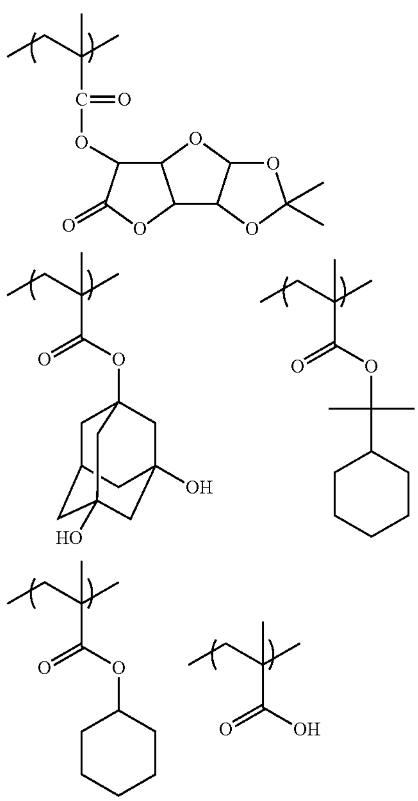
-continued
(18)
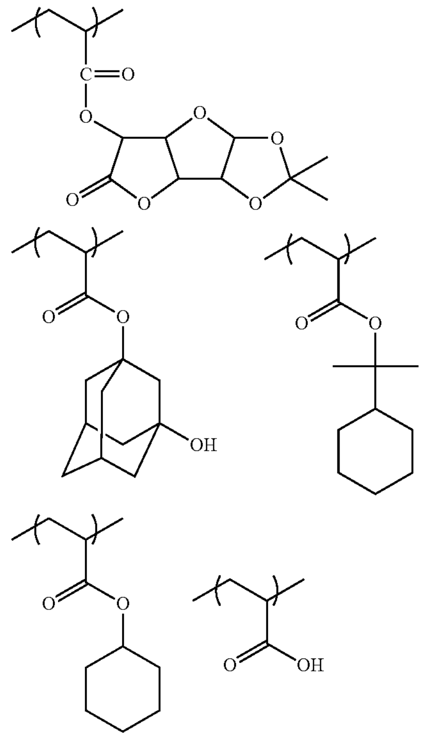
(19)
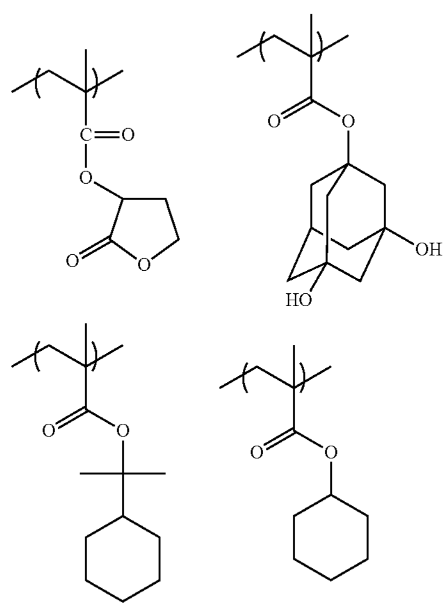
(20)
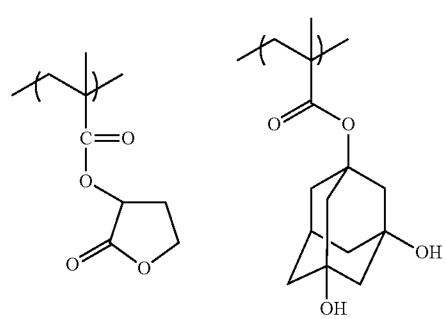

-continued
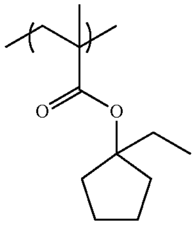
(21)
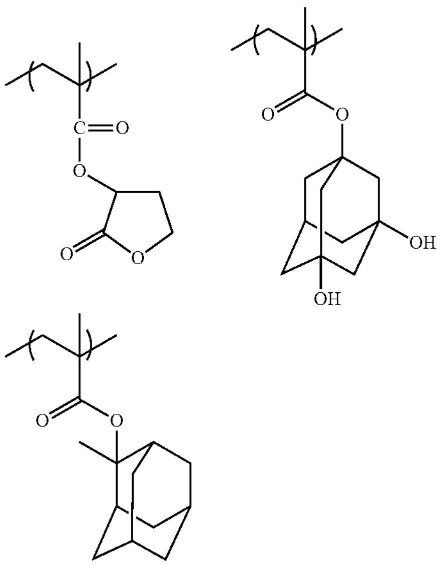
(22)
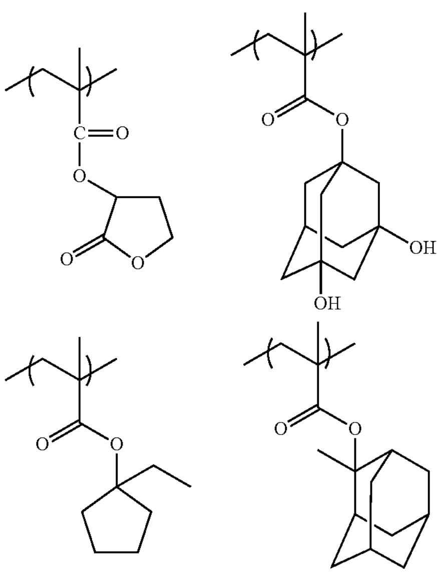
(23)
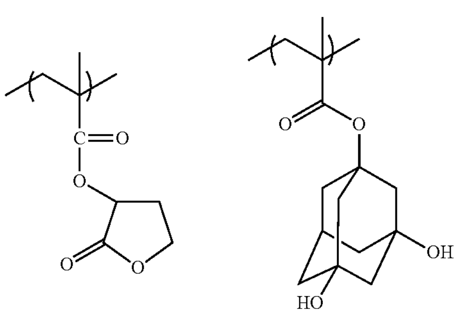
-continued
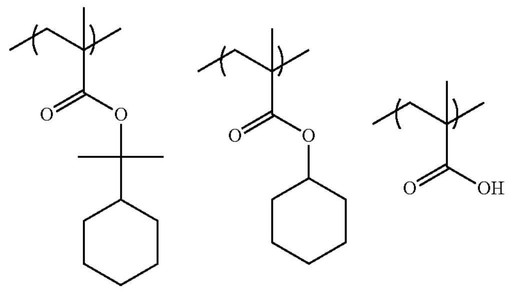
(24)
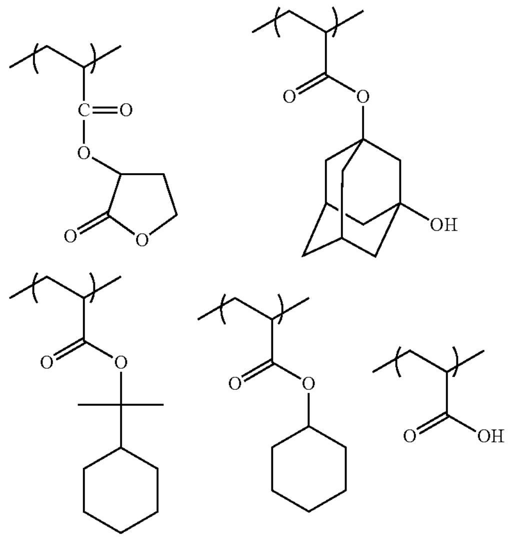
(25)
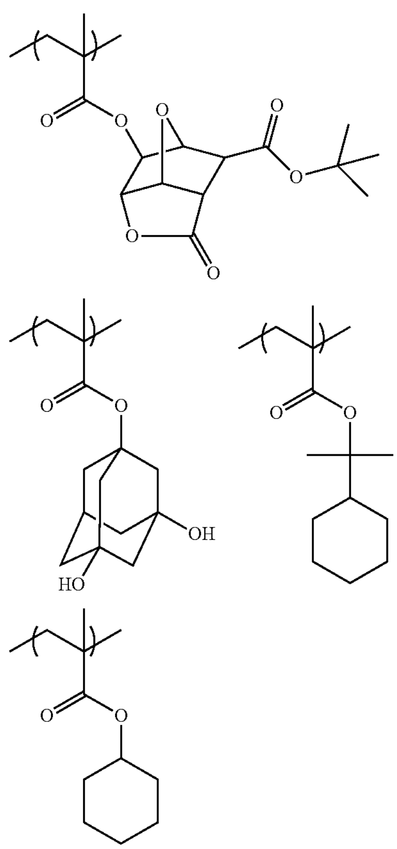

-continued
(26)
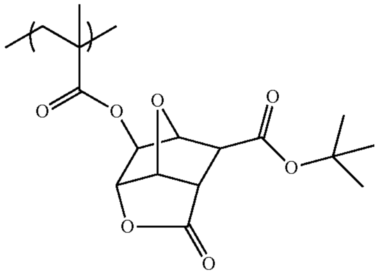
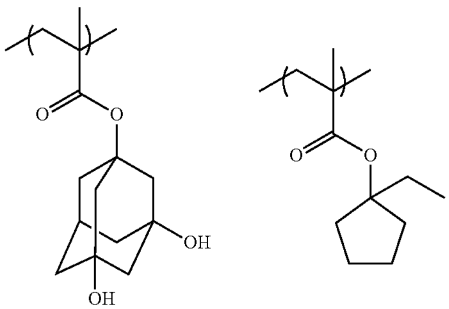
(27)
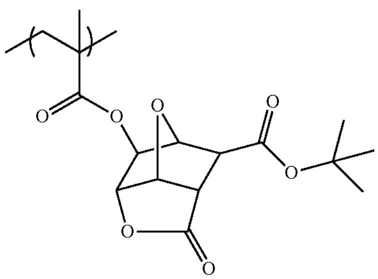
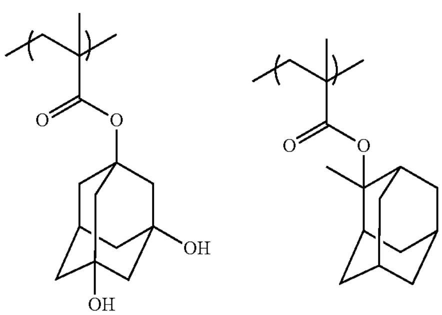
(28)
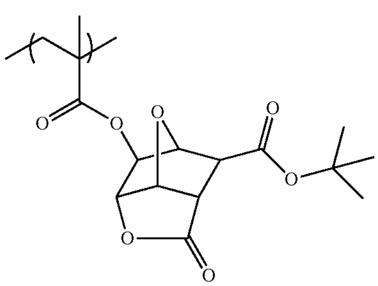
-continued
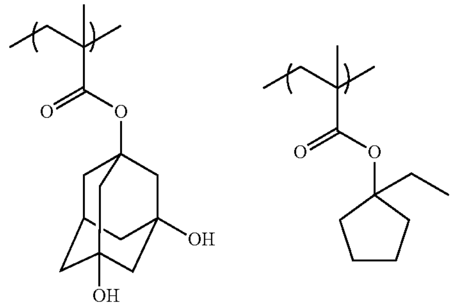
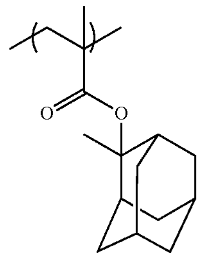
(29)
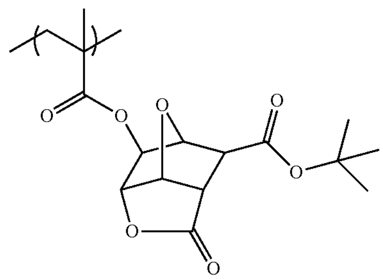
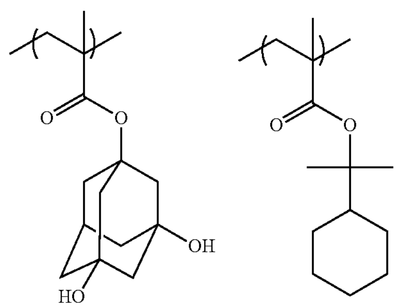
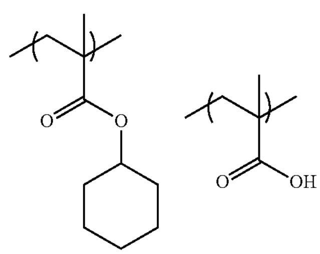
(30)
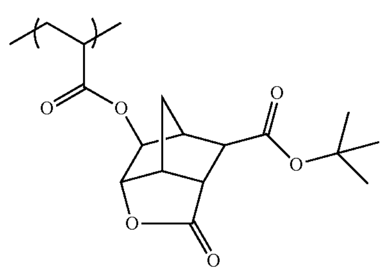

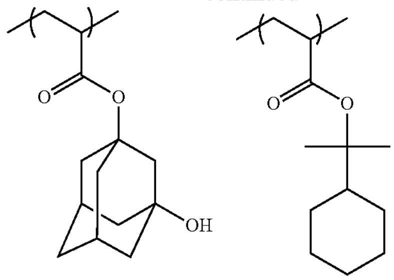
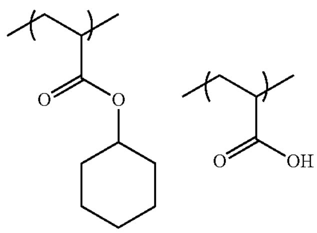
(31)
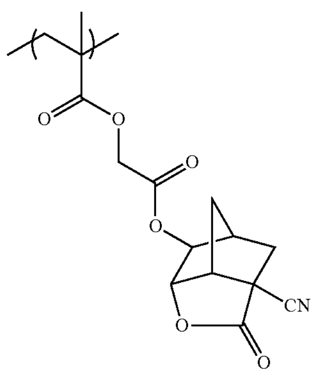
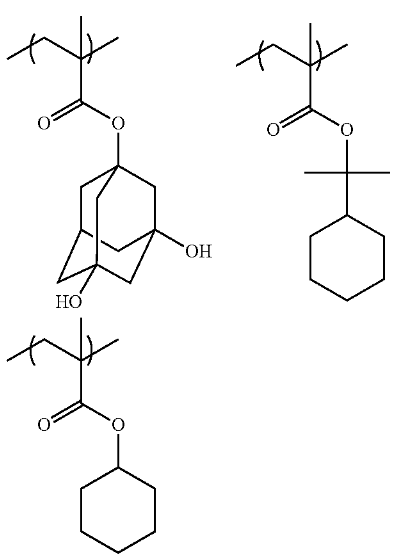
(32)
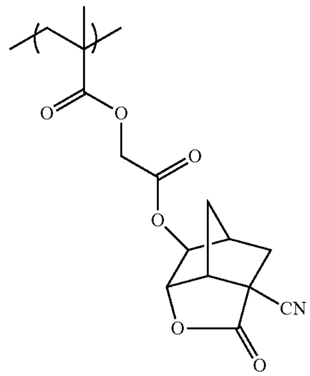
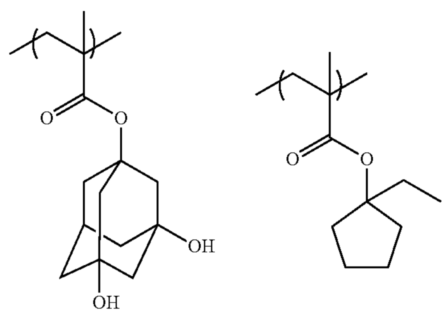
(33)
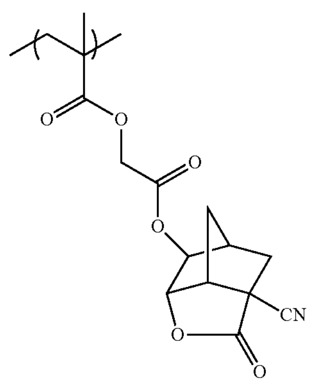
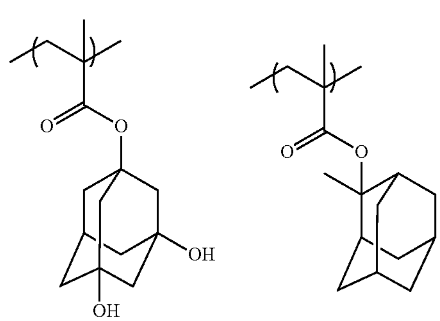

-continued
(34)
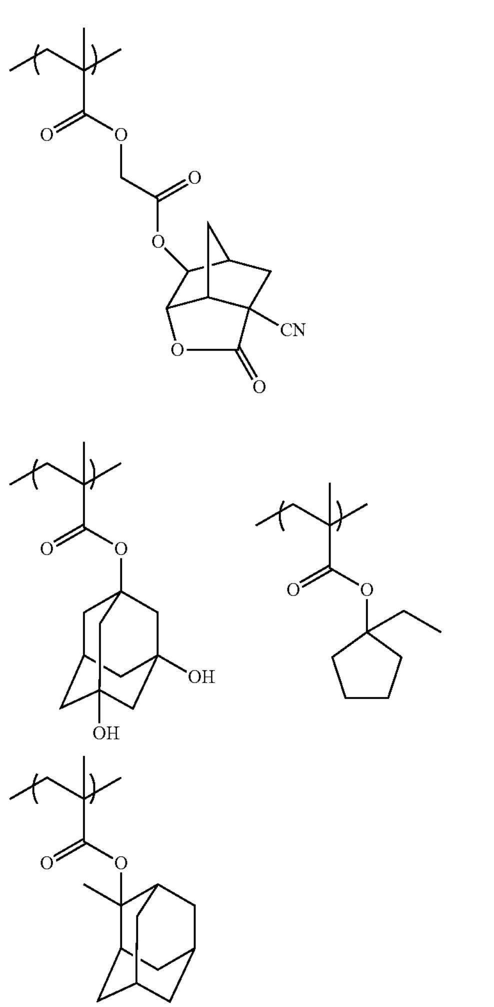
(35)
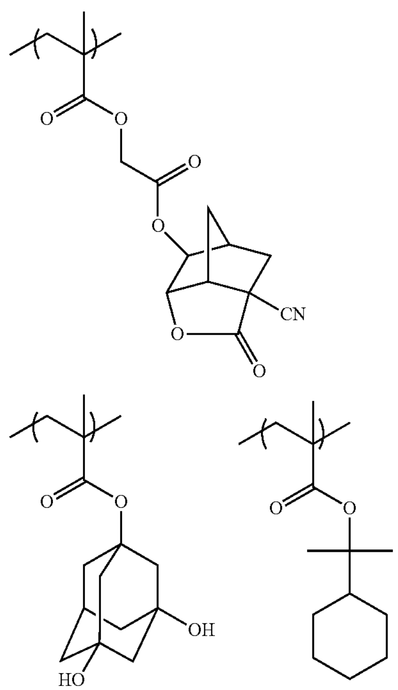
-continued
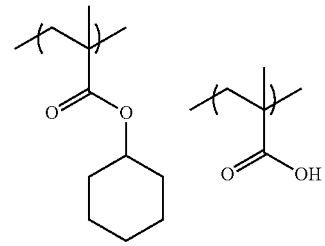
(36)
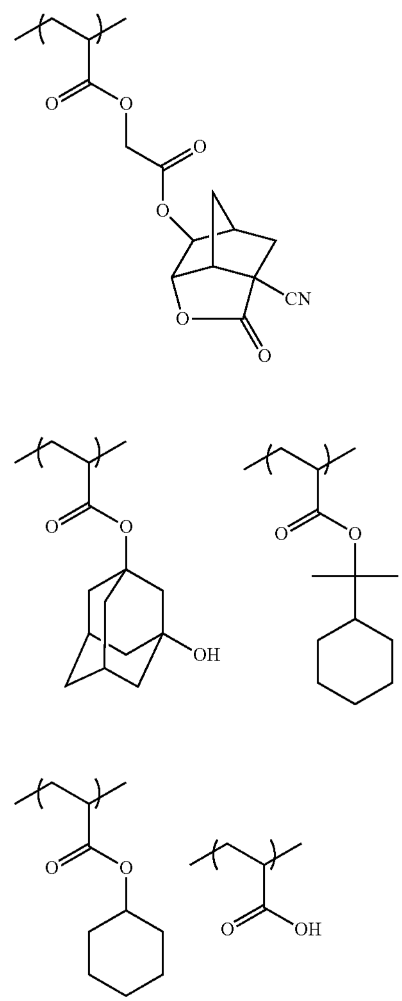
(37)
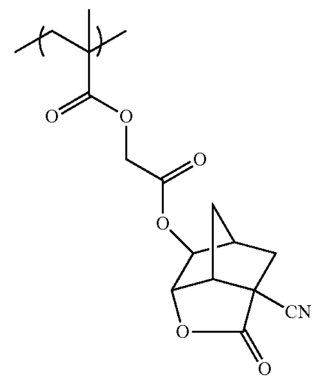

-continued
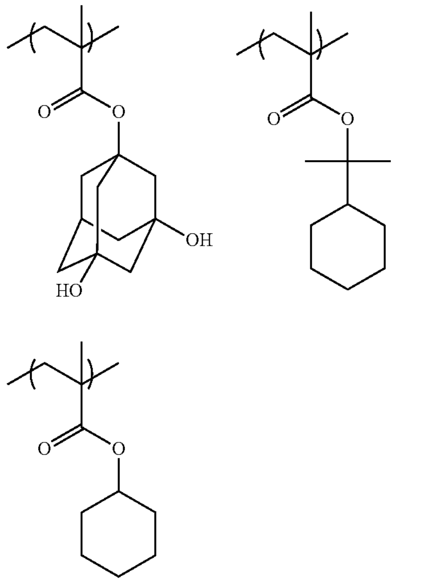
(38)
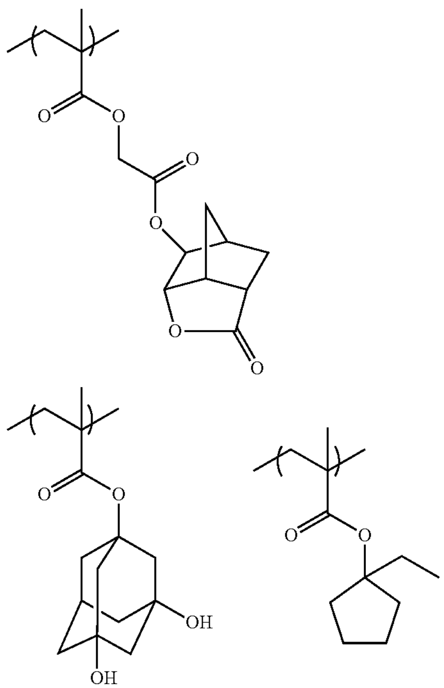
(39)
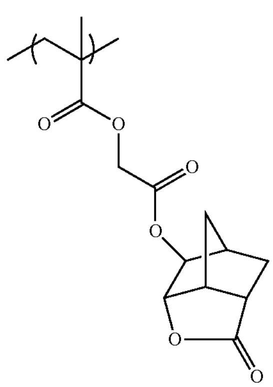
-continued
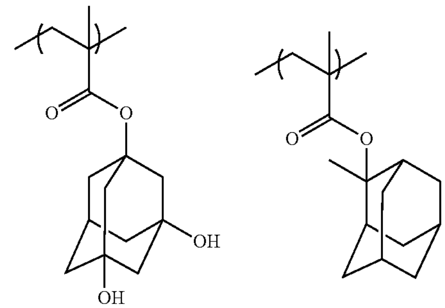
(40)
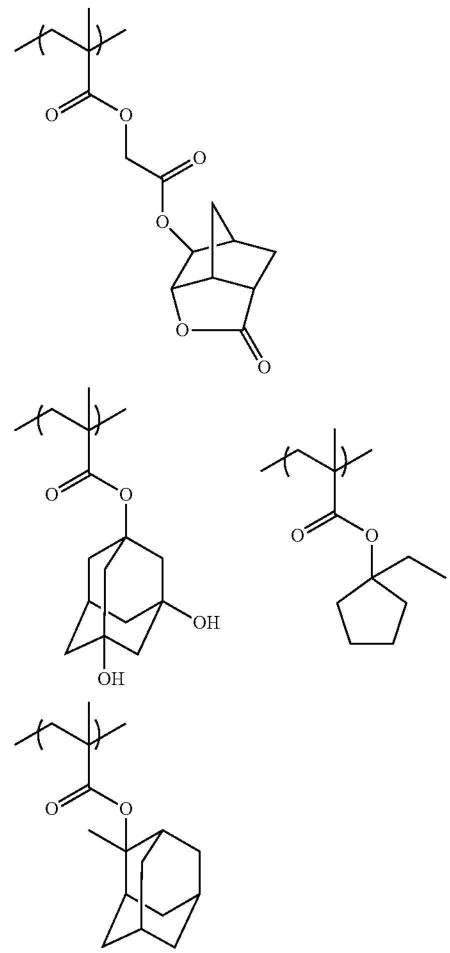
(41)
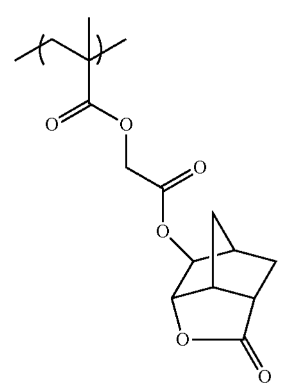

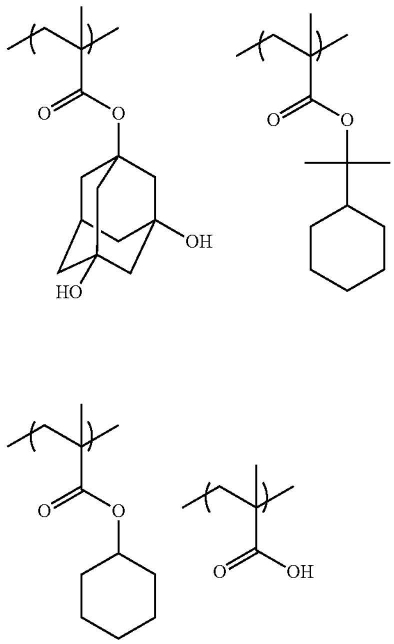
(42)
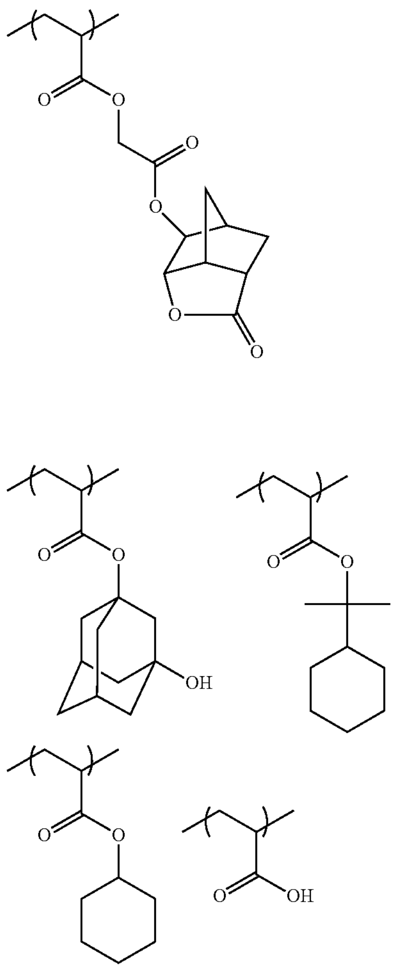
(43)
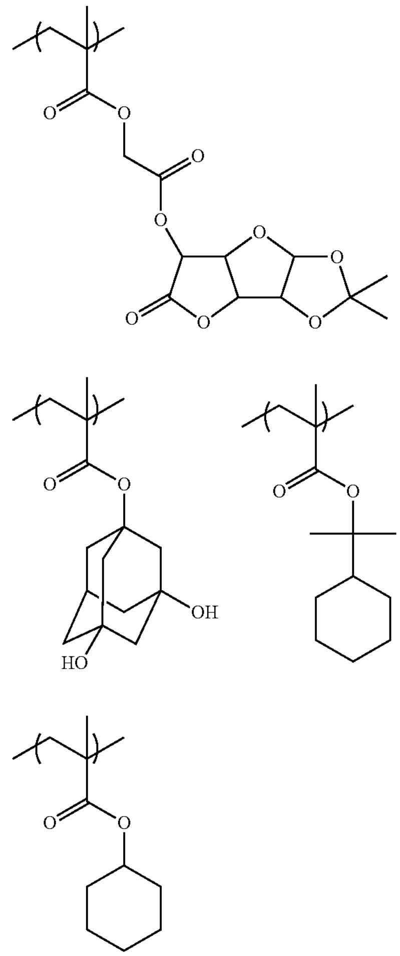
(44)
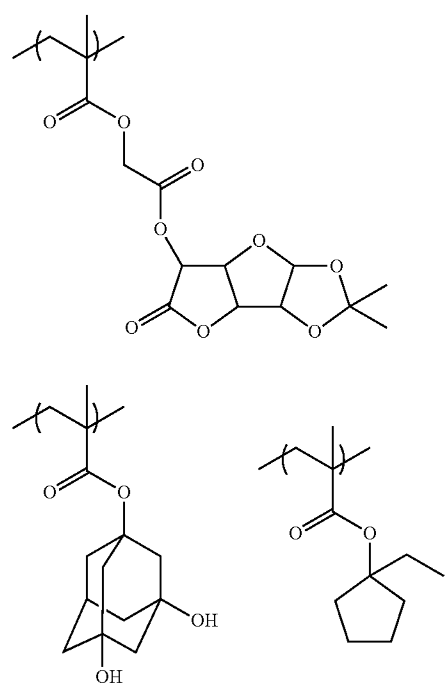

-continued
(45)
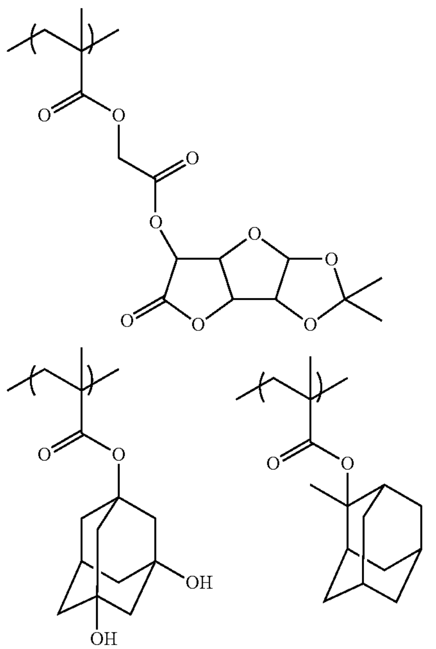
(46)
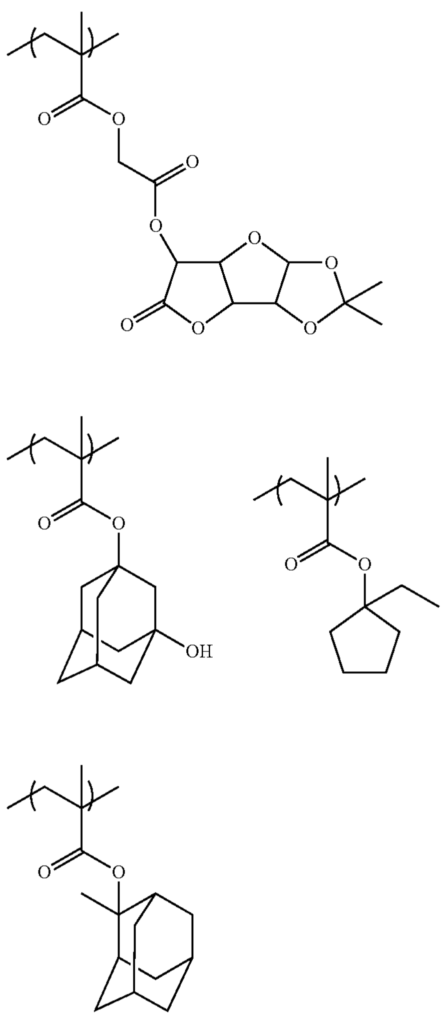
-continued
(47)
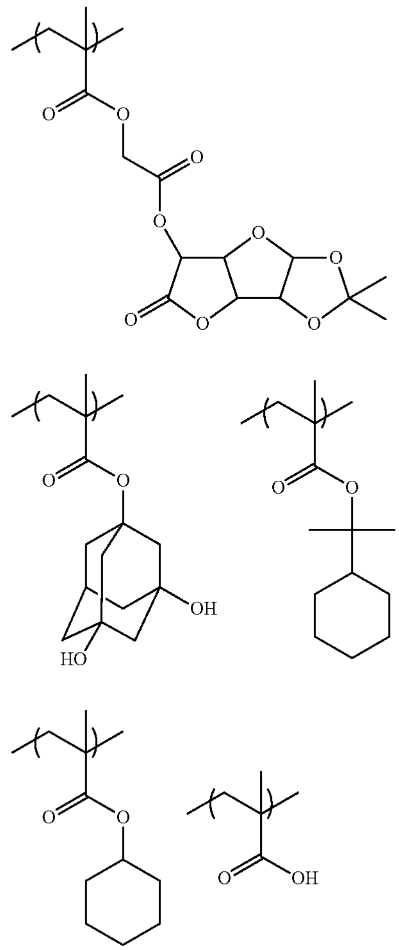
(48)
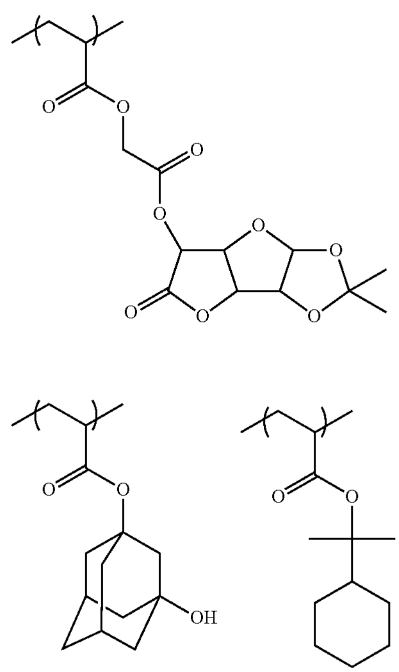

-continued
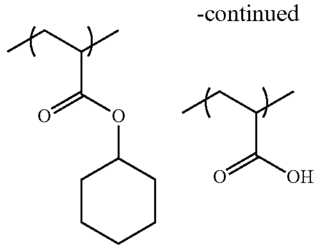
(49)
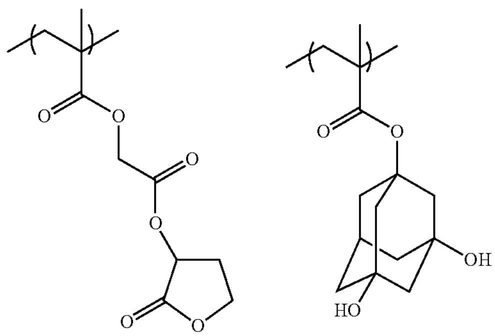
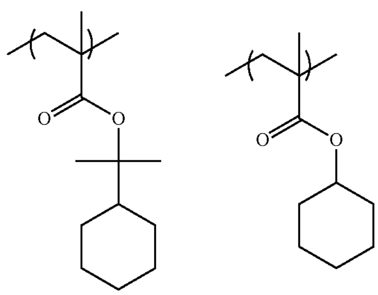
(50)
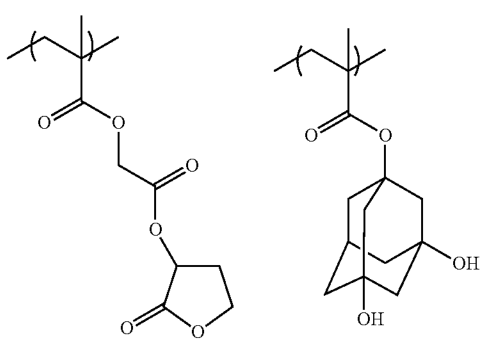
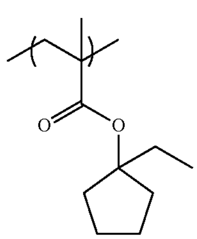
-continued
(51)
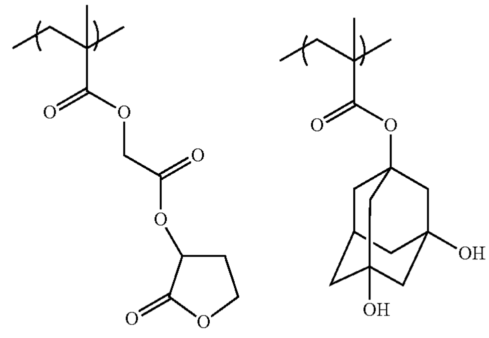
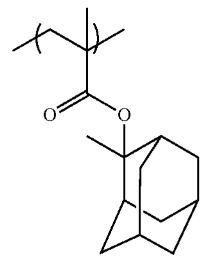
(52)
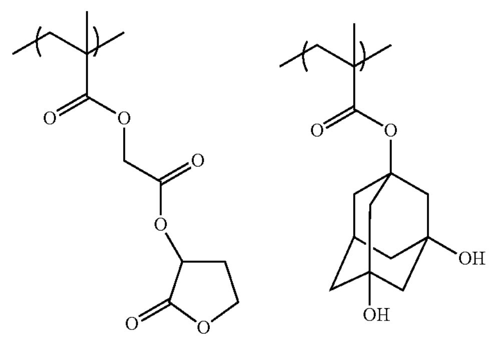
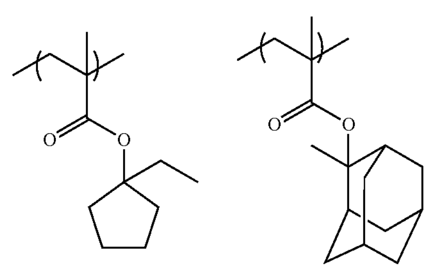
(53)
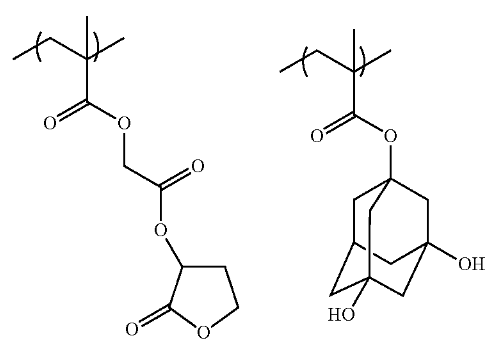

-continued
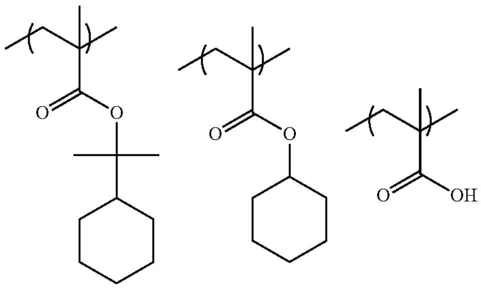
(54)
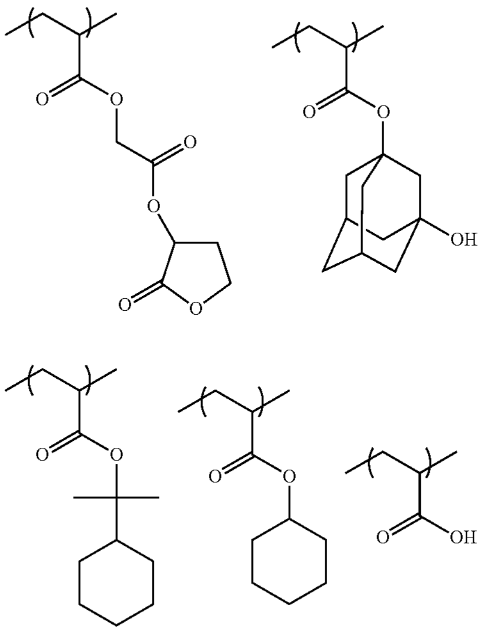
(55)
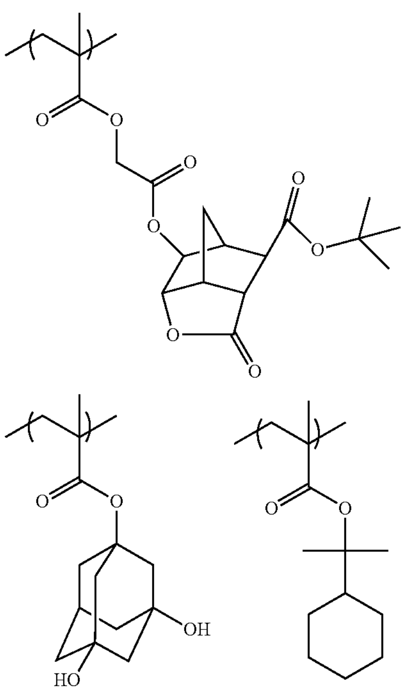
-continued
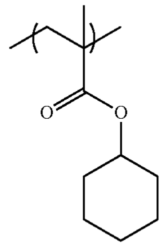
(56)
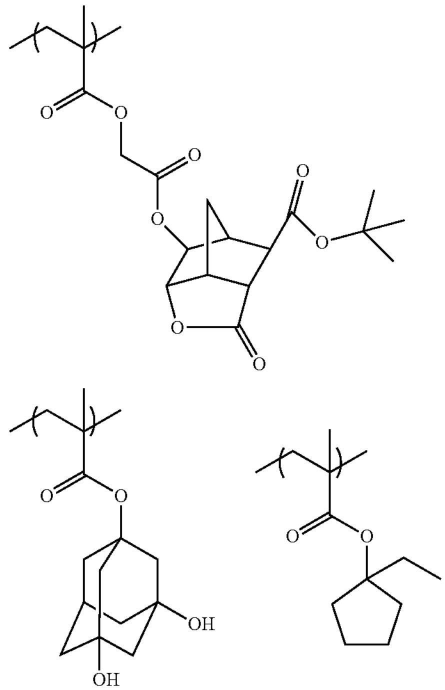
(57)
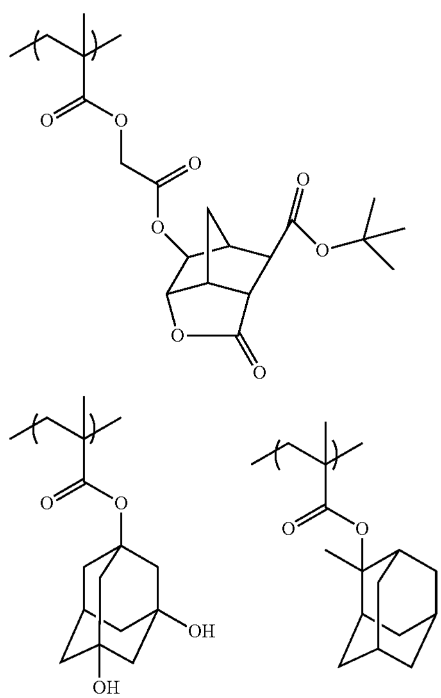

-continued
(58)
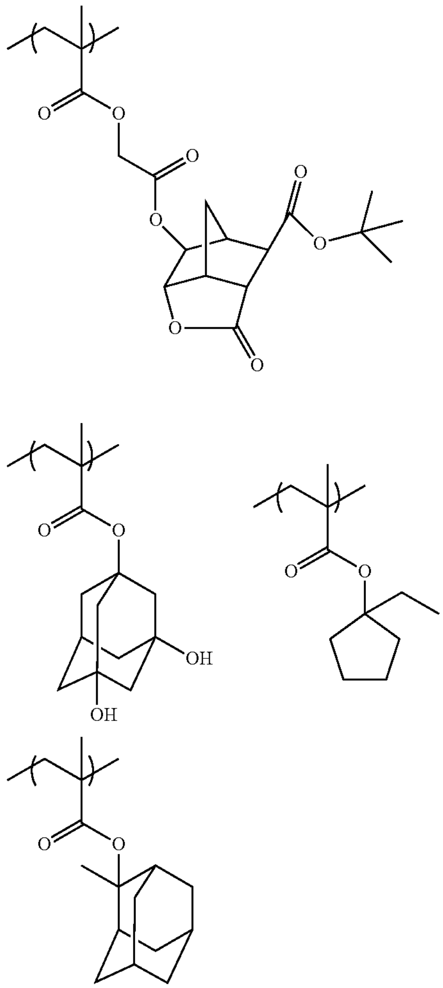
(59)
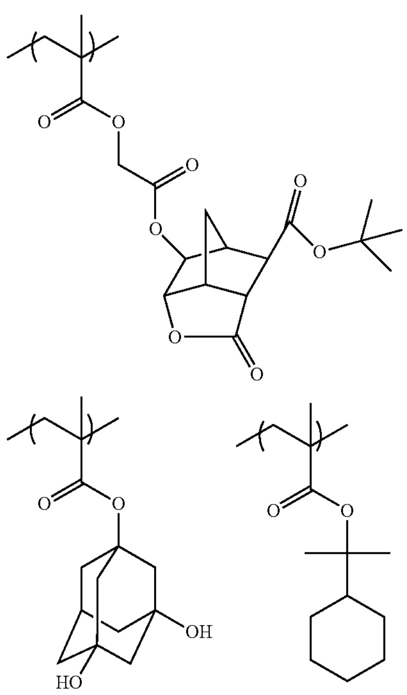
-continued
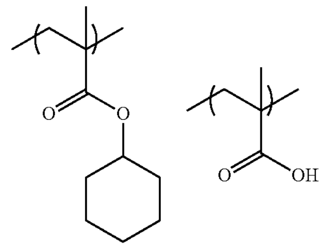
(60)
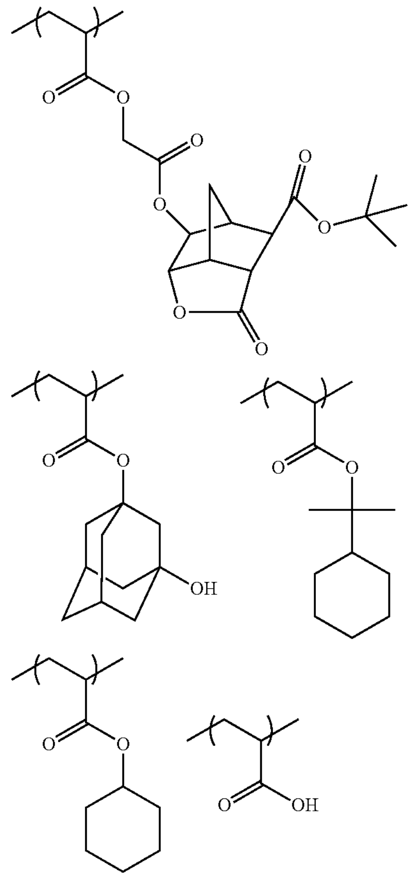
(61)
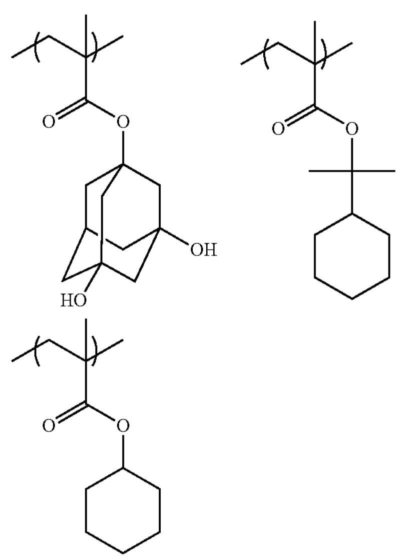

-continued
(62)
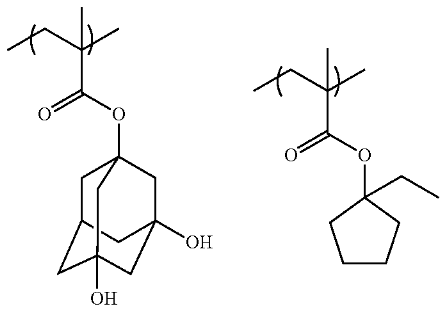
(63)
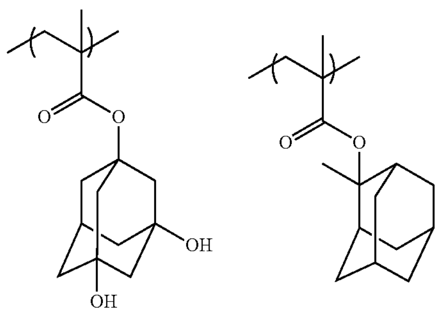
(64)
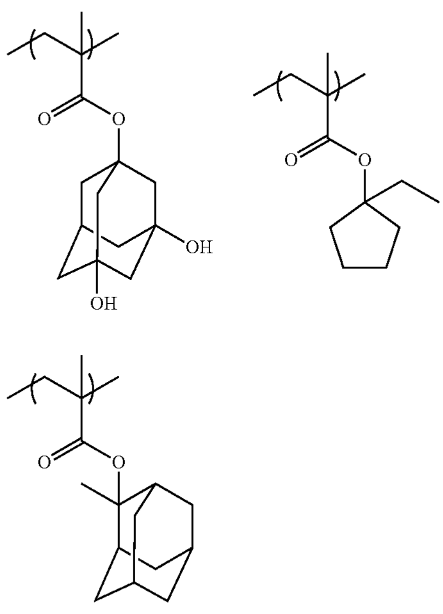
(65)
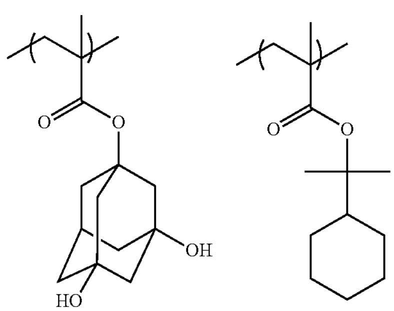
-continued
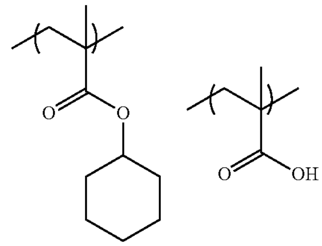
(66)
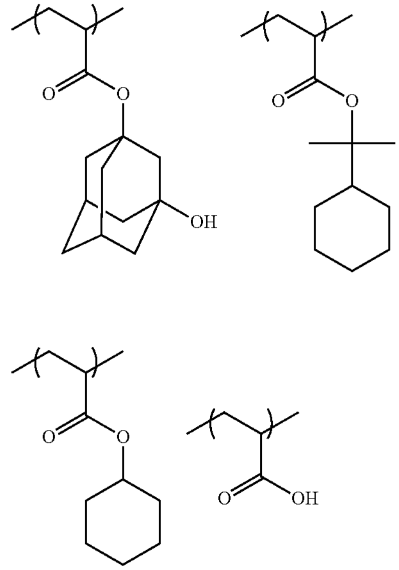
(67)
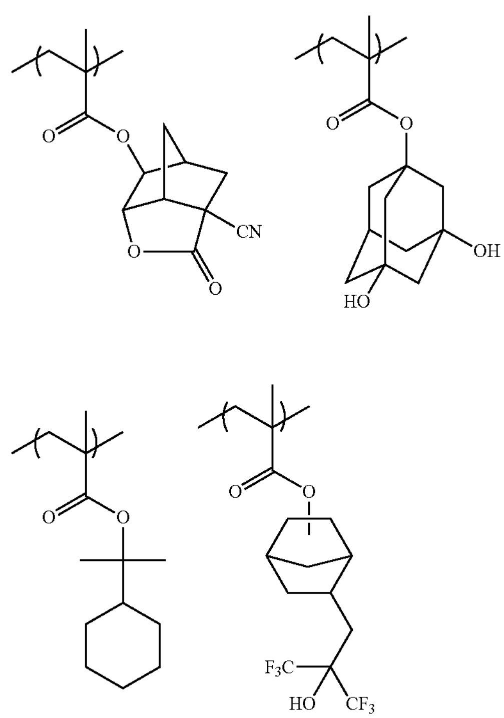

-continued
(68)
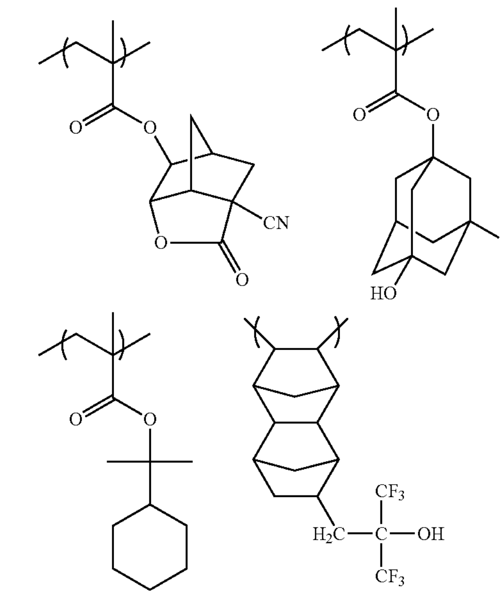
(69)
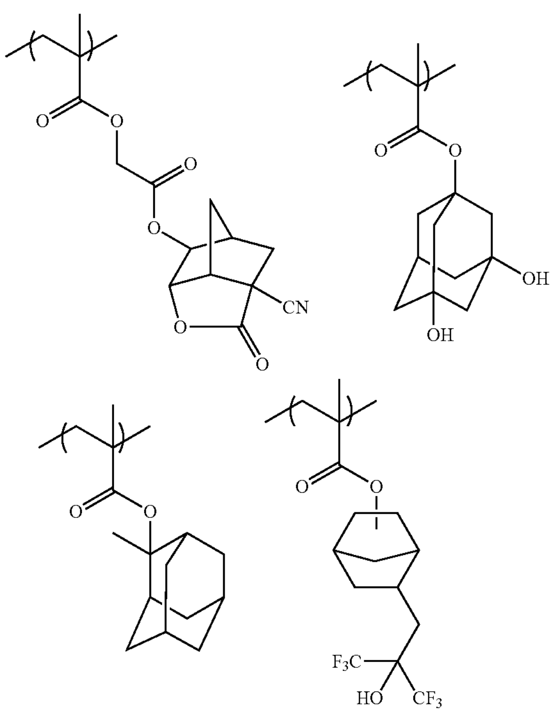
(70)
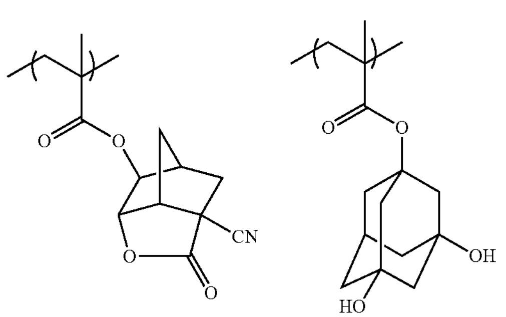
-continued
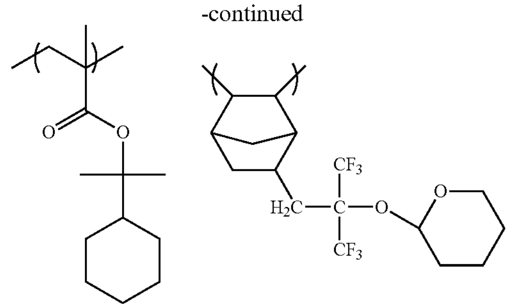
(71)
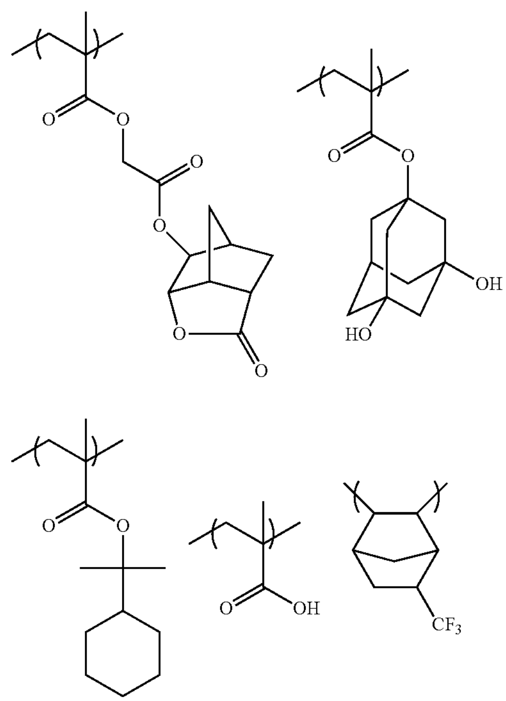
(72)
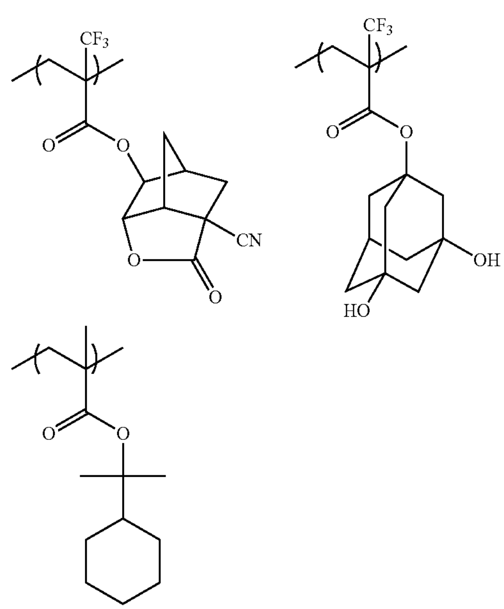

-continued
(73)
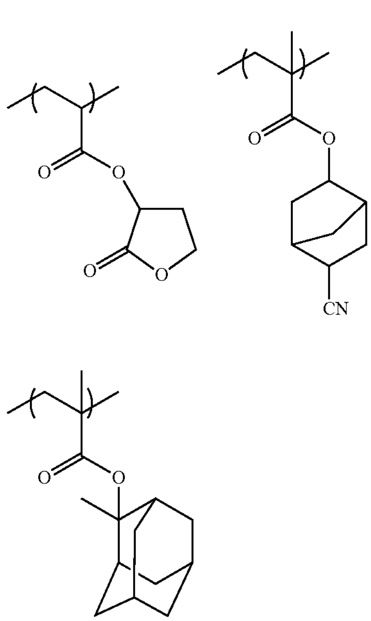
(74)
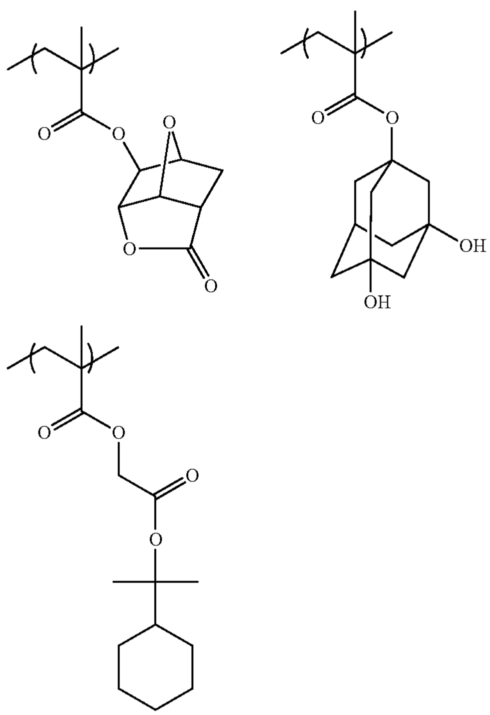
(75)
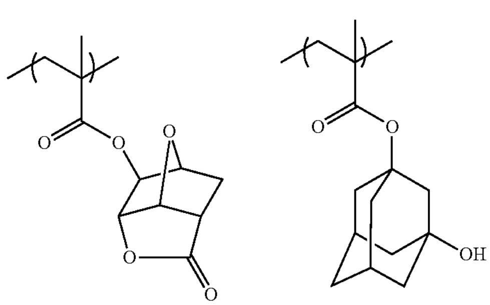
-continued
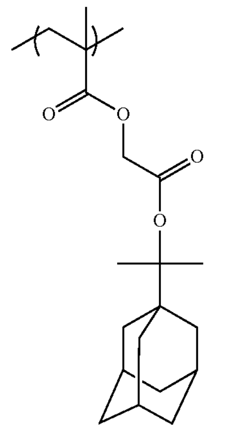
(76)
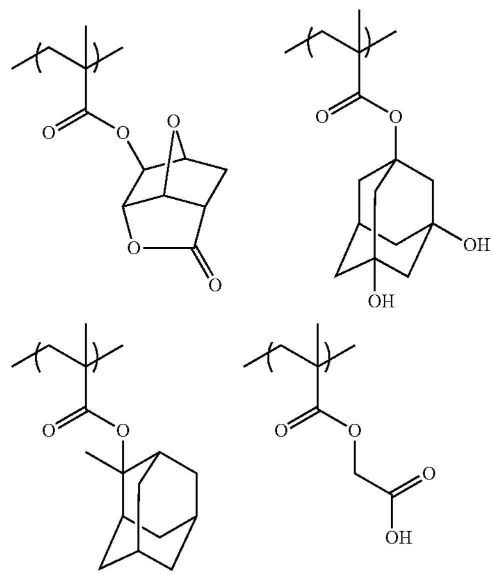
(1b)
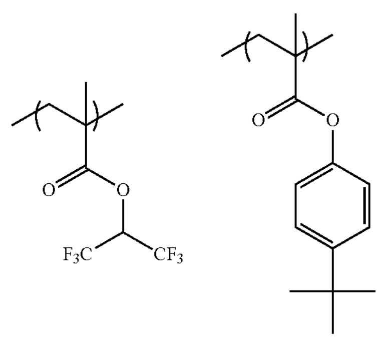
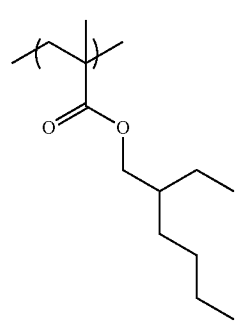

-continued (2b)

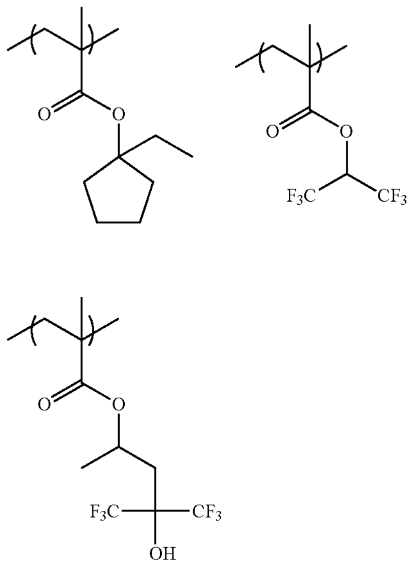

(3b)

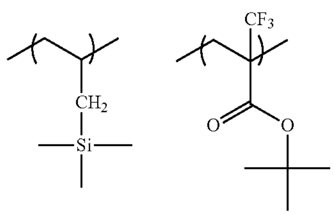

TABLE 1

| Resin | Composition (molar ratio) | Mw | Mw/Mn |
|---|---|---|---|
| (1) | 40/10/40/10 | 10000 | 1.4 |
| (2) | 40/10/50 | 10000 | 1.3 |
| (3) | 40/10/50 | 8000 | 1.5 |
| (4) | 40/10/40/10 | 6000 | 1.5 |
| (5) | 35/10/40/10/5 | 15000 | 1.5 |
| (6) | 35/10/40/10/5 | 15000 | 1.4 |
| (7) | 40/10/40/10 | 10000 | 1.4 |
| (8) | 40/10/50 | 10000 | 1.3 |
| (9) | 40/10/50 | 8000 | 1.5 |
| (10) | 40/10/40/10 | 6000 | 1.5 |
| (11) | 35/10/40/10/5 | 15000 | 1.5 |
| (12) | 35/10/40/10/5 | 15000 | 1.4 |
| (13) | 40/10/40/10 | 10000 | 1.4 |
| (14) | 40/10/50 | 10000 | 1.3 |
| (15) | 40/10/50 | 8000 | 1.5 |
| (16) | 40/10/40/10 | 6000 | 1.5 |
| (17) | 35/10/40/10/5 | 15000 | 1.5 |
| (18) | 35/10/40/10/5 | 15000 | 1.4 |
| (19) | 40/10/40/10 | 10000 | 1.4 |
| (20) | 40/10/50 | 10000 | 1.3 |
| (21) | 40/10/50 | 8000 | 1.5 |
| (22) | 40/10/40/10 | 6000 | 1.5 |
| (23) | 35/10/40/10/5 | 15000 | 1.5 |
| (24) | 35/10/40/10/5 | 15000 | 1.4 |
| (25) | 40/10/40/10 | 10000 | 1.4 |
| (26) | 40/10/50 | 10000 | 1.3 |
| (27) | 40/10/50 | 8000 | 1.5 |
| (28) | 40/10/40/10 | 6000 | 1.5 |
| (29) | 35/10/40/10/5 | 15000 | 1.5 |
| (30) | 35/10/40/10/5 | 15000 | 1.4 |
| (31) | 40/10/40/10 | 10000 | 1.4 |

TABLE 1-continued

| Resin | Composition (molar ratio) | Mw | Mw/Mn |
|---|---|---|---|
| (32) | 40/10/50 | 10000 | 1.3 |
| (33) | 40/10/50 | 8000 | 1.5 |
| (34) | 40/10/40/10 | 6000 | 1.5 |
| (35) | 35/10/40/10/5 | 15000 | 1.5 |
| (36) | 35/10/40/10/5 | 15000 | 1.4 |
| (37) | 40/10/40/10 | 10000 | 1.4 |
| (38) | 40/10/50 | 10000 | 1.3 |
| (39) | 40/10/50 | 8000 | 1.5 |

TABLE 2

| Resin | Composition (molar ratio) | Mw | Mw/Mn |
|---|---|---|---|
| (40) | 40/10/40/10 | 6000 | 1.5 |
| (41) | 35/10/40/10/5 | 15000 | 1.5 |
| (42) | 35/10/40/10/5 | 15000 | 1.4 |
| (43) | 40/10/40/10 | 10000 | 1.4 |
| (44) | 40/10/50 | 10000 | 1.3 |
| (45) | 40/10/50 | 8000 | 1.5 |
| (46) | 40/10/40/10 | 6000 | 1.5 |
| (47) | 35/10/40/10/5 | 15000 | 1.5 |
| (48) | 35/10/40/10/5 | 15000 | 1.4 |
| (49) | 40/10/40/10 | 10000 | 1.4 |
| (50) | 40/10/50 | 10000 | 1.3 |
| (51) | 40/10/50 | 8000 | 1.5 |
| (52) | 40/10/40/10 | 6000 | 1.5 |
| (53) | 35/10/40/10/5 | 15000 | 1.5 |
| (54) | 35/10/40/10/5 | 15000 | 1.4 |
| (55) | 40/10/40/10 | 10000 | 1.4 |
| (56) | 40/10/50 | 10000 | 1.3 |
| (57) | 40/10/50 | 8000 | 1.5 |
| (58) | 40/10/40/10 | 6000 | 1.5 |
| (59) | 35/10/40/10/5 | 15000 | 1.5 |
| (60) | 35/10/40/10/5 | 15000 | 1.4 |
| (61) | 20/70/10 | 10000 | 1.4 |
| (62) | 20/80 | 10000 | 1.3 |
| (63) | 30/70 | 8000 | 1.5 |
| (64) | 20/70/10 | 6000 | 1.5 |
| (65) | 20/55/20/5 | 15000 | 1.5 |
| (66) | 25/60/10/5 | 15000 | 1.4 |

TABLE 3

| Resin | Composition (molar ratio) | Mw | Mw/Mn |
|---|---|---|---|
| (67) | 40/10/40/10 | 8000 | 1.5 |
| (68) | 40/10/40/10 | 8000 | 1.5 |
| (69) | 40/10/40/10 | 8000 | 1.5 |
| (70) | 40/10/40/10 | 8000 | 1.5 |
| (71) | 35/10/40/10/5 | 8000 | 1.5 |
| (72) | 40/10/50 | 8000 | 1.5 |
| (73) | 40/10/50 | 10000 | 1.7 |
| (74) | 40/10/50 | 10000 | 1.7 |
| (75) | 40/10/50 | 10000 | 1.7 |
| (76) | 40/10/40/10 | 10000 | 1.7 |
| (1b) | 30/60/10 | 5000 | 1.4 |
| (2b) | 50/40/10 | 6500 | 1.5 |
| (3b) | 50/50 | 4000 | 1.3 |

Acid Generator or Compound (PA)
(PAG-01)
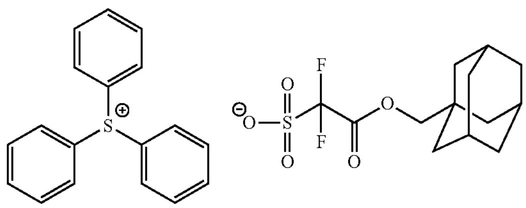
(PAG-02)
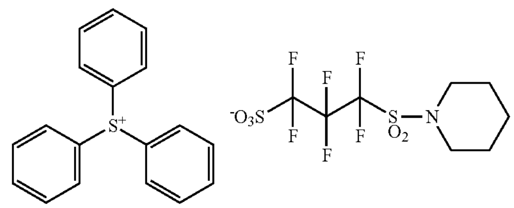
(PAG-03)
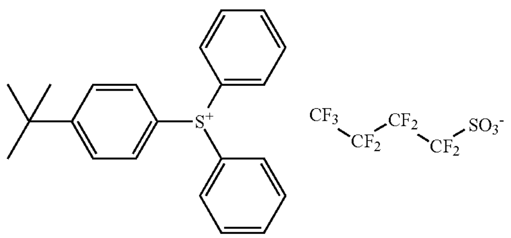
(PAG-04)
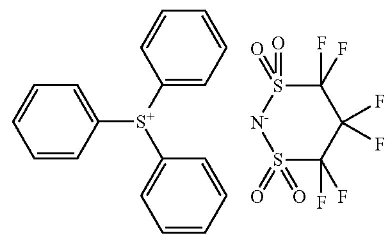
(PAG-05)
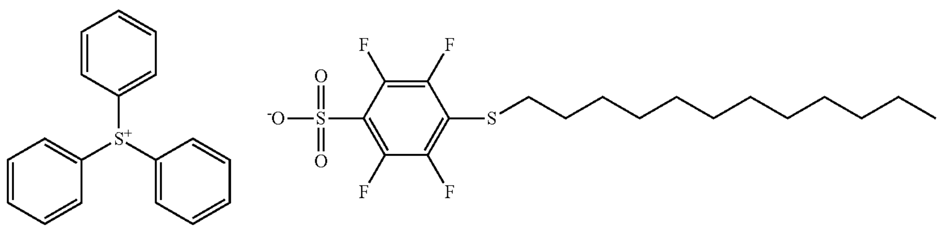
(PAG-06)
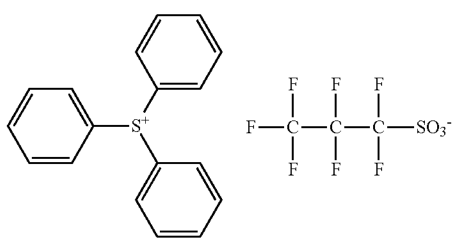
(PAG-07)
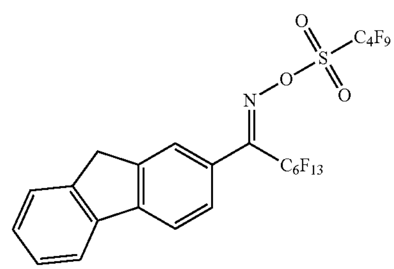
(PAG-08)
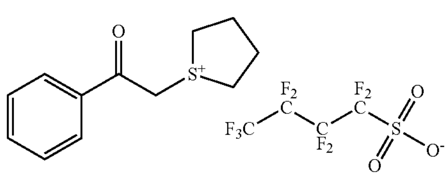
(PAG-09)
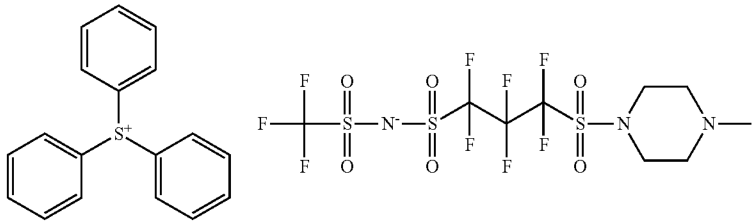

-continued
(PAG-10)
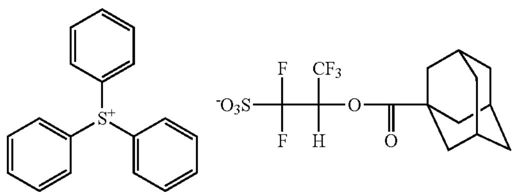
(PAG-11)
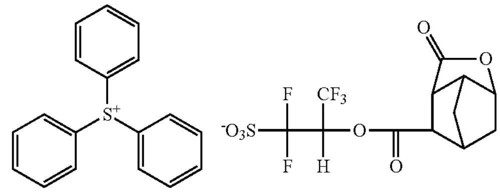
(PAG-12)
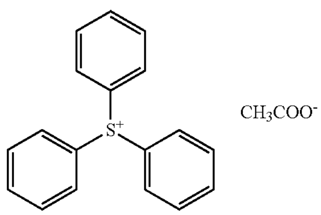
(PAG-13)
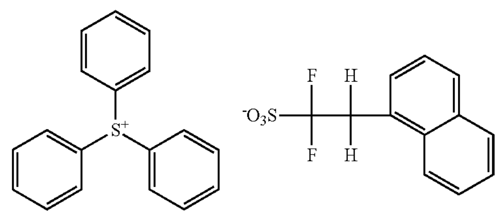
(PAG-14)
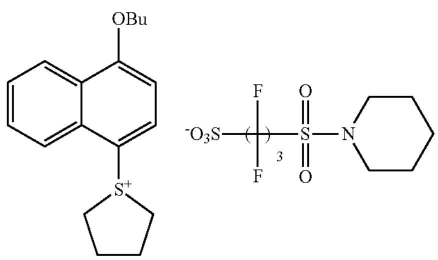
[(c) Basic Compound]
(B-1)
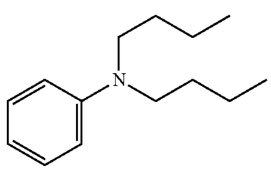
(B-2)
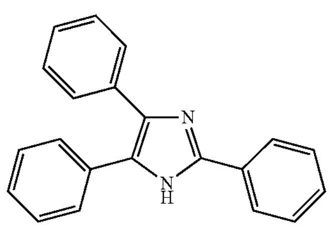
(B-3)
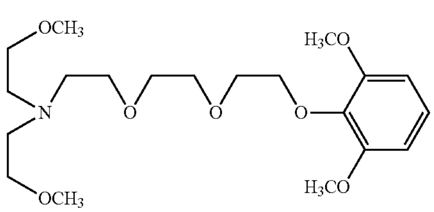
-continued
(B-4)
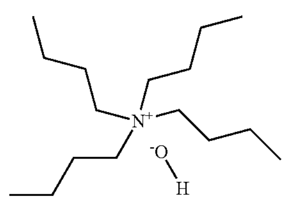
(B-5)
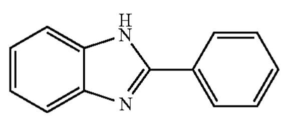
(B-6)
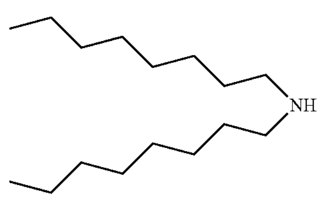
(B-7)
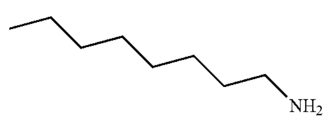
(B-8)
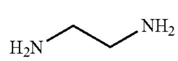
[(d) Surfactant]
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)

W-3: polysiloxane polymer KP-341 (produced by Shin-Etsu Chemical Co., Ltd.) (silicon-containing)

[Solvent]

A1: propylene glycol monomethyl ether acetate (PGMEA, another name: 1-methoxy-2-acetoxypropane)

A2: γ-butyrolactone

A3: cyclohexanone

B1: propylene glycol monomethyl ether (PGME, another name: 1-methoxy-2-propanol)

B2: ethyl lactate

TABLE 4

| Resist | (i) Resin (A) | Mass/g | (ii) Acid Generator | Mass/g | (iii) Acid Generator Used in Combination or Compound (PA) | Mass/g | (iv) Basic Compound | Mass/g | (v) Basic Compound Used in Combination |
|---|---|---|---|---|---|---|---|---|---|
| Ar-01 | (1) | 10 | (PAG-01) | 0.5 | | | (B-1) | 0.02 | (B-3) |
| Ar-02 | (2) | 10 | (PAG-02) | 0.5 | | | (B-2) | 0.02 | (B-7) |
| Ar-03 | (3) | 10 | (PAG-03) | 0.5 | | | (B-3) | 0.02 | (B-8) |
| Ar-04 | (4) | 10 | (PAG-04) | 0.5 | (PAG-07) | 0.2 | (B-4) | 0.03 | |
| Ar-05 | (5) | 10 | (PAG-05) | 0.5 | (PAG-08) | 0.2 | (B-5) | 0.03 | |
| Ar-06 | (6) | 10 | (PAG-06) | 0.5 | (PAG-09) | 0.2 | (B-6) | 0.03 | |
| Ar-07 | (7) | 10 | (PAG-01) | 0.5 | | | (B-1) | 0.02 | (B-3) |
| Ar-08 | (8) | 10 | (PAG-02) | 0.5 | | | (B-2) | 0.02 | (B-7) |
| Ar-09 | (9) | 10 | (PAG-03) | 0.5 | | | (B-3) | 0.02 | (B-8) |
| Ar-10 | (10) | 10 | (PAG-04) | 0.5 | (PAG-07) | 0.2 | (B-4) | 0.03 | |
| Ar-11 | (11) | 10 | (PAG-05) | 0.5 | (PAG-08) | 0.2 | (B-5) | 0.03 | |
| Ar-12 | (12) | 10 | (PAG-06) | 0.5 | (PAG-09) | 0.2 | (B-6) | 0.03 | |
| Ar-13 | (13) | 10 | (PAG-01) | 0.5 | | | (B-1) | 0.02 | (B-3) |
| Ar-14 | (14) | 10 | (PAG-02) | 0.5 | | | (B-2) | 0.02 | (B-7) |
| Ar-15 | (15) | 10 | (PAG-03) | 0.5 | | | (B-3) | 0.02 | (B-8) |
| Ar-16 | (16) | 10 | (PAG-04) | 0.5 | (PAG-07) | 0.2 | (B-4) | 0.03 | |
| Ar-17 | (17) | 10 | (PAG-05) | 0.5 | (PAG-08) | 0.2 | (B-5) | 0.03 | |
| Ar-18 | (18) | 10 | (PAG-06) | 0.5 | (PAG-09) | 0.2 | (B-6) | 0.03 | |
| Ar-19 | (19) | 10 | (PAG-01) | 0.5 | | | (B-1) | 0.02 | (B-3) |
| Ar-20 | (20) | 10 | (PAG-02) | 0.5 | | | (B-2) | 0.02 | (B-7) |
| Ar-21 | (21) | 10 | (PAG-03) | 0.5 | | | (B-3) | 0.02 | (B-8) |
| Ar-22 | (22) | 10 | (PAG-04) | 0.5 | (PAG-07) | 0.2 | (B-4) | 0.03 | |
| Ar-23 | (23) | 10 | (PAG-05) | 0.5 | (PAG-08) | 0.2 | (B-5) | 0.03 | |
| Ar-24 | (24) | 10 | (PAG-06) | 0.5 | (PAG-09) | 0.2 | (B-6) | 0.03 | |
| Ar-25 | (25) | 10 | (PAG-01) | 0.5 | | | (B-1) | 0.02 | (B-3) |
| Ar-26 | (26) | 10 | (PAG-02) | 0.5 | | | (B-2) | 0.02 | (B-7) |
| Ar-27 | (27) | 10 | (PAG-03) | 0.5 | | | (B-3) | 0.02 | (B-8) |
| Ar-28 | (28) | 10 | (PAG-04) | 0.5 | (PAG-07) | 0.2 | (B-4) | 0.03 | |
| Ar-29 | (29) | 10 | (PAG-05) | 0.5 | (PAG-08) | 0.2 | (B-5) | 0.03 | |
| Ar-30 | (30) | 10 | (PAG-06) | 0.5 | (PAG-09) | 0.2 | (B-6) | 0.03 | |
| Ar-31 | (31) | 10 | (PAG-01) | 0.5 | | | (B-1) | 0.02 | (B-3) |
| Ar-32 | (32) | 10 | (PAG-02) | 0.5 | | | (B-2) | 0.02 | (B-7) |
| Ar-33 | (33) | 10 | (PAG-03) | 0.5 | | | (B-3) | 0.02 | (B-8) |
| Ar-34 | (34) | 10 | (PAG-04) | 0.5 | (PAG-07) | 0.2 | (B-4) | 0.03 | |
| Ar-35 | (35) | 10 | (PAG-05) | 0.5 | (PAG-08) | 0.2 | (B-5) | 0.03 | |
| Ar-36 | (36) | 10 | (PAG-06) | 0.5 | (PAG-09) | 0.2 | (B-6) | 0.03 | |
| Ar-37 | (37) | 10 | (PAG-01) | 0.5 | | | (B-1) | 0.02 | (B-3) |

| Resist | Mass/g | (vi) Surfactant | Mass/g | (vii) Hydrophobic Resin (D) | Mass/g | (viii) Solvent | Ratio by Mass |
|---|---|---|---|---|---|---|---|
| Ar-01 | 0.01 | W-1 | 0.03 | (1b) | 0.05 | A1/B1 | 60/40 |
| Ar-02 | 0.01 | W-2 | 0.03 | (2b) | 0.05 | A1/B2 | 80/20 |
| Ar-03 | 0.01 | W-3 | 0.03 | (3b) | 0.05 | A2/B1 | 70/30 |
| Ar-04 | | W-1 | 0.03 | (1b) | 0.05 | A3/B2 | 80/20 |
| Ar-05 | | W-2 | 0.03 | (2b) | 0.05 | A1/A2/B1 | 50/4/46 |
| Ar-06 | | W-3 | 0.03 | (3b) | 0.05 | A1/B1 | 60/40 |
| Ar-07 | 0.01 | W-1 | 0.03 | (1b) | 0.05 | A1/B1 | 60/40 |
| Ar-08 | 0.01 | W-2 | 0.03 | (2b) | 0.05 | A1/B2 | 80/20 |
| Ar-09 | 0.01 | W-3 | 0.03 | (3b) | 0.05 | A2/B1 | 70/30 |
| Ar-10 | | W-1 | 0.03 | (1b) | 0.05 | A3/B2 | 80/20 |
| Ar-11 | | W-2 | 0.03 | (2b) | 0.05 | A1/A2/B1 | 50/4/46 |
| Ar-12 | | W-3 | 0.03 | (3b) | 0.05 | A1/B1 | 60/40 |
| Ar-13 | 0.01 | W-1 | 0.03 | (1b) | 0.05 | A1/B1 | 60/40 |
| Ar-14 | 0.01 | W-2 | 0.03 | (2b) | 0.05 | A1/B2 | 80/20 |
| Ar-15 | 0.01 | W-3 | 0.03 | (3b) | 0.05 | A2/B1 | 70/30 |
| Ar-16 | | W-1 | 0.03 | (1b) | 0.05 | A3/B2 | 80/20 |
| Ar-17 | | W-2 | 0.03 | (2b) | 0.05 | A1/A2/B1 | 50/4/46 |
| Ar-18 | | W-3 | 0.03 | (3b) | 0.05 | A1/B1 | 60/40 |
| Ar-19 | 0.01 | W-1 | 0.03 | (1b) | 0.05 | A1/B1 | 60/40 |
| Ar-20 | 0.01 | W-2 | 0.03 | (2b) | 0.05 | A1/B2 | 80/20 |
| Ar-21 | 0.01 | W-3 | 0.03 | (3b) | 0.05 | A2/B1 | 70/30 |
| Ar-22 | | W-1 | 0.03 | (1b) | 0.05 | A3/B2 | 80/20 |
| Ar-23 | | W-2 | 0.03 | (2b) | 0.05 | A1/A2/B1 | 50/4/46 |
| Ar-24 | | W-3 | 0.03 | (3b) | 0.05 | A1/B1 | 60/40 |
| Ar-25 | 0.01 | W-1 | 0.03 | (1b) | 0.05 | A1/B1 | 60/40 |

TABLE 4-continued

| | | | | | | | |
|---|---|---|---|---|---|---|---|
| Ar-26 | 0.01 | W-2 | 0.03 | (2b) | 0.05 | A1/B2 | 80/20 |
| Ar-27 | 0.01 | W-3 | 0.03 | (3b) | 0.05 | A2/B1 | 70/30 |
| Ar-28 | | W-1 | 0.03 | (1b) | 0.05 | A3/B2 | 80/20 |
| Ar-29 | | W-2 | 0.03 | (2b) | 0.05 | A1/A2/B1 | 50/4/46 |
| Ar-30 | | W-3 | 0.03 | (3b) | 0.05 | A1/B1 | 60/40 |
| Ar-31 | 0.01 | W-1 | 0.03 | (1b) | 0.05 | A1/B1 | 60/40 |
| Ar-32 | 0.01 | W-2 | 0.03 | (2b) | 0.05 | A1/B2 | 80/20 |
| Ar-33 | 0.01 | W-3 | 0.03 | (3b) | 0.05 | A2/B1 | 70/30 |
| Ar-34 | | W-1 | 0.03 | (1b) | 0.05 | A3/B2 | 80/20 |
| Ar-35 | | W-2 | 0.03 | (2b) | 0.05 | A1/A2/B1 | 50/4/46 |
| Ar-36 | | W-3 | 0.03 | (3b) | 0.05 | A1/B1 | 60/40 |
| Ar-37 | 0.01 | W-1 | 0.03 | (1b) | 0.05 | A1/B1 | 60/40 |

TABLE 5

| Resist | (i) Resin (A) | Mass/g | (ii) Acid Generator | Mass/g | (iii) Acid Generator Used in Combination or Compound (PA) | Mass/g | (iv) Basic Compound | Mass/g | (v) Basic Compound Used in Combination |
|---|---|---|---|---|---|---|---|---|---|
| Ar-38 | (38) | 10 | (PAG-02) | 0.5 | | | (B-2) | 0.02 | (B-7) |
| Ar-39 | (39) | 10 | (PAG-03) | 0.5 | | | (B-3) | 0.02 | (B-8) |
| Ar-40 | (40) | 10 | (PAG-04) | 0.5 | (PAG-07) | 0.2 | (B-4) | 0.03 | |
| Ar-41 | (41) | 10 | (PAG-05) | 0.5 | (PAG-08) | 0.2 | (B-5) | 0.03 | |
| Ar-42 | (42) | 10 | (PAG-06) | 0.5 | (PAG-09) | 0.2 | (B-6) | 0.03 | |
| Ar-43 | (43) | 10 | (PAG-01) | 0.5 | | | (B-1) | 0.02 | (B-3) |
| Ar-44 | (44) | 10 | (PAG-02) | 0.5 | | | (B-2) | 0.02 | (B-7) |
| Ar-45 | (45) | 10 | (PAG-03) | 0.5 | | | (B-3) | 0.02 | (B-8) |
| Ar-46 | (46) | 10 | (PAG-04) | 0.5 | (PAG-07) | 0.2 | (B-4) | 0.03 | |
| Ar-47 | (47) | 10 | (PAG-05) | 0.5 | (PAG-08) | 0.2 | (B-5) | 0.03 | |
| Ar-48 | (48) | 10 | (PAG-06) | 0.5 | (PAG-09) | 0.2 | (B-6) | 0.03 | |
| Ar-49 | (49) | 10 | (PAG-01) | 0.5 | | | (B-1) | 0.02 | (B-3) |
| Ar-50 | (50) | 10 | (PAG-02) | 0.5 | | | (B-2) | 0.02 | (B-7) |
| Ar-51 | (51) | 10 | (PAG-03) | 0.5 | | | (B-3) | 0.02 | (B-8) |
| Ar-52 | (52) | 10 | (PAG-04) | 0.5 | (PAG-07) | 0.2 | (B-4) | 0.03 | |
| Ar-53 | (53) | 10 | (PAG-05) | 0.5 | (PAG-08) | 0.2 | (B-5) | 0.03 | |
| Ar-54 | (54) | 10 | (PAG-06) | 0.5 | (PAG-09) | 0.2 | (B-6) | 0.03 | |
| Ar-55 | (55) | 10 | (PAG-01) | 0.5 | | | (B-1) | 0.02 | (B-3) |
| Ar-56 | (56) | 10 | (PAG-02) | 0.5 | | | (B-2) | 0.02 | (B-7) |
| Ar-57 | (57) | 10 | (PAG-03) | 0.5 | | | (B-3) | 0.02 | (B-8) |
| Ar-58 | (58) | 10 | (PAG-04) | 0.5 | (PAG-07) | 0.2 | (B-4) | 0.03 | |
| Ar-59 | (59) | 10 | (PAG-05) | 0.5 | (PAG-08) | 0.2 | (B-5) | 0.03 | |
| Ar-60 | (60) | 10 | (PAG-06) | 0.5 | (PAG-09) | 0.2 | (B-6) | 0.03 | |
| Ar-61 | (61) | 10 | (PAG-01) | 0.5 | | | (B-1) | 0.02 | (B-3) |
| Ar-62 | (62) | 10 | (PAG-02) | 0.5 | | | (B-2) | 0.02 | (B-7) |
| Ar-63 | (63) | 10 | (PAG-03) | 0.5 | | | (B-3) | 0.02 | (B-8) |
| Ar-64 | (64) | 10 | (PAG-04) | 0.5 | (PAG-07) | 0.2 | (B-4) | 0.03 | |
| Ar-65 | (65) | 10 | (PAG-05) | 0.5 | (PAG-08) | 0.2 | (B-5) | 0.03 | |
| Ar-66 | (66) | 10 | (PAG-06) | 0.5 | (PAG-09) | 0.2 | (B-6) | 0.03 | |

| Resist | Mass/g | (vi) Surfactant | Mass/g | (vii) Hydrophobic Resin (D) | Mass/g | (viii) Solvent | Ratio by Mass |
|---|---|---|---|---|---|---|---|
| Ar-38 | 0.01 | W-2 | 0.03 | (2b) | 0.05 | A1/B2 | 80/20 |
| Ar-39 | 0.01 | W-3 | 0.03 | (3b) | 0.05 | A2/B1 | 70/30 |
| Ar-40 | | W-1 | 0.03 | (1b) | 0.05 | A3/B2 | 80/20 |
| Ar-41 | | W-2 | 0.03 | (2b) | 0.05 | A1/A2/B1 | 50/4/46 |
| Ar-42 | | W-3 | 0.03 | (3b) | 0.05 | A1/B1 | 60/40 |
| Ar-43 | 0.01 | W-1 | 0.03 | (1b) | 0.05 | A1/B1 | 60/40 |
| Ar-44 | 0.01 | W-2 | 0.03 | (2b) | 0.05 | A1/B2 | 80/20 |
| Ar-45 | 0.01 | W-3 | 0.03 | (3b) | 0.05 | A2/B1 | 70/30 |
| Ar-46 | | W-1 | 0.03 | (1b) | 0.05 | A3/B2 | 80/20 |
| Ar-47 | | W-2 | 0.03 | (2b) | 0.05 | A1/A2/B1 | 50/4/46 |
| Ar-48 | | W-3 | 0.03 | (3b) | 0.05 | A1/B1 | 60/40 |
| Ar-49 | 0.01 | W-1 | 0.03 | (1b) | 0.05 | A1/B1 | 60/40 |
| Ar-50 | 0.01 | W-2 | 0.03 | (2b) | 0.05 | A1/B2 | 80/20 |
| Ar-51 | 0.01 | W-3 | 0.03 | (3b) | 0.05 | A2/B1 | 70/30 |
| Ar-52 | | W-1 | 0.03 | (1b) | 0.05 | A3/B2 | 80/20 |
| Ar-53 | | W-2 | 0.03 | (2b) | 0.05 | A1/A2/B1 | 50/4/46 |
| Ar-54 | | W-3 | 0.03 | (3b) | 0.05 | A1/B1 | 60/40 |
| Ar-55 | 0.01 | W-1 | 0.03 | (1b) | 0.05 | A1/B1 | 60/40 |
| Ar-56 | 0.01 | W-2 | 0.03 | (2b) | 0.05 | A1/B2 | 80/20 |
| Ar-57 | 0.01 | W-3 | 0.03 | (3b) | 0.05 | A2/B1 | 70/30 |
| Ar-58 | | W-1 | 0.03 | (1b) | 0.05 | A3/B2 | 80/20 |
| Ar-59 | | W-2 | 0.03 | (2b) | 0.05 | A1/A2/B1 | 50/4/46 |

TABLE 5-continued

| | | | | | | | |
|---|---|---|---|---|---|---|---|
| Ar-60 | | W-3 | 0.03 | (3b) | 0.05 | A1/B1 | 60/40 |
| Ar-61 | 0.01 | W-1 | 0.03 | (1b) | 0.05 | A1/B1 | 60/40 |
| Ar-62 | 0.01 | W-2 | 0.03 | (2b) | 0.05 | A1/B2 | 80/20 |
| Ar-63 | 0.01 | W-3 | 0.03 | (3b) | 0.05 | A2/B1 | 70/30 |
| Ar-64 | | W-1 | 0.03 | (1b) | 0.05 | A3/B2 | 80/20 |
| Ar-65 | | W-2 | 0.03 | (2b) | 0.05 | A1/A2/B1 | 50/4/46 |
| Ar-66 | | W-3 | 0.03 | (3b) | 0.05 | A1/B1 | 60/40 |

TABLE 6

| Resist | (i) Resin (A) | Mass/g | (ii) Acid Generator | Mass/g | (iii) Acid Generator Used in Combination or Compound (PA) | Mass/g | (iv) Basic Compound | Mass/g | (v) Basic Compound Used in Combination |
|---|---|---|---|---|---|---|---|---|---|
| Ar-67 | (67) | 10 | (PAG-01) | 0.5 | | | (B-1) | 0.02 | (B-3) |
| Ar-68 | (68) | 10 | (PAG-01) | 0.5 | | | (B-1) | 0.02 | (B-3) |
| Ar-69 | (69) | 10 | (PAG-01) | 0.5 | | | (B-1) | 0.02 | (B-3) |
| Ar-70 | (70) | 10 | (PAG-01) | 0.5 | | | (B-1) | 0.02 | (B-3) |
| Ar-71 | (71) | 10 | (PAG-01) | 0.5 | | | (B-1) | 0.02 | (B-3) |
| Ar-72 | (72) | 10 | (PAG-01) | 0.5 | | | (B-1) | 0.02 | (B-3) |
| Ar-73 | (72) | 10 | (PAG-01) | 0.5 | | | (B-1) | 0.02 | (B-3) |
| Ar-74 | (73) | 10 | (PAG-01) | 0.5 | | | (B-1) | 0.02 | (B-3) |
| Ar-75 | (74) | 10 | (PAG-01) | 0.5 | | | (B-1) | 0.02 | (B-3) |
| Ar-76 | (75) | 10 | (PAG-01) | 0.5 | | | (B-1) | 0.02 | (B-3) |
| Ar-77 | (76) | 10 | (PAG-01) | 0.5 | | | (B-1) | 0.02 | (B-3) |
| Ar-78 | (3) | 10 | (PAG-10) | 0.5 | | | (B-1) | 0.02 | (B-3) |
| Ar-79 | (3) | 10 | (PAG-10) | 0.5 | | | (B-1) | 0.02 | (B-3) |
| Ar-80 | (4) | 10 | (PAG-11) | 0.5 | | | (B-1) | 0.02 | (B-3) |
| Ar-81 | (5) | 10 | (PAG-12) | 0.5 | | | (B-1) | 0.02 | (B-3) |
| Ar-82 | (6) | 10 | (PAG-13) | 0.5 | | | (B-1) | 0.02 | (B-3) |
| Ar-83 | (1) | 5 | (PAG-01) | 0.5 | | | (B-1) | 0.02 | (B-3) |
| | (2) | 5 | | | | | | | |
| Ar-84 | (3) | 10 | (PAG-10) | 0.4 | (PAG-14) | 0.2 | (B-1) | 0.02 | (B-3) |

| Resist | Mass/g | (vi) Surfactant | Mass/g | (vii) Hydrophobic Resin (D) | Mass/g | (viii) Solvent | Ratio by Mass |
|---|---|---|---|---|---|---|---|
| Ar-67 | 0.01 | W-1 | 0.03 | (1b) | 0.05 | A1/B1 | 60/40 |
| Ar-68 | 0.01 | W-1 | 0.03 | (2b) | 0.05 | A1/B1 | 60/40 |
| Ar-69 | 0.01 | W-1 | 0.03 | (3b) | 0.05 | A1/B1 | 60/40 |
| Ar-70 | 0.01 | W-1 | 0.03 | (1b) | 0.05 | A1/B1 | 60/40 |
| Ar-71 | 0.01 | W-1 | 0.03 | (2b) | 0.05 | A1/B1 | 60/40 |
| Ar-72 | 0.01 | W-1 | 0.03 | (3b) | 0.05 | A1/B1 | 60/40 |
| Ar-73 | 0.01 | W-1 | 0.03 | | | A1/B1 | 60/40 |
| Ar-74 | 0.01 | W-1 | 0.03 | (1b) | 0.05 | A1/B1 | 60/40 |
| Ar-75 | 0.01 | W-1 | 0.03 | (2b) | 0.05 | A1/B1 | 60/40 |
| Ar-76 | 0.01 | W-1 | 0.03 | (3b) | 0.05 | A1/B1 | 60/40 |
| Ar-77 | 0.01 | W-1 | 0.03 | (1b) | 0.05 | A1/B1 | 60/40 |
| Ar-78 | 0.01 | | | (1b) | 0.05 | A1/B1 | 60/40 |
| Ar-79 | 0.01 | W-1 | 0.03 | (2b) | 0.05 | A1/B1 | 60/40 |
| Ar-80 | 0.01 | W-1 | 0.03 | (1b) | 0.05 | A1/B1 | 60/40 |
| Ar-81 | 0.01 | W-1 | 0.03 | (3b) | 0.05 | A1/B1 | 60/40 |
| Ar-82 | 0.01 | W-1 | 0.03 | (2b) | 0.05 | A1/B1 | 60/40 |
| Ar-83 | 0.01 | W-1 | 0.03 | (1b) | 0.05 | A1/B1 | 60/40 |
| Ar-84 | 0.01 | | | (1b) | 0.05 | A1/B1 | 60/40 |

Example 1

An organic antireflection film, ARC29A (produced by Nissan Chemical Industries, Ltd.), was applied on a silicon wafer and baked at 205° C. for 60 seconds to form a 86 nm-thick antireflection film, and Resist Composition Ar-01 shown in Table 4 was applied thereon and baked at 115° C. for 60 seconds (PB: Prebake) to form a 100 nm-thick resist film. The obtained wafer was subjected to pattern exposure through an exposure mask (line/space=1/1) by using an ArF excimer laser scanner (NA: 0.75). At this time, the area of exposure was set to 205 $cm^2$ in total. Thereafter, the wafer was heated at 105° C. for 60 seconds (PEB: Post Exposure Bake), developed with an organic solvent-containing developer shown in Table 7 for 30 seconds (organic solvent-based development), rinsed with a rinsing solution shown in Table 7, and spun at a rotation speed of 4,000 rpm for 30 seconds to obtain a line-and-space (1:1) resist pattern having a line width of 150 nm.

Examples 2 to 66, 70 to 77 and 84 to 87 and Comparative Examples 1 to 3

In the same manner as in the method of Example 1, line-and-space (1:1) resist patterns having a pitch of 300 nm and a line width of 150 nm of Examples 2 to 66, 70 to 77 and 84 to 87 and Comparative Examples 1 to 3 were obtained using Resist Compositions Ar-01 to Ar-67 and Ar-70 to Ar-77 shown in Tables 4 to 6 under the conditions shown in Tables 7 to 9.

In Tables 7 to 9, A1, A2, A3, B1 and the like indicative of the organic solvent-containing developer are the same as the symbols of solvents used in the preparation of resists above.

In the case where a solvent is shown in the column of Organic Solvent-containing Developer (2), this means that solvents shown in Organic Solvent Containing Developer (1) and Organic Solvent-Containing Developer (2) of Tables 7 to 9 were used in a solvent ratio (by mass) shown in Tables 7 to 9. Similarly, when a solvent is shown in the column of Rinsing Solution (2), this means that solvents shown in the columns of Rinsing Solution (1) and Rinsing Solution (2) of Tables 7 to 9 were used in a solvent ratio (by mass) shown in Tables 7 to 9.

Example 67

An organic antireflection film, ARC29A (produced by Nissan Chemical Industries, Ltd.), was applied on a silicon wafer and baked at 205° C. for 60 seconds to form a 78 nm-thick antireflection film, and Resist Composition Ar-67 was applied thereon and baked at 115° C. for 60 seconds (PB) to form a 150 nm-thick resist film. The obtained wafer was subjected to pattern exposure through an exposure mask (line/space=1/1) by using an ArF excimer laser scanner (NA: 0.75). At this time, the area of exposure was set to 205 $cm^2$ in total. Thereafter, the wafer was heated at 85° C. for 60 seconds (PEB), developed with an aqueous tetramethylammonium hydroxide solution (2.38 mass %) (alkali developer) for 30 seconds (alkali development) and rinsed with pure water to obtain a pattern having a pitch of 600 nm and a line width of 450 nm. Subsequently, the wafer was developed with an organic solvent-containing developer shown in Table 9 for 30 seconds (organic solvent-based development), rinsed with a rinsing solution shown in Table 9, and spun at a rotation speed of 4,000 rpm for 30 seconds to obtain a line-and-space (1:1) resist pattern having a line width of 150 nm.

Comparative Example 4

A line-and-space (1:1) resist pattern having a pitch of 300 nm and a line width of 150 nm of Comparative Example 4 was obtained in the same manner as in the method of Example 67 under the conditions shown in Table 9.

Example 68

An organic antireflection film, ARC29A (produced by Nissan Chemical Industries, Ltd.), was applied on a silicon wafer and baked at 205° C. for 60 seconds to form a 78 nm-thick antireflection film, and Resist Composition Ar-68 was applied thereon and baked at 115° C. for 60 seconds (PB) to form a 150 nm-thick resist film. The obtained wafer was subjected to pattern exposure through an exposure mask (line/space=1/1) by using an ArF excimer laser scanner (NA: 0.75). At this time, the area of exposure was set to 205 $cm^2$ in total. Thereafter, the wafer was heated at 85° C. for 60 seconds (PEB), developed with an organic solvent-containing developer shown in Table 9 for 30 seconds (organic solvent-based development), rinsed with a rinsing solution shown in Table 9, and spun at a rotation speed of 4,000 rpm for 30 seconds to obtain a pattern having a pitch of 600 nm and a line width of 450 nm. Subsequently, the wafer was developed with an aqueous tetramethylammonium hydroxide solution (2.38 mass %) (alkali developer) for 30 seconds (alkali development) and rinsed with pure water to obtain a line-and-space (1:1) resist pattern having a line width of 150 nm.

Comparative Example 5

A line-and-space (1:1) resist pattern having a pitch of 300 nm and a line width of 150 nm of Comparative Example 5 was obtained using Resist Composition Ar-01 in the same manner as in the method of Example 68 under the conditions shown in Table 9.

Example 69

An organic antireflection film, ARC29A (produced by Nissan Chemical Industries, Ltd.), was applied on a silicon wafer and baked at 205° C. for 60 seconds to form a 78 nm-thick antireflection film, and Resist Composition Ar-69 was applied thereon and baked at 115° C. for 60 seconds (PB) to form a 150 nm-thick resist film. The obtained wafer was subjected to first pattern exposure through an exposure mask (line/space=1/1) having a line width of 150 nm by using an ArF excimer laser scanner (NA: 0.75). At this time, the area of exposure was set to 205 $cm^2$ in total. Thereafter, the mask was rotated to the direction perpendicular to the first exposure, and second pattern exposure was performed through the mask. Subsequently, the wafer was heated at 85° C. for 60 seconds (PEB), developed with an organic solvent-containing developer shown in Table 9 for 30 seconds (organic solvent-based development), rinsed with a rinsing solution shown in Table 9, and spun at a rotation speed of 4,000 rpm for 30 seconds to obtain a hole pattern having a pitch of 300 nm and a hole diameter of 150 nm.

Example 78

An organic antireflection film, ARC29A (produced by Nissan Chemical Industries, Ltd.), was applied on a silicon wafer and baked at 205° C. for 60 seconds to form a 78 nm-thick antireflection film, and Resist Composition Ar-01 was applied thereon and baked at 115° C. for 60 seconds (PB) to form a 150 nm-thick resist film. The obtained wafer was subjected to pattern exposure through an exposure mask (line/space=1/1) by using an ArF excimer laser immersion scanner (NA: 1.20). Ultrapure water was used as the immersion liquid. At this time, the area of exposure was set to 350 $cm^2$ in total. Thereafter, the wafer was heated at 105° C. for 60 seconds (PEB), developed with an organic solvent-containing developer shown in Table 9 for 30 seconds (organic solvent-based development), rinsed with a rinsing solution shown in Table 9, and spun at a rotation speed of 2,000 rpm for 30 seconds to obtain a pattern having a pitch of 110 nm and a line width of 55 nm.

Examples 79 to 83 and Comparative Example 6

In the same manner as in the method of Example 78, line-and-space (1:1) resist patterns having a pitch of 110 nm and a line width of 55 nm of Examples 79 to 83 and Comparative Example 6 were obtained using Resist Compositions Ar-01 to Ar-06 shown in Table 4 under the conditions shown in Table 9.

Example 88

An organic antireflection film, ARC29A (produced by Nissan Chemical Industries, Ltd.), was applied on a silicon wafer and baked at 205° C. for 60 seconds to form a 78 nm-thick antireflection film, and Resist Composition Ar-78 was applied thereon and baked at 100° C. for 60 seconds (PB) to form a 100 nm-thick resist film. The obtained wafer was subjected to pattern exposure through an exposure mask (line/space=1/1) by using an ArF excimer laser immersion scanner (NA: 1.20). Ultrapure water was used as the immersion liquid. At this time, the area of exposure was set to 350 $cm^2$ in total. Thereafter, the wafer was heated at 95° C. for 60 seconds (PEB), developed with an organic solvent-containing developer shown in Table 9 for 30 seconds (organic solvent-based development), rinsed with a rinsing solution shown in Table 9, spun at a rotation speed of 2,000 rpm for 30 seconds, and the heated at 90° C. for 60 seconds, thereby completing the pattern formation, to obtain a pattern having a pitch of 110 nm and a line width of 55 nm.

Examples 89 to 94

In the same manner as in the method of Example 88, line-and-space (1:1) resist patterns having a pitch of 110 nm and a line width of 55 nm of Examples 89 to 94 were obtained using Resist Compositions Ar-79 to Ar-84 shown in Table 6 under the conditions shown in Table 9.

<Evaluation Method>

[Defect]

The wafers with a pattern formed in Examples 1 to 94 and Comparative Examples 1 to 6 were measured for the number of development defects (residue-type defect and blob defect) by using KLA-2360 manufactured by KLA Tencor Ltd., and the values obtained by dividing the obtained numerical value by the area of exposed part and the area of the unexposed part were defined as the number of development defects in exposed area and the number of development defects in unexposed area [pieces/$cm^2$], respectively. A smaller value indicates better performance in terms of development defect.

Incidentally, in Examples and Comparative Examples, PB and PEB conditions suitable for pattern formation were employed according to the structure of the resin.

In Tables 7 to 9, PB (Prebake) means heating before exposure, and PEB (Post Exposure Bake) means heating after exposure. Also, in the columns of PB and PEB, for example, "100060 s" means heating at 100° C. for 60 seconds.

TABLE 7

| | Resist | PB | PEB | Organic Solvent-Containing Developer (1) | Organic Solvent-Containing Developer (2) | Solvent Ratio (1)/(2) |
|---|---|---|---|---|---|---|
| Example (1) | Ar-01 | 115 C. 60 s | 105 C. 60 s | butyl acetate | | 100/0 |
| Example (2) | Ar-02 | 115 C. 60 s | 105 C. 60 s | butyl acetate | | 100/0 |
| Example (3) | Ar-03 | 115 C. 60 s | 105 C. 60 s | butyl acetate | | 100/0 |
| Example (4) | Ar-04 | 115 C. 60 s | 105 C. 60 s | butyl acetate | | 100/0 |
| Example (5) | Ar-05 | 105 C. 60 s | 115 C. 60 s | butyl acetate | | 100/0 |
| Example (6) | Ar-06 | 115 C. 60 s | 115 C. 60 s | butyl acetate | | 100/0 |
| Example (7) | Ar-07 | 115 C. 60 s | 115 C. 60 s | butyl acetate | | 100/0 |
| Example (8) | Ar-08 | 115 C. 60 s | 115 C. 60 s | butyl acetate | | 100/0 |
| Example (9) | Ar-09 | 115 C. 60 s | 115 C. 60 s | butyl acetate | | 100/0 |
| Example (10) | Ar-10 | 115 C. 60 s | 105 C. 60 s | butyl acetate | | 100/0 |
| Example (11) | Ar-11 | 115 C. 60 s | 105 C. 60 s | butyl acetate | | 100/0 |
| Example (12) | Ar-12 | 115 C. 60 s | 105 C. 60 s | butyl acetate | | 100/0 |
| Example (13) | Ar-13 | 115 C. 60 s | 105 C. 60 s | butyl acetate | | 100/0 |
| Example (14) | Ar-14 | 115 C. 60 s | 105 C. 60 s | butyl acetate | | 100/0 |
| Example (15) | Ar-15 | 115 C. 60 s | 105 C. 60 s | butyl acetate | | 100/0 |
| Example (16) | Ar-16 | 110 C. 60 s | 105 C. 60 s | butyl acetate | | 100/0 |
| Example (17) | Ar-17 | 110 C. 60 s | 105 C. 60 s | butyl acetate | | 100/0 |
| Example (18) | Ar-18 | 110 C. 60 s | 105 C. 60 s | butyl acetate | | 100/0 |
| Example (19) | Ar-19 | 110 C. 60 s | 105 C. 60 s | butyl acetate | | 100/0 |
| Example (20) | Ar-20 | 110 C. 60 s | 105 C. 60 s | butyl acetate | | 100/0 |
| Example (21) | Ar-21 | 110 C. 60 s | 105 C. 60 s | butyl acetate | | 100/0 |
| Example (22) | Ar-22 | 110 C. 60 s | 105 C. 60 s | butyl acetate | | 100/0 |
| Example (23) | Ar-23 | 110 C. 60 s | 105 C. 60 s | butyl acetate | | 100/0 |
| Example (24) | Ar-24 | 110 C. 60 s | 105 C. 60 s | butyl acetate | | 100/0 |
| Example (25) | Ar-25 | 110 C. 60 s | 105 C. 60 s | butyl acetate | | 100/0 |
| Example (26) | Ar-26 | 115 C. 60 s | 105 C. 60 s | butyl acetate | | 100/0 |
| Example (27) | Ar-27 | 115 C. 60 s | 105 C. 60 s | butyl acetate | | 100/0 |
| Example (28) | Ar-28 | 115 C. 60 s | 105 C. 60 s | butyl acetate | | 100/0 |
| Example (29) | Ar-29 | 115 C. 60 s | 105 C. 60 s | butyl acetate | | 100/0 |
| Example (30) | Ar-30 | 115 C. 60 s | 105 C. 60 s | butyl acetate | | 100/0 |

| | Rinsing Solution (1) | Rinsing Solution (2) | Solvent Ratio (1)/(2) | Number of Development Defects in Exposed Area [pieces/$cm^2$] | Number of Development Defects in Unexposed Area [pieces/$cm^2$] |
|---|---|---|---|---|---|
| Example (1) | 4-methyl-2-pentanol | | 100/0 | 20 | 10 |
| Example (2) | 4-methyl-2-pentanol | | 100/0 | 20 | 10 |
| Example (3) | 3-methyl-3-pentanol | | 100/0 | 20 | 10 |
| Example (4) | 4-methyl-2-pentanol | | 100/0 | 20 | 10 |
| Example (5) | 4-methyl-2-pentanol | | 100/0 | 20 | 10 |
| Example (6) | 4-methyl-3-pentanol | diisoamyl ether | 80/20 | 20 | 10 |

TABLE 7-continued

| | | | | | |
|---|---|---|---|---|---|
| Example (7) | 4-methyl-3-pentanol | diisoamyl ether | 50/50 | 20 | 10 |
| Example (8) | 4-methyl-2-pentanol | | 100/0 | 20 | 10 |
| Example (9) | 4-methyl-2-pentanol | | 100/0 | 20 | 10 |
| Example (10) | 4-methyl-2-pentanol | | 100/0 | 20 | 10 |
| Example (11) | 4-methyl-2-pentanol | | 100/0 | 20 | 10 |
| Example (12) | 3-methyl -2-pentanol | | 100/0 | 20 | 10 |
| Example (13) | Cyclopentanol | | 100/0 | 20 | 10 |
| Example (14) | 4-methyl-2-pentanol | | 100/0 | 20 | 10 |
| Example (15) | 4-methyl-2-pentanol | | 100/0 | 20 | 10 |
| Example (16) | 2,3-dimethyl-2-butanol | | 100/0 | 20 | 10 |
| Example (17) | 3,3-dimethyl-2-butanol | | 100/0 | 20 | 10 |
| Example (18) | 4-methyl-2-pentanol | | 100/0 | 20 | 10 |
| Example (19) | 4-methyl-2-pentanol | | 100/0 | 20 | 10 |
| Example (20) | 4-methyl-2-pentanol | | 100/0 | 20 | 10 |
| Example (21) | 4-methyl-2-pentanol | | 100/0 | 20 | 10 |
| Example (22) | 9-methyl-2-decanol | | 100/0 | 40 | 30 |
| Example (23) | 4-methyl-2-pentanol | | 100/0 | 20 | 10 |
| Example (24) | 4-methyl-2-pentanol | | 100/0 | 20 | 10 |
| Example (25) | 3-cyclohexyl-2-propanol | | 100/0 | 30 | 20 |
| Example (26) | | cyclohexyl 1-butyl ether | 0/100 | 50 | 40 |
| Example (27) | | cyclopentyl 1-propyl ether | 0/100 | 30 | 20 |
| Example (28) | 2-methyl-2-pentanol | | 100/0 | 20 | 10 |
| Example (29) | 4-methyl-2-pentanol | | 100/0 | 20 | 10 |
| Example (30) | 4-methyl-2-pentanol | | 100/0 | 20 | 10 |

TABLE 8

| | Resist | PB | PEB | Organic Solvent-Containing Developer (1) | Organic Solvent-Containing Developer (2) | Solvent Ratio (1)/(2) |
|---|---|---|---|---|---|---|
| Example (31) | Ar-31 | 120 C. 60 s | 90 C. 60 s | butyl acetate | | 100/0 |
| Example (32) | Ar-32 | 120 C. 60 s | 90 C. 60 s | butyl acetate | | 100/0 |
| Example (33) | Ar-33 | 120 C. 60 s | 90 C. 60 s | butyl acetate | | 100/0 |
| Example (34) | Ar-34 | 120 C. 60 s | 90 C. 60 s | butyl acetate | | 100/0 |
| Example (35) | Ar-35 | 120 C. 60 s | 90 C. 60 s | butyl acetate | | 100/0 |
| Example (36) | Ar-36 | 120 C. 60 s | 90 C. 60 s | butyl acetate | | 100/0 |
| Example (37) | Ar-37 | 120 C. 60 s | 90 C. 60 s | butyl acetate | | 100/0 |
| Example (38) | Ar-38 | 120 C. 60 s | 90 C. 60 s | butyl acetate | | 100/0 |
| Example (39) | Ar-39 | 120 C. 60 s | 90 C. 60 s | butyl acetate | | 100/0 |
| Example (40) | Ar-40 | 120 C. 60 s | 90 C. 60 s | butyl acetate | | 100/0 |
| Example (41) | Ar-41 | 120 C. 60 s | 90 C. 60 s | ethyl acetate | | 100/0 |
| Example (42) | Ar-42 | 120 C. 60 s | 90 C. 60 s | A3 | | 100/0 |
| Example (43) | Ar-43 | 120 C. 60 s | 90 C. 60 s | B1 | | 100/0 |
| Example (44) | Ar-44 | 120 C. 60 s | 90 C. 60 s | A1 | | 100/0 |
| Example (45) | Ar-45 | 120 C. 60 s | 90 C. 60 s | butyl acetate | | 100/0 |
| Example (46) | Ar-46 | 115 C. 60 s | 85 C. 60 s | butyl acetate | | 100/0 |
| Example (47) | Ar-47 | 115 C. 60 s | 85 C. 60 s | butyl acetate | | 100/0 |
| Example (48) | Ar-48 | 115 C. 60 s | 85 C. 60 s | butyl acetate | | 100/0 |
| Example (49) | Ar-49 | 115 C. 60 s | 85 C. 60 s | butyl acetate | | 100/0 |
| Example (50) | Ar-50 | 115 C. 60 s | 85 C. 60 s | butyl acetate | | 100/0 |
| Example (51) | Ar-51 | 115 C. 60 s | 85 C. 60 s | butyl acetate | | 100/0 |
| Example (52) | Ar-52 | 115 C. 60 s | 85 C. 60 s | butyl acetate | | 100/0 |

TABLE 8-continued

| | | | | | | |
|---|---|---|---|---|---|---|
| Example (53) | Ar-53 | 115 C. 60 s | 85 C. 60 s | butyl acetate | | 100/0 |
| Example (54) | Ar-54 | 115 C. 60 s | 85 C. 60 s | butyl acetate | | 100/0 |
| Example (55) | Ar-55 | 115 C. 60 s | 105 C. 60 s | butyl acetate | | 100/0 |
| Example (56) | Ar-56 | 115 C. 60 s | 105 C. 60 s | methyl ethyl ketone | | 100/0 |
| Example (57) | Ar-57 | 115 C. 60 s | 105 C. 60 s | isobutyl acetate | | 100/0 |
| Example (58) | Ar-58 | 115 C. 60 s | 105 C. 60 s | butyl acetate | | 100/0 |
| Example (59) | Ar-59 | 115 C. 60 s | 105 C. 60 s | butyl acetate | A3 | 80/20 |
| Example (60) | Ar-60 | 115 C. 60 s | 105 C. 60 s | butyl acetate | B1 | 40/60 |

| | Rinsing Solution (1) | Rinsing Solution (2) | Solvent Ratio (1)/(2) | Number of Development Defects in Exposed Area [pieces/cm$^2$] | Number of Development Defects in Unexposed Area [pieces/cm$^2$] |
|---|---|---|---|---|---|
| Example (31) | 4-methyl-2-pentanol | | 100/0 | 20 | 10 |
| Example (32) | 4-methyl-2-pentanol | | 100/0 | 20 | 10 |
| Example (33) | 7-methyl-2-octanol | | 100/0 | 40 | 30 |
| Example (34) | 4-methyl-2-pentanol | | 100/0 | 20 | 10 |
| Example (35) | 4-methyl-2-pentanol | | 100/0 | 20 | 10 |
| Example (36) | 6-methyl-2-heptanol | | 100/0 | 20 | 10 |
| Example (37) | 4-methyl-2-pentanol | | 100/0 | 20 | 20 |
| Example (38) | 9-methyl-2-decanol | | 100/0 | 40 | 20 |
| Example (39) | cyclohexanol | | 100/0 | 30 | 10 |
| Example (40) | 4-methyl-2-pentanol | | 100/0 | 20 | 10 |
| Example (41) | 4-methyl-2-pentanol | | 100/0 | 20 | 10 |
| Example (42) | 8-methyl-2-nonanol | | 100/0 | 40 | 20 |
| Example (43) | 4-methyl-2-pentanol | | 100/0 | 30 | 20 |
| Example (44) | 4-methyl-2-pentanol | | 100/0 | 30 | 20 |
| Example (45) | 4-methyl-2-pentanol | | 100/0 | 20 | 10 |
| Example (46) | 4-methyl-2-pentanol | | 100/0 | 20 | 10 |
| Example (47) | 4-methyl-2-pentanol | | 100/0 | 20 | 10 |
| Example (48) | 4-methyl-2-pentanol | | 100/0 | 20 | 10 |
| Example (49) | 4-methyl-2-pentanol | | 100/0 | 20 | 10 |
| Example (50) | 4-methyl-2-pentanol | | 100/0 | 20 | 10 |
| Example (51) | 4-methyl-2-pentanol | | 100/0 | 20 | 10 |
| Example (52) | 4-methyl-2-pentanol | | 100/0 | 20 | 10 |
| Example (53) | 4-methyl-2-pentanol | | 100/0 | 20 | 10 |
| Example (54) | 4-methyl-2-pentanol | | 100/0 | 20 | 10 |
| Example (55) | 4-methyl-2-pentanol | | 100/0 | 20 | 10 |
| Example (56) | 4-methyl-2-pentanol | | 100/0 | 30 | 20 |
| Example (57) | 4-methyl-2-pentanol | | 100/0 | 20 | 10 |
| Example (58) | | diisoamyl ether | 0/100 | 20 | 10 |
| Example (59) | | diisoamyl ether | 0/100 | 20 | 10 |
| Example (60) | 4-methyl-3-pentanol | diisoamyl ether | 40/60 | 20 | 10 |

TABLE 9

| | Resist | PB | PEB | Organic Solvent-Containing Developer (1) | Organic Solvent-Containing Developer (2) | Solvent Ratio (1)/(2) |
|---|---|---|---|---|---|---|
| Example (61) | Ar-61 | 115 C. 60 s | 105 C. 60 s | butyl acetate | isobutyl acetate | 85/15 |
| Example (62) | Ar-62 | 115 C. 60 s | 115 C. 60 s | butyl acetate | acetone | 95/5 |
| Example (63) | Ar-63 | 115 C. 60 s | 115 C. 60 s | butyl acetate | A1 | 50/50 |
| Example (64) | Ar-64 | 115 C. 60 s | 115 C. 60 s | butyl acetate | | 100/0 |
| Example (65) | Ar-65 | 115 C. 60 s | 105 C. 60 s | butyl acetate | | 100/0 |
| Example (66) | Ar-66 | 115 C. 60 s | 105 C. 60 s | acetone | | 100/0 |
| Example (67) | Ar-67 | 115 C. 60 s | 85 C. 60 s | butyl acetate | | 100/0 |
| Example (68) | Ar-68 | 115 C. 60 s | 85 C. 60 s | butyl acetate | | 100/0 |
| Example (69) | Ar-69 | 115 C. 60 s | 85 C. 60 s | butyl acetate | | 100/0 |
| Example (70) | Ar-70 | 115 C. 60 s | 85 C. 60 s | butyl acetate | | 100/0 |
| Example (71) | Ar-71 | 115 C. 60 s | 85 C. 60 s | butyl acetate | | 100/0 |
| Example (72) | Ar-72 | 115 C. 60 s | 85 C. 60 s | butyl acetate | | 100/0 |
| Example (73) | Ar-73 | 115 C. 60 s | 85 C. 60 s | butyl acetate | | 100/0 |
| Example (74) | Ar-01 | 115 C. 60 s | 105 C. 60 s | butyl acetate | | 100/0 |
| Example (75) | Ar-02 | 115 C. 60 s | 105 C. 60 s | butyl acetate | | 100/0 |
| Example (76) | Ar-01 | 115 C. 60 s | 105 C. 60 s | butyl acetate | | 100/0 |
| Example (77) | Ar-67 | 115 C. 60 s | 105 C. 60 s | butyl acetate | | 100/0 |
| Example (78) | Ar-01 | 115 C. 60 s | 105 C. 60 s | butyl acetate | | 100/0 |
| Example (79) | Ar-02 | 115 C. 60 s | 105 C. 60 s | butyl acetate | | 100/0 |
| Example (80) | Ar-03 | 115 C. 60 s | 105 C. 60 s | butyl acetate | | 100/0 |
| Example (81) | Ar-04 | 115 C. 60 s | 105 C. 60 s | butyl acetate | | 100/0 |
| Example (82) | Ar-05 | 105 C. 60 s | 115 C. 60 s | butyl acetate | | 100/0 |
| Example (83) | Ar-06 | 115 C. 60 s | 115 C. 60 s | butyl acetate | | 100/0 |
| Example (84) | Ar-74 | 115 C. 60 s | 105 C. 60 s | butyl acetate | | 100/0 |
| Example (85) | Ar-75 | 115 C. 60 s | 105 C. 60 s | butyl acetate | | 100/0 |
| Example (86) | Ar-76 | 115 C. 60 s | 105 C. 60 s | butyl acetate | | 100/0 |
| Example (87) | Ar-77 | 115 C. 60 s | 105 C. 60 s | butyl acetate | | 100/0 |
| Example (88) | Ar-78 | 100 C. 60 s | 95 C. 60 s | butyl acetate | | 100/0 |
| Example (89) | Ar-79 | 100 C. 60 s | 95 C. 60 s | butyl acetate | | 100/0 |
| Example (90) | Ar-80 | 100 C. 60 s | 95 C. 60 s | butyl acetate | | 100/0 |
| Example (91) | Ar-81 | 100 C. 60 s | 95 C. 60 s | butyl acetate | | 100/0 |
| Example (92) | Ar-82 | 100 C. 60 s | 95 C. 60 s | butyl acetate | A2 | 60/40 |
| Example (93) | Ar-83 | 100 C. 60 s | 105 C. 60 s | butyl acetate | A1 | 70/30 |
| Example (94) | Ar-84 | 100 C. 60 s | 105 C. 60 s | butyl acetate | A1 | 70/30 |
| Comparative Example (1) | Ar-01 | 115 C. 60 s | 105 C. 60 s | butyl acetate | | 100/0 |
| Comparative Example (2) | Ar-02 | 115 C. 60 s | 105 C. 60 s | butyl acetate | | 100/0 |
| Comparative Example (3) | Ar-03 | 115 C. 60 s | 105 C. 60 s | butyl acetate | | 100/0 |
| Comparative Example (4) | Ar-01 | 115 C. 60 s | 105 C. 60 s | butyl acetate | | 100/0 |
| Comparative Example (5) | Ar-01 | 115 C. 60 s | 105 C. 60 s | butyl acetate | | 100/0 |
| Comparative Example (6) | Ar-01 | 115 C. 60 s | 105 C. 60 s | butyl acetate | | 100/0 |

| | Rinsing Solution (1) | Rinsing Solution (2) | Solvent Ratio (1)/(2) | Number of Development Defects in Exposed Area [pieces/cm$^2$] | Number of Development Defects in Unexposed Area [pieces/cm$^2$] |
|---|---|---|---|---|---|
| Example (61) | cyclohexanol | dibutyl ether | 85/15 | 20 | 10 |
| Example (62) | 2-propanol | diisoamyl ether | 95/5 | 20 | 10 |
| Example (63) | 2-propanol | diisoamyl ether | 50/50 | 20 | 10 |
| Example (64) | | diisoamyl ether | 0/100 | 40 | 20 |
| Example (65) | | diisoamyl ether | 0/100 | 40 | 20 |
| Example (66) | | diisoamyl ether | 0/100 | 40 | 20 |
| Example (67) | 4-methyl-2-pentanol | | 100/0 | 20 | 10 |
| Example (68) | 4-methyl-2-pentanol | | 100/0 | 20 | 10 |
| Example (69) | 4-methyl-2-pentanol | | 100/0 | 20 | 10 |
| Example (70) | 4-methyl-2-pentanol | | 100/0 | 20 | 10 |
| Example (71) | 4-methyl-2-pentanol | | 100/0 | 20 | 10 |

TABLE 9-continued

| | | | | | |
|---|---|---|---|---|---|
| Example (72) | 4-methyl-2-pentanol | | 100/0 | 20 | 10 |
| Example (73) | 4-methyl-2-pentanol | | 100/0 | 20 | 10 |
| Example (74) | | cyclopentyl methyl ether | 0/100 | 30 | 30 |
| Example (75) | | dihexyl ether | 0/100 | 40 | 30 |
| Example (76) | 4-methyl-2-pentanol | | 100/0 | 20 | 10 |
| Example (77) | 4-methyl-2-pentanol | | 100/0 | 20 | 10 |
| Example (78) | 4-methyl-2-pentanol | | 100/0 | 20 | 10 |
| Example (79) | 4-methyl-2-pentanol | | 100/0 | 20 | 10 |
| Example (80) | 3-methyl-3-pentanol | | 100/0 | 20 | 10 |
| Example (81) | 4-methyl-2-pentanol | | 100/0 | 20 | 10 |
| Example (82) | 4-methyl-2-pentanol | | 100/0 | 20 | 10 |
| Example (83) | 4-methyl-3-pentanol | diisoamyl ether | 80/20 | 20 | 10 |
| Example (84) | 4-methyl-2-pentanol | | 100/0 | 20 | 10 |
| Example (85) | 4-methyl-2-pentanol | | 100/0 | 20 | 10 |
| Example (86) | 4-methyl-2-pentanol | | 100/0 | 20 | 10 |
| Example (87) | 4-methyl-2-pentanol | | 100/0 | 20 | 10 |
| Example (88) | 4-methyl-2-pentanol | | 100/0 | 20 | 10 |
| Example (89) | 4-methyl-2-pentanol | | 100/0 | 20 | 10 |
| Example (90) | 4-methyl-2-pentanol | | 100/0 | 20 | 10 |
| Example (91) | 4-methyl-2-pentanol | | 100/0 | 20 | 10 |
| Example (92) | 4-methyl-2-pentanol | diisoamyl ether | 90/10 | 20 | 10 |
| Example (93) | 4-methyl-2-pentanol | diisoamyl ether | 80/20 | 20 | 10 |
| Example (94) | 4-methyl-2-pentanol | diisoamyl ether | 80/20 | 20 | 10 |
| Comparative Example (1) | 1-hexanol | | 100/0 | 800 | 700 |
| Comparative Example (2) | | dibutyl ether | 0/100 | 800 | 700 |
| Comparative Example (3) | tert-butyl alcohol | | 100/0 | 800 | 700 |
| Comparative Example (4) | 2-hexanol | | 100/0 | 1000 | 1000 |
| Comparative Example (5) | 1-hexanol | dibutyl ether | 75/25 | 1000 | 1000 |
| Comparative Example (6) | 1-hexanol | | 100/0 | 800 | 700 |

As apparent from the results above, in the patterning by negative development, the defect is significantly reduced by the method of the present invention.

In Examples 1 to 66, 70 to 77 and 84 to 87 and Comparative Examples 1 to 3 where a line-and-space (1:1) resist pattern having a line width of 80 nm is produced, the same results as above are obtained.

In Example 67, Comparative Example 4, Example 68 and Comparative Example 5 where a 100 nm-thick resist film is formed and a line-and-space (1:1) resist pattern having a line width of 150 nm is produced, the same results as above are obtained. Furthermore, also when a 100 nm-thick resist film is formed and a line-and-space (1:1) resist pattern having a line width of 80 nm is produced, the same results as above are obtained.

In Example 69 where a 100 nm-thick resist film is formed and a hole pattern having a pitch of 180 nm and a hole diameter of 90 nm, the same results as above are obtained.

In Examples 78 to 83 and Comparative Example 6 where a 100 nm-thick resist film is formed, the same results as above are obtained.

INDUSTRIAL APPLICABILITY

According to the present invention, a specific rinsing solution is used, so that in a pattern forming method involving organic solvent-based development, a pattern remarkably reduced in defects can be formed.

This application is based on Japanese patent application JP 2008-303259, filed on Nov. 27, 2008, the entire content of which is hereby incorporated by reference, the same as if set forth at length.

The invention claimed is:

1. A pattern forming method, comprising:

(i) a step of forming a resist film from a resist composition for organic solvent-based development, the resist composition containing (A) a resin capable of increasing the polarity of the resin (A) by an action of an acid to decrease the solubility of the resin (A) in an organic solvent-containing developer, (B) a compound capable of generating an acid upon irradiation with an actinic ray or radiation, and (C) a solvent;

(ii) an exposure step;

(iii) a development step using an organic solvent-containing developer; and (iv) a washing step using a rinsing solution, wherein in the step (iv), a rinsing solution containing at least the following solvent S2 is used:

Solvent S2 is a dialkyl ether having at least either an alkyl group having a carbon number of from 5 to 8 or a cycloalkyl group having a carbon number of from 5 to 8.

2. The pattern forming method according to claim 1, wherein the resin (A) contains a repeating unit represented by the following formula (pA):

(pA)

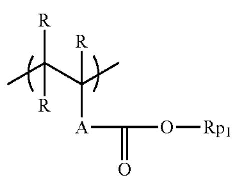

wherein R represents a hydrogen atom, a halogen atom or a linear or branched alkyl group having a carbon number of 1 to 4, and each R may be the same as or different from every other R;

A represents a single bond, an alkylene group, an ether bond, a thioether bond, a carbonyl group, an ester bond, an amido bond, a sulfonamido bond, a urethane bond, a ureylene bond or a combination of two or more of these groups and bonds; and $Rp_1$ represents a group represented by any one of the following formulae (pI) to (pV):

(pI)

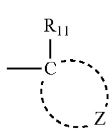

(pII)

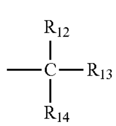

(pIII)

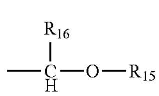

(pIV)

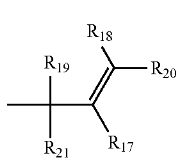

-continued (pV)

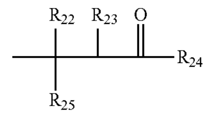

wherein $R_{11}$ represents a methyl group, an ethyl group, an n-propyl group, an isopropyl group, an n-butyl group, an isobutyl group or a sec-butyl group;

Z represents an atomic group necessary for forming a cycloalkyl group together with the carbon atom;

each of $R_{12}$ to $R_{16}$ independently represents a linear or branched alkyl group having a carbon number of 1 to 4 or a cycloalkyl group, provided that at least one of $R_{12}$ to $R_{14}$ and either one of $R_{15}$ and $R_{16}$ represent a cycloalkyl group;

each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group; and each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

3. The pattern forming method according to claim 1, wherein the resin (A) contains a repeating unit represented by the following formula (IX) having neither a hydroxyl group nor a cyano group:

(IX)

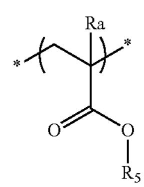

wherein $R_5$ represents a hydrocarbon group having at least one cyclic structure and having neither a hydroxyl group nor a cyano group; and Ra represents a hydrogen atom, an alkyl group or a —$CH_2$—O—$Ra_2$ group in which $Ra_2$ represents an alkyl group or an acyl group.

4. A method for manufacturing an electronic device, comprising the pattern forming method according to claim 1.

5. A pattern forming method, comprising:

(i) a step of forming a resist film from a resist composition for organic solvent-based development, the resist composition containing (A) a resin capable of increasing the polarity of the resin (A) by an action of an acid to decrease the solubility of the resin (A) in an organic solvent-containing developer, (B) a compound capable of generating an acid upon irradiation with an actinic ray or radiation, and (C) a solvent;

(ii) an exposure step;

(iii) a development step using an organic solvent-containing developer; and (iv) a washing step using a rinsing solution, wherein in the step (iv), a rinsing solution containing both the following solvent S1 and the solvent S2 is used:

Solvent S1 is an alcohol having a carbon number of at least 5 and having an alkyl chain containing at least either a branched or cyclic structure, with a secondary or tertiary carbon atom in the alkyl chain being bonded to a hydroxyl group; and Solvent S2 is a dialkyl ether having at least either an alkyl group having a carbon number of at least 5 or a cycloalkyl group having a carbon number of at least 5;

wherein the rinsing solution satisfies the condition that the ratio by mass of solvent S1/solvent S2 is from 50/50 to 80/20.

6. The pattern forming method according to claim 5, wherein the resin (A) contains a repeating unit represented by the following formula (pA):

(pA)

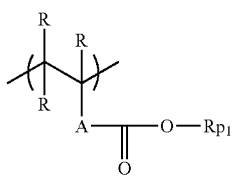

wherein R represents a hydrogen atom, a halogen atom or a linear or branched alkyl group having a carbon number of 1 to 4, and each R may be the same as or different from every other R;

A represents a single bond, an alkylene group, an ether bond, a thioether bond, a carbonyl group, an ester bond, an amido bond, a sulfonamido bond, a urethane bond, a ureylene bond or a combination of two or more of these groups and bonds; and $Rp_1$ represents a group represented by any one of the following formulae (pI) to (pV):

(pI)

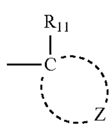

(pII)

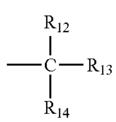

(pIII)

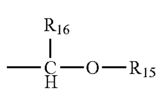

(pIV)

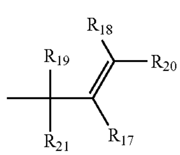

(pV)

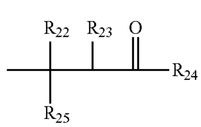

wherein $R_{11}$ represents a methyl group, an ethyl group, an n-propyl group, an isopropyl group, an n-butyl group, an isobutyl group or a sec-butyl group;

Z represents an atomic group necessary for forming a cycloalkyl group together with the carbon atom;

each of $R_{12}$ to $R_{16}$ independently represents a linear or branched alkyl group having a carbon number of 1 to 4 or a cycloalkyl group, provided that at least one of $R_{12}$ to $R_{14}$ and either one of $R_{15}$ and $R_{16}$ represent a cycloalkyl group;

each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group; and each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

7. The pattern forming method according to claim 5, wherein the resin (A) contains a repeating unit represented by the following formula (IX) having neither a hydroxyl group nor a cyano group:

(IX)

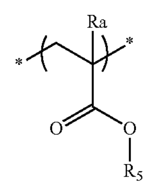

wherein $R_5$ represents a hydrocarbon group having at least one cyclic structure and having neither a hydroxyl group nor a cyano group; and Ra represents a hydrogen atom, an alkyl group or a —$CH_2$—O—$Ra_2$ group in which $Ra_2$ represents an alkyl group or an acyl group.

8. A method for manufacturing an electronic device, comprising the pattern forming method according to claim 5.

9. A pattern forming method, comprising:

(i) a step of forming a resist film from a resist composition for organic solvent-based development, the resist composition containing (A) a resin capable of increasing the polarity of the resin (A) by an action of an acid to decrease the solubility of the resin (A) in an organic solvent-containing developer, (B) a compound capable of generating an acid upon irradiation with an actinic ray or radiation, and (C) a solvent;

(ii) an exposure step;

(iii) a development step using an organic solvent-containing developer; and (iv) a washing step using a rinsing solution, wherein in the step (iv), a rinsing solution containing at least the following solvent S1 is used:

Solvent S1 is any one of 3-methyl-2-pentanol, 3-methyl-3-pentanol, 4-methyl-2-pentanol, 4-methyl-3-pentanol and 2-methyl-2-pentanol.

10. The pattern forming method according to claim 9, wherein the solvent S1 is 4-methyl-2-pentanol.

11. The pattern forming method according to claim 9, wherein the resin (A) contains a repeating unit represented by the following formula (pA):

(pA)

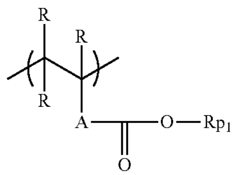

wherein R represents a hydrogen atom, a halogen atom or a linear or branched alkyl group having a carbon number of 1 to 4, and each R may be the same as or different from every other R;

A represents a single bond, an alkylene group, an ether bond, a thioether bond, a carbonyl group, an ester bond, an amido bond, a sulfonamido bond, a urethane bond, a ureylene bond or a combination of two or more of these groups and bonds; and $Rp_1$ represents a group represented by any one of the following formulae (pI) to (pV):

(pI)

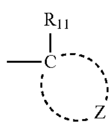

(pII)

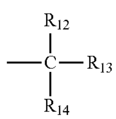

(pIII)

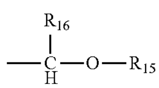

(pIV)

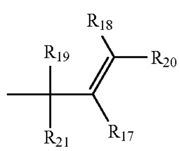

(pV)

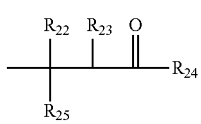

wherein $R_{11}$ represents a methyl group, an ethyl group, an n-propyl group, an isopropyl group, an n-butyl group, an isobutyl group or a sec-butyl group;

Z represents an atomic group necessary for forming a cycloalkyl group together with the carbon atom;

each of $R_{12}$ to $R_{16}$ independently represents a linear or branched alkyl group having a carbon number of 1 to 4 or a cycloalkyl group, provided that at least one of $R_{12}$ to $R_{14}$ and either one of $R_{15}$ and $R_{16}$ represent a cycloalkyl group;

each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group; and each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

12. The pattern forming method according to claim 9, wherein the resin (A) contains a repeating unit represented by the following formula (IX) having neither a hydroxyl group nor a cyano group:

(IX)

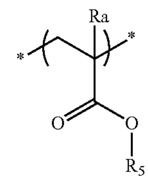

wherein $R_5$ represents a hydrocarbon group having at least one cyclic structure and having neither a hydroxyl group nor a cyano group; and Ra represents a hydrogen atom, an alkyl group or a —$CH_2$—O-$Ra_2$ group in which $Ra_2$ represents an alkyl group or an acyl group.

13. A method for manufacturing an electronic device, comprising the pattern forming method according to claim 9.

14. A rinsing solution for organic solvent-based development, which is used for a resist composition for organic solvent-based development, the rinsing solution comprising at least the following solvent S2:

Solvent S2 is a dialkyl ether having at least either an alkyl group having a carbon number of from 5 to 8 or a cycloalkyl group having a carbon number of from 5 to 8.

15. The rinsing solution for organic solvent-based developing according to claim 14, wherein the water content in the rinsing solution is 30 mass % or less.

16. A rinsing solution for organic solvent-based development, which is used for a resist composition for organic solvent-based development, the rinsing solution comprising both the following solvent S1 and the solvent S2:

Solvent S1 is an alcohol having a carbon number of at least 5 and having an alkyl chain containing at least either a branched or cyclic structure, with a secondary or tertiary carbon atom in the alkyl chain being bonded to a hydroxyl group; and Solvent S2 is a dialkyl ether having at least either an alkyl group having a carbon number of at least 5 or a cycloalkyl group having a carbon number of at least 5;

and satisfying the condition that the ratio by mass of solvent S1/solvent S2 is from 50/50 to 80/20.

17. The rinsing solution for organic solvent-based developing according to claim 16, wherein the water content in the rinsing solution is 30 mass % or less.

18. A rinsing solution for organic solvent-based development, which is used for a resist composition for organic solvent-based development, the rinsing solution comprising at least the following solvent S1:

Solvent S1 is any one of 3-methyl-2-pentanol, 3-methyl-3-pentanol, 4-methyl-2-pentanol, 4-methyl-3-pentanol and 2-methyl-2-pentanol.

19. The rinsing solution for organic solvent-based developing according to claim 18, wherein the solvent S1 is 4-methyl-2-pentanol.

20. The rinsing solution for organic solvent-based developing according to claim 18, wherein the water content in the rinsing solution is 30 mass % or less.

* * * * *